US007972920B2

(12) United States Patent
Chakihara et al.

(10) Patent No.: US 7,972,920 B2
(45) Date of Patent: Jul. 5, 2011

(54) SEMICONDUCTOR MEMORY DEVICE AND A METHOD OF MANUFACTURING THE SAME, A METHOD OF MANUFACTURING A VERTICAL MISFET AND A VERTICAL MISFET, AND A METHOD OF MANUFACTURING A SEMICONDUCTOR DEVICE AND A SEMICONDUCTOR DEVICE

(75) Inventors: Hiraku Chakihara, Akishima (JP); Kousuke Okuyama, Kawagoe (JP); Masahiro Moniwa, Sayama (JP); Makoto Mizuno, Kokubunji (JP); Keiji Okamoto, Higashiyamato (JP); Mitsuhiro Noguchi, Sagamihara (JP); Tadanori Yoshida, Sayama (JP); Yasuhiko Takahshi, Higashiyamato (JP); Akio Nishida, Tachikawa (JP)

(73) Assignees: Hitachi ULSI Systems Co., Ltd., Tokyo (JP); Renesas Electronics Corp., Kanagawa (JP)

(*) Notice: Subject to any disclaimer, the term of this patent is extended or adjusted under 35 U.S.C. 154(b) by 30 days.

(21) Appl. No.: 12/700,344

(22) Filed: Feb. 4, 2010

(65) Prior Publication Data

US 2010/0136778 A1 Jun. 3, 2010

Related U.S. Application Data

(63) Continuation of application No. 12/364,279, filed on Feb. 2, 2009, now Pat. No. 7,701,020, which is a continuation of application No. 11/418,029, filed on May 5, 2006, now Pat. No. 7,161,215, which is a continuation of application No. 11/418,024, filed on May 5, 2006, now Pat. No. 7,495,289, which is a continuation of application No. 10/629,733, filed on Jul. 30, 2003, now Pat. No. 7,190,031.

(30) Foreign Application Priority Data

Jul. 31, 2002 (JP) ................................ 2002-224254
Mar. 31, 2003 (JP) ................................ 2003-097210

(51) Int. Cl.
*H01L 21/8244* (2006.01)
*G11C 11/40* (2006.01)

(52) U.S. Cl. ................ 438/212; 438/279; 257/E21.409; 257/E21.41; 257/E21.421; 365/187

(58) Field of Classification Search .................. 438/212, 438/279; 257/E21.409, E21.41, E21.421; 365/187
See application file for complete search history.

(56) References Cited

U.S. PATENT DOCUMENTS

| | | | |
|---|---|---|---|
| 5,072,286 | A | 12/1991 | Minami et al. |
| 5,132,771 | A | 7/1992 | Yamanaka et al. |
| 5,239,196 | A | 8/1993 | Ikeda et al. |
| 5,364,810 | A | 11/1994 | Kosa et al. |
| 5,550,396 | A | 8/1996 | Tsutsumi |
| 5,994,735 | A | 11/1999 | Maeda et al. |
| 6,060,723 | A | 5/2000 | Nakazato et al. |
| 6,670,262 | B2 | 12/2003 | Nii et al. |
| 6,740,921 | B2 | 5/2004 | Matsuoka et al. |
| 7,190,031 | B2 | 3/2007 | Chakihara et al. |

FOREIGN PATENT DOCUMENTS

| | | |
|---|---|---|
| JP | 01-265558 | 10/1989 |
| JP | 04-176168 | 6/1992 |
| JP | 5062474 | 3/1993 |
| JP | 5206394 | 8/1993 |
| JP | 6104405 | 4/1994 |
| JP | 888328 | 4/1996 |
| JP | 11 87541 | 3/1999 |
| JP | 07-099311 | 11/1999 |
| JP | 2002-367925 | 12/2002 |
| WO | WO 03019663 | 3/2003 |
| WO | WO 03036714 | 5/2003 |

OTHER PUBLICATIONS

Office Action issued in Japanese Patent Application No. 2008-265127 on Jan. 5, 2011.
U.S. Appl. No. 10/465,550 Specification (pp. 77) and drawings (pp. 78), Jan. 2004.
Japanese Official Action issued Jan. 5, 2011 in connection with Japanese Patent Application No. 2008-265127, English translation (related portion).

*Primary Examiner* — Evan Pert
(74) *Attorney, Agent, or Firm* — Antonelli, Terry, Stout & Kraus, LLP.

(57) ABSTRACT

Vertical MISFETs are formed over drive MISFETs and transfer MISFETs. The vertical MISFETs comprise rectangular pillar laminated bodies each formed by laminating a lower semiconductor layer (drain), an intermediate semiconductor layer, and an upper semiconductor layer (source), and gate electrodes formed on corresponding side walls of the laminated bodies with gate insulating films interposed therebetween. In each vertical MISFET, the lower semiconductor layer constitutes a drain, the intermediate semiconductor layer constitutes a substrate (channel region), and the upper semiconductor layer constitutes a source. The lower semiconductor layer, the intermediate semiconductor layer and the upper semiconductor layer are each comprised of a silicon film. The lower semiconductor layer and the upper semiconductor layer are doped with a p type and constituted of a p type silicon film.

12 Claims, 104 Drawing Sheets

SEMICONDUCTOR MEMORY DEVICE AND A METHOD OF MANUFACTURING THE SAME, A METHOD OF MANUFACTURING A VERTICAL MISFET AND A VERTICAL MISFET, AND A METHOD OF MANUFACTURING A SEMICONDUCTOR DEVICE AND A SEMICONDUCTOR DEVICE

CROSS-REFERENCE TO RELATED APPLICATION

This application is a continuation of U.S. application Ser. No. 12/364,279, filed Feb. 2, 2009now U.S. Pat. No. 7,701,020, which, in turn, is a continuation of U.S. application Ser. No. 11/418,029, filed May 5, 2006 (now U.S. Pat. No. 7,161,215), which in turn, is a continuation of U.S. application Ser. No. 11/418,024, filed May 5, 2006 (now U.S. Pat. No. 7,495,289), which is also a continuation of U.S. application Ser. No. 10/629,733, filed Jul. 30, 2003 (now U.S. Pat. No. 7,190,031), the entire contents of which applications are herein incorporated by reference.

BACKGROUND OF THE INVENTION

The present invention relates to a semiconductor memory device and to a method of manufacturing the same, a method of manufacturing a vertical MISFET and a vertical MISFET, and a method of manufacturing a semiconductor device and a semiconductor device; and, more particularly, the invention relates to a technology that is effective when applied to a semiconductor memory device having an SRAM (Static Random Access Memory), wherein each of the memory cells is configured using vertical MISFETs.

In an SRAM (Static Random Access Memory) which represents a kind of general-purpose large-capacity semiconductor memory device, a memory cell comprises, for example, four n channel type MISFETs (Metal Insulator-Semiconductor-Field-Effect-Transistors) and two p channel type MISFETs. Since, however, this type of so-called full CMOS (Complementary-Metal-Oxide-Semiconductor) type S RAM has six MISFETs disposed on a major surface of a semiconductor substrate on a plane basis, it is difficult to scale down the memory cell size. Namely, the full CMOS type SRAM, which needs p and n type well regions for forming CMOS and well isolation regions for respectively separating n channel type MISFETs and p channel type MISFETs from one another, presents difficulties in scaling down the memory cell size.

SUMMARY OF THE INVENTION

Japanese Patent Application Laid-Open No. Hei. 8 (1996)-88328 (Japanese Application corresponding to U.S. Pat. No. 5,364,810), describes a technology relating to an SRAM made up of six MISFETs, wherein some of MISFETs constituting a memory cell are constituted using MISFETs wherein channel portions are formed at side walls of trenches and gates are formed so as to embed the trenches, thereby scaling down the size of a memory cell. However, in this case, since the gates formed so as to embed the trenches are constituted of conductive films, each formed over a MISFET with an insulating film interposed therebetween by patterning, and are electrically connected to other MISFETs, a space including an alignment allowance for photolithography is required, and, hence, the memory cell size increases.

In a full CMOS type SRAM wherein four n channel type MISFETs and two p channel type MISFETs are disposed on a semiconductor substrate side by side, as described in, for example, Japanese Patent Application Laid-Open No. Hei 5 (1993)-206394 (Japanese Application corresponding to U.S. Pat. No. 5,550,396), a space corresponding to the six transistors is needed, and, hence, the memory cell size increases, whereby the manufacturing process increases in complexity.

A vertical transistor has been described in, for example, Japanese Patent Application Laid-Open No. Hei 11 (1999)-87541 (Japanese Application corresponding to U.S. Pat. No. 6,060,723). As disclosed in this publication, the source, drain and gate of the vertical transistor are electrically connected to a metal wiring layer formed on an insulating film via a connecting hole defined in an insulating film covering the vertical transistor.

As a result of investigations about this type of vertical transistor, the present inventors have found that, since the vertical transistor is disposed on a plane parallel to a major surface of a substrate to connect the source, drain and gate thereof to the metal wiring layer, corresponding regions are needed in the extending direction thereof, and an area for the placement or the like of the metal wiring layer connected to the vertical transistor is required, thereby causing apprehension that the transistor size will be increased.

An object of the present invention is to provide a technology that is capable of scaling down the memory cell size of an SRAM.

The above, other objects and novel features of the present invention will become apparent from the description provided in the present specification and from the accompanying drawings.

Summaries of representative aspects of the invention disclosed in the present application will be described as follows:

There is provided a semiconductor memory device of the present invention, comprising a memory cell which has first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first and second transfer MISFETs, and the first and second drive MISFETs are formed on a major surface of a semiconductor substrate, wherein the first and second vertical MISFETs are formed over the first and second transfer MISFETs and the first and second drive MISFETs, wherein the first vertical MISFET has a source, a channel region and a drain formed in a first laminated body extending in a direction perpendicular to the major surface of the semiconductor substrate, and a first gate electrode formed on sidewall portions of the first laminated body with a gate insulating film interposed therebetween, wherein the second vertical MISFET includes a source, a channel region and a drain formed in a second laminated body extending in a direction perpendicular to the major surface of the semiconductor substrate, and a second gate electrode formed on sidewall portions of the second laminated body with a gate insulating film interposed therebetween, wherein the source of the first vertical MISFET, a gate electrode of the second drive MISFET, and a drain of the first drive MISFET are electrically connected to one another through a first intermediate conductive layer, wherein the source of the second vertical MISFET, a gate electrode of the first drive MISFET, and a drain of the second drive MISFET are electrically connected to one another through a second intermediate conductive layer, wherein the first gate electrode of the first vertical MISFET is electrically connected to the second intermediate conductive layer through a first gate drawing electrode formed so as to come into contact with the first gate electrode, and a first conductive layer lying in a first connecting hole, which is formed so as to come into contact with the first gate drawing electrode and the second intermediate conductive layer, and wherein the second gate electrode of the second vertical MISFET is electrically connected to the first intermediate conductive layer through a second gate drawing electrode formed so as to come into contact with the second gate electrode, and a second conductive layer lying in a second connecting hole, which is formed so as to come into contact with the second gate drawing electrode and the first intermediate conductive layer.

Further, the semiconductor memory device is manufactured by, for example, the following steps (a) through (f) of:

(a) forming first and second transfer MISFETs and first and second drive MISFETs in a first area of a major surface of a semiconductor substrate;

(b) forming a first intermediate conductive layer for electrically connecting a gate electrode of the second drive MISFET and a drain of the first drive MISFET over the first and second transfer MISFETs and the first and second drive MISFETs, and forming a second intermediate conductive layer for electrically connecting a gate electrode of the first drive MISFET and a drain of the second drive MISFET over the first and second transfer MISFETs and the first and second drive MISFETs;

(c) forming first and second gate drawing electrodes over the first and second intermediate conductive layers with a first insulating film interposed therebetween;

(d) after the step (c), forming first and second laminated bodies over the first and second gate drawing electrodes to thereby electrically connect a drain of a first vertical MISFET formed in the first laminated body with the first intermediate conductive layer and electrically connect a drain of a second vertical MISFET formed in the second laminated body with the second intermediate conductive layer;

(e) electrically connecting a gate electrode of the first vertical MISFET, which is formed on sidewall portions of the first laminated body with a gate insulating film interposed therebetween, with the first gate drawing electrode, and electrically connecting a gate electrode of the second vertical MISFET, which is formed on sidewall portions of the second laminated body with a gate insulating film interposed therebetween, with the second gate drawing electrode; and (f) forming a first connecting hole over the first gate drawing electrode so as to come into contact with the first gate drawing electrode and the second intermediate conductive layer and embedding a first conductive layer into the first connecting hole, and forming a second connecting hole over the second gate drawing electrode so as to come into contact with the second gate drawing electrode and the first intermediate conductive layer and embedding a second conductive layer into the second connecting hole.

DETAILED DESCRIPTION OF THE PREFERRED EMBODIMENTS

Figure 1:
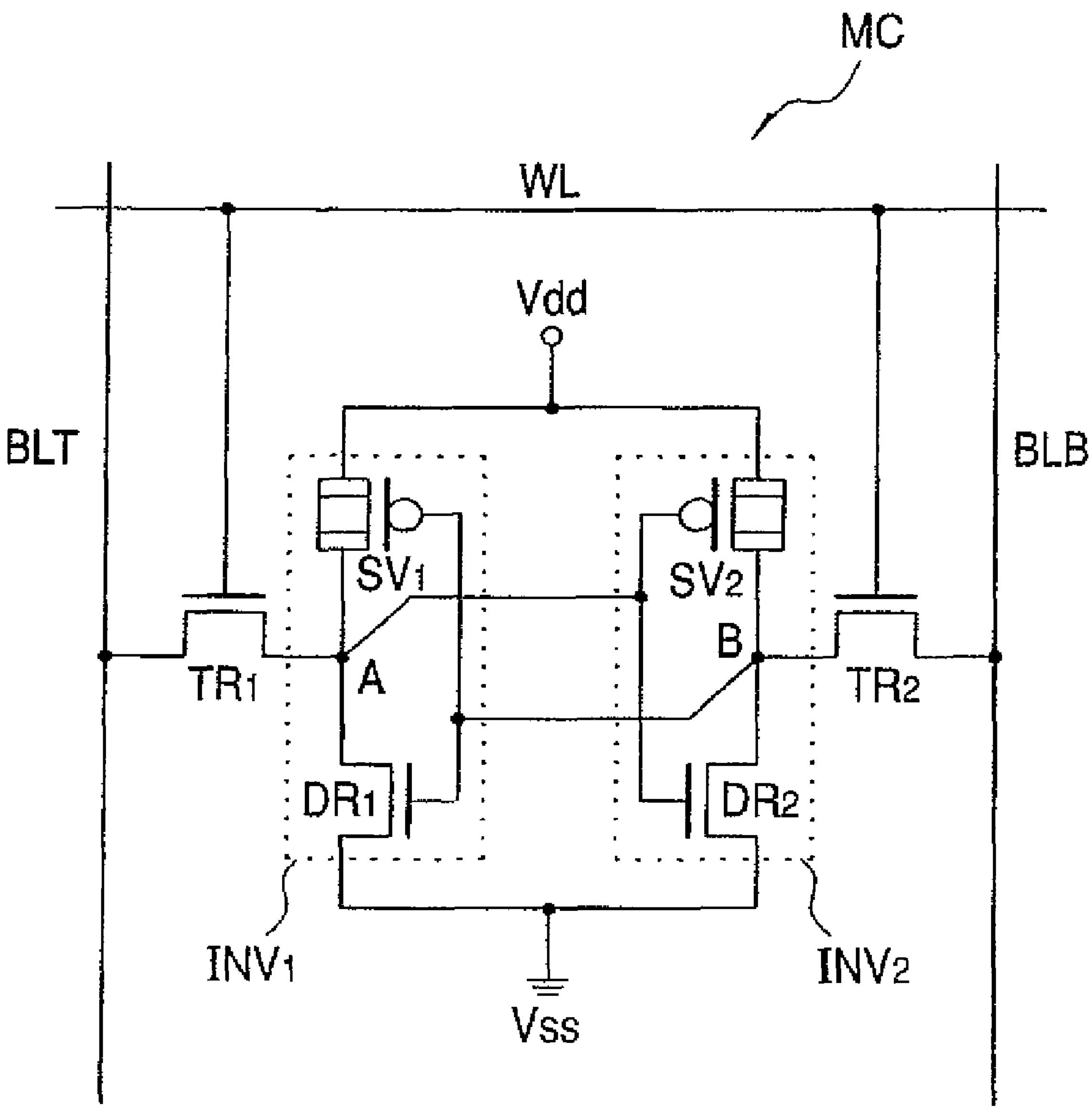
FIG. 1 is an equivalent circuit diagram of a memory cell of an SRAM according to one embodiment of the present invention.

Preferred embodiments of the present invention will be described in detail based on the accompanying drawings. Incidentally, components or members each having the same function, are respectively identified by the same reference numerals, and their repetitive description will be omitted.

First Embodiment

FIG. 1 is an equivalent circuit diagram of a memory cell of an SRAM showing a first embodiment of the present invention. As shown in FIG. 1, the memory cell (MC) of the SRAM comprises two transfer MISFETs ($TR_1$ and $TR_2$) disposed at portions where a pair of complementary data lines (BLT and BLB) and a word line (WL) intersect, two drive MISFETs ($DR_1$ and $DR_2$), and two vertical MISFETs ($SV_1$ and $SV_2$).

Of the six MISFETs constituting the memory cell (MC), the two transfer MISFETs ($TR_1$ and $TR_2$) and two drive MISFETs ($DR_1$ and $DR_2$) are respectively made up of n channel type MISFETs. Further, the two vertical MISFETs ($SV_1$ and $SV_2$) are respectively made up of p channel type MISFETs. While the vertical MISFETs ($SV_1$ and $SV_2$) are equivalent to load MISFETs employed in a known full CMOS type SRAM, they are different from normal load MISFETs. They are constituted of vertical structures, as will be described later, and, they are disposed over areas for forming the drive MISFETs ($DR_1$ and $DR_2$) and transfer MISFETs ($TR_1$ and $TR_2$).

The drive MISFET ($DR_1$) and vertical MISFET ($SV_1$) of the memory cell (MC) constitute a first inverter $INV_1$, whereas the drive MISFET ($DR_2$) and vertical MISFET ($SV_2$) constitute a second inverter $INV_2$. These inverters $INV_1$ and $INV_2$, provided in one pair, are cross-connected to constitute a flip-flop circuit serving as an information storage unit for storing one-bit information therein.

Namely, the drain of the drive MISFET ($DR_1$), the drain of the vertical MISFET ($SV_1$), the gate of the drive MISFET ($DR_2$), and the gate of the vertical MISFET ($SV_2$) are respectively electrically connected to one another and constitute one storage node (A) of the memory cell. The drain of the drive MISFET ($DR_2$), the drain of the vertical MISFET ($SV_2$), the gate of the drive MISFET ($DR_1$), and the gate of the vertical MISFET ($SV_1$) are respectively electrically connected to one another and constitute the other storage node (B) of the memory cell.

One input/output terminal of the flip-flop circuit is electrically connected to one of the source and drain of the transfer MISFET ($TR_1$), and another input/output terminal thereof is electrically connected to one of the source and drain of the transfer MISFET ($TR_2$). The other of the source and drain of the transfer MISFET ($TR_1$) is electrically connected to one data line BLT of the pair of complementary data lines, whereas the other of the source and drain of the transfer MISFET ($TR_2$) is electrically connected to the other data line BLB of the pair of complementary data lines. One end of the flip-flop circuit, i.e., the sources of the two vertical MISFETs ($SV_1$ and $SV_2$) are electrically connected to a power source voltage line (Vdd) for supplying a power supply voltage (Vdd) of, for example, 3V higher in potential than a reference voltage (Vss). The other end thereof, i.e., the sources of the two drive MISFETs ($DR_1$ and $DR_2$) are electrically connected to a reference voltage line (Vss) for supplying a reference voltage (Vss) of, for example, 0V. The gate electrodes of the transfer MISFETs ($TR_1$ and $TR_2$) are respectively electrically connected to the word line (WL). The memory cell (MC) brings one of the pair of storage nodes (A and B) to High and brings the other thereof to Low to thereby store information therein.

Operations for retaining, reading and writing of the information in the memory cell (MC) are basically identical to those of the known full CMOS type SRAM. Namely, upon reading of the information, for example, the power supply voltage (Vdd) is applied to the selected word line (WL) to turn ON the transfer MISFETs ($TR_1$ and $TR_2$), whereby the difference in potential between the pair of storage nodes (A and B) is read by the complementary data lines (BLT and BLB). Upon writing, for example, the power supply voltage (Vdd) is applied to the selected word line (WL) to turn ON the transfer MISFET ($TR_1$ and $TR_2$) and connect one of the complementary data lines (BLT and BLB) to the power supply voltage (Vdd) and connect the other line thereof to the reference voltage (Vss), whereby the turning ON and OFF operations of the drive MISFETs ($DR_1$ and $DR_2$) are inverted.

Figure 2:
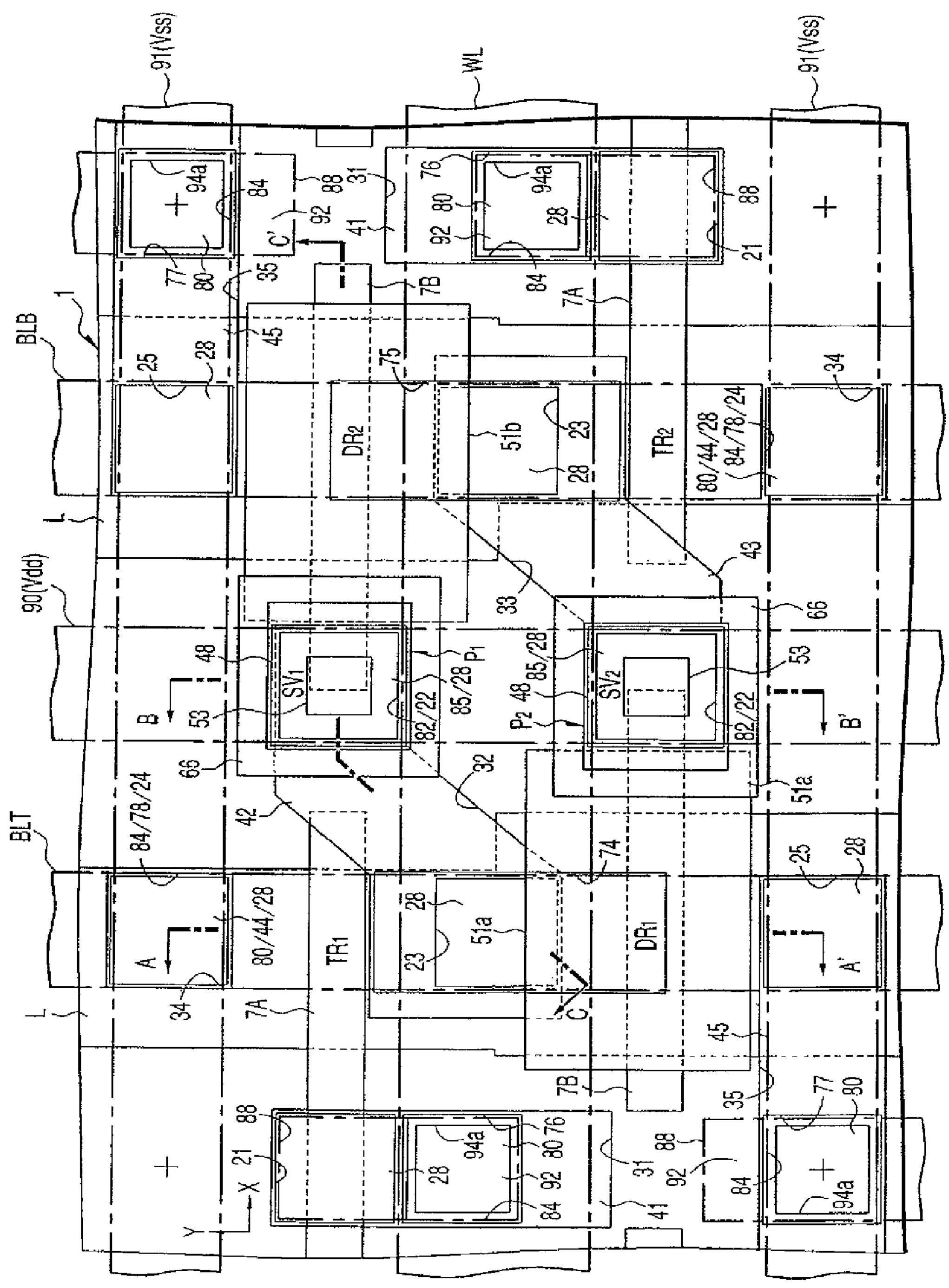
FIG. 2 is a fragmentary plan view of the SRAM showing the one embodiment of the present invention.
Figure 3:
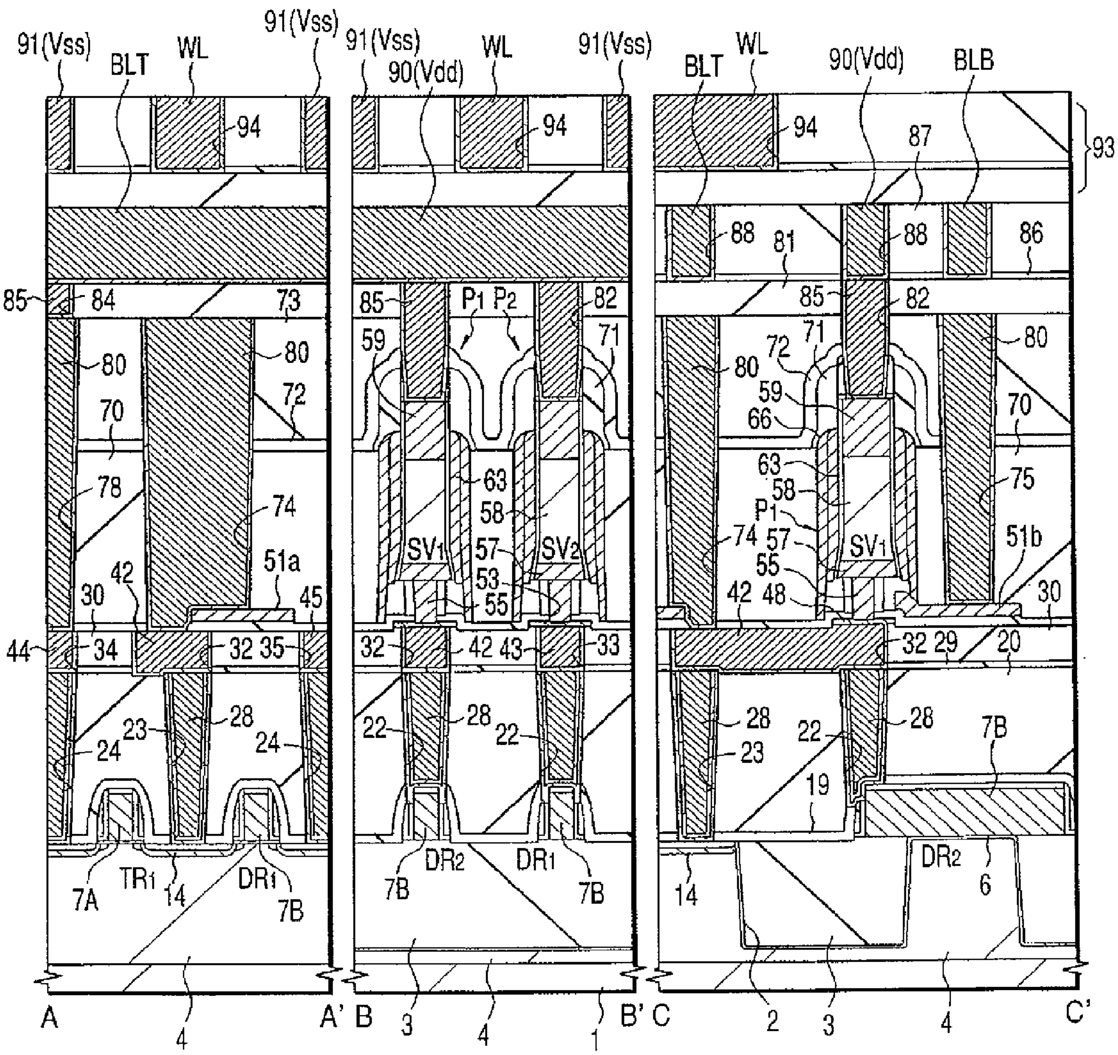
FIG. 3 is a fragmentary cross-sectional view of the SRAM showing the one embodiment of the present invention.

FIG. 2 is a plan view showing a specific structure of the memory cell (MC). A left portion of FIG. 3 is a cross-sectional view taken along line A-A' of FIG. 2, a central portion thereof is a cross-sectional view taken along line B-B' of FIG. 2, and a right portion thereof is a cross-sectional view taken along line C-C' of FIG. 2, respectively. A rectangular area surrounded by four marks (+) in FIG. 2 represents an area (memory cell forming area) occupied by one memory cell. However, such marks (+) are marks provided to make it easy to understand the drawing and are not actually formed on a semiconductor substrate. FIG. 2 also shows only major conductive layers constituting the memory cell and their connecting areas to make it easy to understand the drawing. An illustration of an insulating film, etc. formed between the conductive layers is omitted.

For example, p type wells 4 are formed on a major (main, principal) surface of a semiconductor substrate (hereinafter called "substrate") 1 made up of p type monocrystal silicon. Two transfer MISFETs ($TR_1$ and $TR_2$) and two drive MISFETs ($DR_1$ and $DR_2$) constituting part of a memory cell (MC) are formed in active areas (L) whose peripheries are respectively defined by element (device) isolation trenches 2 formed in the p type wells 4. An insulating film 3 made up of, for example, a silicon oxide film or the like is embedded into the device isolation trenches 2, which constitutes an element (device) isolation portion.

Incidentally, although not shown in the drawings, n channel and p channel MISFETs constituting peripheral circuits are formed in an n type well 5 and a p type well of the substrate 1 in a peripheral circuit area. While an X decoder circuit, a Y decoder circuit, a sense amplifier circuit, an input/output circuit, a logic circuit, etc. are constituted by their corresponding peripheral circuit MISFETs, no limitation is imposed on it. They may constitute logic circuits, such as a microprocessor, a CPU, etc.

As shown in FIG. 2, the active areas (L) have substantially rectangular plane patterns extending in a vertical direction (Y direction) as viewed in the drawing, and the two active regions (L and L) are disposed in parallel to each other in the occupied area of one memory cell. Of the two transfer MISFETs ($TR_1$ and $TR_2$) and two drive MISFETs ($DR_1$ and $DR_2$), one transfer MISFET ($TR_1$) and drive MISFET ($DR_1$) are formed in one active region (L) and respectively share ones of their sources and drains with each other. On the other hand, the other transfer MISFET ($TR_2$) and drive MISFET ($DR_2$) are formed in other active region (L) and respectively share ones of their sources and drains with each other.

One transfer MISFET ($TR_1$) and drive MISFET ($DR_1$), and the other transfer MISFET ($TR_2$) and drive MISFET ($DR_2$) are respectively disposed so as to be spaced in a horizontal direction (X direction), as viewed in the drawing, with device isolation portions interposed therebetween and are respectively disposed point-symmetrically with respect to a central point of a memory cell forming area. Gate electrodes 7B of the drive MISFET ($DR_2$) and drive MISFET ($DR_1$) are respectively disposed so as to extend in the horizontal direction (X direction), as viewed in the drawing. As viewed in the X direction, their one ends are terminated on the device isolation portions between one transfer MISFET ($TR_1$) and drive MISFET ($DR_1$) and the other transfer MISFET ($TR_2$) and drive MISFET ($DR_2$), and vertical MISFETs ($SV_1$ and $SV_2$) to be described later are formed on their one ends. Thus, the size of the memory cell can be scaled down. Further, the vertical MISFETs ($SV_1$ and $SV_2$) are disposed adjacent to each other in the vertical direction (Y direction) as viewed in the drawing. A power source voltage line (Vdd) 90, which is electrically connected to the sources of the vertical MISFETs ($SV_1$ and $SV_2$), is disposed over the vertical MISFETs ($SV_1$ and $SV_2$) so as to extend in the vertical direction (Y direction) as viewed in the drawing. Consequently, the size of the memory cell can be scaled down. The power source voltage line (Vdd) 90 and the complementary data lines BLT and BLB are formed in the same wiring layer, and the power source voltage line (Vdd) 90 is formed between the complementary data lines BLT and BLB extending in the vertical direction (Y direction) as viewed in the drawing, so that the size of the memory cell can be scaled down. Namely, the vertical MISFETs ($SV_1$ and $SV_2$) lying between one transfer MISFET ($TR_1$) and drive MISFET ($DR_1$) and the other transfer MISFET ($TR_2$) and drive MISFET ($DR_2$) are disposed in the horizontal direction (X direction) as viewed in the drawing, and the power source voltage line (Vdd) 90 is disposed between the complementary data lines BLT and BLB as viewed in the horizontal direction (X direction) in the drawing, whereby the size of the memory cell can be scaled down.

Each of the transfer MISFETs ($TR_1$ and $TR_2$) is formed principally of a gate insulating film 6 formed on the surface of the p type well 4, a gate electrode 7A formed over the gate insulating film 6, and $n^+$ type semiconductor regions 14 (source and drain) formed in the p type well 4, which are located on both sides of the gate electrode 7A. On the other hand, each of the drive MISFETs ($DR_1$ and $DR_2$) is formed principally of the gate insulating film 6 formed on the surface of the p type well 4, a gate electrode 7B formed over the gate insulating film 6, and $n^+$ type semiconductor regions 14 (source and drain) formed in the p type well 4, which are located on both sides of the gate electrode 7B.

One of the source and drain of the transfer MISFET ($TR_1$) and the drain of the drive MISFET ($DR_1$) are integrally formed by the corresponding $n^+$ type semiconductor region 14. A contact hole 23 with a plug 28 embedded therein is formed over such an $n^+$ type semiconductor region 14. A contact hole 22 with a plug 28 embedded therein is formed over the corresponding gate electrode 7B of the drive MISFET ($DR_2$). An intermediate conductive layer 42 for connecting the plug 28 lying in the contact hole 22 and the plug 28 lying in the contact hole 23 is formed over the contact holes 22 and 23. One of the source and drain of the transfer MISFET ($TR_1$) and the $n^+$ type semiconductor region 14 corresponding to the drain of the drive MISFET ($DR_1$), and the gate electrode 7B of the drive MISFET ($DR_2$) are electrically connected to one another via these plugs 28 and 28 and the intermediate conductive layer 42.

One of the source and drain of the transfer MISFET ($TR_2$) and the drain of the drive MISFET ($DR_2$) are integrally formed by the corresponding $n^+$ type semiconductor region 14. A contact hole 23 with a plug 28 embedded therein is formed over such an $n^+$ type semiconductor region 14. A contact hole 22 with a plug 28 embedded therein is formed over the corresponding gate electrode 7B of the drive MISFET ($DR_1$). An intermediate conductive layer 43 for connecting the plug 28 lying in the contact hole 22 and the plug 28 lying in the contact hole 23 is formed over the contact holes 22 and 23. One of the source and drain of the transfer MISFET ($TR_2$) and the $n^+$ type semiconductor region 14 corresponding to the drain of the drive MISFET ($DR_2$), and the gate electrode 7B of the drive MISFET ($DR_1$) are electrically connected to one another via these plugs 28 and the intermediate conductive layer 43.

The plugs 28 are respectively made up of, for example, a metal film such as tungsten (W), and the intermediate conductive layers 42 and 43 are respectively made up of a metal film such as tungsten (W). Making up the intermediate conductive layers 42 and 43 of the metal film in this way allows a reduction in resistance and an improvement in the characteristic of the memory cell.

As will be described later, plugs 28 and intermediate conductive layers 46 and 47 of the same layer as the plugs 28 and intermediate conductive layers 42 and 43 carry out electrical connection between sources/drains and gates of n channel and p channel MISFETs constituting peripheral circuits. Thus, the degree of freedom of an electrical connection between the MISFETs constituting each peripheral circuit can be improved and high integration is enabled. The formation of the intermediate conductive layers 46 and 47 by a metal film enables a reduction in the connection resistance between the MISFETs and an improvement in circuit's operating speed. Namely, since a metal wiring layer 89 formed in an upper layer is formed over the vertical MISFETs ($SV_1$ and $SV_2$) as will be described later, the degree of freedom of wiring can be improved and high integration can be achieved only by the upper metal wiring layer 89 as compared with the execution of electrical connections between the MISFETs.

The vertical MISFET ($SV_1$) is formed on one end of the gate electrode 7B of the drive MISFET ($DR_2$), and the vertical MISFET ($SV_2$) is formed on one end of the gate electrode 7B of the drive MISFET ($DR_1$).

The vertical MISFET ($SV_1$) comprises a rectangular pillar laminated body ($P_1$) formed by laminating a lower semiconductor layer (drain) 57, an intermediate semiconductor layer 58, and an upper semiconductor layer (source) 59, and a gate electrode 66 formed on each side wall of the laminated body $P_1$ through a gate insulting film 63. The lower semiconductor layer (drain) 57 of the vertical MISFET ($SV_1$) is connected to its corresponding intermediate conductive layer 42 through a plug 55 and a barrier layer 48 formed therebelow. Further, the lower semiconductor layer 57 is electrically connected to one of the source and drain of the transfer MISFET ($TR_1$), the $n^+$ type semiconductor region 14 corresponding to the drain of the drive MISFET ($DR_1$), and the gate electrode 7B of the drive MISFET ($DR_2$) through the intermediate conductive layer 42 and the plugs 28 and 28 lying therebelow.

The vertical MISFET ($SV_2$) comprises a rectangular pillar laminated body ($P_2$) formed by laminating a lower semiconductor layer (drain) 57, an intermediate semiconductor layer 58, and an upper semiconductor layer (source) 59, and a gate electrode 66 formed on each side wall of the laminated body ($P_2$) via a gate insulating film 63. The lower semiconductor layer (drain) 57 of the vertical MISFET ($SV_2$) is connected to its corresponding intermediate conductive layer 43 through a plug 55 and a barrier layer 48 formed therebelow. Further, the lower semiconductor layer 57 is electrically connected to one of the source and drain of the transfer MISFET ($TR_2$), the $n^+$ type semiconductor region 14 corresponding to the source of the drive MISFET ($DR_2$), and the gate electrode 7B of the drive MISFET ($DR_1$) through the intermediate conductive layer 43 and the plugs 28 and 28 lying therebelow.

In each of the vertical MISFETs ($SV_1$ and $SV_2$), the lower semiconductor layer 57 constitutes the drain, the intermediate semiconductor layer 58 constitutes the substrate (channel region), and the upper semiconductor layer 59 constitutes the source. The lower semiconductor layer 57, the intermediate semiconductor layer 58 and the upper semiconductor layer 59 are respectively formed of a silicon film, and the lower semiconductor layer 57 and the upper semiconductor layer 59 are respectively doped with a p type and made up of a p type silicon film. Namely, the vertical MISFETs ($SV_1$ and $SV_2$) are made up of p channel type MISFETs formed of the silicon film.

In order to set the silicon film constituting each plug 55 to the same conductivity type (p type) as a polycrystal silicon film constituting the lower semiconductor layers 57 of the vertical MISFETs ($SV_1$ and $SV_2$), it is doped with boron upon film growth or after the growth and thereby made up of a p type silicon film.

Since the lower semiconductor layer 57 corresponding to the source is formed of the silicon film, the barrier layer 48 is provided between the silicon film (plug 55) and each of the intermediate conductive layers 42 and 43 formed of tungsten in order to prevent the occurrence of an undesired silicide reaction at an interface between the silicon film (plug 55) and each of the intermediate conductive layers 42 and 43. Thus, the lower semiconductor layers 57, intermediate semiconductor layers 58, and upper semiconductor layers 59 each formed of the silicon film can be respectively formed over the intermediate conductive layers 42 and 43, each formed of tungsten, and the vertical MISFETs ($SV_1$ and $SV_2$) can be formed over the intermediate conductive layers 42 and 43, respectively. Namely, the intermediate conductive layers 42 and 43 are made up of the metal film such as tungsten (W), and the vertical MISFETs each formed of the silicon film are formed over the intermediate conductive layers 42 and 43 with the barrier layers 48 interposed therebetween. Thus, it is possible to reduce the resistance for connection between the MISFETs, improve the characteristic of the memory cell, and scale down the size of the memory cell.

Incidentally, the barrier layer 48 is made up of, for example, a single-layered film such as a WN film, a Ti film or a TiN film, or a laminated film obtained by laminating two or more types of films such as a laminated film of the WN film and a W film, a laminated film of the TiN film and W film.

The respective gate electrodes 66 of the vertical MISFETs ($SV_1$ and $SV_2$) are formed so as to surround the side walls of the rectangular pillar laminated bodies ($P_1$ and $P_2$). Incidentally, the gate electrodes 66 are formed in sidewall form on a self-alignment basis with respect to the rectangular pillar laminated bodies ($P_1$ and $P_2$) as will be described later.

Thus, the vertical MISFETs ($SV_1$ and $SV_2$) constitute so-called vertical channel MISFETs wherein the sources, substrate (channel region) and drains are laminated in the direction perpendicular to the major surface of the substrate, and channel currents flow in the direction perpendicular to the major surface of the substrate. Namely, the direction of a channel length of each of the vertical MISFETs ($SV_1$ and $SV_2$) corresponds to the direction perpendicular to the major surface of the substrate, and the channel length is defined by the length between the lower semiconductor layer 57 and the upper semiconductor layer 59 as viewed in the direction perpendicular to the major surface of the substrate. The channel width of each of the vertical MISFETs ($SV_1$ and $SV_2$) is defined by the round length of the side walls of each rectangular pillar laminated body. Thus, the channel widths of the vertical MISFETs ($SV_1$ and $SV_2$) can be increased.

The gate electrode 66 of the vertical MISFET ($SV_1$) is electrically connected to a gate drawing electrode 51 (51*b*) formed at its lower end. Using the process of forming the gate electrode 66 of the vertical MISFET ($SV_1$) in sidewall form on a self-alignment basis with respect to the rectangular pillar laminated body ($P_1$), as will be described later, the gate electrode 66 of the vertical MISFET ($SV_1$), e.g., the bottom face of the gate electrode 66, is connected to the gate drawing electrode 51 (51*b*) on a self-alignment basis at the lower portion of the gate electrode 66. Consequently, the size of the memory cell can be scaled down.

A through hole 75 having a plug 80 embedded therein is formed over the gate drawing electrode 51 (51*b*). The plug 80 has part connected to the intermediate conductive layer 43, and the gate electrode 66 of the vertical MISFET ($SV_1$) is electrically connected to one of the source and drain of the transfer MISFET ($TR_2$), the $n^+$ type semiconductor region 14 corresponding to the drain of the drive MISFET ($DR_2$), and the gate electrode 7B of the drive MISFET ($DR_1$) through the gate drawing electrode 51 (51*b*), plug 80, intermediate conductive layer 43 and plugs 28 placed therebelow. As will be described later, the plug 80 is not electrically connected to a wiring lying in a layer above the plug 80, and the complementary data line BLT is disposed so as to overlap with the plug 80 as viewed on a plane basis with the upper portion of the plug 80 being extended in the vertical direction (Y direction) as viewed in the drawing. Electrically connecting the gate drawing electrode 51 (51*b*) and the intermediate conductive layer 43 using the bottom of the plug 80 in this way enables a reduction in memory cell size. Further, the complementary data line BLT can be disposed over the plug 80 and the size of the memory cell can be scaled down.

The gate electrode 66 of the vertical MISFET ($SV_2$) is electrically connected to its corresponding gate drawing electrode 51 (51*a*) formed at its lower end. Using the process of forming the gate electrode 66 of the vertical MISFET ($SV_2$) in sidewall form on a self-alignment basis with respect to the rectangular pillar laminated body ($P_2$), as will be described later, the gate electrode 66 of the vertical MISFET ($SV_2$), e.g., the bottom face of the gate electrode 66, is connected to the gate drawing electrode 51 (51*a*) on a self-alignment basis at the lower portion of the gate electrode 66. Thus, the size of the memory cell can be scaled down.

A through hole 74 having a plug 80 embedded therein is farmed over the gate drawing electrode 51 (51*a*). The plug 80 has part connected to the intermediate conductive layer 42, and the gate electrode 66 of the vertical MISFET ($SV_2$) is electrically connected to one of the source and drain of the transfer MISFET ($TR_1$), the $n^+$ type semiconductor region 14 corresponding to the drain of the drive MISFET ($DR_2$), and the gate electrode 7B of the drive MISFET ($DR_2$) through the gate drawing electrode 51 (51*a*), plug 80, intermediate conductive layer 42 and plugs 28 placed therebelow.

As will be described later, the plug 80 is not electrically connected to a wiring (metal wiring layer) lying in a layer above the plug 80, and the complementary data line BLB is disposed so as to overlap with the plug 80 as viewed on a plane basis with the upper portion of the plug 80 being extended. Electrically connecting the gate drawing electrode 51 (51*a*) and the intermediate conductive layer 42 using the bottom of the plug 80 in this way enables a reduction in memory cell size. Further, the complementary data line BLB can be disposed over the plug 80 and the size of the memory cell can be scaled down. The plug 80 is made up of a metal film such as tungsten (W) or the like.

Thus, the gate electrodes 66 of the vertical MISFETs ($SV_1$ and $SV_2$) are respectively connected to the gate drawing electrodes 51 (51*a* and 51*b*) in sidewall form on a self-alignment basis with respect thereto in such a manner that, for example, the bottom faces of the gate electrodes 66 contact the gate drawing electrodes 51 (51*a* and 51*b*), each corresponding to the conductive film. Consequently, the size of the memory cell can be scaled down.

The gates (66) of the vertical MISFETs ($SV_1$ and $SV_2$) formed over the drive MISFETs with the insulating film interposed therebetween are electrically connected to their corresponding gate drawing electrodes 51 (51*a* and 51*b*), each corresponding to the lower conductive film at the lower portions of the gates (66). Current paths between the gates (66) of the vertical MISFETs ($SV_1$ and $SV_2$) and the gates (7B) or drains (14) of the drive MISFETs ($SV_1$ and $SV_2$) are respectively formed via the lower portions of the gates (66) of the vertical MISFETs ($SV_1$ and $SV_2$) through the gate drawing electrodes 51 (51*a* and 51*b*), each corresponding to the conductive film. Namely, the gates (66) of the vertical MISFETs ($SV_1$ and $SV_2$) are connected to the gate drawing electrodes 51 (51*a* and 51*b*) on a self-alignment basis with respect thereto, and they are electrically connected to the gates (7B) or drains (14) of The drive MISFETs ($SV_1$ and $SV_2$) formed therebelow via the gate drawing electrodes 51 (51*a* and 51*b*), the intermediate conductive layers 42 and 43, each corresponding to the conductive film, and the plugs 28 such that the current paths extend or flow in the direction perpendicular to the major surface of the substrate. Namely, the gates (66) of the vertical MISFETs ($SV_1$ and $SV_2$) are disposed over the plugs 28, and the plugs 28 and the gates (66) of the vertical MISFETs ($SV_1$ and $SV_2$) are disposed so as to overlap on a plane basis. It is thus possible to improve the characteristic of the memory cell and scale down the size of the memory cell.

Further, the plugs 80 are respectively disposed over the plugs 28, and the plugs 28 and plugs 80 are disposed so as to overlap on a plane basis. It is thus possible to improve the characteristic of the memory cell and scale down the size of the memory cell.

A power source voltage line (Vdd) 90 is formed over the laminated body ($P_1$) constituting part of the vertical MISFET ($SV_1$) and the laminated body ($P_2$) constituting part of the vertical MISFET ($SV_2$) with an interlayer insulating film interposed therebetween. The power source voltage line (Vdd) 90 is electrically connected to its corresponding upper semiconductor layer (source) 59 of the vertical MISFET ($SV_1$) through a plug 85 embedded in a through hole 82 formed over the laminated body ($P_1$) and it is electrically connected to its corresponding upper semiconductor layer (source) 59 of the vertical MISFET ($SV_2$) through a plug 85 embedded in a through hole 82 formed over the laminated body ($P_2$).

Complementary data lines BLT and BLB are formed in the same wiring layer as the power source voltage line (Vdd) 90. The power source voltage line (Vdd) 90 and the complementary data lines BLT and BLB extend in parallel along the Y direction of FIG. 2. Namely, the complementary data line BLT is disposed so as to overlap with one transfer MISFET ($TR_1$) and drive MISFET ($DR_1$) as viewed on a plane basis and in such a manner that the upper portions of the transfer MISFET ($TR_1$) and drive MISFET ($DR_1$) extend along the Y direction in FIG. 2. The complementary data line BLB is disposed so as to overlap with the other transfer MISFET ($TR_2$) and drive MISFET ($DR_2$) as viewed on a plane basis and in such a manner that the upper portions of the transfer MISFET ($TR_2$) and drive MISFET ($DR_2$) extend along the Y direction in FIG. 2. It is thus possible to scale down the size of the memory cell.

The complementary data line BLT is electrically connected to the other of the source and drain ($n^+$ type semiconductor region 14) of the transfer MISFET ($TR_1$) through a plug 85 lying in the same layer as the plug 85, a plug 80 lying in the same layer as the plug 80, an intermediate conductive layer 44 lying in the same layer as the intermediate conductive layers 42 and 43, and a plug 28 lying in the same layer as the plug 28. Further, the complementary data line BLB is electrically connected to the other of the source and drain ($n^+$ type semiconductor region 14) of the transfer MISFET ($TR_2$) through a plug 85 lying in the same layer as the plug 85, a plug 80 lying in the same layer as the plug 80, an intermediate conductive layer 44 lying in the same layer as the intermediate conductive layers 42 and 43, and a plug 28 lying in the same layer as the plug 28. The power source voltage line (Vdd) 90 and the complementary data lines BLT and BLB are formed of a metal film composed principally of copper (Cu), for example.

Thus, the vertical MISFETs ($SV_1$ and $SV_2$) are disposed adjacent to each other in the vertical direction (Y direction) as viewed in the drawing, and the power source voltage line (Vdd) 90 electrically connected to the sources of the vertical MISFETs ($SV_1$ and $SV_2$) is disposed over the vertical MISFET ($SV_1$ and $SV_2$) so as to extend in the vertical direction (Y direction) as viewed in the drawing. Consequently, the size of the memory cell can be scaled down. The power source voltage line (Vdd) 90 and complementary data lines BLT and BLB are formed in the same wiring layer, and the power source voltage line (Vdd) 90 is formed between the complementary data lines BLT and BLB extending in the vertical direction (Y direction) as viewed in the drawing, so that the size of the memory cell can be scaled down. Namely, the vertical MISFETs ($SV_1$ and $SV_2$) between one transfer MISFET ($TR_1$) and drive MISFET ($DR_1$) and the other transfer MISFET ($TR_2$) and drive MISFET ($DR_2$) are disposed in the horizontal direction (X direction) as viewed in the drawing. The power source voltage line (Vdd) 90 extending in the vertical direction (Y direction) as viewed in the drawing is disposed over the vertical MISFETs ($SV_1$ and $SV_2$). Further, the complementary data lines BLT and BLB extending in the vertical direction (Y direction) as viewed in the drawing are disposed over the transfer MISFETs ($TR_1$ and $TR_2$) and drive MISFETs ($DR_1$ and $DR_2$). Consequently, the size of the memory cell can be scaled down.

A word line (WL) and reference voltage lines (Vss) 91 extending in parallel along the X direction of FIG. 2 are formed over the power source voltage line (Vdd) 90 and the complementary data lines BLT and BLB with an insulating film 93 interposed therebetween. The word line (WL) is disposed between the reference voltage lines (Vss) 91 in the Y direction of FIG. 2. The word line (WL) is electrically connected to the gate electrodes 7A of the transfer MISFETs ($TR_1$ and $TR_2$) through plugs and intermediate conductive layers lying in the same layer as the plugs and intermediate conductive layers. Similarly, the reference voltage lines (Vss) 91 are electrically connected to their corresponding $n^+$ type semiconductor regions (sources) 14 of the drive MISFETs ($DR_1$ and $DR_2$) through plugs and intermediate conductive layers lying in the same layer as the plugs and intermediate conductive layers. The word line (WL) and reference voltage lines (Vss) 91 are respectively formed of a metal film composed principally of copper (Cu), for example.

The plugs 80, 83 and 85 and first metal wiring layer 89 lying in the same layer as the plugs 80 and 85, power source voltage line (Vdd) 90 and complementary data lines ALT and BLB form an electrical connection between the sources/drains and gates of the n channel and p channel MISFETs constituting the peripheral circuits. Plugs and second metal wiring layer lying in the same layer as unillustrated plugs, the reference voltage lines (Vss) 91 and the word line (WL) form an electrical connection between the sources/drains and gates of the n channel and p channel MISFETs constituting the peripheral circuits. The first metal wiring layer 89 and the second metal wiring layer are electrically connected by the unillustrated plugs.

Thus, the electrical connections between the MISFETs constituting each peripheral circuit are made by the plugs 28 and intermediate conductive layers 46 and 47 formed below the vertical MISFETs ($SV_1$ and $SV_2$) and are formed using the plugs and first and second metal wiring layers formed above the vertical MISFETs ($SV_1$ and $SV_2$), whereby the degree of freedom of wiring can be enhanced, and, hence, a high integration can be achieved. It is also possible to reduce the connection resistance between the adjacent MISFETs, and enhance a circuit's operating speed.

In the SRAM according to the present embodiment, as described above, the two transfer MISFETs ($TR_1$ and $TR_2$) and the two drive MISFETs ($DR_1$ and $DR_2$) are formed on the p-type well 4 of the substrate 1, and the two vertical MISFETs ($SV_1$ and $SV_2$) are formed over these four MISFETs ($TR_1$, $TR_2$, $DR_1$ and $DR_2$).

Since the area occupied by each memory cell is substantially equivalent to the area occupied by the four MISFETs ($TR_1$, $TR_2$, $DR_1$ and $DR_2$) owing to this configuration, the occupied area of one memory cell can be scaled down or reduced as compared with a full CMOS memory cell of the same design rule, which is formed of six MISFETs. Since the p channel type vertical MISFETs ($SV_1$ and $SV_2$) are formed above the four MISFETs ($TR_1$, $TR_2$, $DR_1$ and $DR_2$), in the SRAM according to the present embodiment, it is not necessary to provide areas for separating the p type and n type wells within the occupied area of one memory cell as distinct from the full CMOS type memory cell wherein the p channel type vertical MISFETs are formed in the n type well of the substrate. Thus, since the occupied area of each memory cell can be further reduced, a high-speed and large-capacity SRAM can be realized.

A more detailed structure of the SRAM according to the present embodiment will be described together on the basis of its manufacturing method with reference to FIGS. 4 through 61. In respective cross-sectional views for describing the method of manufacturing the SRAM, a portion designated at A and A' shows a cross section of a memory cell, which is taken along line A-A' of FIG. 2, a portion designated at B and B' shows a cross section of the memory cell, which is taken along line B-B' of FIG. 2, a portion designated at C and C' shows a cross section of the memory cell, which is taken along line C-C' of FIG. 2, and other portion shows a cross section of some of each peripheral circuit area, respectively. Each peripheral circuit of the SRAM is formed of n channel and p channel type MISFETs. However, since these two types of MISFETs have structures approximately identical to each other, except that they are opposite in conductivity type to each other, only one (the p channel type MISFET) is shown in the drawing. Respective plan views (plan views of memory array) illustrating steps of the method of manufacturing the SRAM show major conductive layers constituting each memory cell and their connecting areas alone, and an illustration of an insulating film and the like formed between the adjacent conductive layers is omitted in principle. Further, rectangular areas surrounded by four marks (+) in the respective plan views respectively represent an area occupied by one memory cell. Incidentally, while an X decoder circuit, a Y decoder circuit, a sense amplifier circuit, an input/output circuit, a logic circuit, etc. are constituted by the n channel and p channel MISFETs constituting the peripheral circuits, the present invention is not limited to those. They may constitute logic circuits, such as a microprocessor, a CPU, etc.

Figure 4:
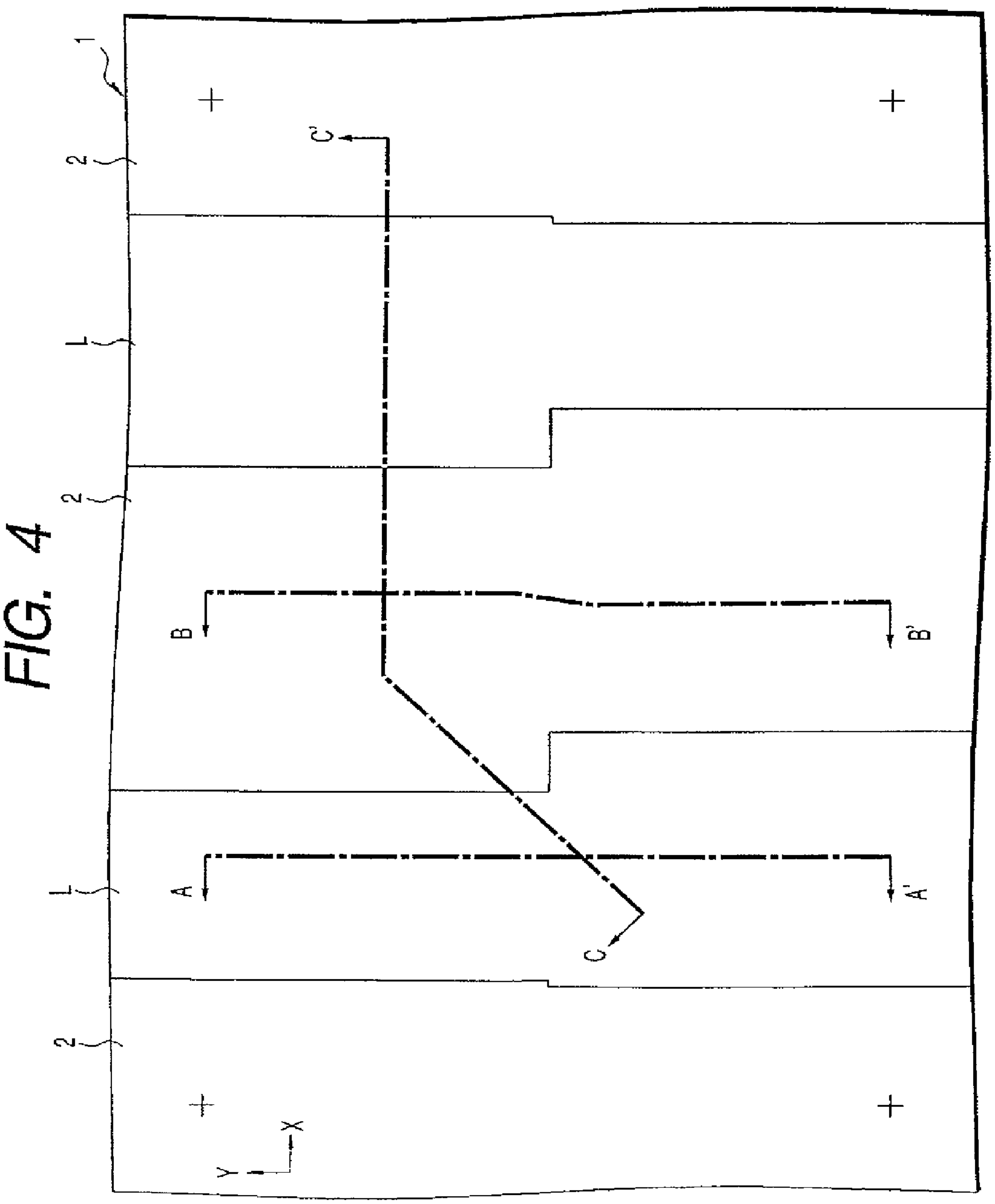
FIG. 4 is a fragmentary plan view illustrating a method of manufacturing the SRAM according to the one embodiment of the present invention.
Figure 5:
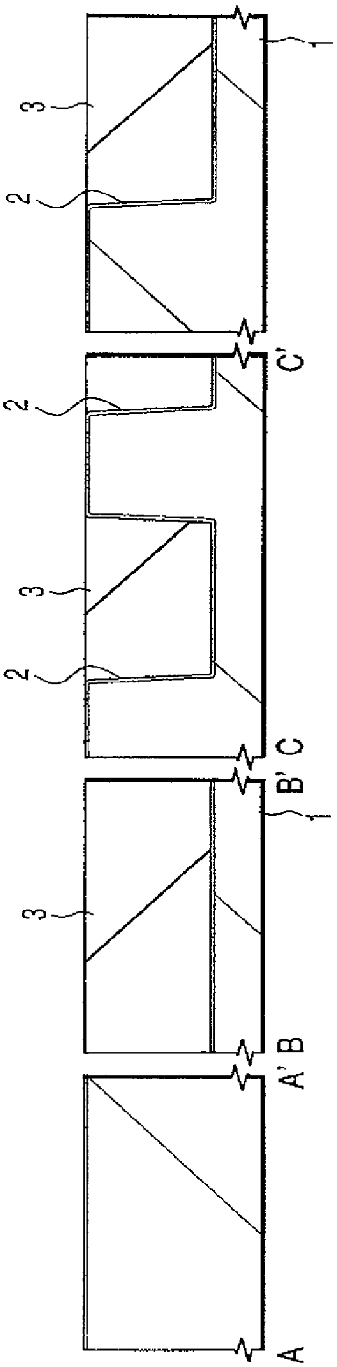
FIG. 5 is a fragmentary cross-sectional view depicting a step in the method of manufacturing the SRAM showing the one embodiment of the present invention.

As shown in FIGS. 4 and 5, device isolation trenches 2 are first defined in a device isolation area of a major surface of a substrate 1 formed of p-type monocrystal silicon, for example. In order to define the device isolation trenches 2, for example, the major surface of the substrate 1 is dry-etched to form trenches, followed by deposition of an insulating film, such as a silicon oxide film 3 or the like, on the substrate 1 including the interiors of the trenches by a CVD method, Thereafter, the unnecessary silicon oxide film 3 outside the trenches is polished and removed by a CMP (Chemical Mechanical Polishing) method, thereby leaving the silicon oxide film 3 inside the trenches. Owing to the formation of the device isolation trenches 2, island-shaped active regions (L) whose peripheries are defined by the device isolation trenches 2, are formed on the major surface of the substrate 1 of the memory array.

Figure 6:
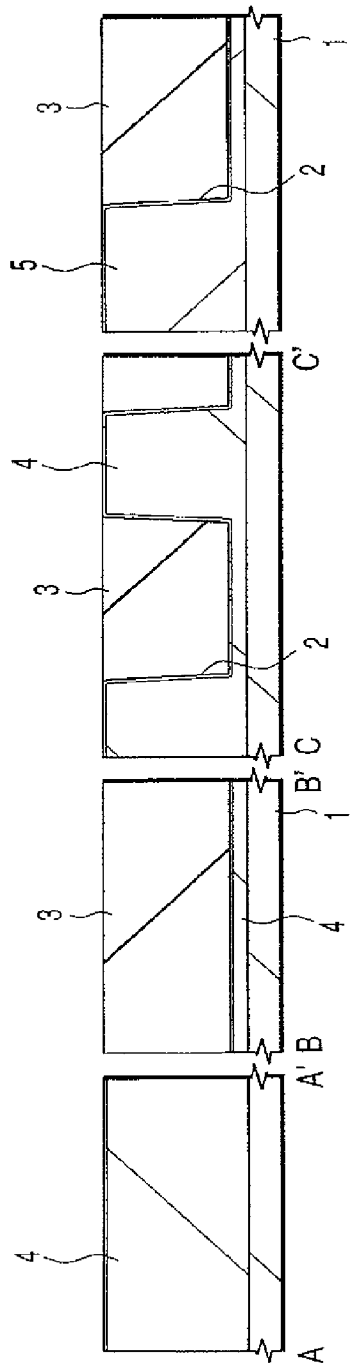
FIG. 6 is a fragmentary cross-sectional view illustrating a step in the method of manufacturing the SRAM of the present invention.

Next, as shown in FIG. 6, for example, part of the substrate 1 is ion-implanted with phosphor (P), and another part is ion-implanted with boron (B). Thereafter, the substrate 1 is heat-treated or annealed to diffuse these impurities into the substrate 1, thereby forming p type and n type wells 4 and 5 on the major surface of the substrate 1. As shown in the drawing, only the p type well 4 is formed on the substrate 1 of the memory array, and no n type well 5 is formed. On the other hand, the n type well 5 and an unillustrated p type well are formed in the substrate 1 for the peripheral circuit area.

Figure 7:
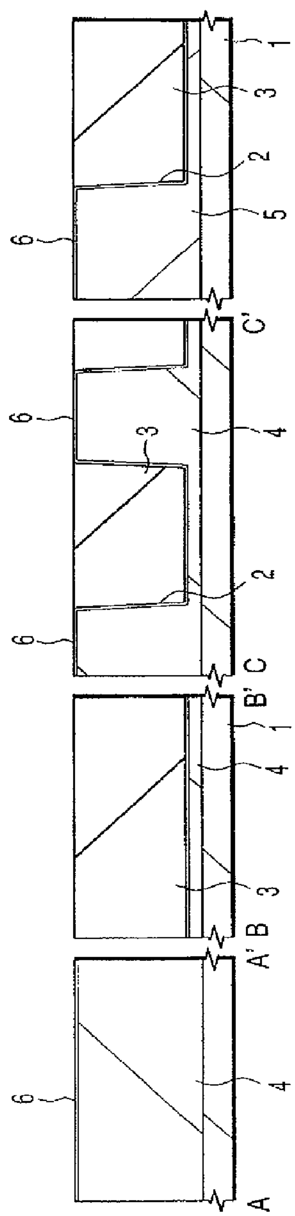
FIG. 7 is a fragmentary cross-sectional view depicting a step in the method of manufacturing the SRAM of the present invention.
Figure 8:
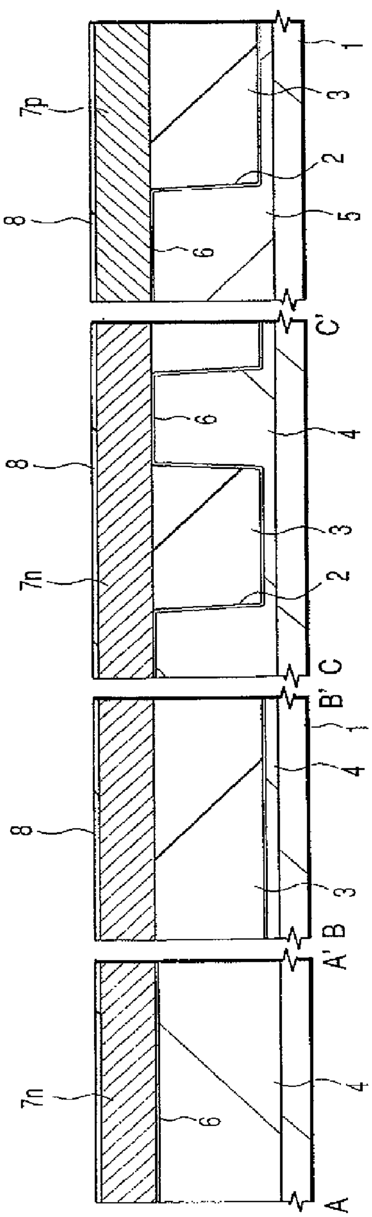
FIG. 8 is a fragmentary cross-sectional view illustrating a step in the method of manufacturing the SRAM of the present invention.

Next, as shown in FIG. 7, the substrate 1 is thermally-oxidized to form a gate insulating film 6 made up of, for example, silicon oxide and having a thickness ranging from about 3 nm to about 4 nm on the surfaces of the p type well 4 and the n type well 5. Subsequently, as shown in FIG. 8, for example, an n type polycrystal silicon film **7*n* is formed on the gate insulating film 6 of the p type well 4 as a conductive film. A p type polycrystal silicon film 7*p* is formed on the gate insulating film 6 of the n type well 5 as a conductive film. Thereafter, a silicon oxide film 8 is deposited over the n type polycrystal silicon film 7*n* and the p type polycrystal silicon film 7*p*** as a cap insulating film by the CVD method, for example.

In order to form each of the n type polycrystal silicon film **7*n* and the p type polycrystal silicon film 7*p*, for example, a non-doped polycrystal silicon film (or amorphous silicon film) is deposited on the gate insulating film 6 by the CVD method. Afterwards, the non-doped polycrystal silicon film (or amorphous silicon film) on the p type well 4 is ion-implanted with phosphor (or arsenic), and the non-doped polycrystal silicon film (or amorphous silicon film) on the n type well 5** is ion-implanted with boron.

Figure 9:
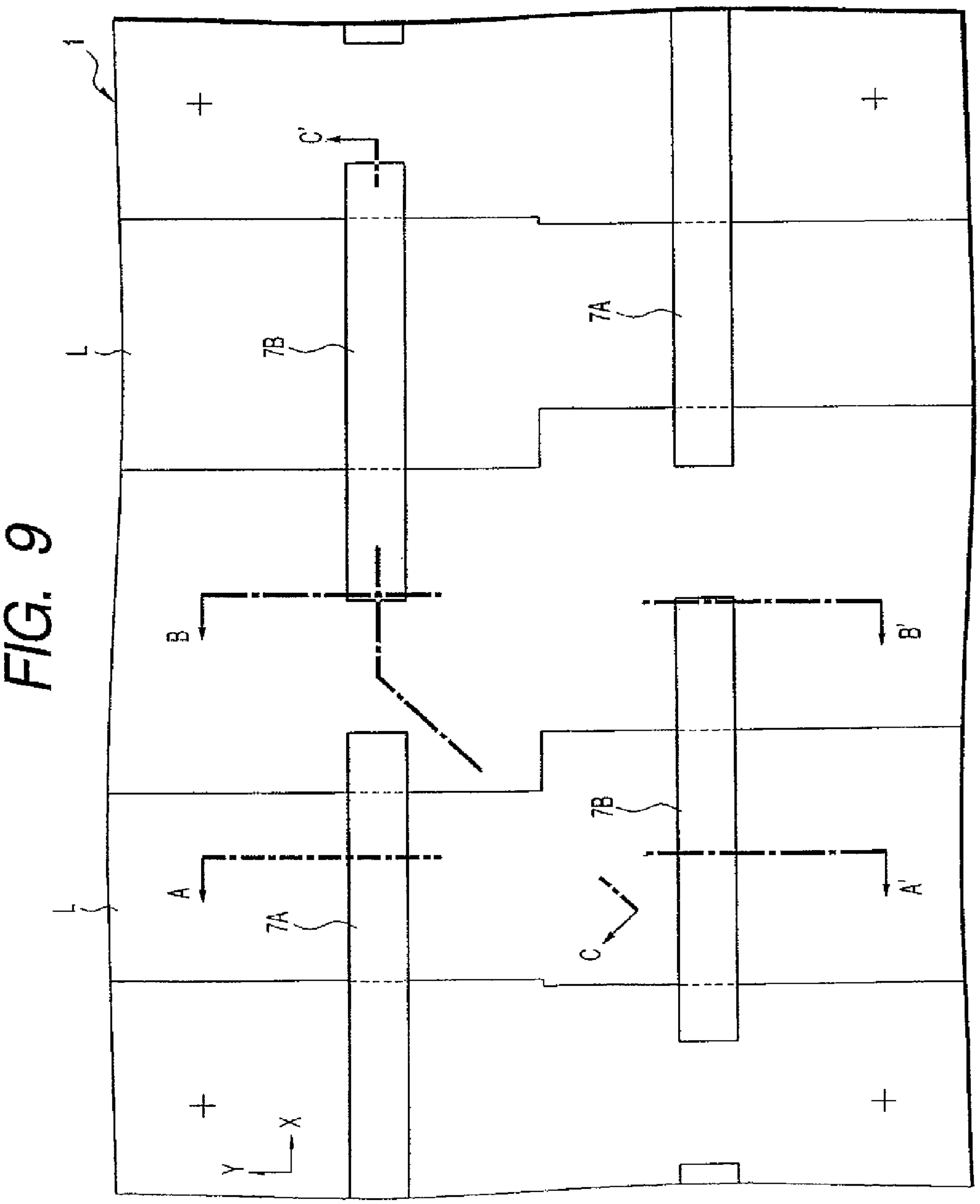
FIG. 9 is a fragmentary plan view depicting a step in the method of manufacturing the SRAM of the present invention.
Figure 10:
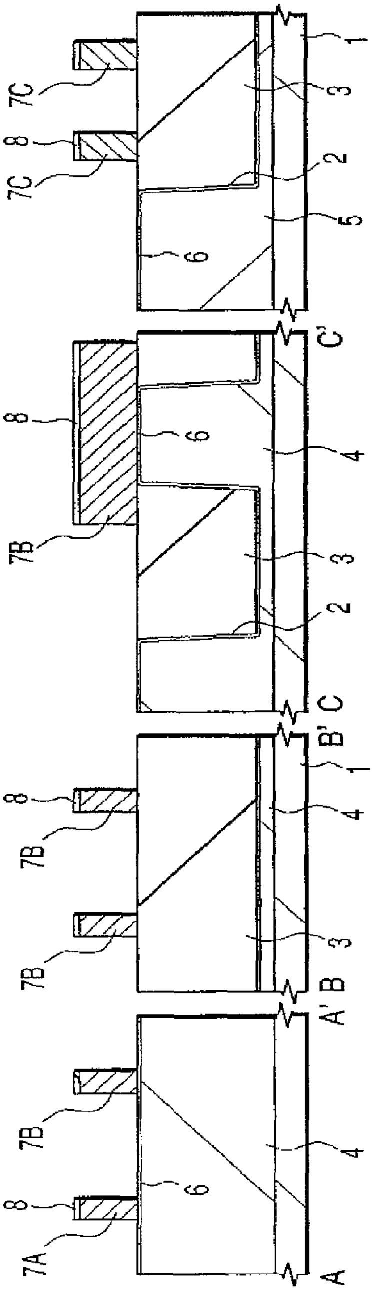
FIG. 10 is a fragmentary cross-sectional view illustrating a step in the method of manufacturing the SRAM of the present invention.

Next, as shown in FIGS. 9 and 10, the n type polycrystal silicon film **7*n*** and *p* type polycrystal silicon film **7*p* are dry-etched, for example, to thereby form gate electrodes 7A and 7B each made up of the n type polycrystal silicon film 7*n* on the p type wells 4 of the memory array and form gate electrodes 7C each made up of the p type polycrystal silicon film 7*p* on the n type well 5 in the peripheral circuit area. Although not shown in the drawings, gate electrodes each made up of the n type polycrystal silicon film 7*n* are formed on the p type well 4** in the peripheral circuit area.

The gate electrodes 7A constitute gate electrodes of transfer MISFETs ($TR_1$ and $TR_2$), whereas the gate electrodes 7B constitute gate electrodes of drive MISFETs ($DR_1$ and $DR_2$), respectively. Further, the gate electrode 7C constitutes a gate electrode of each p channel type MISSFET in the peripheral circuit. As shown in FIG. 9, the gate electrodes 7A and 7B formed in the memory array have rectangular plane patterns extending in an X direction shown in the same drawing, and their widths in a Y direction, i.e., their gate lengths range from 0.13 μm to 0.14 μm, for example.

In order to form the gate electrodes 7A, 7B and 7C, a silicon oxide film 8 is patterned so as to assume or take the same plane forms as the gate electrodes 7A, 7B and 7C by dry etching using a photoresist as a mask, for example. Subsequently, the n type polycrystal silicon film **7*n*** and *p* type polycrystal silicon film **7*p* are dry-etched using each patterned silicon oxide film 8 as a mask. Since silicon oxide is large in etching selection ratio to polycrystal silicon as compared with a photoresist, the gate electrodes 7A, 7B and 7C each having a micro-fabricated gate length can be patterned with satisfactory accuracy as compared with the case in which the silicon oxide film 8 and the polycrystal silicon films (7***n* and 7*p*) are continuously etched using the photoresist film as the mask.

Figure 11:
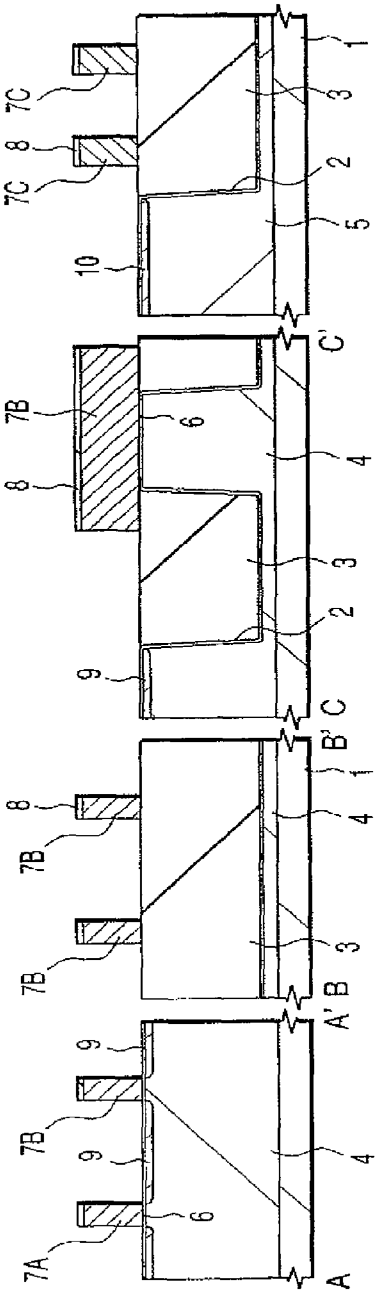
FIG. 11 is a fragmentary cross-sectional view depicting a step in the method of manufacturing the SRAM of the present invention.

Next, as shown in FIG. 11, for example, each p type well 4 is ion-implanted with phosphor or arsenic as an n type impurity to thereby form $n^-$ type semiconductor regions 9 relatively low in concentration. The n type well 5 is ion-implanted with boron as a p type impurity to thereby form a $p^-$ type semiconductor region 10 relatively low in concentration. The $n^-$ type semiconductor regions 9 are formed to bring each of the sources and drains of the transfer MISFETs ($TR_1$ and $TR_2$), drive MISFETs ($DR_1$ and $DR_2$), and n channel type MISFETs of each peripheral circuit to an LCD (lightly doped drain) structure. The $p^-$ type semiconductor region 10 is formed to bring each of the source and drain of each p channel type MISFET of the peripheral circuit to the LDD structure.

Figure 12:
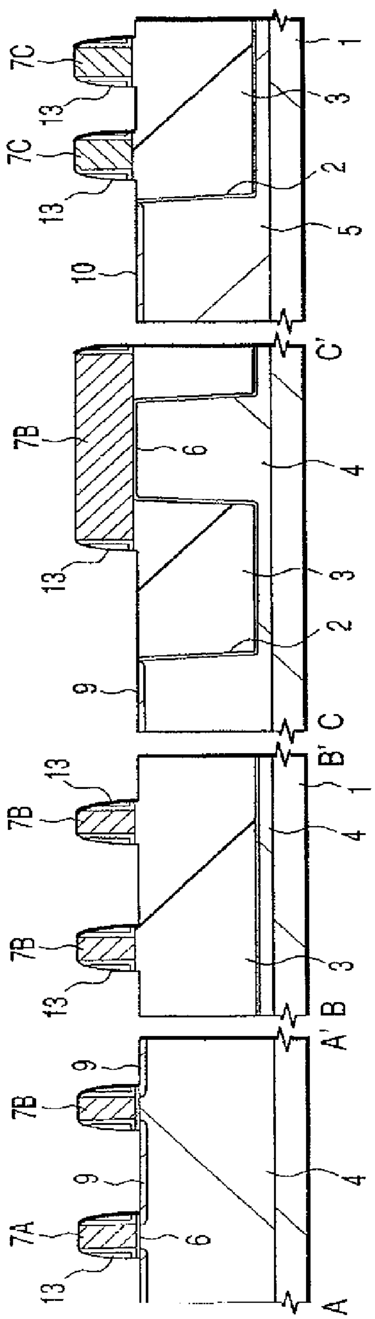
FIG. 12 is a fragmentary cross-sectional view illustrating a step in the method of manufacturing the SRAM of the present invention.

Next, as shown in FIG. 12, sidewall spacers 13 each formed of an insulating film are formed on their corresponding side walls of the gate electrodes 7A, 7B and 7C. In order to form the sidewall spacers 13, for example, a silicon oxide film and a silicon nitride film are deposited on the substrate 1 by the CVD method. Thereafter, the silicon nitride film and silicon oxide film are anisotropically etched. At this time, the silicon oxide film 8, which covers the respective upper surfaces of the gate electrodes 7A, 7B and 7C, and the silicon oxide film (gate insulating film 6) on the surface of the substrate 1 are etched to expose the respective surfaces of the gate electrodes 7A, 7B and 7C, and the respective surfaces of the $n^-$ type semiconductor regions 9 and $p^-$ type semiconductor region 10.

Figure 13:
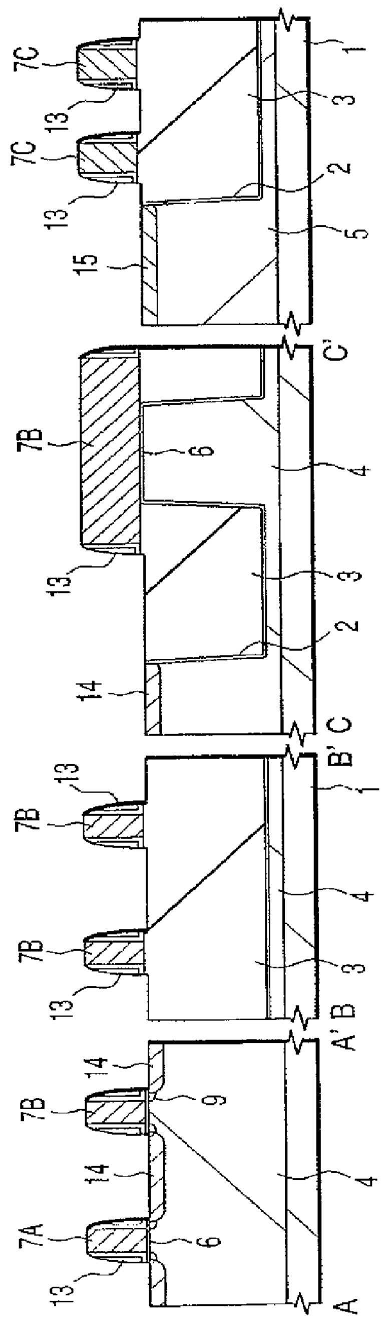
FIG. 13 is a fragmentary cross-sectional view showing a step in the method of manufacturing the SRAM of the present invention.

Next, as shown in FIG. 13, each p type well 4 is ion-implanted with phosphor or arsenic as the n type impurity to form $n^+$ type semiconductor regions 14 that are relatively high in concentration. The n type well 5 is ion-implanted with boron as the p type impurity to form a $p^+$ type semiconductor region 15 that is relatively high in concentration. The $n^+$ type semiconductor regions 14 each formed in the p type well 4 of the memory array constitute the sources and drains of the transfer MISFETs ($TR_1$ and $TR_2$) and drive MISFETs ($DR_1$ and $DR_2$), whereas the $p^+$ type semiconductor region 15 formed in the n type well 5 in the peripheral circuit area constitutes each of the source and drain of each p channel type MISFET. The unillustrated p type well in the peripheral circuit area is ion-implanted with phosphor or arsenic as the n type impurity to form an $n^+$ type semiconductor region that is relatively high in concentration, which constitutes each of the source and drain of each n channel type MISFET.

Figure 14:
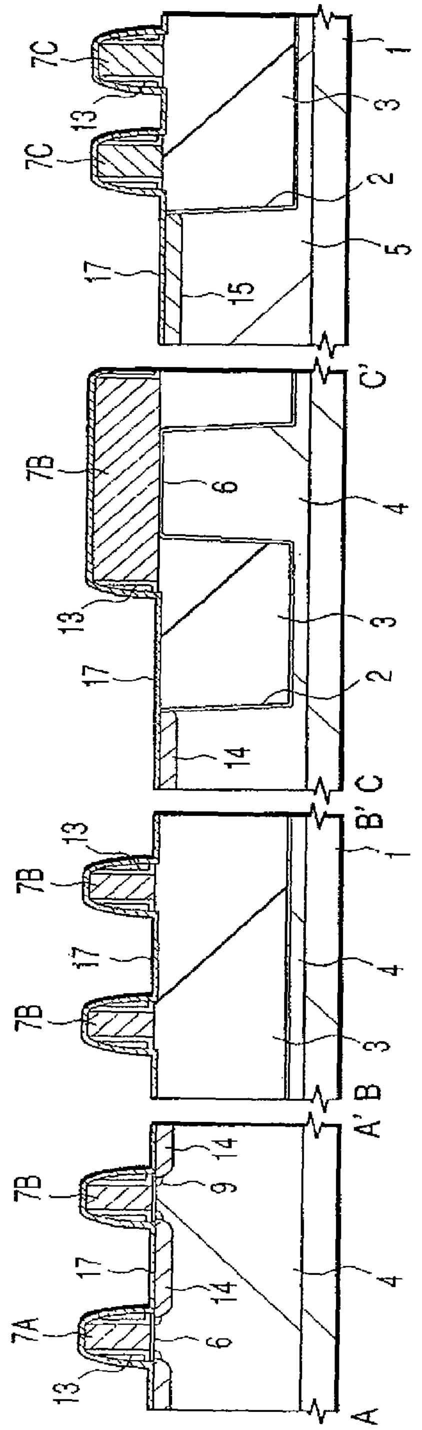
FIG. 14 is a fragmentary cross-sectional view depicting a step in the method of manufacturing the SRAM of the present invention.
Figure 15:
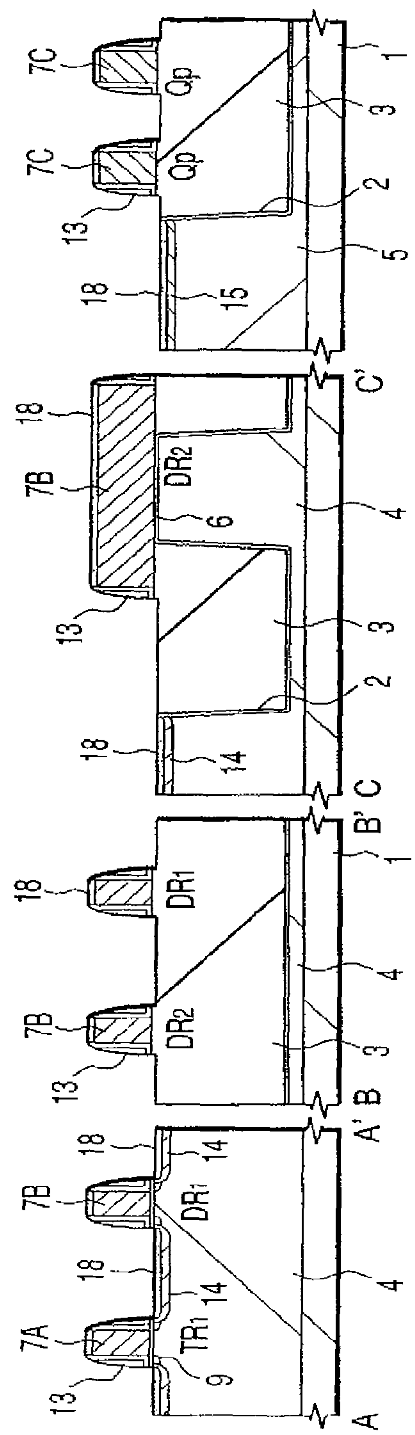
FIG. 15 is a fragmentary cross-sectional view illustrating a step in the method of manufacturing the SRAM of the present invention.

Next, as shown in FIG. 14, for example, a cobalt (Co) film 17 is deposited on the substrate 1 by a sputtering method. Subsequently, as shown in FIG. 15, the substrate 1 is heat-treated to cause silicide reactions at an interface between the Co film 17 and each of the gate electrodes 7A, 7B and 7C and an interface between the Co film 17 and the substrate 1. Thereafter, the unreacted Co film 17 is removed by etching. Thus, Co silicide layers 18 each corresponding to a silicide layer are formed on the surfaces of the gate electrodes 7A, 7B and 7C and the surfaces of the sources and drains ($n^+$ type semiconductor regions 14 and $p^+$ type semiconductor region 15). According to the processes up to here, as shown in FIGS. 15 and 16, the n channel type transfer MISFETs ($TR_1$ and $TR_2$) and drive MISFETs ($DR_1$ and $DR_2$) are formed in the memory array, and the p channel type MISFETs (Qp) and n channel MISFETs (not shown) are formed in the peripheral circuit area.

Figure 16:
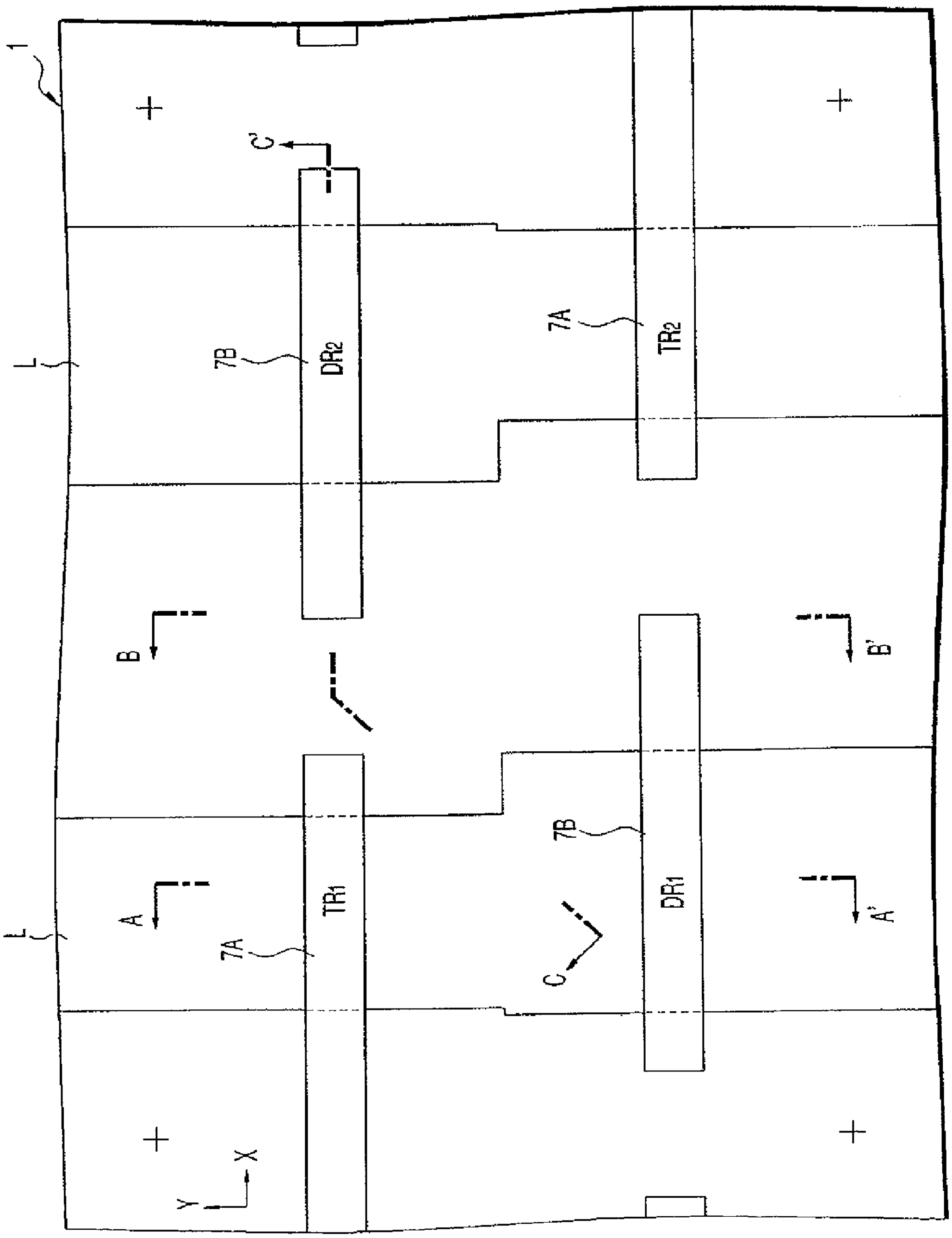
FIG. 16 is a fragmentary plan view depicting a step in the method of manufacturing the SRAM of the present invention.

As shown in FIG. 16, one transfer MISFET ($TR_1$) and drive MISFET ($DR_1$), and the other transfer MISFET ($TR_2$) and drive MISFET ($DR_2$) are respectively disposed so as to be spaced in a horizontal direction (X direction), as viewed in the drawing, with device isolation portions interposed therebetween and are respectively disposed point-symmetrically with respect to a central point of a memory cell forming area. The gate electrodes 7B of the drive MISFET ($DR_2$) and drive MISFET ($DR_1$) are respectively disposed so as to extend in the horizontal direction (X direction) as viewed in the drawing. As viewed in the X direction, one end of one transfer MISFET ($TR_1$) and drive MISFET ($DR_1$) and the other transfer MISFET ($TR_2$) and drive MISFET ($DR_2$) are terminated on the device isolation portions between one transfer MISFET ($TR_1$) and drive MISFET ($DR_1$) and the other transfer MISFET ($TR_2$) and drive MISFET ($DR_2$), and vertical MISFETs ($SV_1$ and $SV_2$) to be described later are formed on their one ends.

Figure 17:
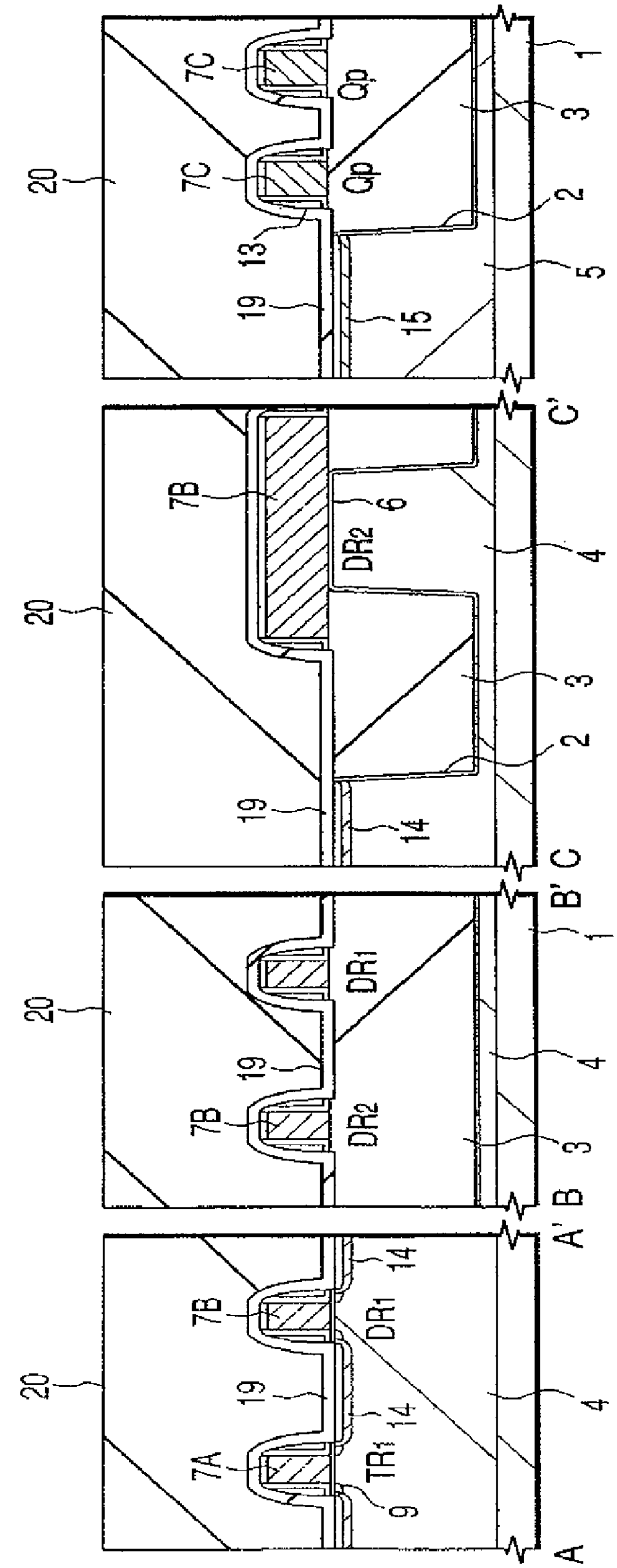
FIG. 17 is a fragmentary cross-sectional view illustrating a step in the method of manufacturing the SRAM of the present invention.

Next, as shown in FIG. 17, for example, a silicon nitride film 19 and a silicon oxide film 20 are deposited as insulating films for covering the MISFETs ($TR_1$, $TR_2$, $DR_1$, $DR_2$ and Qp) by the CVD method, and the surface of the silicon oxide film 20 is subsequently planarized by the CMP method.

Figure 18:
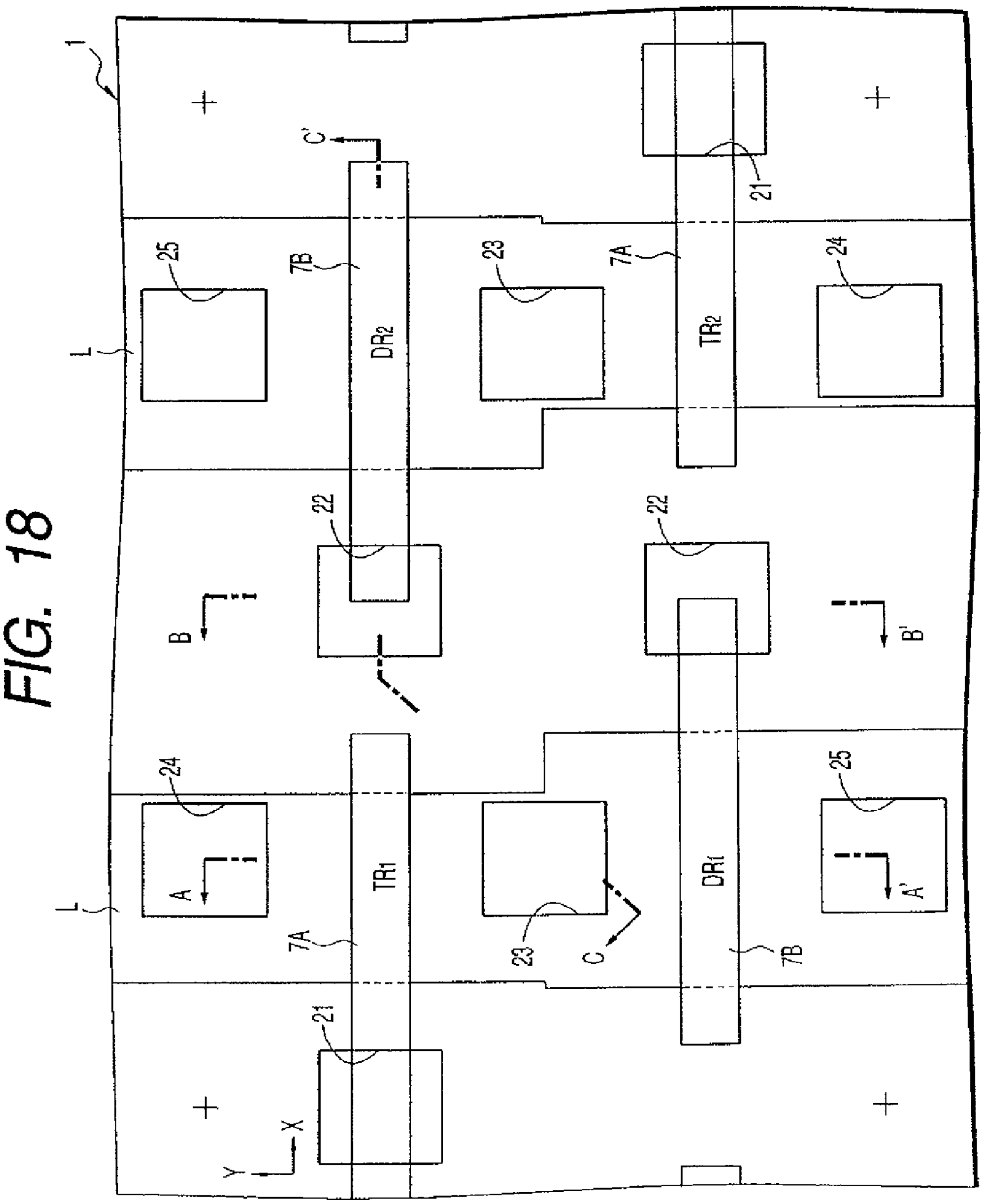
FIG. 18 is a fragmentary plan view showing a step in the method of manufacturing the SRAM of the present invention.
Figure 19:
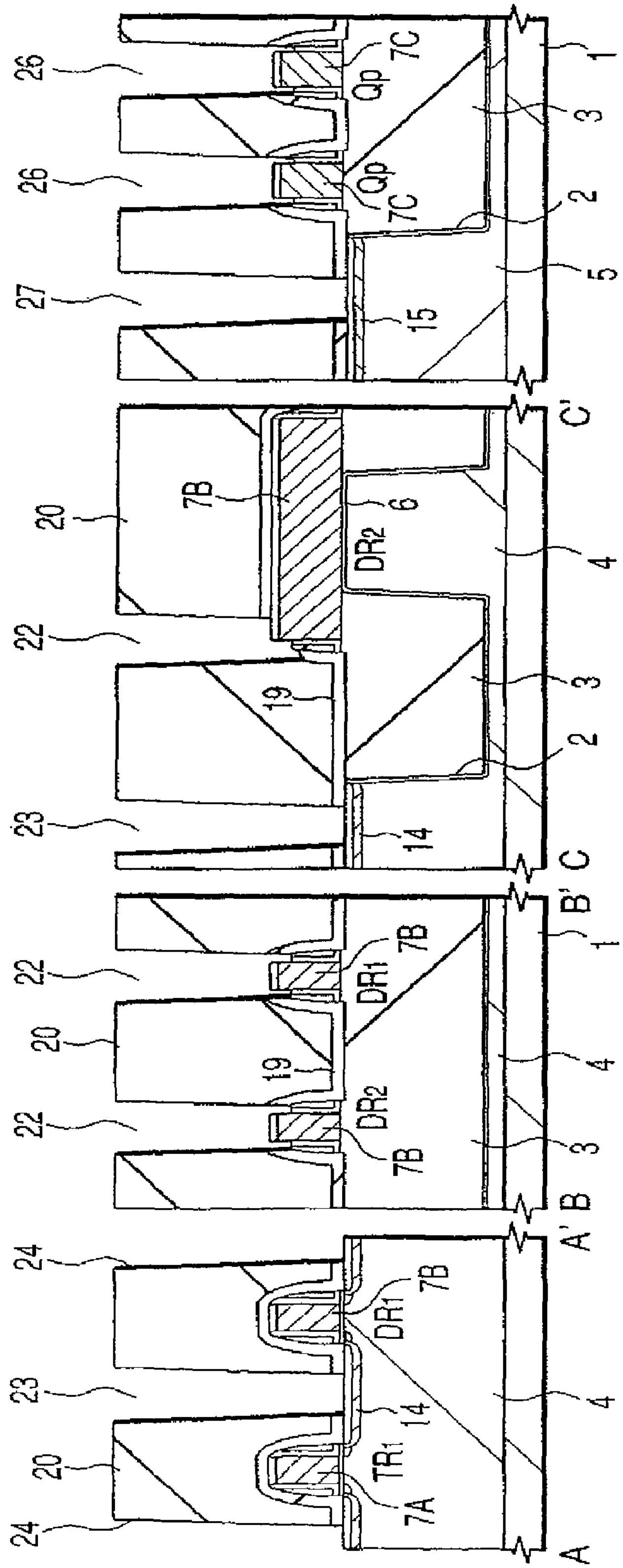
FIG. 19 is a fragmentary cross-sectional view illustrating a step in the method of manufacturing the SRAM of the present invention.

Next, as shown in FIGS. 18 and 19, the silicon oxide film 20 and the silicon nitride film 19 are dry-etched using a photoresist film as a mask to form contact holes 21 over the gate electrodes 7A of the transfer MISFETs ($TR_1$ and $TR_2$) and form contact holes 22 over the gate electrodes 7B of the drive MISFETs ($DR_1$ and $DR_2$). Contact holes 23, 24 and 25 are formed over the sources and drains ($n^+$ type semiconductor regions 14) of the transfer MISFETs ($TR_1$ and $TR_2$) and drive MISFETs ($DR_1$ and $DR_2$), and contact holes 26 and 27 are formed over the gate electrodes 7C and sources and drains ($p^+$ type semiconductor regions 15) of the p channel type MISFETs (Qp) in the peripheral circuit area.

Figure 20:
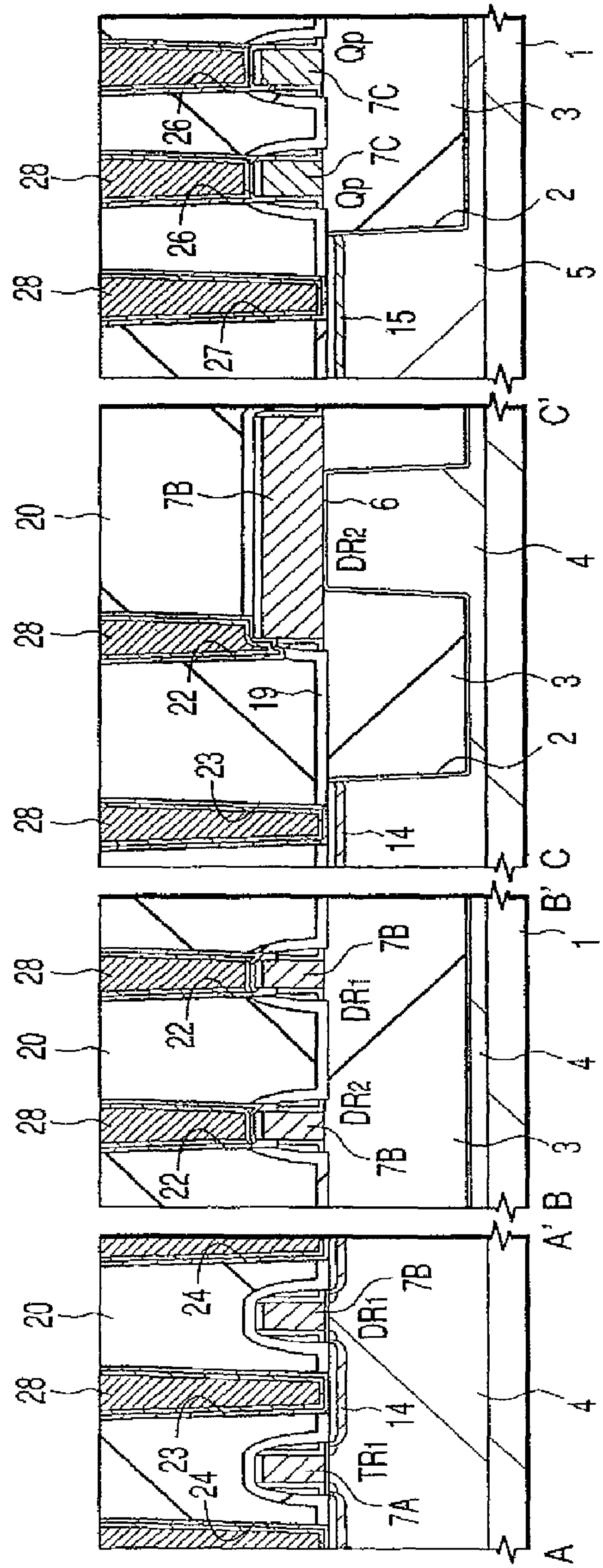
FIG. 20 is a fragmentary cross-sectional view depicting a step in the method of manufacturing the SRAM of the present invention.

Next, as shown in FIG. 20, plugs 28 are formed inside the contact holes 21 through 27. In order to form the plugs 28, for example, a titanium (Ti) film and a titanium nitride (TiN) film are deposited on the silicon oxide film 20 containing the interiors of the contact holes 21 through 27 by the sputtering method. Subsequently, a TiN film and a tungsten (W) film used as a metal film are deposited thereon by the CVD method, followed by removal of the W film, TiN film and Ti film lying outside the contact holes 21 through 27 by the CMP method.

Figure 21:
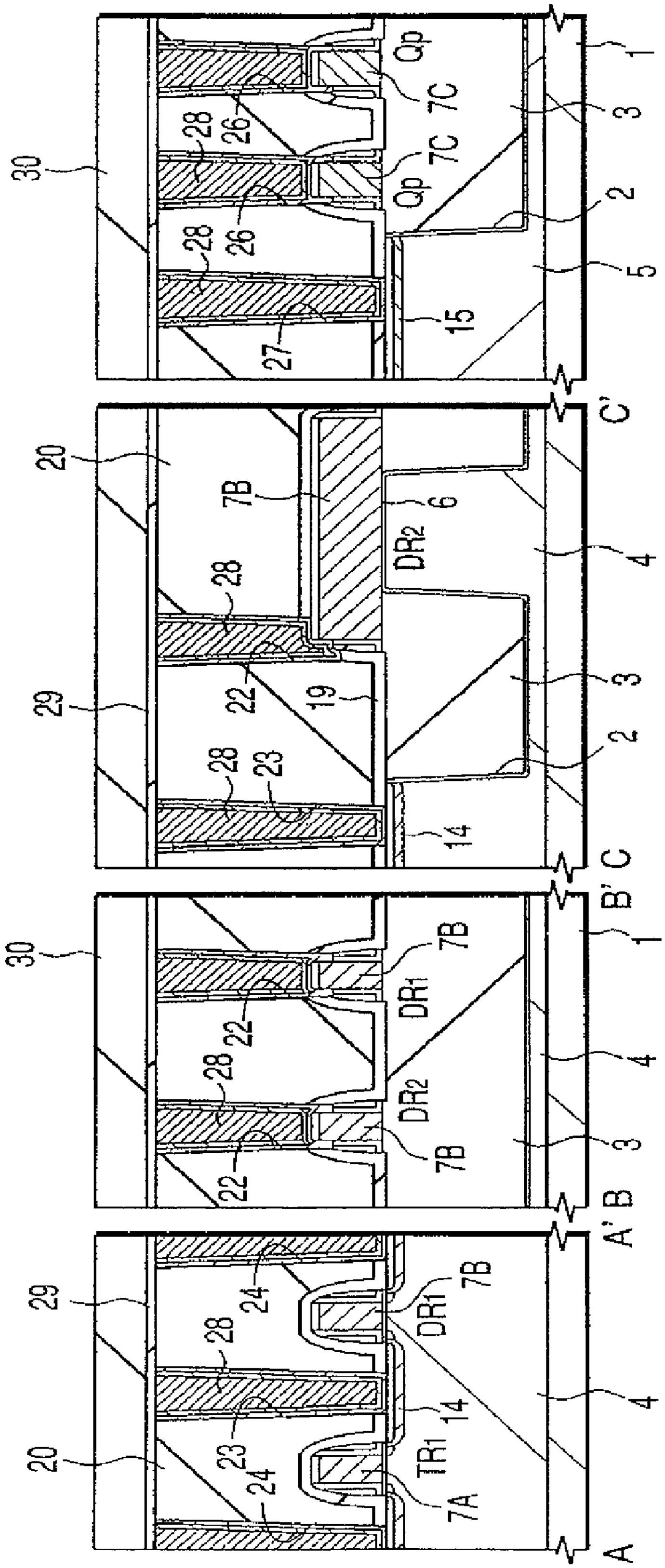
FIG. 21 is a fragmentary cross-sectional view illustrating a step in the method of manufacturing the SRAM of the present invention.
Figure 22:
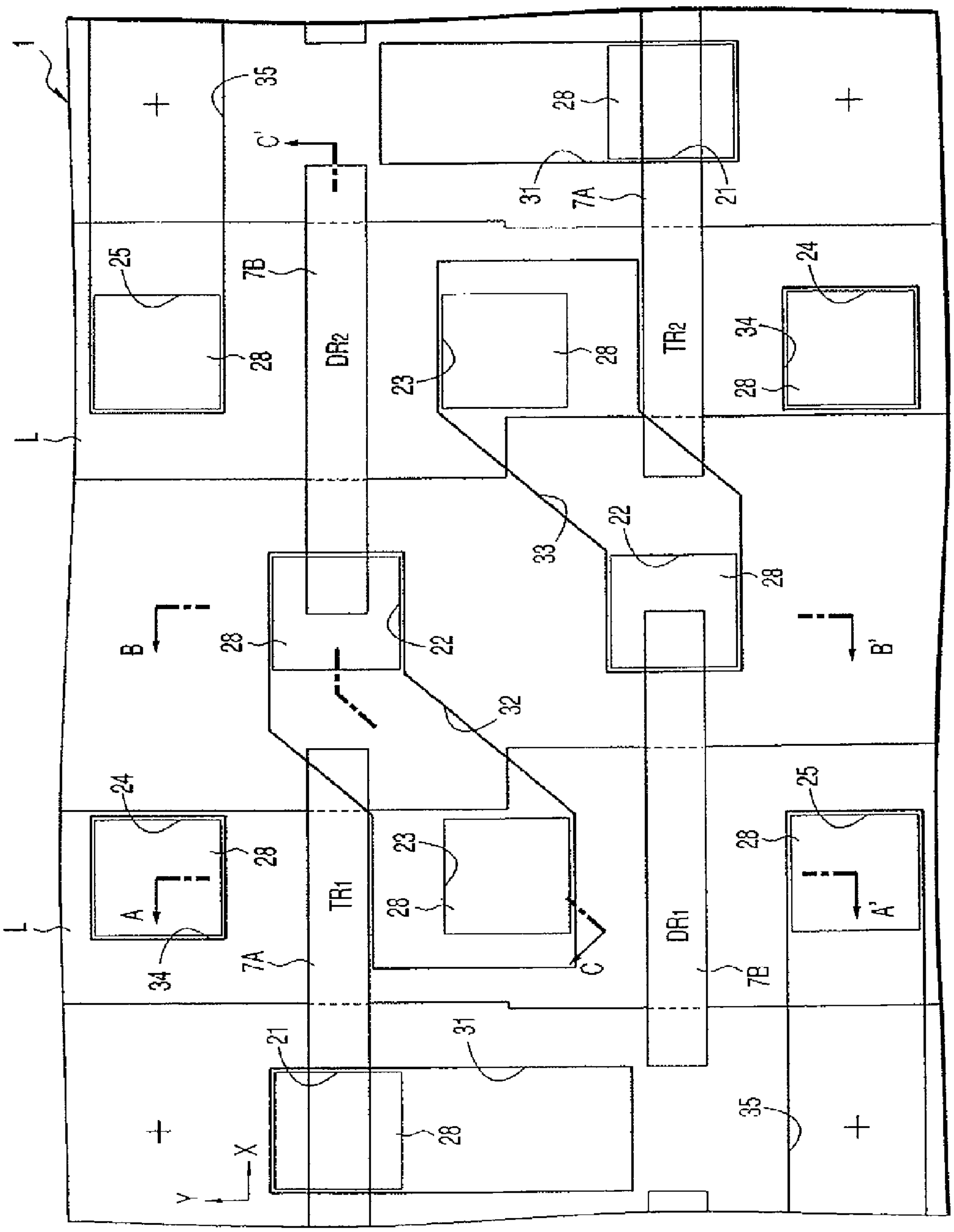
FIG. 22 is a fragmentary plan view depicting a step in the method of manufacturing the SRAM of the present invention.
Figure 23:
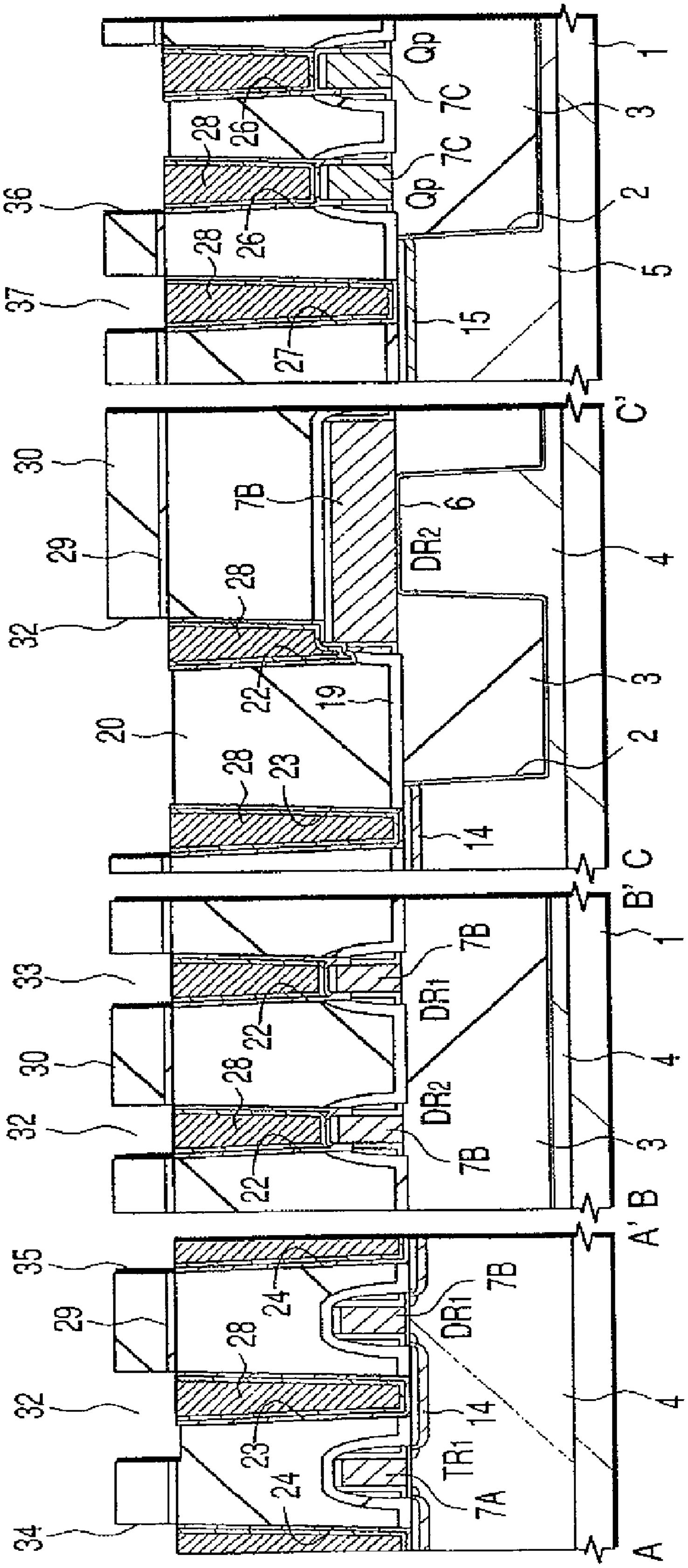
FIG. 23 is a fragmentary cross-sectional view illustrating a step in the method of manufacturing the SRAM of the present invention.

Next, as shown in FIG. 21, for example, a silicon nitride film 29 and a silicon oxide film 30 are deposited on the substrate 1 as insulating films by the CVD method. Thereafter, the silicon oxide film 29 and silicon nitride film 30 are dry-etched using a photoresist film as a mask as shown in FIGS. 22 and 23, whereby trenches 31 through 37 are formed over the contact holes 21 through 27. Of these trenches 31 through 37, the trenches 32 and 33 formed in the memory array are formed so as to extend over the contact holes 22 and the contact holes 23, as shown in FIG. 22.

The silicon nitride film 29 located below the silicon oxide film 30 is used as a stopper film upon etching of the silicon oxide film 30. Namely, when the trenches 31 through 37 are formed, the silicon oxide film 30 is first etched and its etching is stopped at the surface of the lower silicon nitride film 29 and thereafter the silicon nitride film 29 is etched. Thus, even when the trenches 31 through 37 and the contact holes 21 through 27 placed therebelow are relatively displaced in position due to misalignment of the photomasks, the silicon oxide film 20 below each of the trenches 31 through 37 is not excessively etched.

Figure 24:
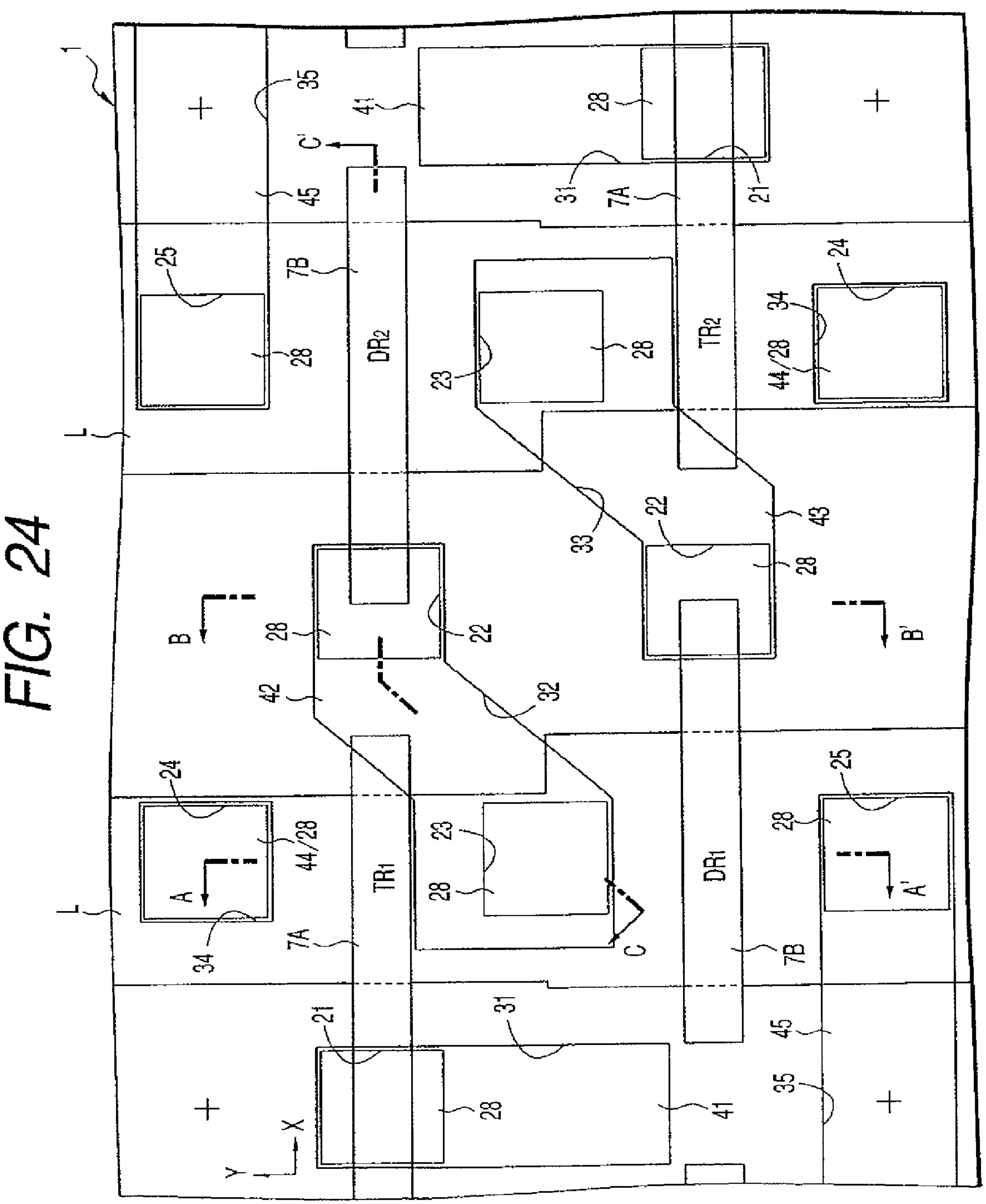
FIG. 24 is a fragmentary plan view showing a step in the method of manufacturing the SRAM of the present invention.
Figure 25:
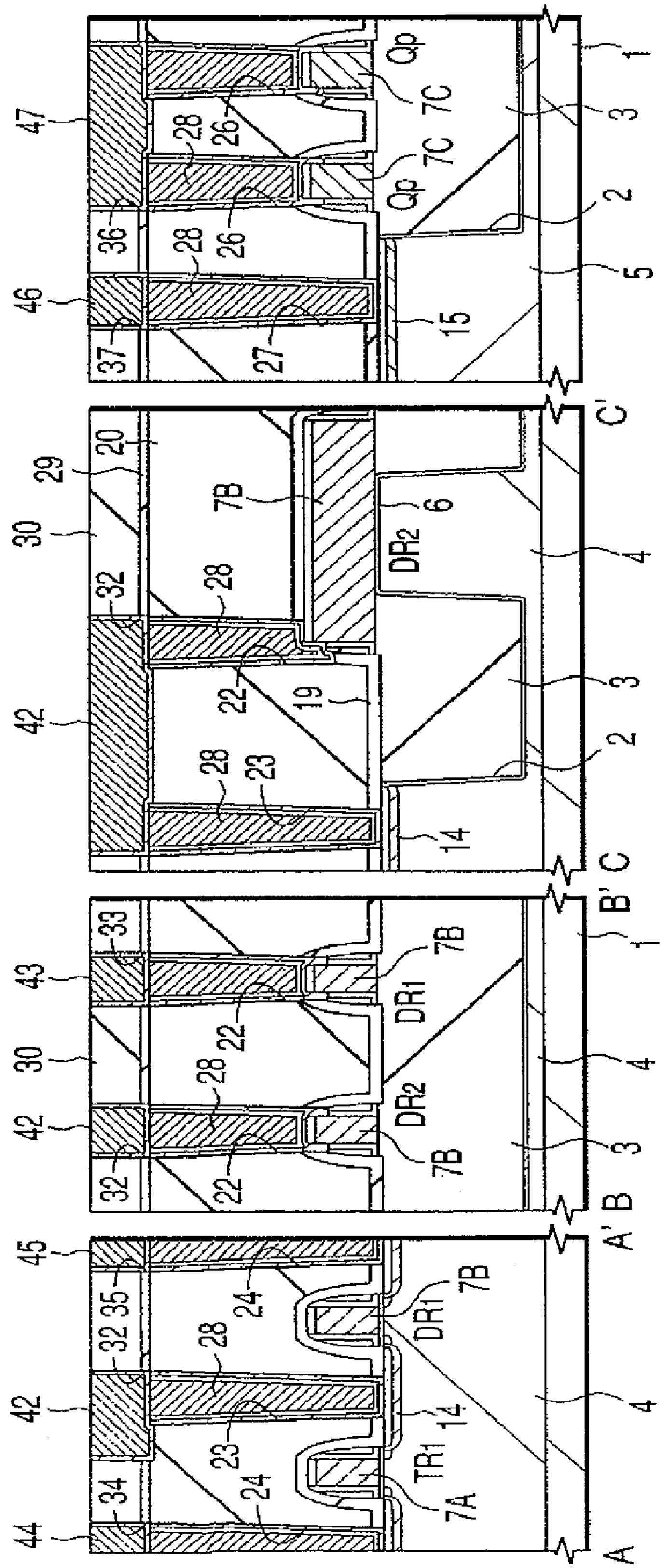
FIG. 25 is a fragmentary cross-sectional view illustrating a step in the method of manufacturing the SRAM of the present invention.

Next, as shown in FIGS. 24 and 25, intermediate conductive layers 41 through 45 are respectively formed inside the trenches 31 through 35 formed in the memory array, and first layer wirings 46 and 47 are respectively formed inside the trenches 36 and 37 formed in the peripheral circuit area. In order to form the intermediate conductive layers 41 through 45 and first layer wirings 46 and 47, for example, a TiN film is deposited on the silicon oxide film 30 including the interiors of the trenches 31 through 37 by the sputtering method. Subsequently, a W film is deposited thereon as a metal film by the CVD method, followed by removal of the W film and TiN film lying outside the trenches 31 through 37 by the CMP method.

Of the intermediate conductive layers 41 through 45 formed in the memory, array, the intermediate conductive layers 41 are used to electrically connect the gate electrodes 7A of the transfer MISFETs ($TR_1$ and $TR_2$) and a word line (WL) formed in a subsequent process. The intermediate conductive layers 44 are used to electrically connect the $n^+$ type semiconductor regions 14 (ones of the sources and drains) of the transfer MISFETs ($TR_1$ and $TR_2$) and complementary data lines (BLT and BLB). Further, the intermediate conductive layers 45 are used to electrically connect the $n^+$ type semiconductor regions 14 (sources) of the drive MISFETs ($DR_1$ and $DR_2$) and reference voltage lines 91 (Vss) formed in a subsequent process.

One (intermediate conductive layer 42) of the pair of intermediate conductive layers 42 and 43 formed substantially in the central portion of each memory cell area is used as a local interconnect or wiring for electrically connecting the $n^+$ type semiconductor region 14 constituting one of the source and drain of the transfer MISFET ($TR_1$) and the drain of the drive MISFET ($DR_1$), the gate electrode 7B of the drive MISFET ($DR_2$), and the lower semiconductor layer 57 (drain) of the vertical MISFET ($SV_1$) formed in a subsequent process. On the other hand, the other layer (intermediate conductive layer 43) thereof is used as a local interconnect or wiring for electrically connecting the $n^+$ type semiconductor region 14 constituting one of the source and drain of the transfer MISFET ($TR_2$) and the drain of the drive MISFET ($DR_2$), the gate electrode 7B of the drive MISFET ($DR_1$) and the lower semiconductor layer 57 (drain) of the vertical MISFET ($SV_2$) formed in a subsequent process.

The intermediate conductive layers 41 through 45 are made up of a metal film such as a W film. Thus, since the metal wirings (first layer wirings 46 and 47) of the peripheral circuit can be simultaneously formed in the process of forming the intermediate conductive layers 41 through 45, the number of process steps for manufacturing the SRAM and the number of masks can be reduced.

The plugs 28 and intermediate conductive layers 46 and 47 lying in the same layer as the plugs 28 and intermediate conductive layers 42 and 43 made up of a metal film such as tungsten or the like form an electrical connection between the sources/drains and gates of the n channel and p channel MISFETs constituting each peripheral circuit. Thus, the degree of freedom of an electrical connection between the MISFETs constituting the peripheral circuit can be enhanced and high integration is enabled. It is also possible to achieve a reduction in connection resistance between the adjacent MISFETs and enhance a circuit's operating speed.

Figure 26:
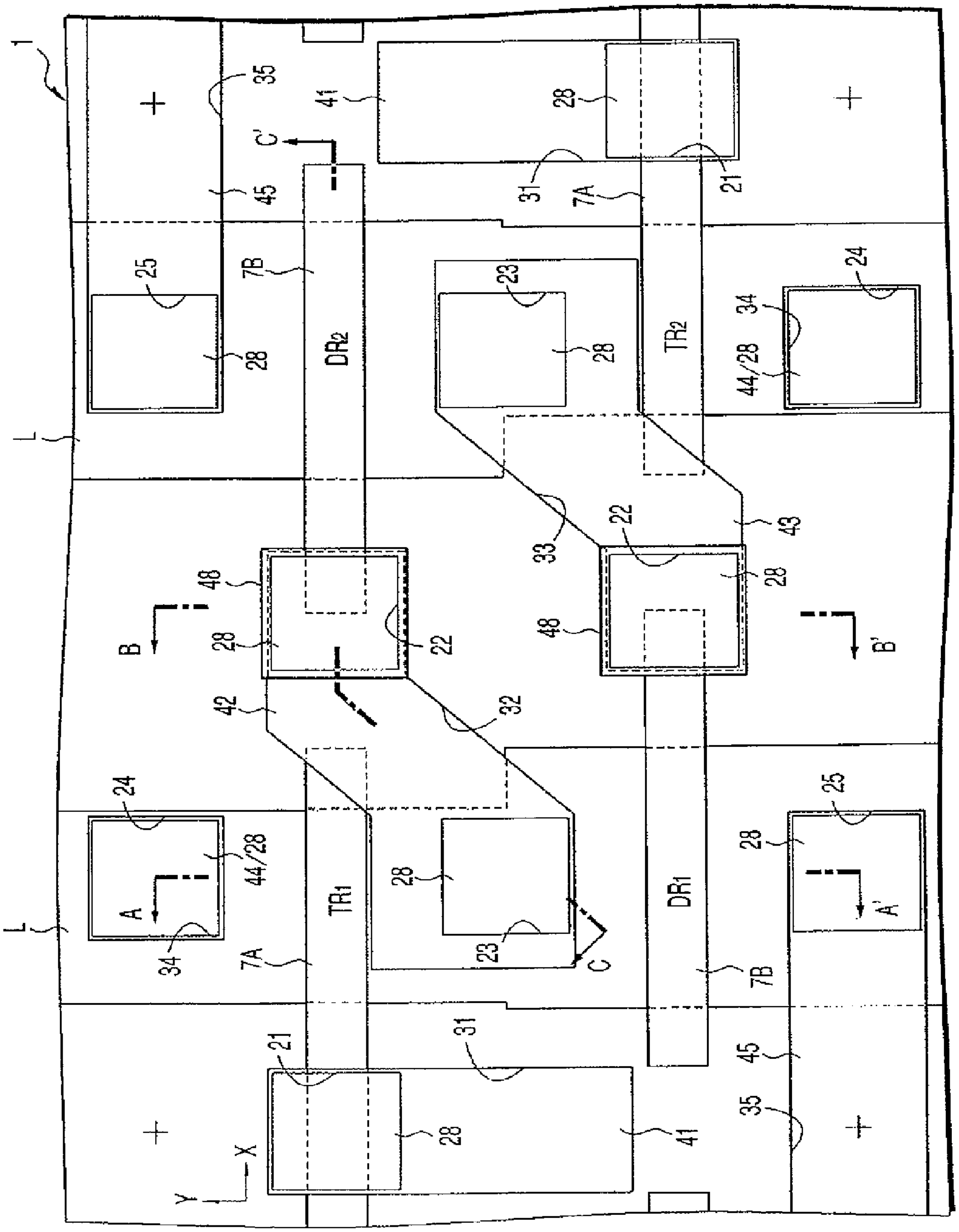
FIG. 26 is a fragmentary plan view depicting a step in the method of manufacturing the SRAM of the present invention.
Figure 27:
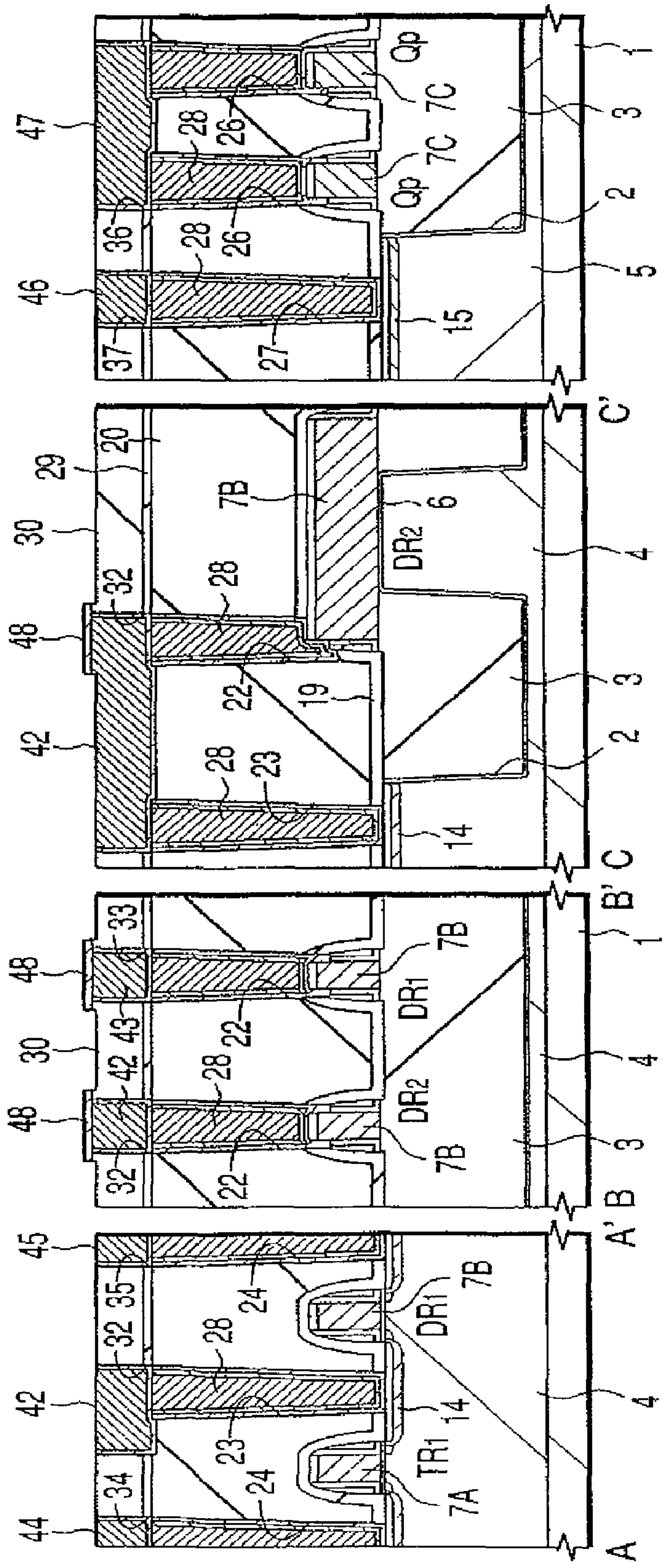
FIG. 27 is a fragmentary cross-sectional view illustrating a step in the method of manufacturing the SRAM of the present invention.

Next, as shown in FIGS. 26 and 27, barrier layers 48 are formed on the surfaces of the respective intermediate conductive layers 42 and 43. The barrier layers 48 are formed in areas of the surface areas of the intermediate conductive layers 42 and 43, which are located below the areas in which the vertical MISFETs ($SV_1$ and $SV_2$) are principally formed. In order to form the barrier layers 48, a WN film is deposited on the substrate 1 by the sputtering method, and thereafter, the WN film is patterned by dry etching using a photoresist film as a mask. Thus, the barrier layers 48 capable of preventing the occurrence of an undesired silicide reaction at an interface between the silicon film and each of the intermediate, conductive layers 42 and 43, are interposed between the silicon film and the W film constituting the intermediate conductive layers 42 and 43.

The barrier layers 48 may be made up of a laminated film of a Ti film, a TiN film, a WN film and a W film, a laminated film of the TiN film and W film, a laminated film of the Ti film and TiN film, a Co silicide film, a W silicide film, or the like in addition to the WN film. A Ti thin film has a feature that adhesion and heat resistance to the silicon oxide film are excellent as compared with the WN film. On the other hand, since the WN film is easily passivated due to oxidation, the possibility that it will contaminate a device is low, and it can be simply handled. The selection of the film is enabled according to whether any of the adhesion, heat resistance and availability is taken as important. Thus, when, for example, the barrier film is needed in the process in which there is apprehension that the characteristic of each MISFET will vary, is less reduced-even if the Ti thin film is re-adhered to the substrate 1, as in the case of the wiring forming process subsequent to the formation of each MISFET, the Ti thin film rather than the WN film may be used.

Thus, the intermediate conductive layers 42 and 43 are made up of the metal film such as tungsten (W), and the vertical MISFETs each formed of the silicon film are formed over the intermediate conductive layers 42 and 43 with the barrier layers 48 interposed therebetween. Consequently, the connection resistance between the adjacent MISFETs can be reduced, the characteristic of each memory cell can be enhanced, and the size of the memory cell can be scaled down. Incidentally, the surfaces of the intermediate conductive layers 42 and 43 each made up of tungsten may be nitrided to change to tungsten nitride as an alternative to the means for forming the barrier layers 48. In doing so, the masks for forming the barrier layers 48 become unnecessary.

Figure 28:
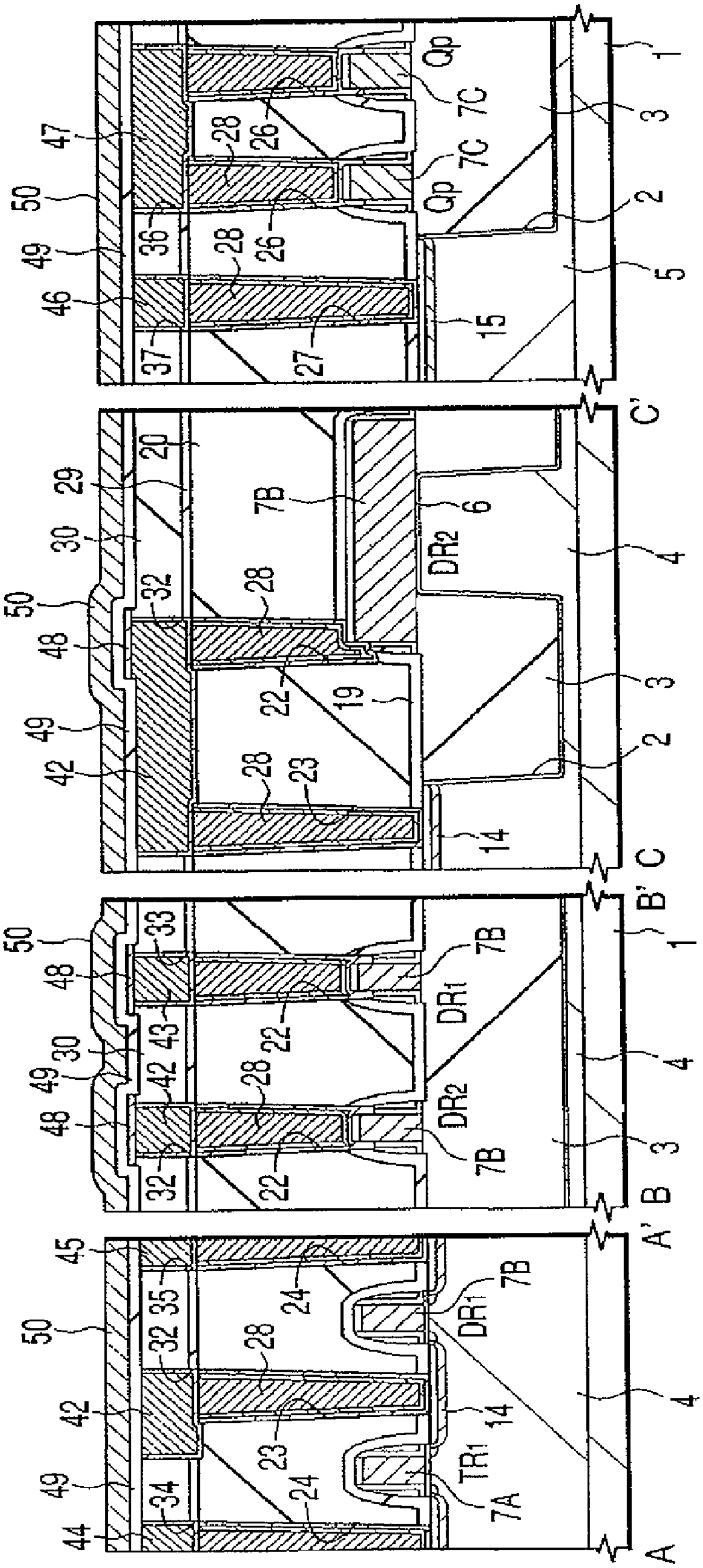
FIG. 28 is a fragmentary cross-sectional view depicting a step in the method of manufacturing the SRAM of the present invention.

Next, as shown in FIG. 28, a silicon nitride film 49 is deposited on the substrate 1 by the CVD method, and a polycrystal silicon film (or amorphous silicon film) 50 is continuously deposited over the silicon nitride film 49 by the CVD method. The silicon nitride film 49 is used as an etching stopper film for preventing the lower silicon oxide film 20 from being etched upon etching a silicon oxide film (52) deposited over the silicon nitride film 49 in a subsequent process. In order to set the polycrystal silicon film 50 to the same conductivity type (e.g., p type) as polycrystal silicon layers (64 and 65) constituting the gate electrodes (66) of the vertical MISFETs ($SV_1$ and $SV_2$), the polycrystal silicon film 50 is doped with boron upon film growth or after the growth.

Figure 29:
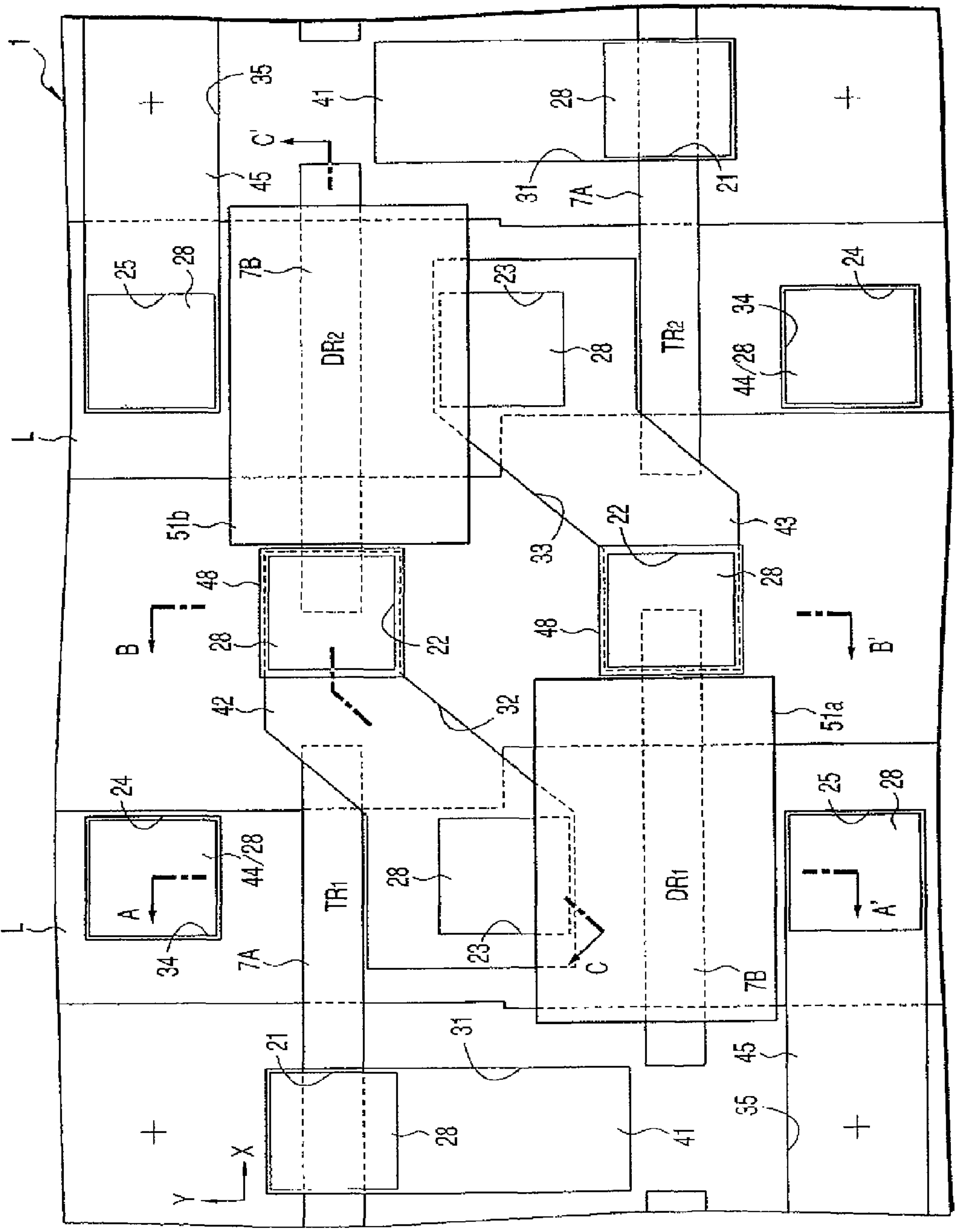
FIG. 29 is a fragmentary plan view showing a step in the method of manufacturing the SRAM of the present invention.
Figure 30:
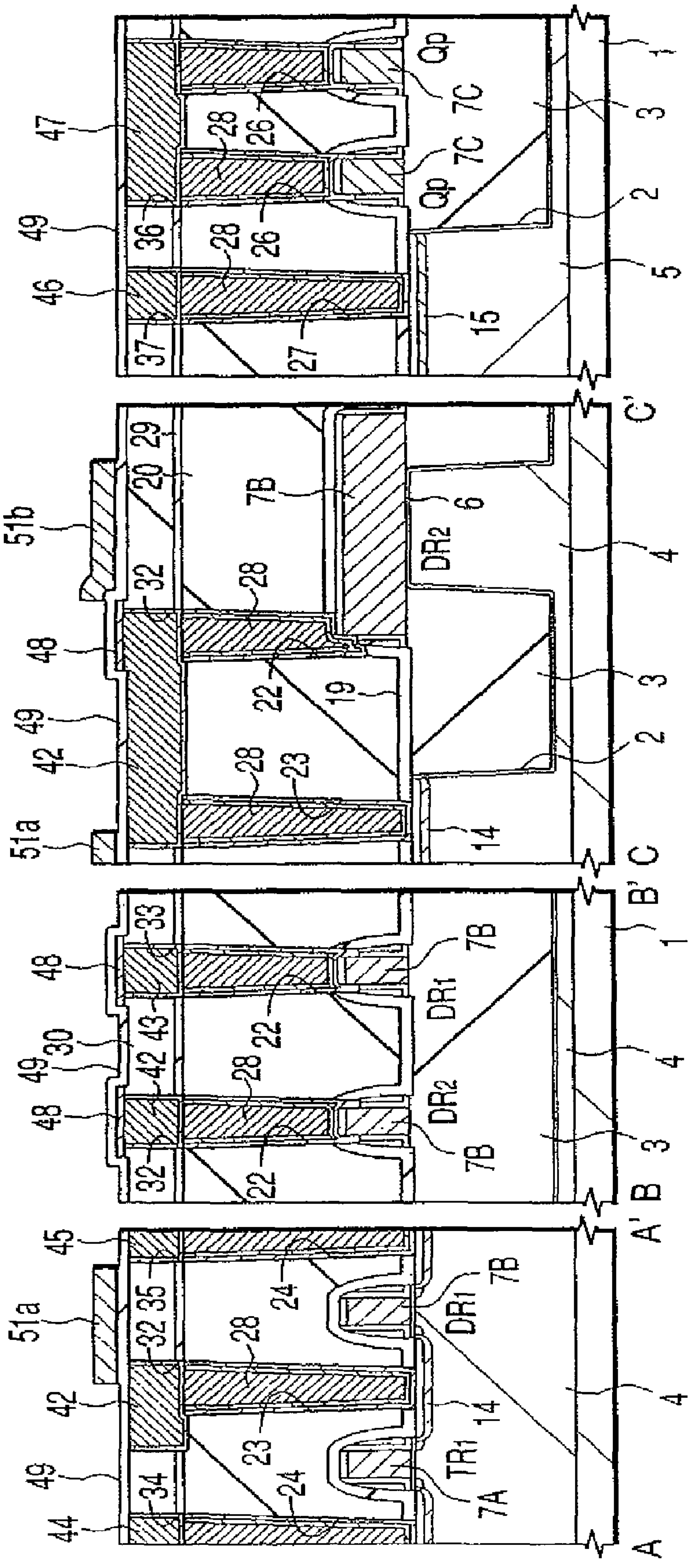
FIG. 30 is a fragmentary cross-sectional view illustrating a step in the method of manufacturing the SRAM of the present invention.

Next, as shown in FIGS. 29 and 30, the polycrystal silicon film 50 is patterned by dry etching using a photoresist film as a mask to thereby form a pair of gate drawing electrodes 51 (51*a* and 51*b*) over the silicon nitride film 49. The gate drawing electrodes 51 (51*a* and 51*b*) are disposed in areas adjacent to the vertical MISFETs ($SV_1$ and $SV_2$) formed in the subsequent process and are used to connect the gate electrodes (66) of the vertical MISFETs ($SV_1$ and $SV_2$) and the lower transfer MISFETs ($TR_1$ and $TR_2$) and drive MISFET ($DR_1$ and $DR_2$).

Figure 31:
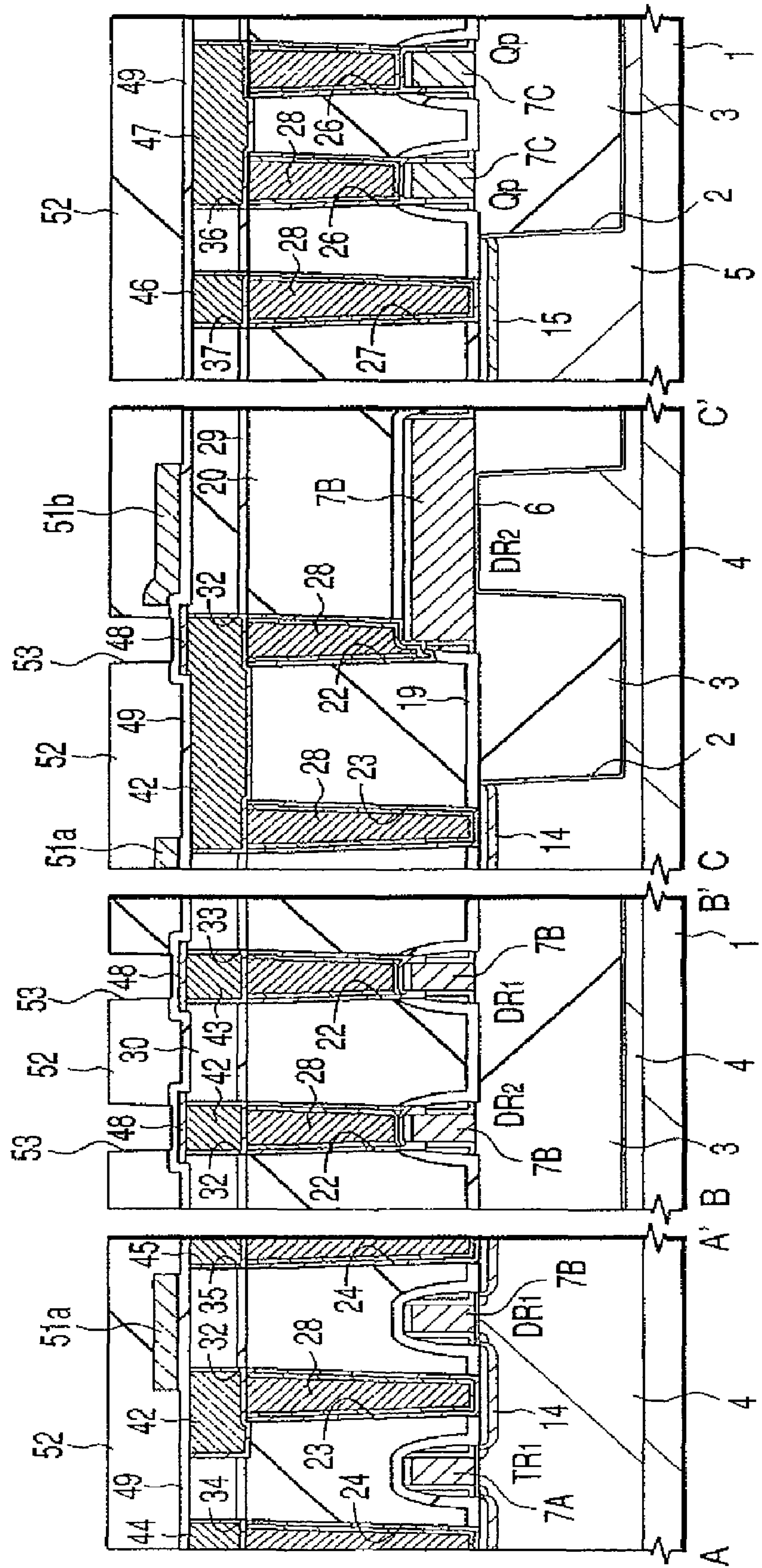
FIG. 31 is a fragmentary cross-sectional view depicting a step in the method of manufacturing the SRAM of the present invention.

Next, as shown in FIG. 31, a silicon oxide film 52 is deposited over the silicon nitride film 49 as an insulating film by the CVD method to thereby cover the upper portions of the gate drawing electrodes 51. Thereafter, the silicon oxide film 52 is dry-etched using a photoresist film as a mask to thereby form through holes 53 in the silicon oxide film 52 lying in areas above the barrier layers 48, i.e., areas in which the vertical MISFETs ($SV_1$ and $SV_2$) are formed.

Figure 32:
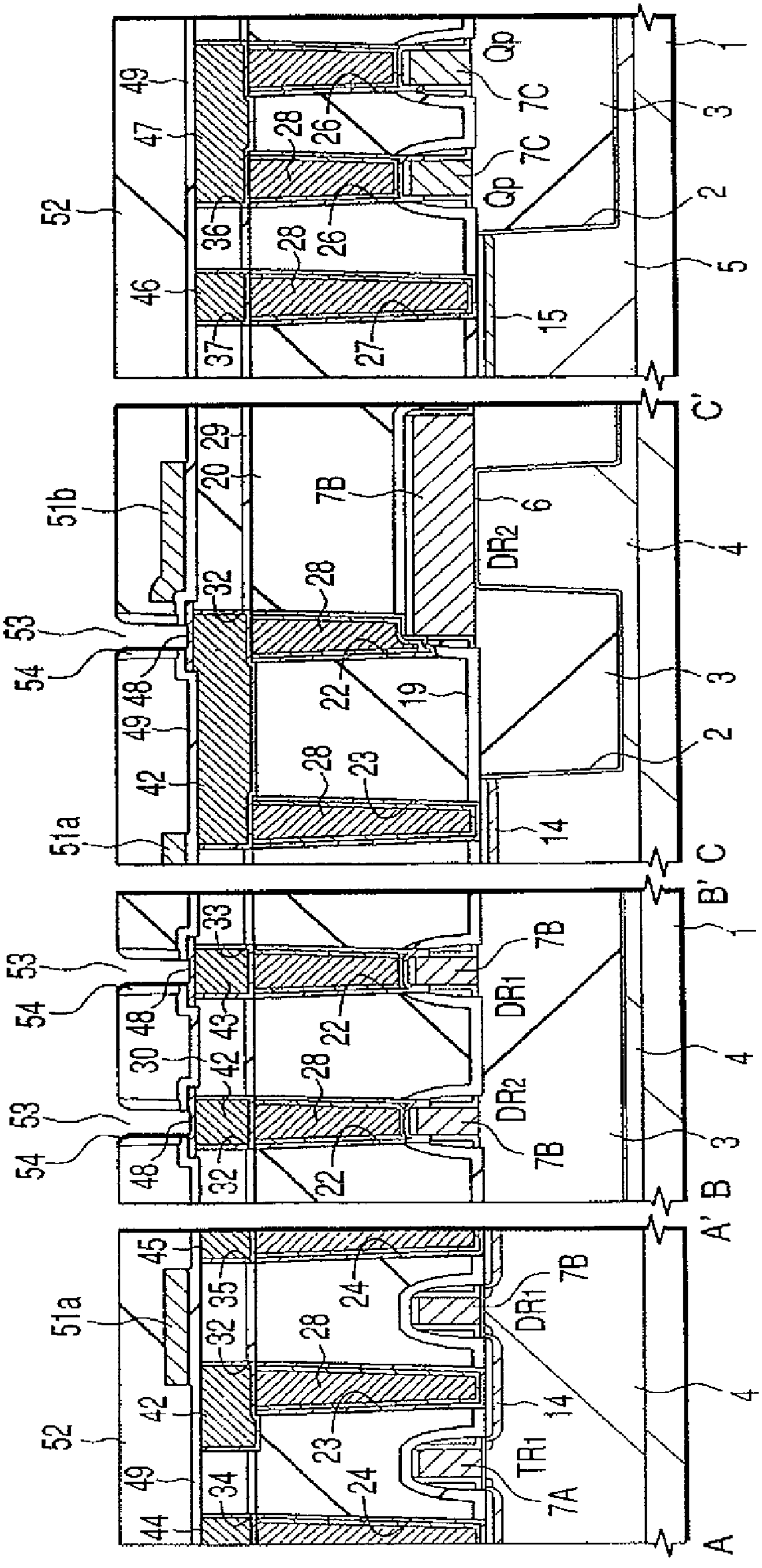
FIG. 32 is a fragmentary cross-sectional view illustrating a step in the method of manufacturing the SRAM the one embodiment of the present invention.

Next, as shown in FIG. 32, sidewall spacers 54 each made up of an insulating film are formed on their corresponding side walls of the through holes 53. In order to form the sidewall spacers 54, a silicon oxide film is deposited on the silicon oxide film 52 including the interiors of the through holes 53 by the CVD method. Subsequently, the silicon oxide film is anisotropically etched to leave the non-etched films on the side walls of the through holes 53. At this time, the silicon nitride film 49 at the bottoms of the through holes 53 is etched following the etching of the silicon oxide film to thereby expose the barrier layers 48 at the bottoms of the through holes 53.

Figure 33:
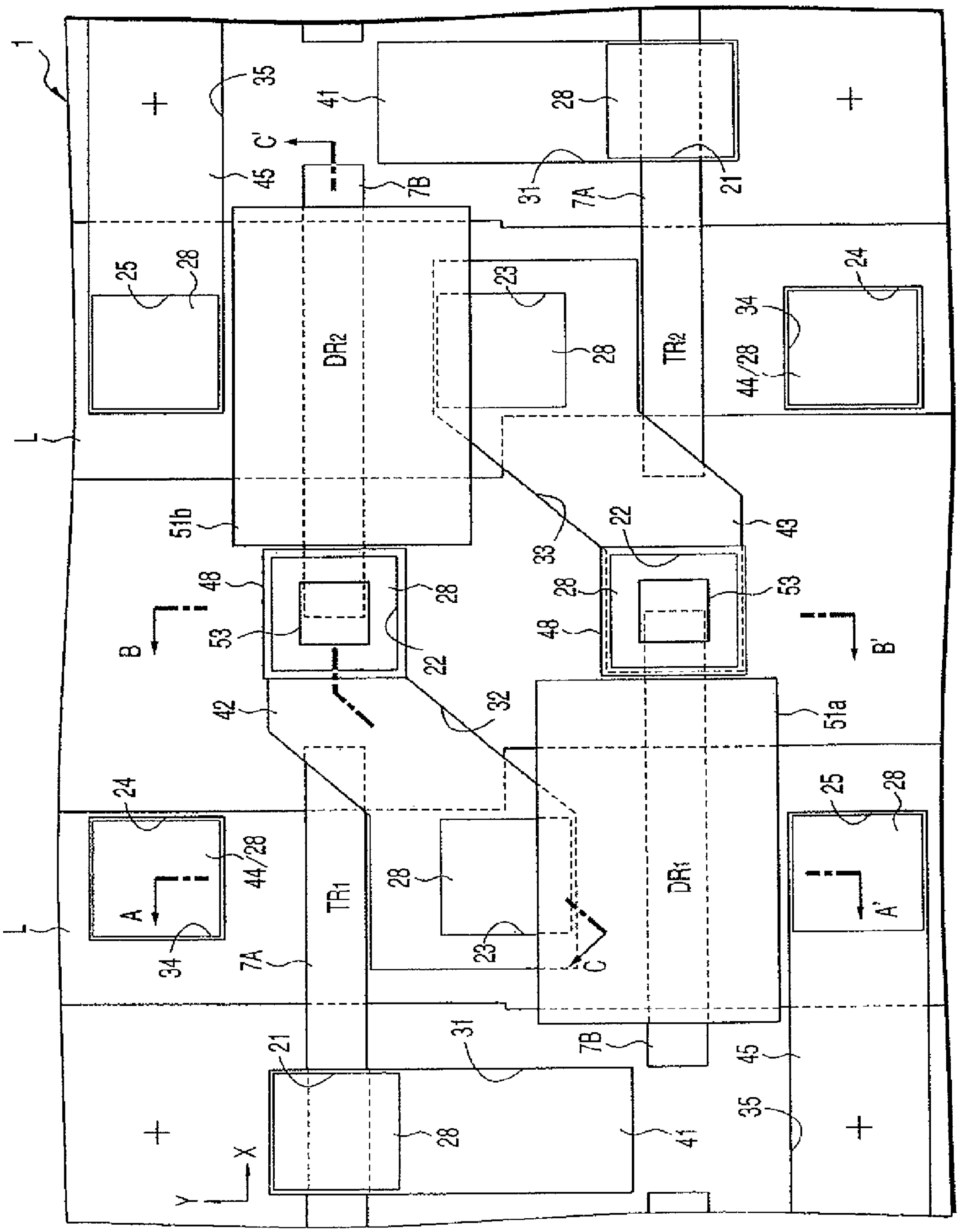
FIG. 33 is a fragmentary plan view depicting a step in the method of manufacturing the SRAM of the present invention.

By forming the sidewall spacers 54 each formed of the insulating film on their corresponding side walls to thereby reduce the diameters of the through holes 53 in this way, the through holes 53 each having a diameter smaller than the area of each barrier layer 48 are formed over the barrier layers 48, as shown in FIG. 33. Thus, since only the barrier layers 48 can be exposed at the bottoms of the through holes 53 even when the positions of the through holes 53 are displaced relative to the barrier layers 48, the areas at which plugs (55) formed inside the through holes 53 in the following process contact their corresponding barrier layers 48, can be ensured.

Figure 34:
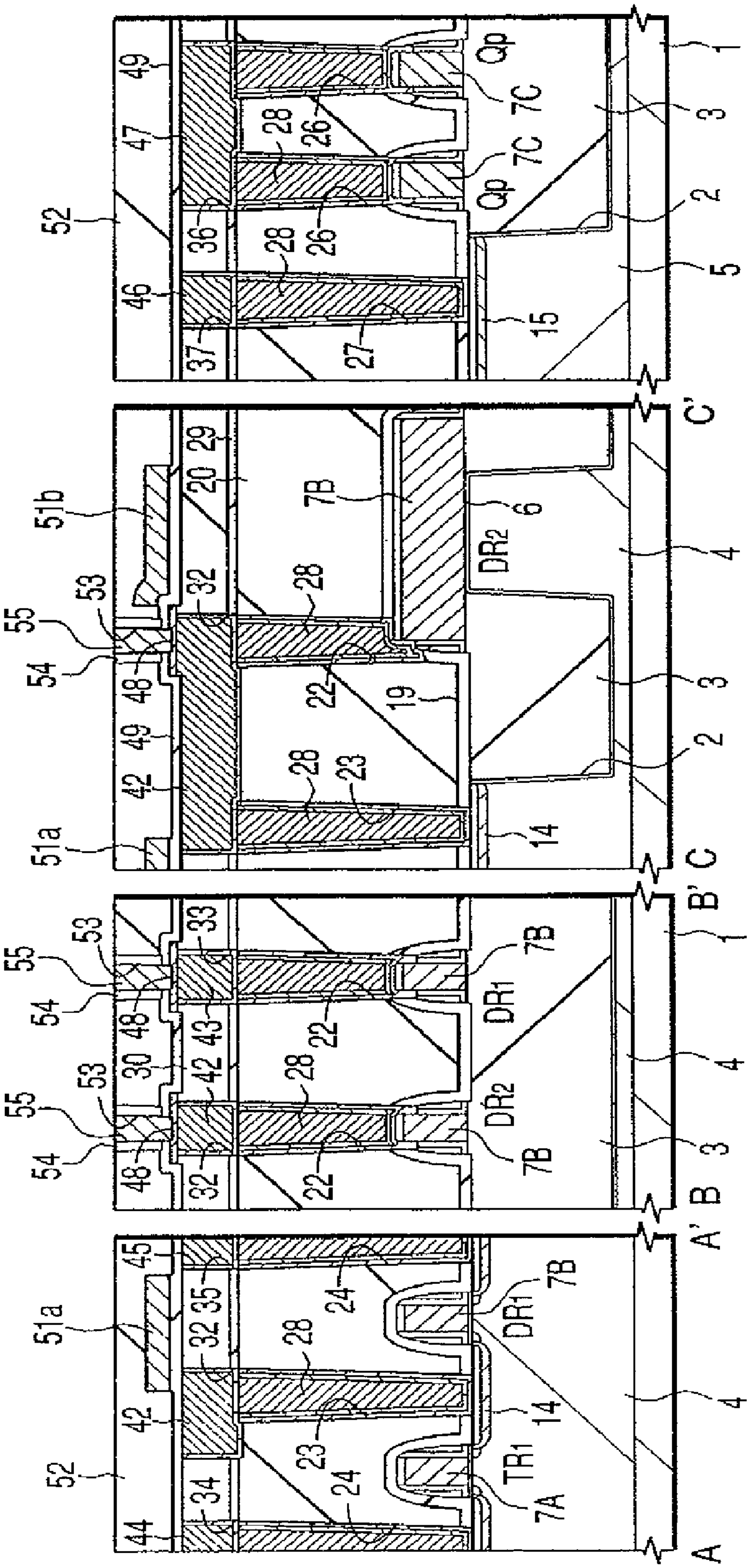
FIG. 34 is a fragmentary cross-sectional view showing a step in the method of manufacturing the SRAM of the present invention.

Next, as shown in FIG. 34, the plugs 55 are respectively formed inside the through holes 53. In order to form the plugs 55, a polycrystal silicon film (or amorphous silicon film) is deposited on the silicon oxide film 52 containing the interiors of the through holes 53 by the CVD method and thereafter the polycrystal, silicon film (or amorphous silicon film) lying outside the through holes 53 is removed by the CMP method (or etchback method). In order to set the polycrystal silicon film (or amorphous silicon film) constituting each plug 55 to the same conductivity type (p type) as the polycrystal silicon film constituting the lower semiconductor layers (57) of the vertical MISFETs ($SV_1$ and $SV_2$), it is doped with boron upon film growth or after the growth.

The plugs 55 formed inside the through holes 53 are respectively electrically connected to the lower intermediate conductive layers 42 and 43 through the barrier layers 48. Interposing each of the barrier layers 48 formed of the WN film between the polycrystal silicon film (or amorphous silicon film) constituting the plugs 55 and the W film constituting the intermediate conductive layers 42 and 43 enables prevention of the occurrence of an undesired silicide reaction at the interface between the plug 55 and each of the intermediate conductive layers 42 and 43. Incidentally, the plugs 55 may be made up of tungsten in place of the polycrystal silicon film (or amorphous silicon film). Their surfaces may be nitrided to change to tungsten nitride. In doing so, a mask for forming each barrier layer 48 becomes unnecessary.

Figure 35:
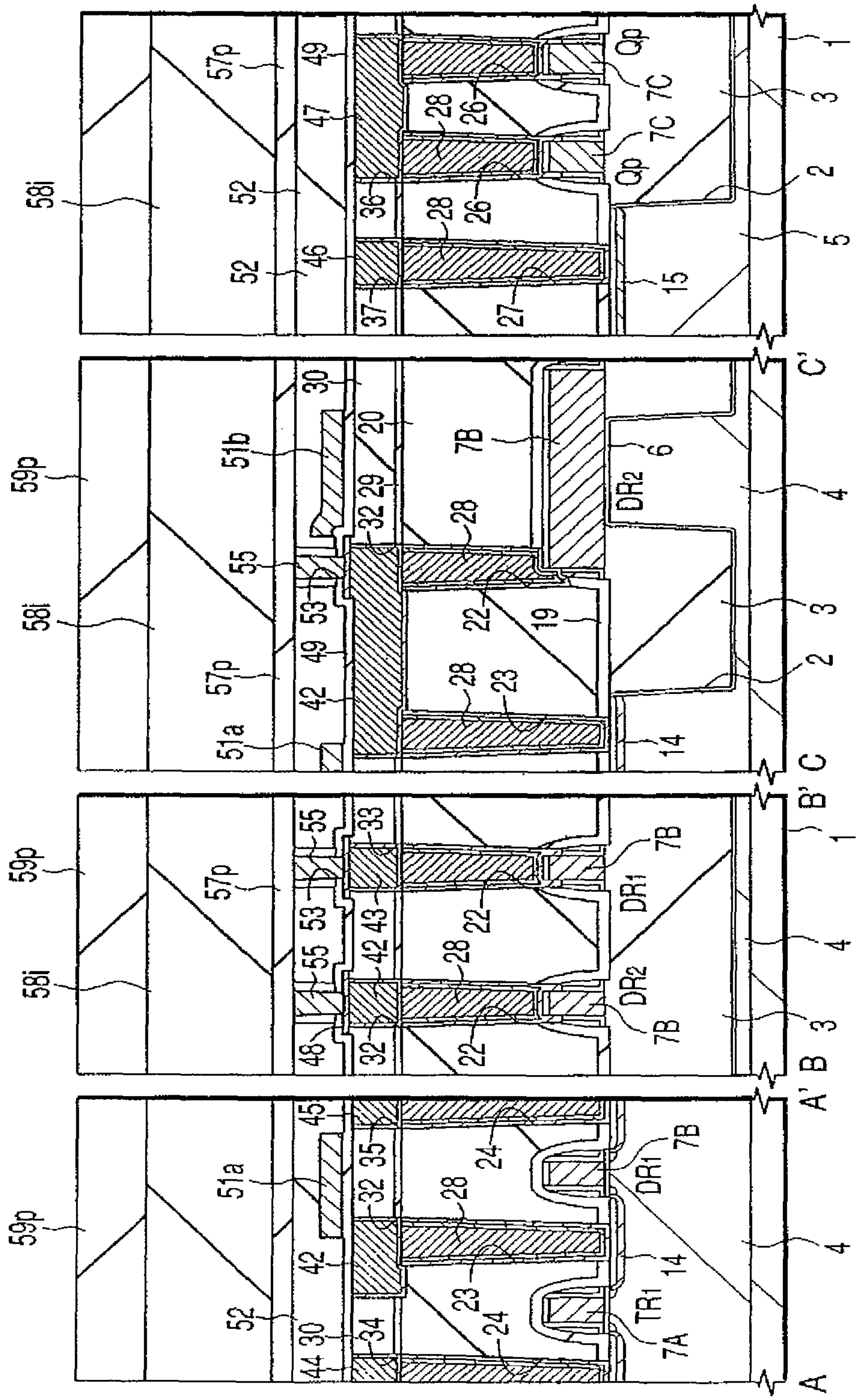
FIG. 35 is a fragmentary cross-sectional view illustrating a step in the method of manufacturing the SRAM the one embodiment of the present invention.

Next, as shown in FIG. 35, a p type silicon film 57*p*, a silicon film 58*i* and a p type silicon film 59*p* are formed over the silicon oxide film 52. In order to form these three silicon films (57*p*, 58*i* and 59*p*), for example, an amorphous silicon film doped with boron, and a non-doped amorphous silicon film are sequentially deposited by the CVD method and heat-treated to crystallize these amorphous silicon films, whereby the p type silicon film 57*p* and silicon film 58*i* are formed. Next, the silicon film 58*i* is ion-implanted with an n type or p type impurity for channel formation. Thereafter, the amorphous silicon film doped with the boron is deposited over the silicon film 58*i* by the CVD method and then heat-treated to crystallize the amorphous silicon film, whereby the p type silicon film 59*p* is formed.

Crystallizing the amorphous silicon film to thereby form the silicon films (57*p*, 58*i* and 59*p*) in this way makes it possible to increase crystal grains in the films as compared with the polycrystal silicon film, so that the characteristics of the vertical MISFETs ($SV_1$ and $SV_2$) are enhanced. Incidentally, when the silicon film 58*i* is ion-implanted with the impurity for channel formation, a through insulating film made up of a silicon oxide film is formed on the surface of the silicon film 58*i*, and the silicon film 58*i* may be ion-implanted with the impurity via the through insulating film. The crystallization of the amorphous silicon film may be carried out using a thermal oxidation process or the like for forming a gate insulating film to be described later.

Figure 36:
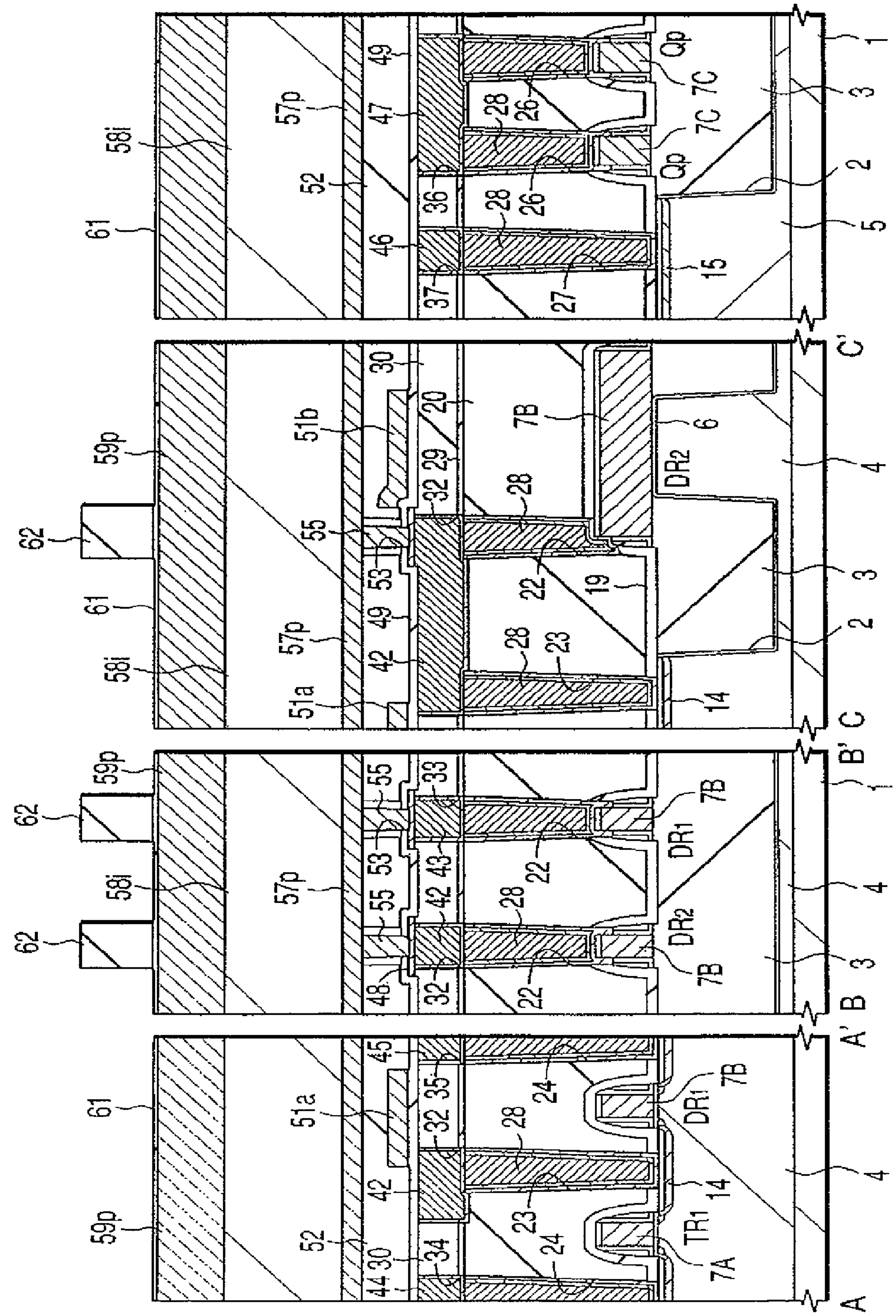
FIG. 36 is a fragmentary cross-sectional view illustrating a step in the method of manufacturing the SRAM of the present invention.

Next, as shown in FIG. 36, a silicon oxide film 61 and a silicon nitride film 62 are sequentially deposited over the p type silicon film 59*p* by the CVD method. Thereafter, the silicon nitride film 62 is dry-etched using a photoresist film as a mask to thereby leave the silicon nitride films 62 over the areas for forming the vertical MISFETs ($SV_1$ and $SV_2$). The silicon nitride films 62 are used as masks upon etching of the triple-layer silicon films (57*p*, 58*i* and 59*p*). Since silicon nitride is large in etching selection ratio relative to silicon as compared with a photoresist, the silicon films (57*p*, 58*i* and 59*p*) can be patterned with satisfactory accuracy as compared with the etching which uses a photoresist film as the mask.

Figure 37:
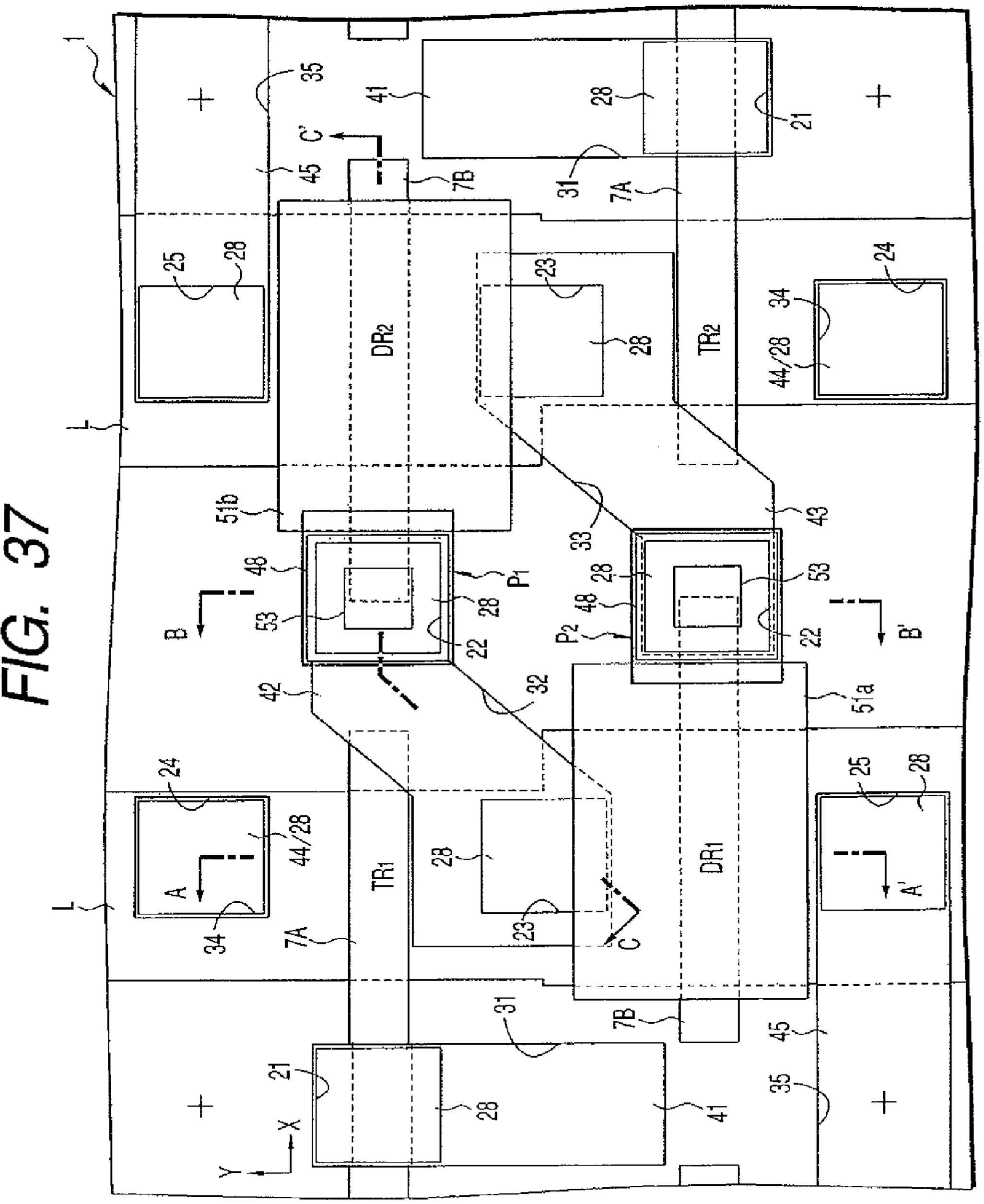
FIG. 37 is a fragmentary plan view depicting a step in the method of manufacturing the SRAM of the present invention.
Figure 38:
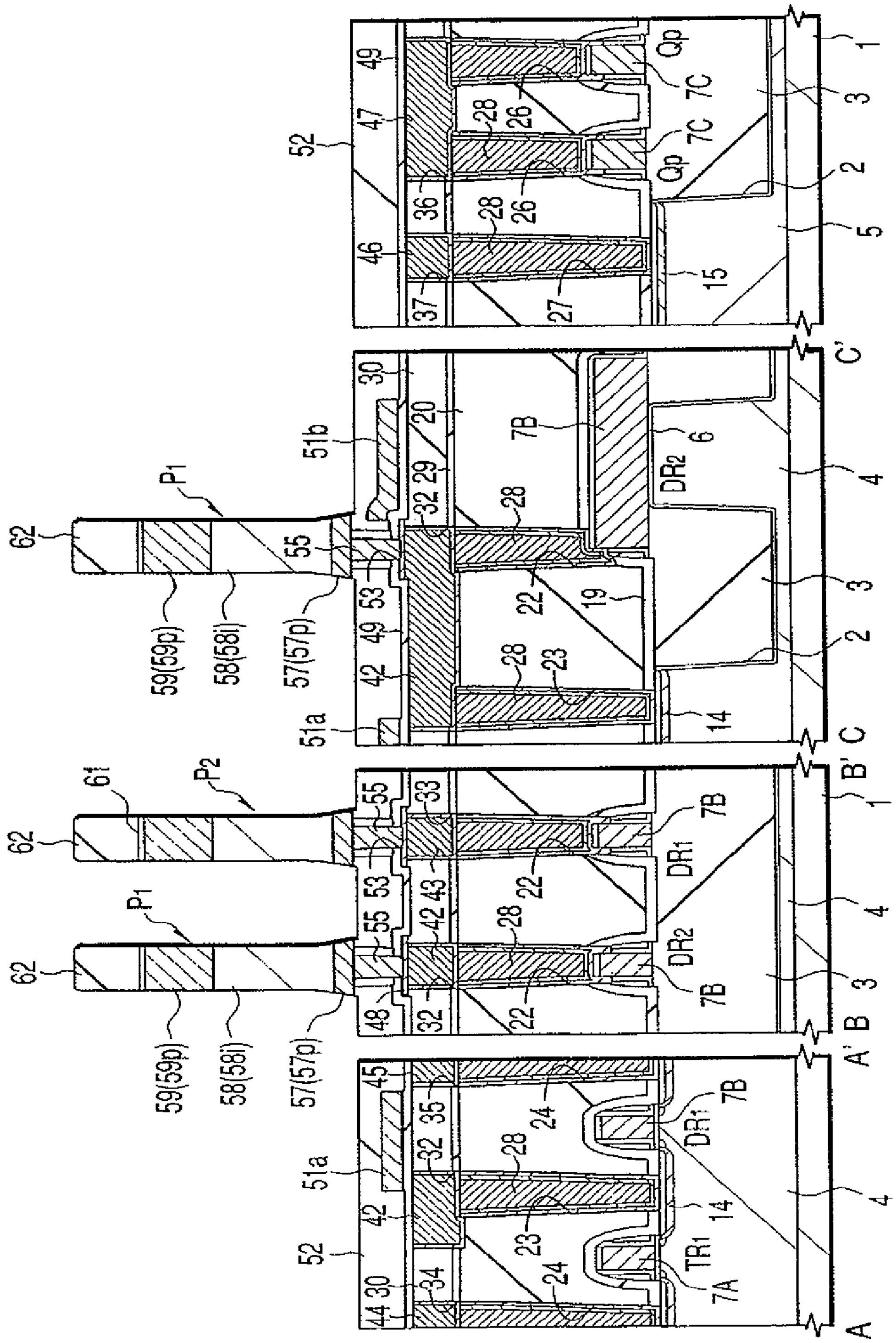
FIG. 38 is a fragmentary cross-sectional view showing a step in the method of manufacturing the SRAM of the present invention.

Next, as shown in FIGS. 37 and 38, the triple-layer silicon films (57*p*, 58*i* and 59*p*) are dry-etched using the silicon nitride films 62 as the masks. Consequently, rectangular pillar laminated bodies ($P_1$ and $P_2$) each constituted by a lower semiconductor layer 57 formed of the p type silicon film 57*p*, an intermediate semiconductor layer 58 formed of the silicon film 58*i*, and an upper semiconductor layer 59 formed of the p type silicon film 59*p* are formed.

The lower semiconductor layer 57 of each laminated body ($P_1$) constitutes the drain of the vertical MISFET ($SV_1$), and the upper semiconductor layer 59 constitutes the source thereof. The intermediate semiconductor layer 58 located between the lower semiconductor layer 57 and the upper semiconductor layer 59 substantially constitutes a substrate for the vertical MISFET ($SV_1$), and its side walls constitute a channel region. Further, the lower semiconductor layer 57 of the laminated body ($P_2$) constitutes the drain of the vertical MISFET ($SV_2$), and the upper semiconductor layer 59 constitutes the source thereof. The intermediate semiconductor layer 58 substantially constitutes a substrate for the vertical MISFET ($SV_2$), and its side walls constitute a channel region.

When viewed on a plane basis, the laminated body ($P_1$) is disposed so as to overlap with the through hole 53, the barrier layer 48, one end of the intermediate conductive layer 42, the contact hole 22 and one end of the gate electrode 78 of the drive MISFET $DR_2$, which are provided therebelow. The laminated body ($P_2$) is disposed so as to overlap with the through hole 53, the barrier layer 48, one end of the intermediate conductive layer 43, the contact hole 22 and one end of the gate electrode 7B of the drive MISFET $DR_1$, which are placed therebelow.

When the silicon films (57*p*, 58*i* and 59*p*) are dry-etched, tapers are formed at the bottoms of the sidewalls of the laminated bodies ($P_1$ and $P_2$), and the areas of the lower portions (lower semiconductor layers 57) of the laminated bodies ($P_1$ and $P_2$) may be set to be larger than the areas of the upper portions (intermediate semiconductor layers 58 and upper semiconductor layers 59), as shown in FIG. 38 by way of example. In doing so, a reduction in the area where the plug 55 lying in each through hole 53 and the lower semiconductor layer 57 contact, is prevented even when the position of each of the laminated bodies ($P_1$ and $P_2$) is displaced relative to the through hole 53 due to misalignment of the photomasks. It is therefore possible to suppress an increase in the resistance of contact between the lower semiconductor layer 57 and the plug 55.

When each of the laminated bodies ($P_1$ and $P_2$) is formed, tunnel insulating films of one or more layers, which are formed of a silicon nitride film or the like, may be provided in the neighborhood of an interface between the upper semiconductor layer 59 and the intermediate semiconductor layer 58, in the neighborhood of an interface between the lower semiconductor layer 57 and the intermediate semiconductor layer 58, and at part of the intermediate semiconductor layer 58, for example. In doing so, the impurities in the p type silicon films (57*p* and 59*p*) constituting the lower semiconductor layers 57 and the upper semiconductor layers 59 can be prevented from diffusing into the intermediate semiconductor layers 58. Therefore, the vertical MISFETs ($SV_1$ and $SV_2$) can be enhanced in performance. In this case, the tunnel insulating film is formed with a thin thickness (less than or equal to a few nm) equivalent to the extent that a reduction in drain current (Ids) of each of the vertical MISFET ($SV_1$ and $SV_2$) can be suppressed.

Figure 39:
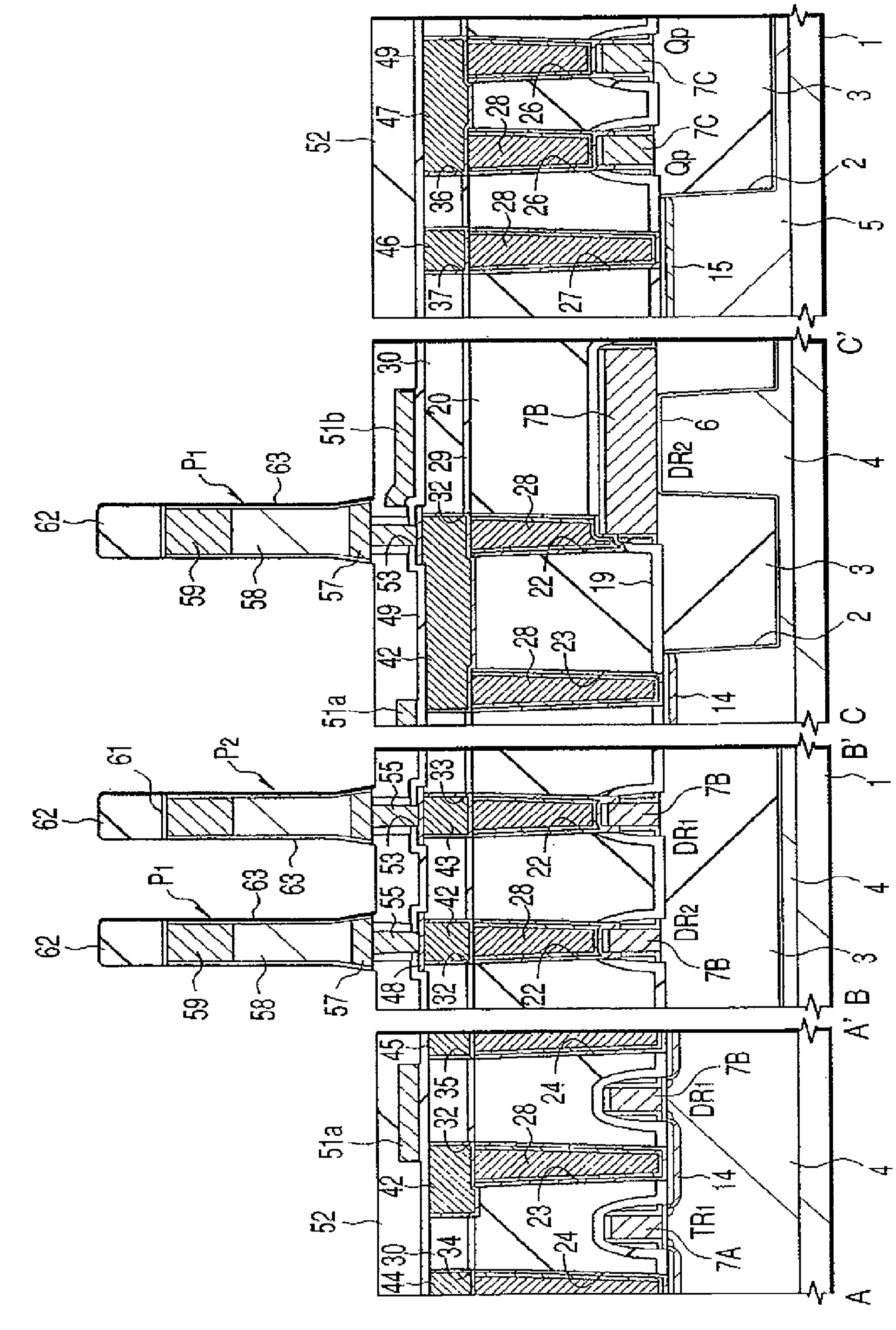
FIG. 39 is a fragmentary cross-sectional view illustrating a step in the method of manufacturing the SRAM of the present invention.

Next, as shown in FIG. 39, the substrate 1 is thermally-oxidized to form gate insulating films 63 each made up of a silicon oxide film on their corresponding surfaces of the sidewalls of the lower semiconductor layers 57, intermediate semiconductor layers 58 and upper semiconductor layers 59 constituting the laminated bodies ($P_1$ and $P_2$). Since, at this time, the gate drawing electrodes 51 made up of the polycrystal silicon film, which have been formed below the laminated bodies ($P_1$ and $P_2$), and the plugs 55 lying inside the through holes 53 are covered with the silicon oxide insulating films (silicon oxide film 52 and sidewall spacers 54), there is no possibility that the surfaces of the gate drawing electrodes 51 and plugs 55 will increase in resistance due to their oxidation. Since the silicon oxide films 61 are respectively formed between the laminated bodies ($P_1$ and $P_2$) and the silicon nitride films 62 placed thereabove, the gate insulating films 63 and the silicon nitride films 62 formed on the surfaces of the upper semiconductor layers 59 can be prevented from contacting each other, and a reduction in the withstand voltage of the gate insulating film 63 in the neighborhood of an upper end of each of the laminated bodies ($P_1$ and $P_2$) can be prevented.

While the gate insulating films 63 on the sidewalls of the laminated bodies ($P_1$ and $P_2$) are formed by low temperature thermal oxidation (e.g., wet oxidation) at less than or equal to 800° C., for example, no limitation is imposed on it. The gate insulating films 63 may be formed of, for example, a silicon oxide film deposited by the CVD method, or a high dielectric film such as hafnium oxide ($HfO_2$), tantalum oxide ($Ta_2O_5$) deposited by the CVD method. Since the gate insulating film 63 can be formed at a further low temperature in this case, variations in threshold voltages of the vertical MISFETs ($SV_1$ and $SV_2$) due to the diffusion or the like of the impurities can be suppressed.

Figure 40:
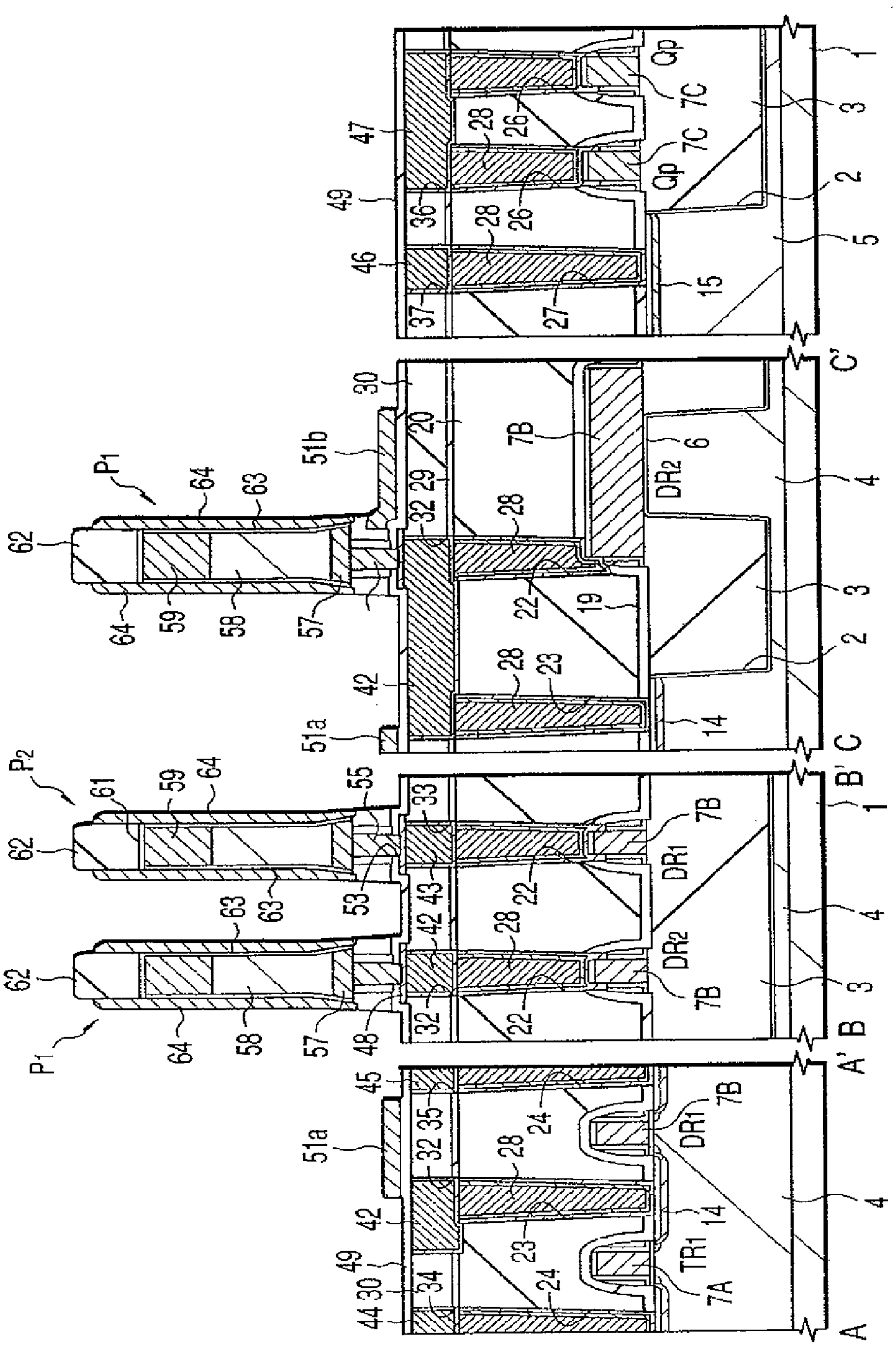
FIG. 40 is a fragmentary cross-sectional view illustrating a step in the method of manufacturing the SRAM of the present invention.

Next, as shown in FIG. 40, for example, a first polycrystal silicon layer 64 is formed on each of the rectangular pillar laminated bodies ($P_1$ and $P_2$) and the side walls of the silicon nitride film 62 provided thereabove as a conductive film which constitutes part of each of the gate electrodes (66) of the vertical MISFETs ($SV_1$ and $SV_2$). In order to form the first polycrystal silicon layer 64, a polycrystal silicon film is deposited over the silicon oxide film 52 by the CVD method. Thereafter, the polycrystal silicon film is etched anisotropically and thereby left in sidewall spacer form so as to surround the side walls of the rectangular pillar laminated bodies ($P_1$ and $P_2$) and the silicon nitride films 62. Thus, since the first polycrystal silicon layers 64 constituting parts of the gate electrodes (66) are formed on a self-alignment basis with respect to the rectangular pillar laminated bodies ($P_1$ and $P_2$) and the gate insulating films 63, the size of each memory cell can be scaled down. The polycrystal silicon film constituting the first polycrystal silicon layer 64 is doped with boron to bring its conductivity to a p type.

When the polycrystal silicon film is etched to form the first polycrystal silicon layers 64, the lower silicon oxide film 52 is etched in succession to the etching of the polycrystal silicon film. Thus, the silicon oxide films 52 in the areas excluding ones directly under the rectangular pillar laminated bodies ($P_1$ and $P_2$) are removed so that the gate drawing electrodes 51 and the silicon nitride films 49 are exposed. Incidentally, since the silicon oxide film 52 remains between the lower end of the first polycrystal silicon layer 64 and each gate drawing electrode 51, the first polycrystal silicon layer 64 and its corresponding gate drawing electrode 51 are not electrically connected.

Figure 41:
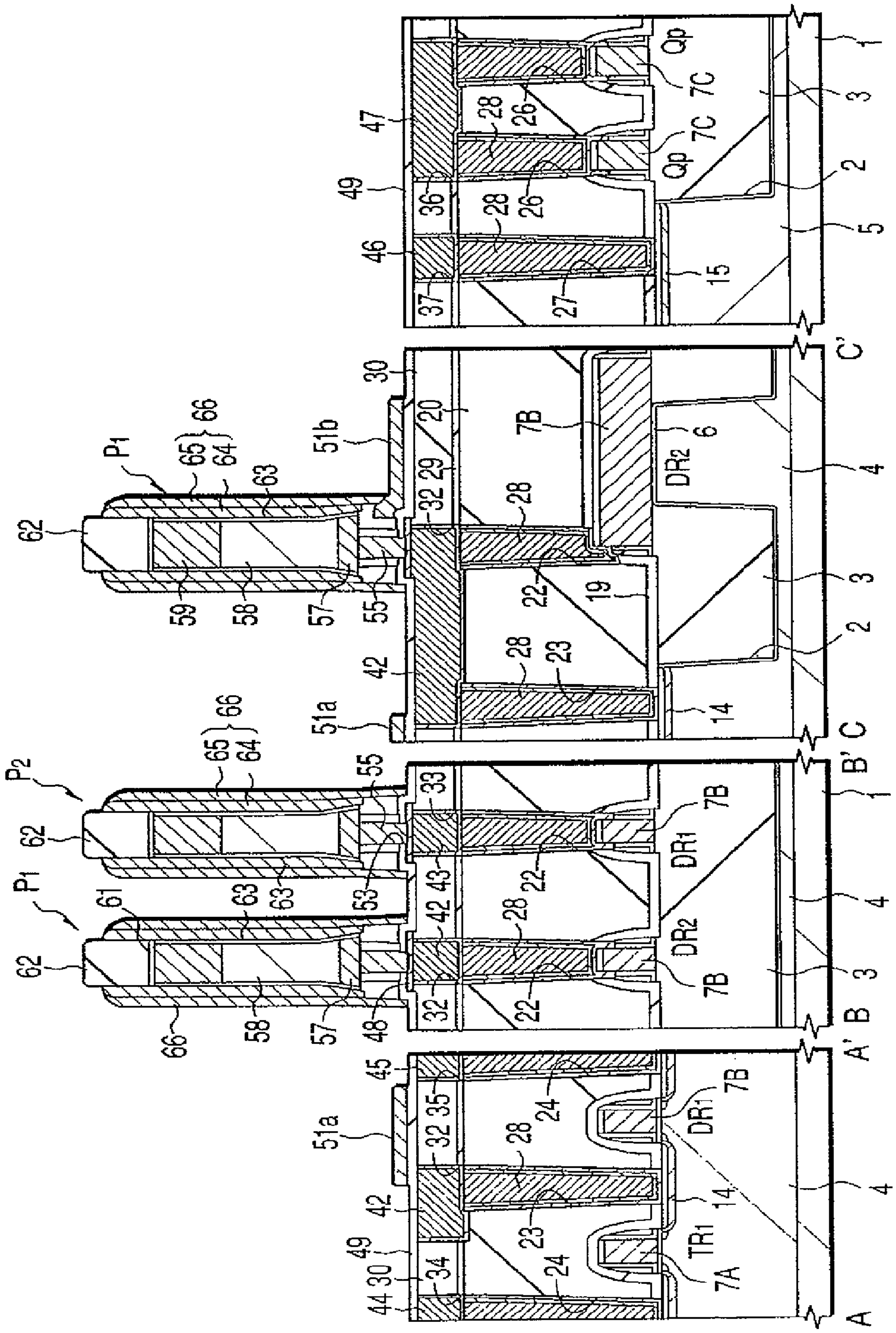
FIG. 41 is a fragmentary cross-sectional view depicting a step in the method of manufacturing the SRAM of the present invention.

Next, as shown in FIG. 41, for example, a second polycrystal silicon layer 65 is formed on the surface of each first polycrystal silicon layer 64 as a conductive film. In order to form the second polycrystal silicon layer 65, the surface of the substrate 1 is wet-cleaned with a cleaning fluid and thereafter a polycrystal silicon film is deposited over the corresponding silicon oxide film 52 by the CVD method, followed by anisotropic etching of the polycrystal silicon film, whereby the second polycrystal silicon layer 65 is left in sidewall spacer form so as to surround the surface of each first polycrystal silicon layer 64. The polycrystal silicon film constituting the second polycrystal silicon layer 65 is doped with boron to bring its conductivity to the p type.

Since the polycrystal silicon film constituting the second polycrystal silicon layer 65 is deposited even on the side walls of the silicon oxide films 52 left directly under the rectangular pillar laminated bodies ($P_1$ and $P_2$) and the surfaces of the gate drawing electrodes 51, the lower end of the second polycrystal silicon layer 65 is brought into contact with the surface of each gate drawing electrode 51 when the polycrystal silicon film is anisotropically etched.

Thus, since the second polycrystal silicon layer 65 whose lower end is electrically connected to each gate drawing electrode 51, is formed on a self-alignment basis with respect to the first polycrystal silicon layer 64, the size of the memory cell can be scaled down.

Owing to the processes described up to now, the gate electrodes 66 of the vertical MISFETs ($SV_1$ and $SV_2$) each formed of a laminated film of the first polycrystal silicon layer 64 and second polycrystal silicon film 65 are formed on their corresponding side walls of the rectangular pillar laminated bodies ($P_1$ and $P_2$) and silicon nitride films 62. Each of the gate electrodes 66 is electrically connected to its corresponding gate drawing electrode 51 through the second polycrystal silicon film 65 constituting part thereof.

Namely, the first polycrystal silicon layer 64 and second polycrystal silicon film 65 constituting the gate electrode 66 of the vertical MISFET ($SV_1$) are electrically connected to their corresponding gate drawing electrode 51*b* at the lower ends thereof. The first polycrystal silicon layer 64 and second polycrystal silicon film 65 constituting the gate electrode 66 of the vertical MISFET ($SV_2$) are electrically connected to their corresponding gate drawing electrode 51*a* at the lower ends thereof.

Thus, the first polycrystal silicon layers 64, which constitute parts of the gate electrodes (66), are formed in sidewall spacer form on a self-alignment basis with respect to the rectangular pillar laminated bodies ($P_1$ and $P_2$) and gate insulating films 63. The second polycrystal silicon layers 65 whose lower ends are electrically connected to the gate drawing electrodes 51*a* and 51*b* are formed on a self-alignment basis in sidewall spacer form with respect to the first polycrystal silicon layer 64. Thus, the size of the memory cell can be scaled down. Namely, the gate electrodes (66) are formed on a self-alignment basis with respect to the rectangular pillar laminate bodies ($P_1$ and $P_2$) and gate insulating films 63. Further, the gate electrodes (66) are respectively connected to the gate drawing electrodes 51*a* and 51*b* on a self-alignment basis. It is thus possible to scale down the size of the memory cell.

When each gate electrode 66 is made up of the two-layer conductive films (first polycrystal silicon layer 64 and second polycrystal silicon film 65) as described above, the gate electrode 66 may also be brought to a low-resistance silicide structure or polymetal structure by use of a W silicide film or a W film in place of the second polycrystal silicon film 65.

Figure 42:
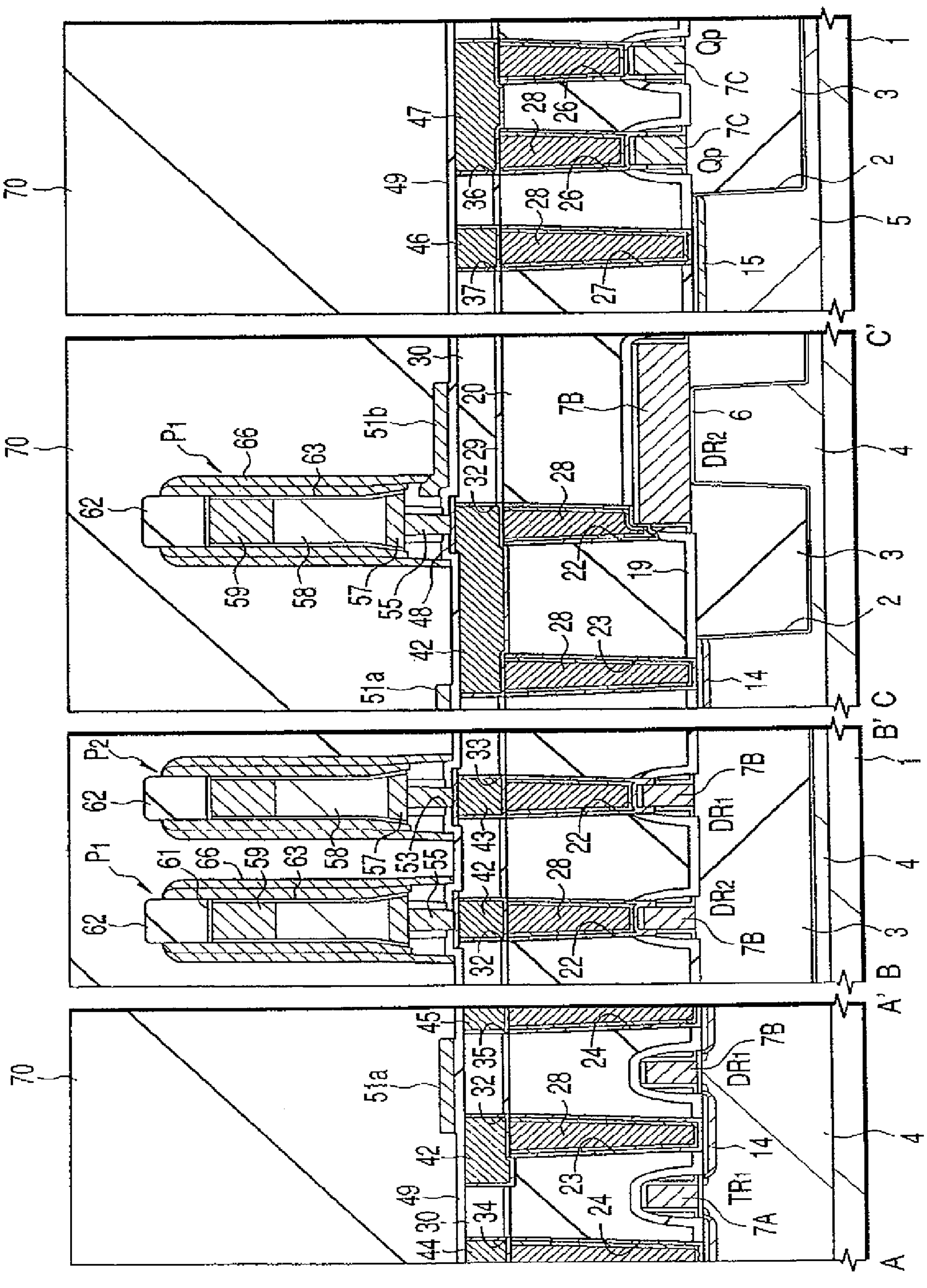
FIG. 42 is a fragmentary cross-sectional view showing a step in the method of manufacturing the SRAM of the present invention.

Next, as shown in FIG. 42, a silicon oxide film 70 is deposited over the substrate 1 as an insulating film by the CVD method, for example, and thereafter its surface is planarized by the CMP method. The silicon oxide film 70 is deposited to a large thickness such that the height of the planarized surface becomes higher than the surface of each silicon nitride film 62, thereby avoiding cutting or scraping of the surface of the silicon nitride film 62 at the time of its planarizing process.

Figure 43:
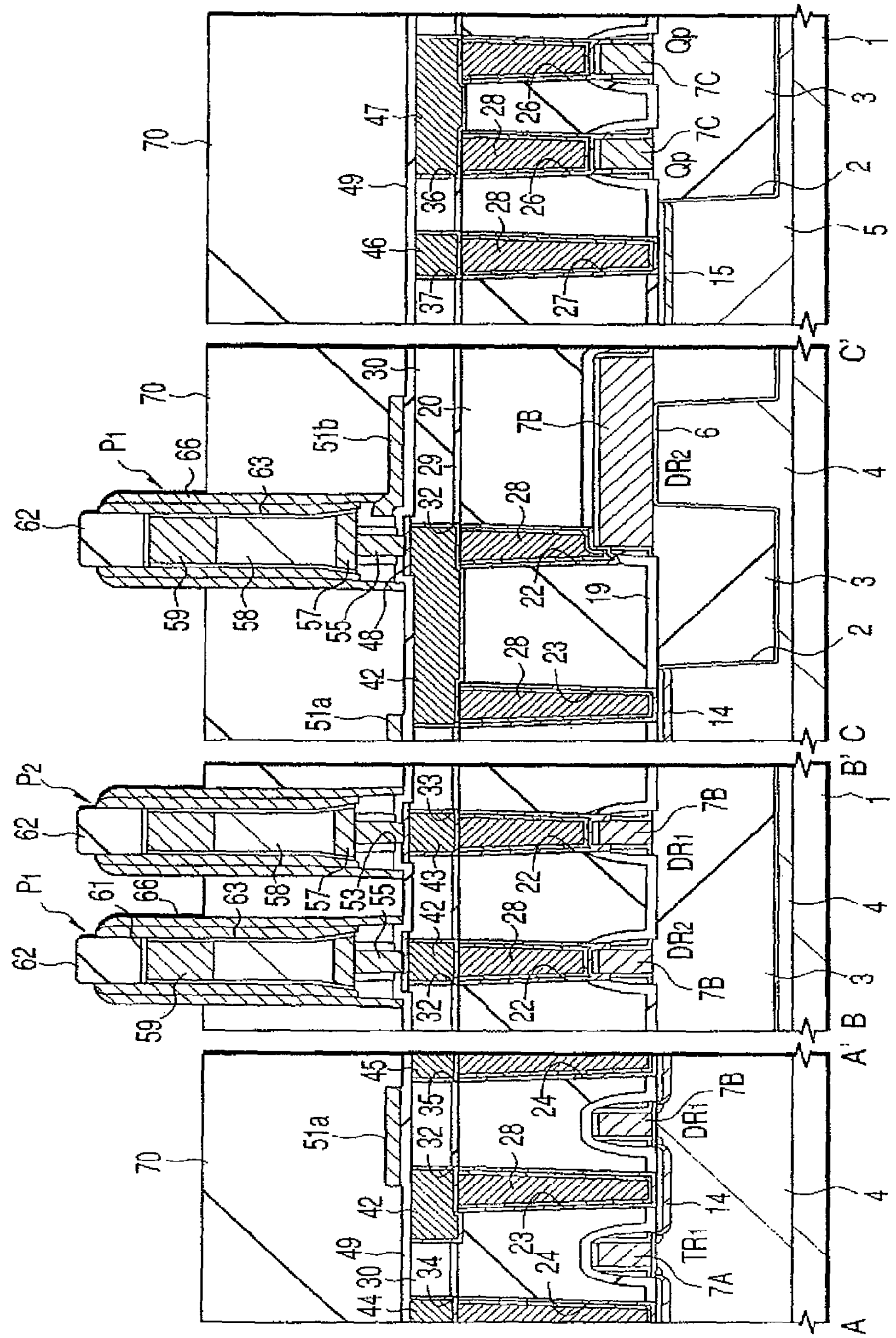
FIG. 43 is a fragmentary cross-sectional view illustrating a step in the method of manufacturing the SRAM showing the one embodiment of the present invention.

Next, as shown in FIG. 43, the silicon oxide film 70 is etched to withdraw its surface to the midstream portions of the laminated bodies ($P_1$ and $P_2$). Thereafter, the gate electrodes 66 formed on the side walls of the laminated bodies ($P_1$ and $P_2$) and silicon nitride films 62 are etched to withdraw their upper ends downwards as shown in FIG. 44.

The etching of each gate electrode 66 is done to prevent a short developed between a source voltage line (90) formed over the laminated bodies ($P_1$ and $P_2$) in a subsequent process and the gate electrode 66. Thus, the gate electrode 66 is withdrawn until its upper end is located below the upper end of each upper semiconductor layer 59. However, in order to prevent an offset between the gate electrode 66 and the upper semiconductor layer (source) 59, the amount of etching is controlled in such a manner that the upper end of each gate electrode 66 is located above the upper end of the intermediate semiconductor layer 58.

Figure 44:
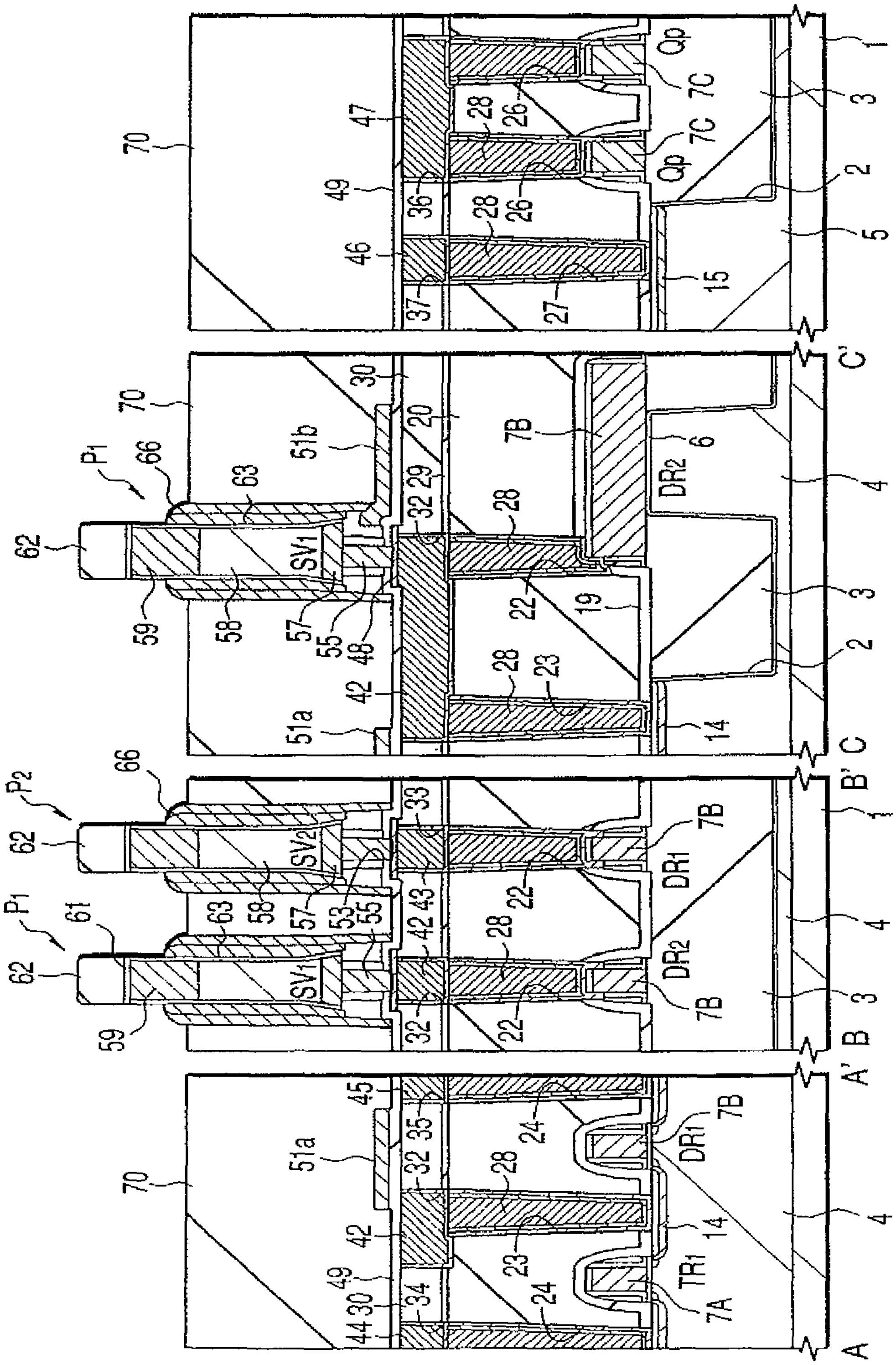
FIG. 44 is a fragmentary cross-sectional view depicting a step in the method of manufacturing the SRAM of the present invention.
Figure 45:
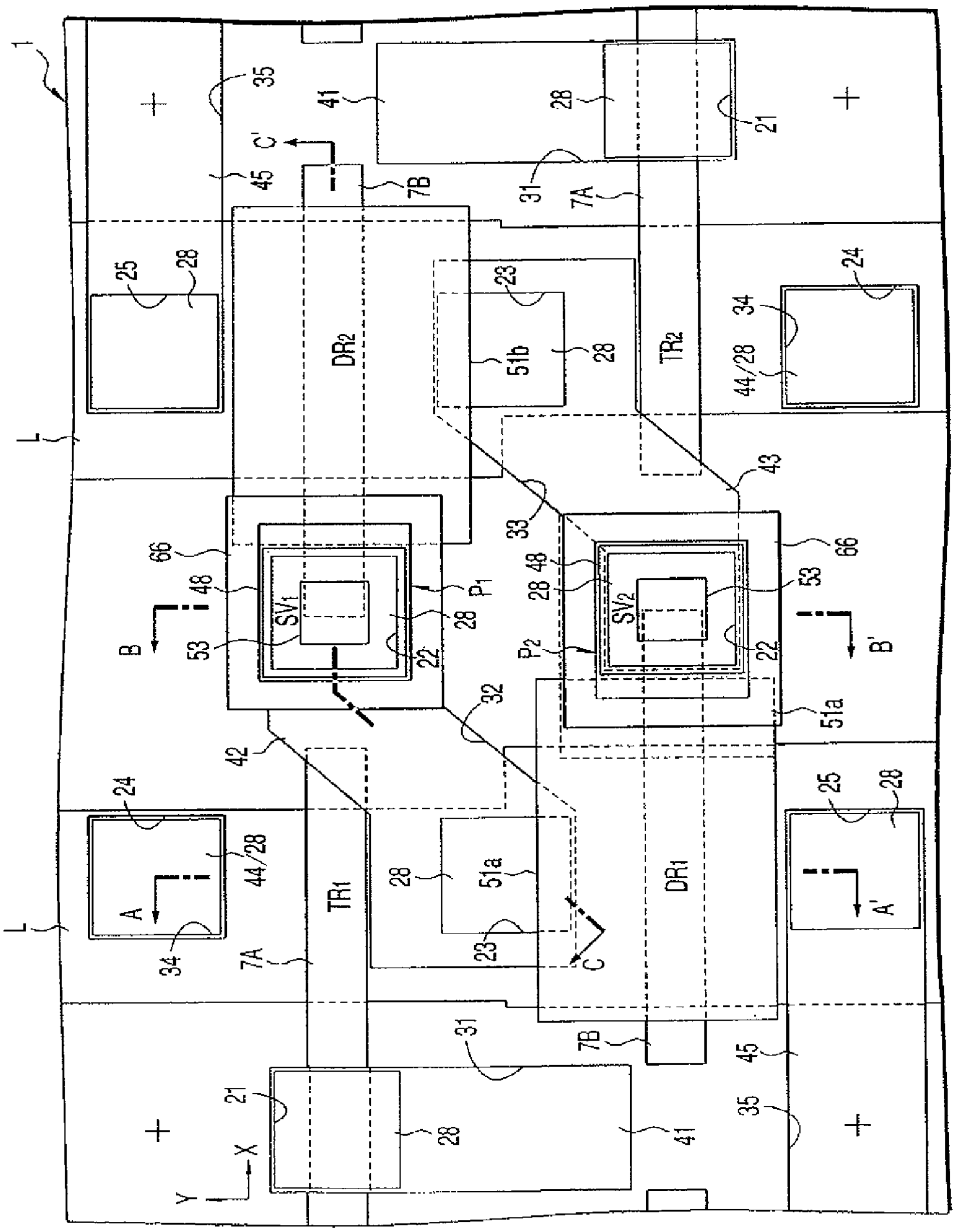
FIG. 45 is a fragmentary plan view illustrating a step in the method of manufacturing the SRAM of the present invention.

According to the processes described up to now, as shown in FIGS. 44 and 45, the laminated bodies ($P_1$ and $P_2$) made up of the lower semiconductor layers (drains) 57, intermediate semiconductor layers (substrate) 58, and the upper semiconductor layers (sources), and the p channel type vertical MISFETs ($SV_1$ and $SV_2$) having the gate insulating films 63 and the gate electrodes 66 are formed in their corresponding memory cell areas of the memory array.

Figure 46:
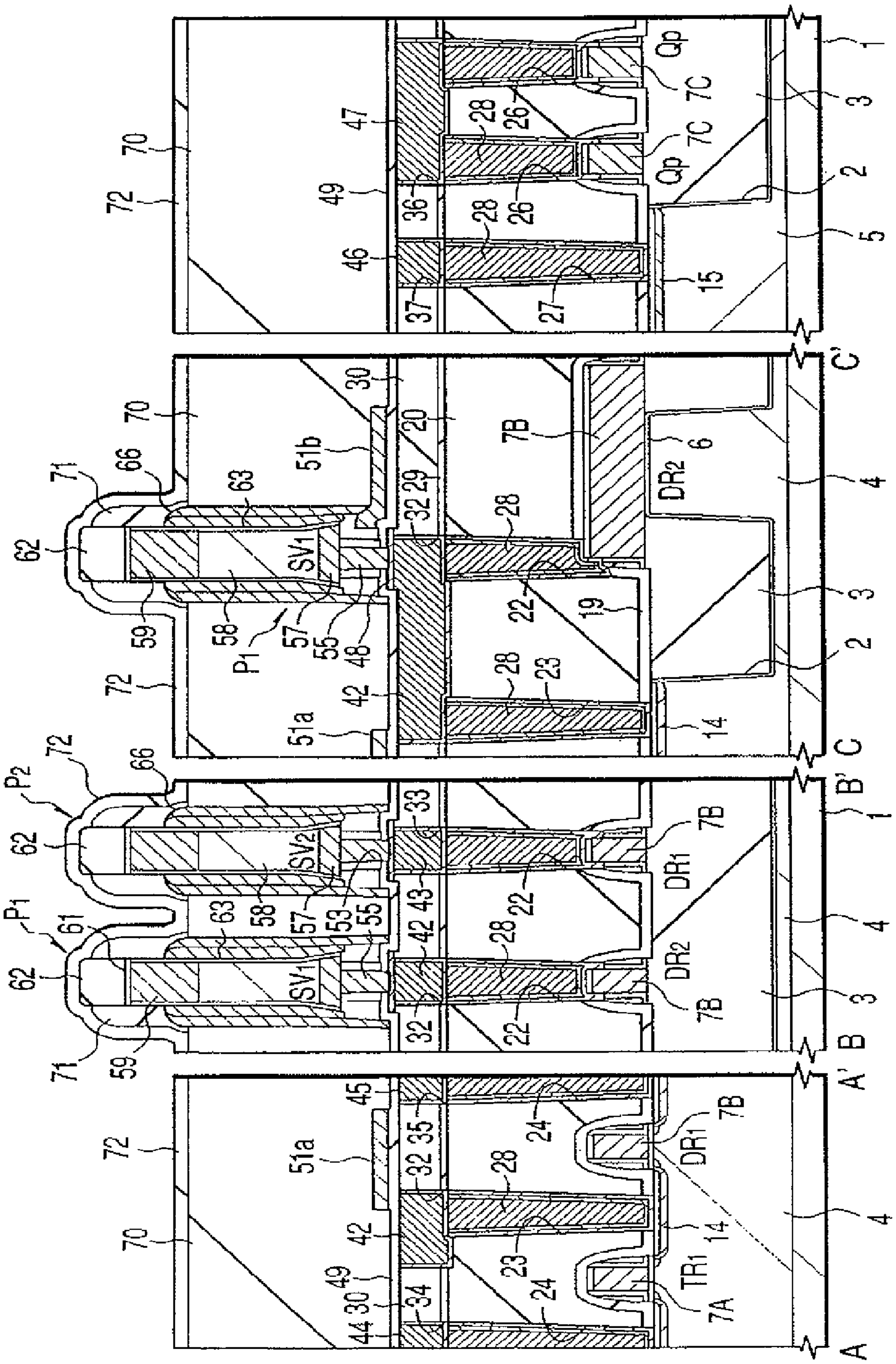
FIG. 46 is a fragmentary cross-sectional view depicting a step in the method of manufacturing the SRAM showing the one embodiment of the present invention.

Next, as shown in FIG. 46, sidewall spacers 71 each formed of a silicon oxide film are formed on their corresponding side walls of the gate electrodes 66 of the vertical MISFETs ($SV_1$ and $SV_2$), the upper semiconductor layers 59 and the silicon nitride films 62 located thereabove, which have been exposed to above the silicon oxide film 70. Thereafter, a silicon nitride film 72 is deposited over the silicon oxide film 70 by the CVD method. The sidewall spacers 71 are formed by anisotropically etching the silicon oxide film deposited by the CVD method.

Figure 47:
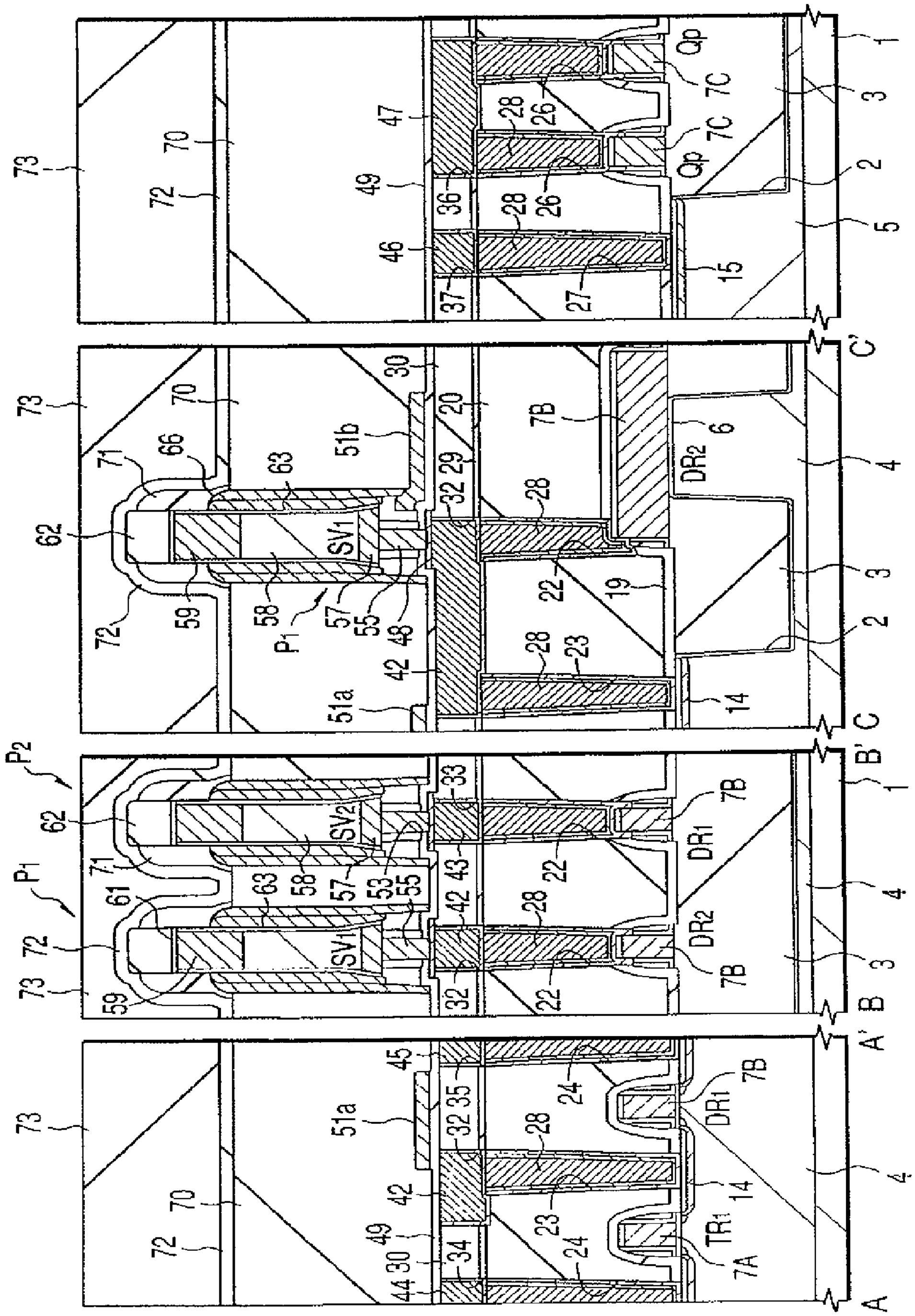
FIG. 47 is a fragmentary cross-sectional view showing a step in the method of manufacturing the SRAM of the present invention.

Next, as shown in FIG. 47, a silicon oxide film 73 is deposited over the silicon nitride film 72 by the CVD method. Thereafter, the surface of the silicon oxide film 73 is planarized by the CMP method.

Figure 48:
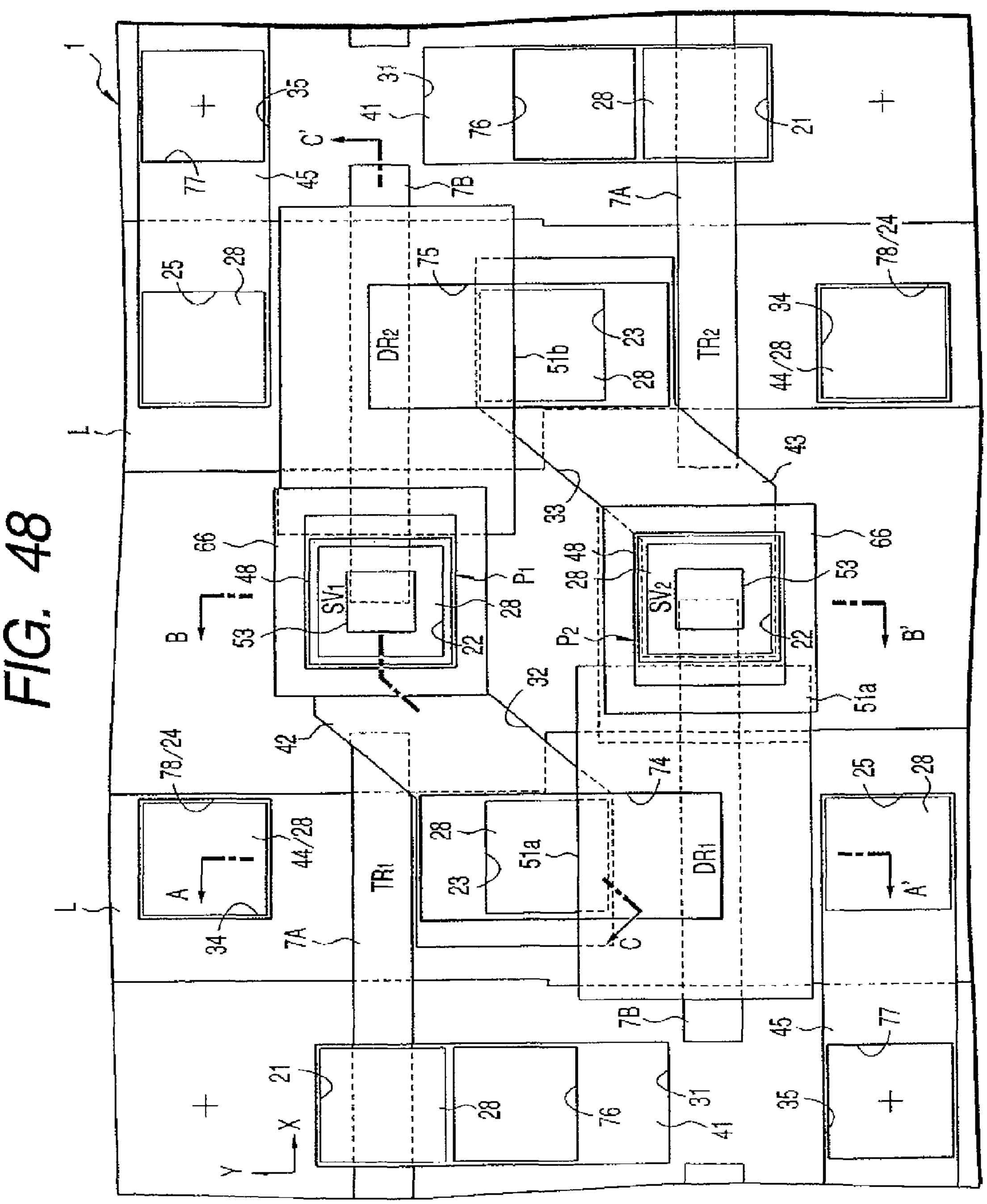
FIG. 48 is a fragmentary plan view illustrating a step in the method of manufacturing the SRAM of the present invention.
Figure 49:
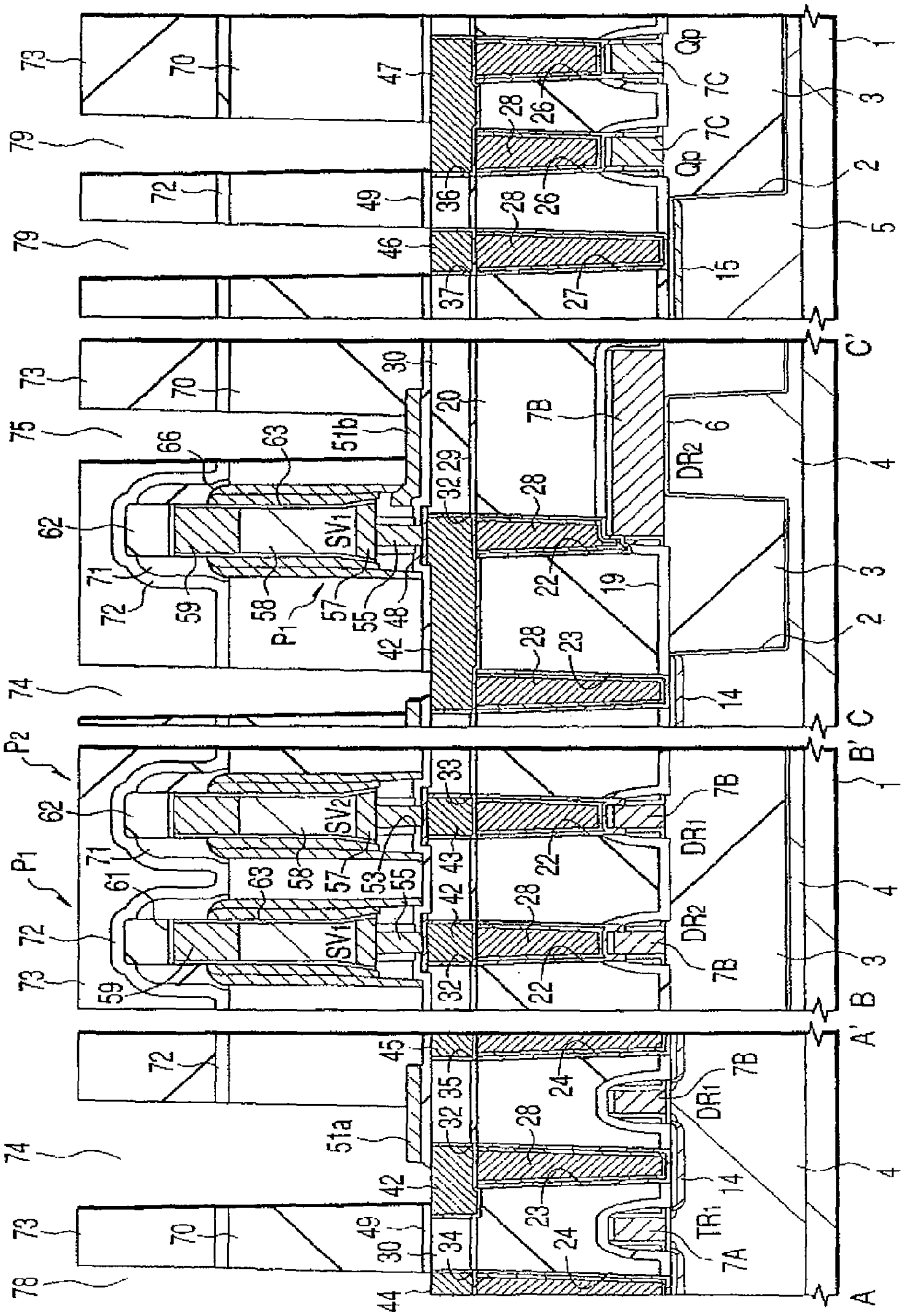
FIG. 49 is a fragmentary cross-sectional view depicting a step in the method of manufacturing the SRAM of the present invention.

Next, as shown in FIGS. 48 and 49, the silicon oxide film 73, the silicon nitride film 72 and the silicon oxide film 70 are dry-etched using a photoresist film as a mask to thereby form a through hole 74 through which the surfaces of the gate drawing electrode 51 and intermediate conductive layer 42 are exposed, and a through hole 75 through which the surfaces of the gate drawing electrode 51 and intermediate conductive layer 43 are exposed. As shown in FIG. 48 at this time as well, through holes 76, 77 and 78, through which the surfaces of the respective intermediate conductive layers 41, 44 and 45 are exposed, are formed, and a through hole 79, through which the surfaces of the first layer wirings 46 and 47 in the peripheral circuit are exposed, is formed.

Figure 50:
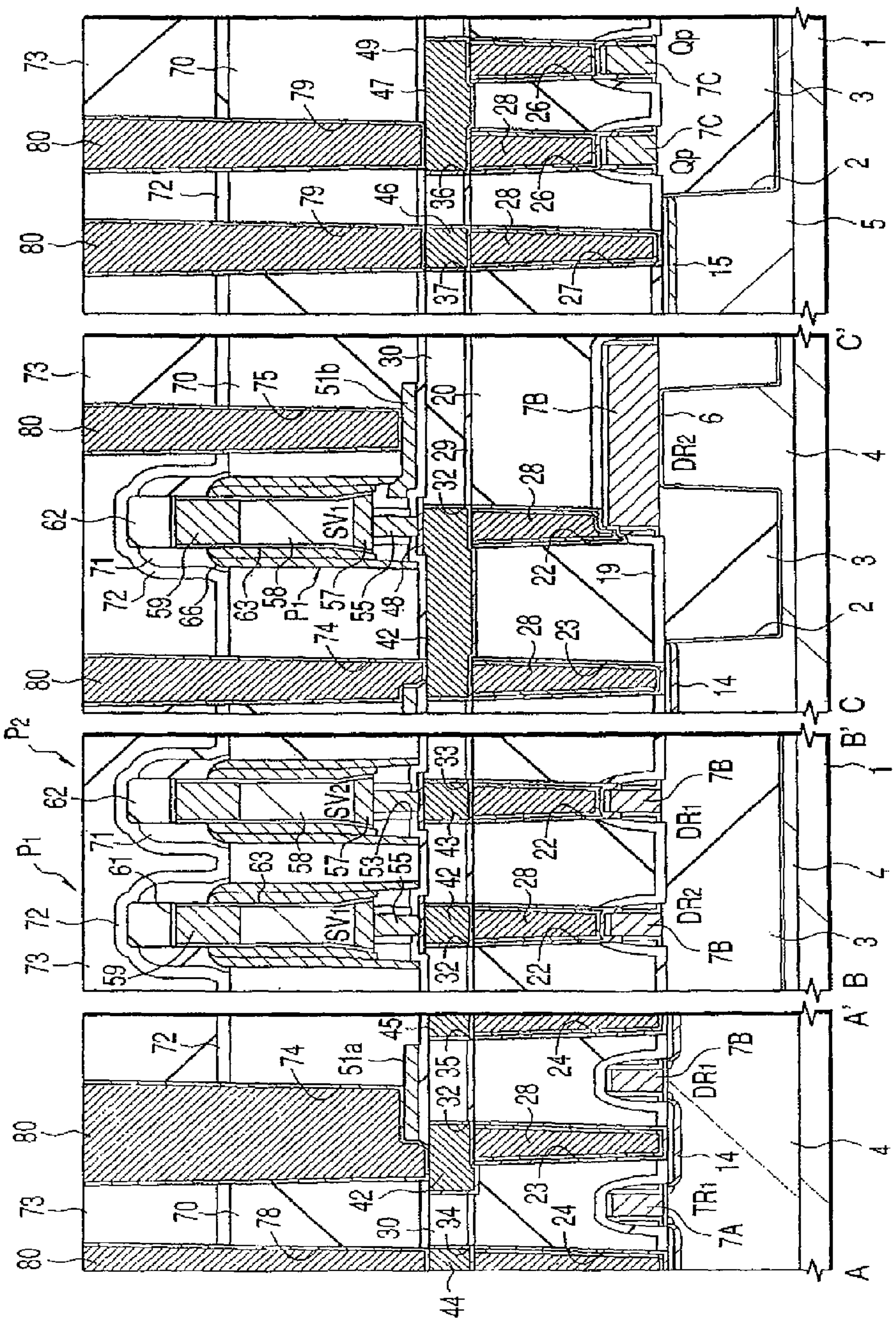
FIG. 50 is a fragmentary cross-sectional view illustrating a step in the method of manufacturing the SRAM of the present invention.

Next, as shown in FIG. 50, plugs 80 are formed inside the through holes 74 through 79. In order to form the plugs 80, for example, a Ti film and a TiN film are deposited on the silicon oxide film 73 including the interiors of the through holes 74 through 79 by the sputtering method. Subsequently, a TiN film and a W film are deposited by the CVD method, followed by removal of the TiN film and Ti film lying outside the through holes 74 through 79 by the CMP method.

According to the processes described up to here, the gate electrode 66 of the vertical MISFET ($SV_2$), the $n^+$ type semiconductor region 14 constituting one of the source and drain of the transfer MISFET ($TR_1$) and the source of the drive MISFET ($DR_1$), and the gate electrode 7B of the drive MISFET ($DR_2$) are electrically connected to one another via the gate drawing electrode 51*a*, the plugs 80, the intermediate conductive layer 42, and the plugs 28. On the other hand, the gate electrode 66 of the vertical MISFET ($SV_1$), the $n^+$ type semiconductor region 14 constituting one of the source and drain of the transfer MISFET ($TR_2$) and the source of the drive MISFET ($DR_2$), and the gate electrode 7B of the drive MISFET ($DR_1$) are electrically connected to one another via the gate drawing electrode 51*b*, the plugs 80, the intermediate conductive layer 43, and the plugs 28.

According to the processes described up to now, the corresponding memory cell is substantially completed which comprises the two transfer MISFETs ($TR_1$ and $TR_2$), two drive MISFETs ($DR_1$ and $DR_2$) and two vertical MISFETs ($SV_1$ and $SV_2$).

Figure 51:
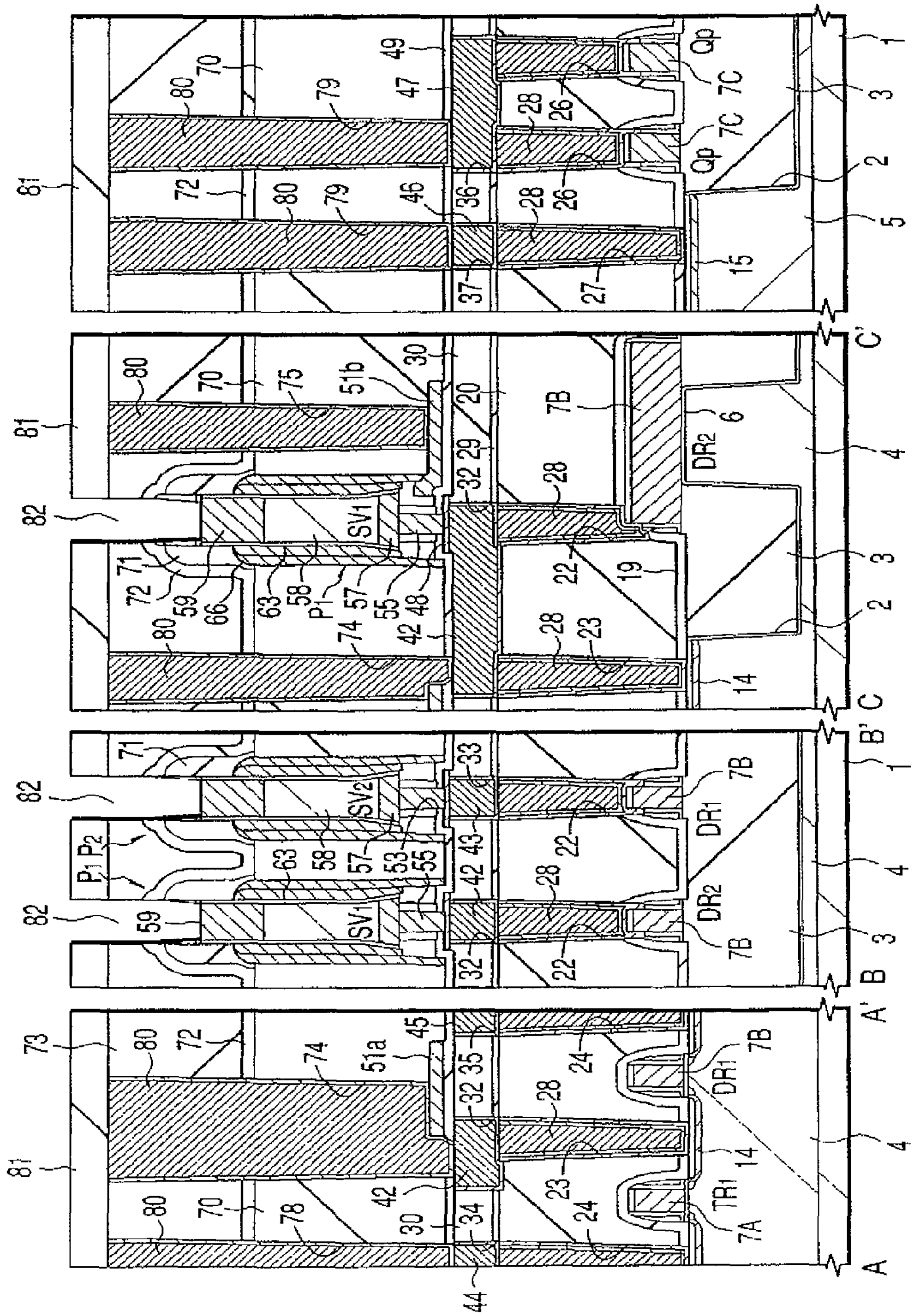
FIG. 51 is a fragmentary cross-sectional view depicting a step in the method of manufacturing the SRAM of the present invention.

Next, as shown in FIG. 51, a silicon oxide film 81 is deposited over the silicon oxide film 73 as an insulating film by the CVD method. Thereafter, the silicon oxide films 81 and 73 and the silicon nitride films 72 and 62 placed above the laminated bodies ($P_1$ and $P_2$) are removed by dry etching using a photoresist film as a mask to thereby form through holes 82 through which the upper semiconductor layers (sources) 59 of the vertical MISFETs ($SV_1$ and $SV_2$) are exposed.

Figure 52:
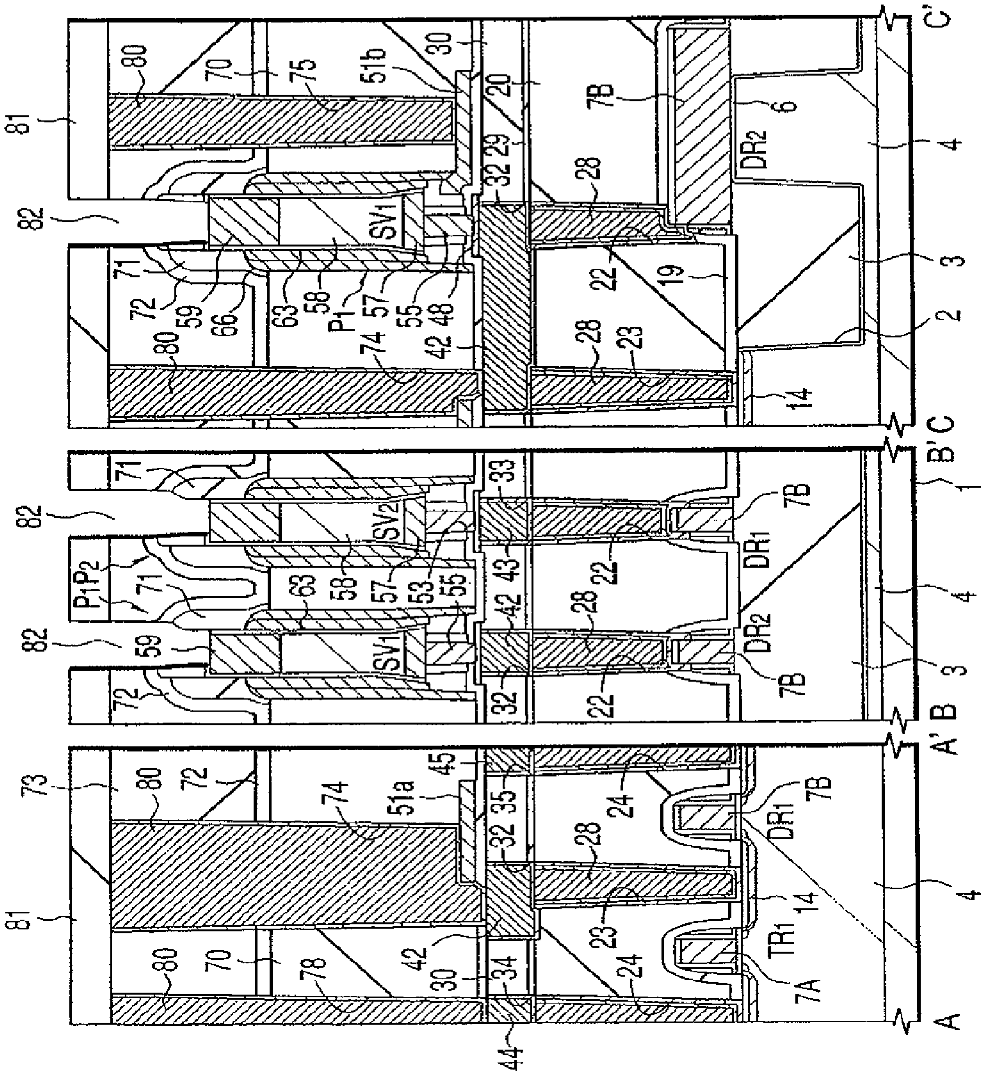
FIG. 52 is a fragmentary cross-sectional view showing a step in the method of manufacturing the SRAM of the present invention.

Upon execution of the above described dry etching, the etching is first stopped once at the stage where the silicon oxide films 81 and 73 above the laminated bodies ($P_1$ and $P_2$) are removed, and the silicon nitride films 72 and 62 are next etched. Since, at this time, the sidewall spacers 71 each formed of the silicon oxide film are formed on their corresponding side walls of the silicon nitride films 62 and upper semiconductor layers 59, as shown in FIG. 52, even when the relative positions of the through holes 82 and the upper semiconductor layers 59 are displaced in the direction taken along line B-B', for example, the upper portions of the gate electrodes 66 are protected by the sidewall spacers 71 when the silicon nitride films 72 and 62 are etched, so that the gate electrodes 66 are prevented from being exposed.

Figure 53:
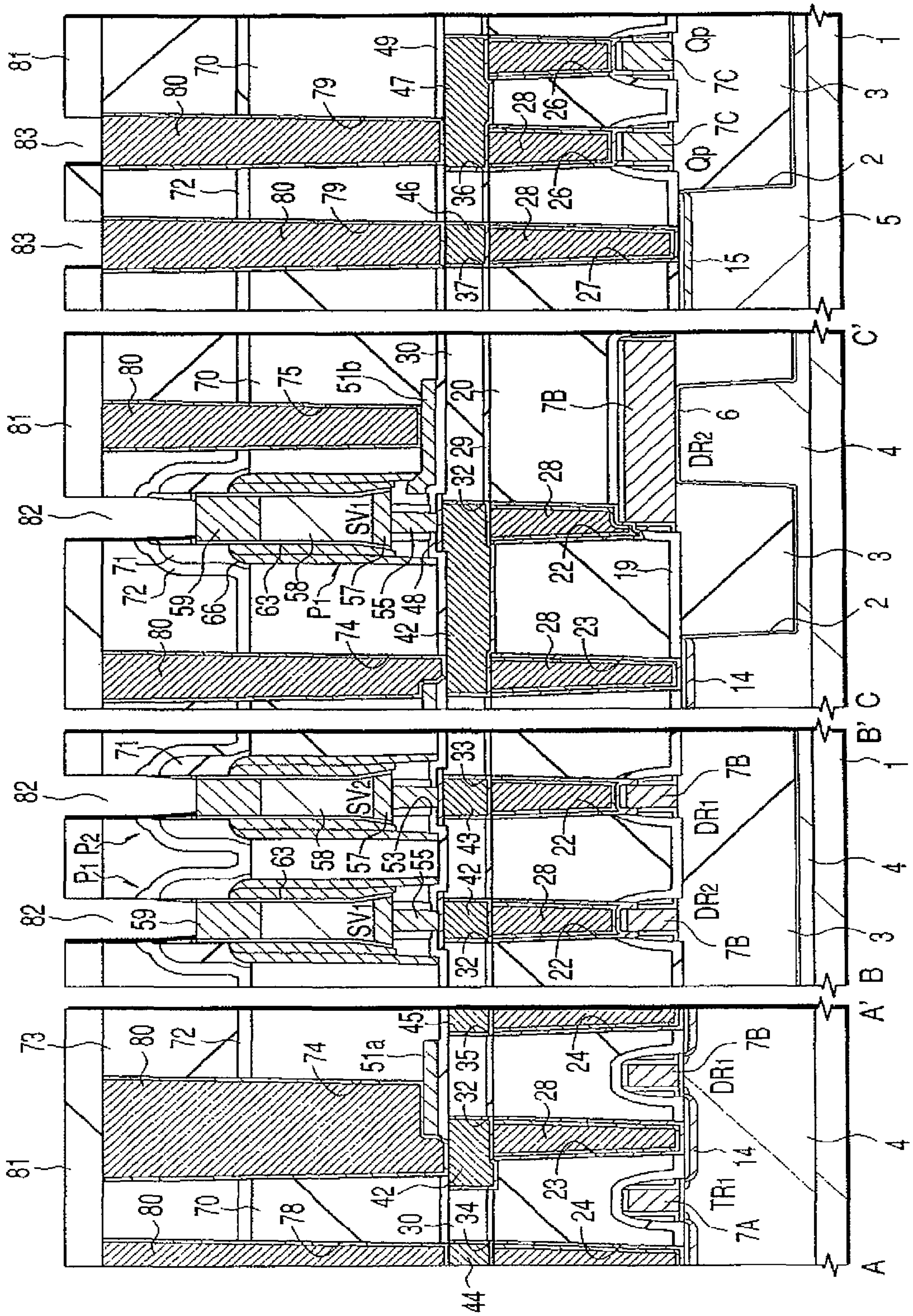
FIG. 53 is a fragmentary cross-sectional view illustrating a step in the method of manufacturing the SRAM of the present invention.
Figure 54:
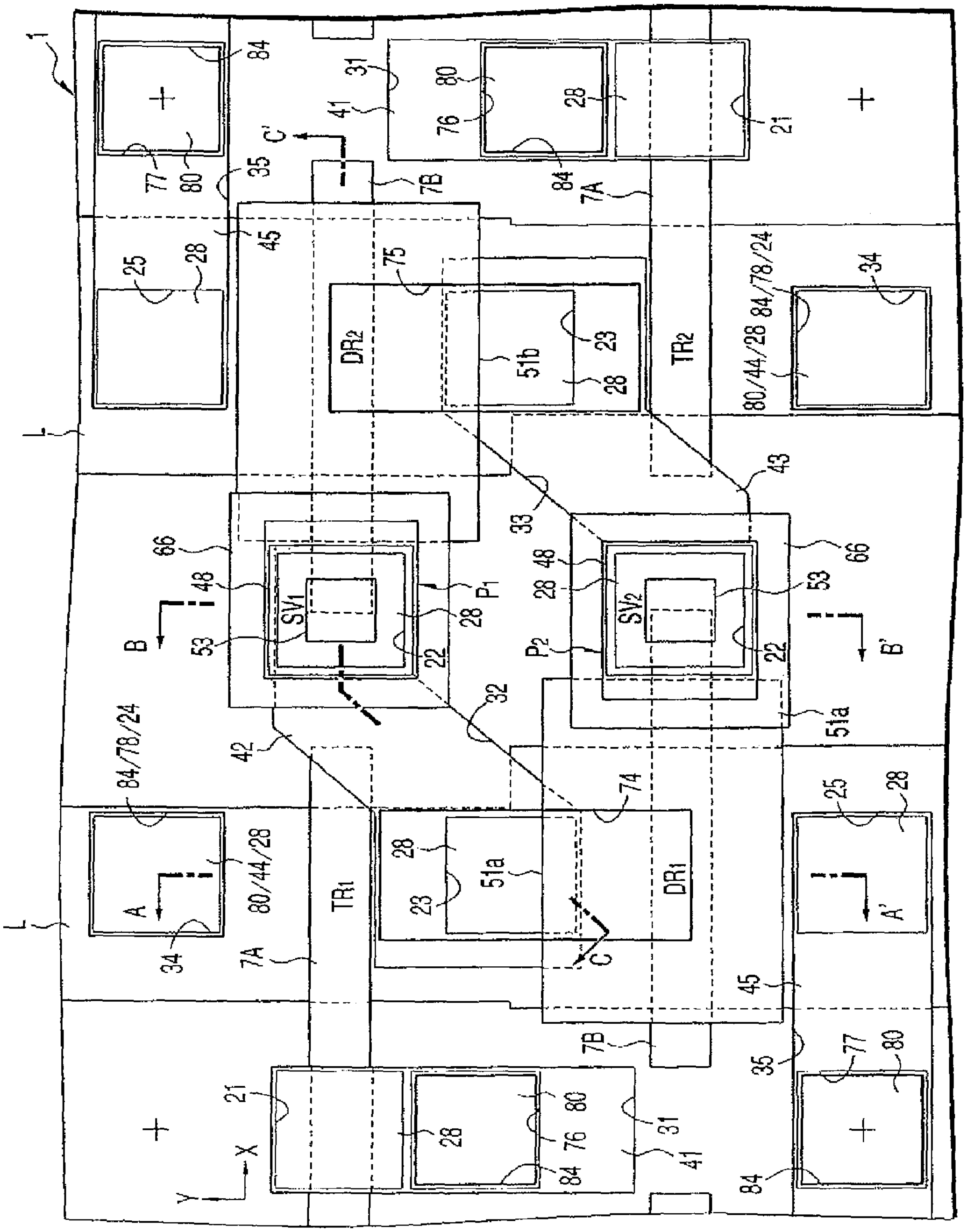
FIG. 54 is a fragmentary plan view depicting a step in the method of manufacturing the SRAM of the present invention.

Next, as shown in FIG. 53, the silicon oxide film 81 covering the upper portions of the through holes 79 in the peripheral circuit is etched to define through holes 83, thereby exposing the surfaces of the plugs 80 embedded in the through holes 79. Further, the silicon oxide film 81 covering the upper portions of the through holes 76 through 78 defined in the memory array is etched to form through holes 84 (see FIG. 54), whereby the surfaces of the plugs 80 embedded in the through holes 76 through 78 are exposed.

Figure 55:
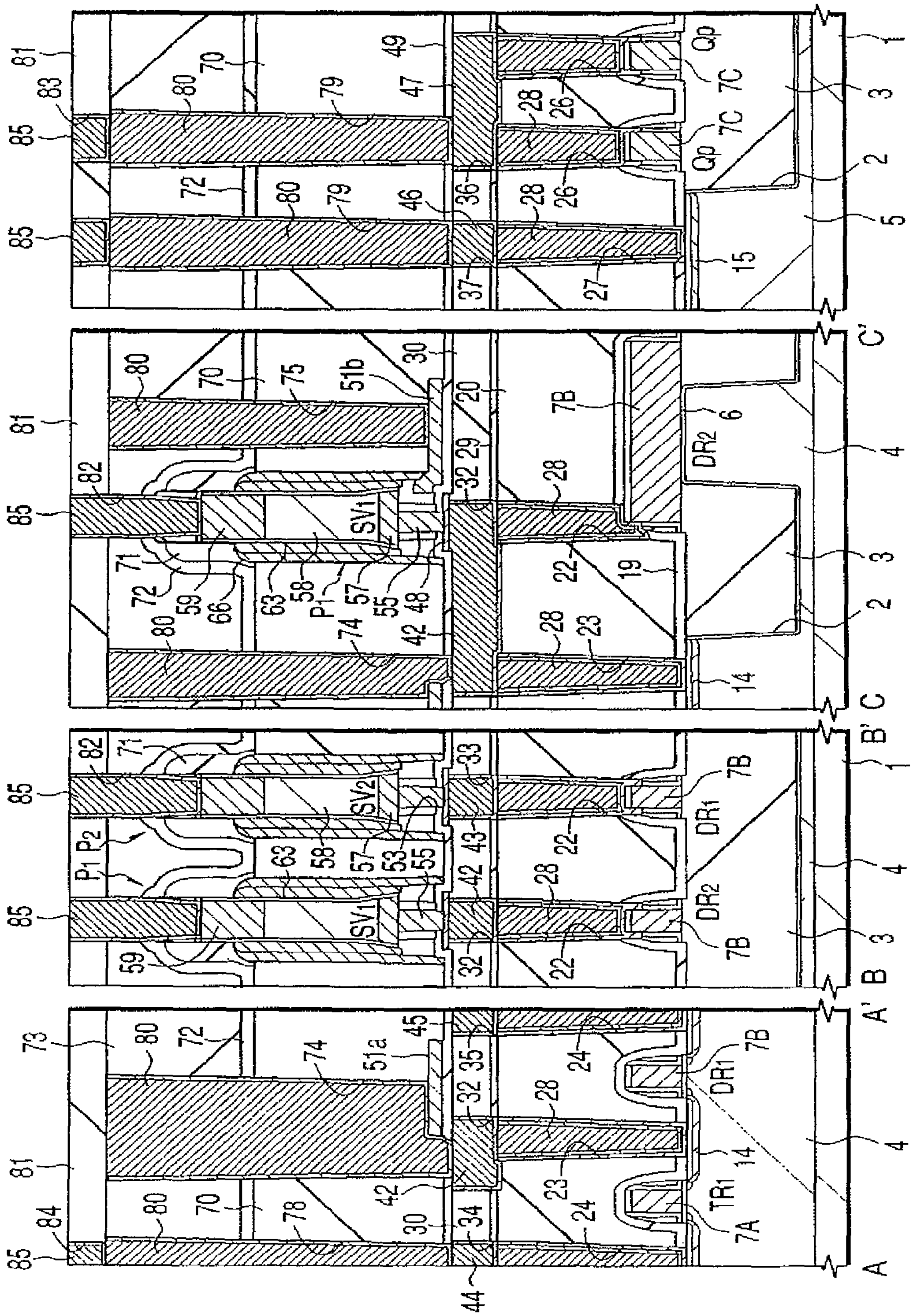
FIG. 55 is a fragmentary cross-sectional view showing a step in the method of manufacturing the SRAM of the present invention.

Next, as shown in FIG. 55, plugs 85 are formed inside the through holes 82, 83 and 84. In order to form the plugs 85, for example, a TiN film is deposited on the silicon oxide film 81 including the interiors of the through holes 82, 83 and 84 by the sputtering method, and a Ti N film and a W film are subsequently deposited thereon by the CVD method. Afterwards, the TiN film and W film lying outside the through holes 82, 83 and 84 are removed by the CMP method.

Figure 56:
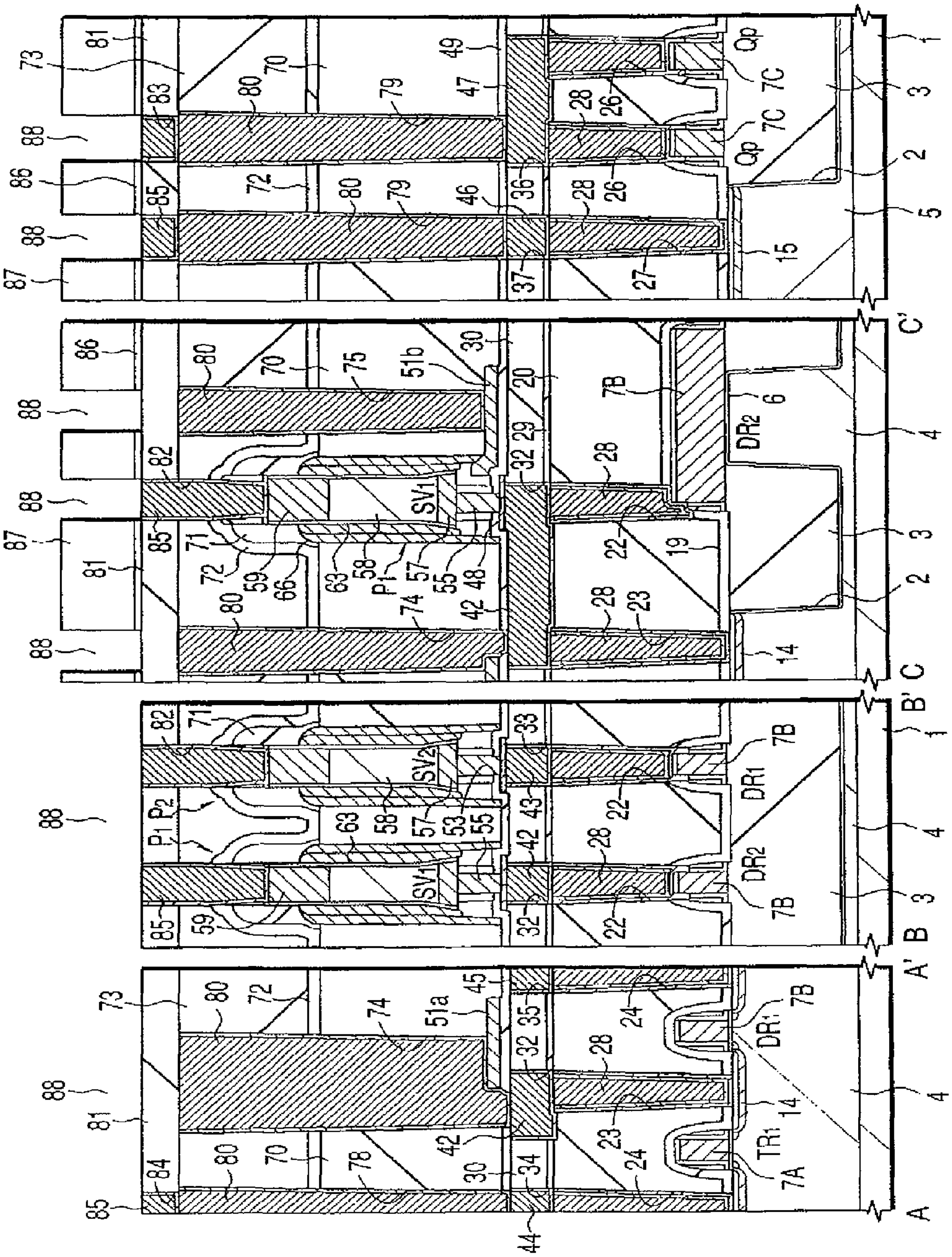
FIG. 56 is a fragmentary cross-sectional view illustrating a step in the method of manufacturing the SRAM of the present invention.
Figure 57:
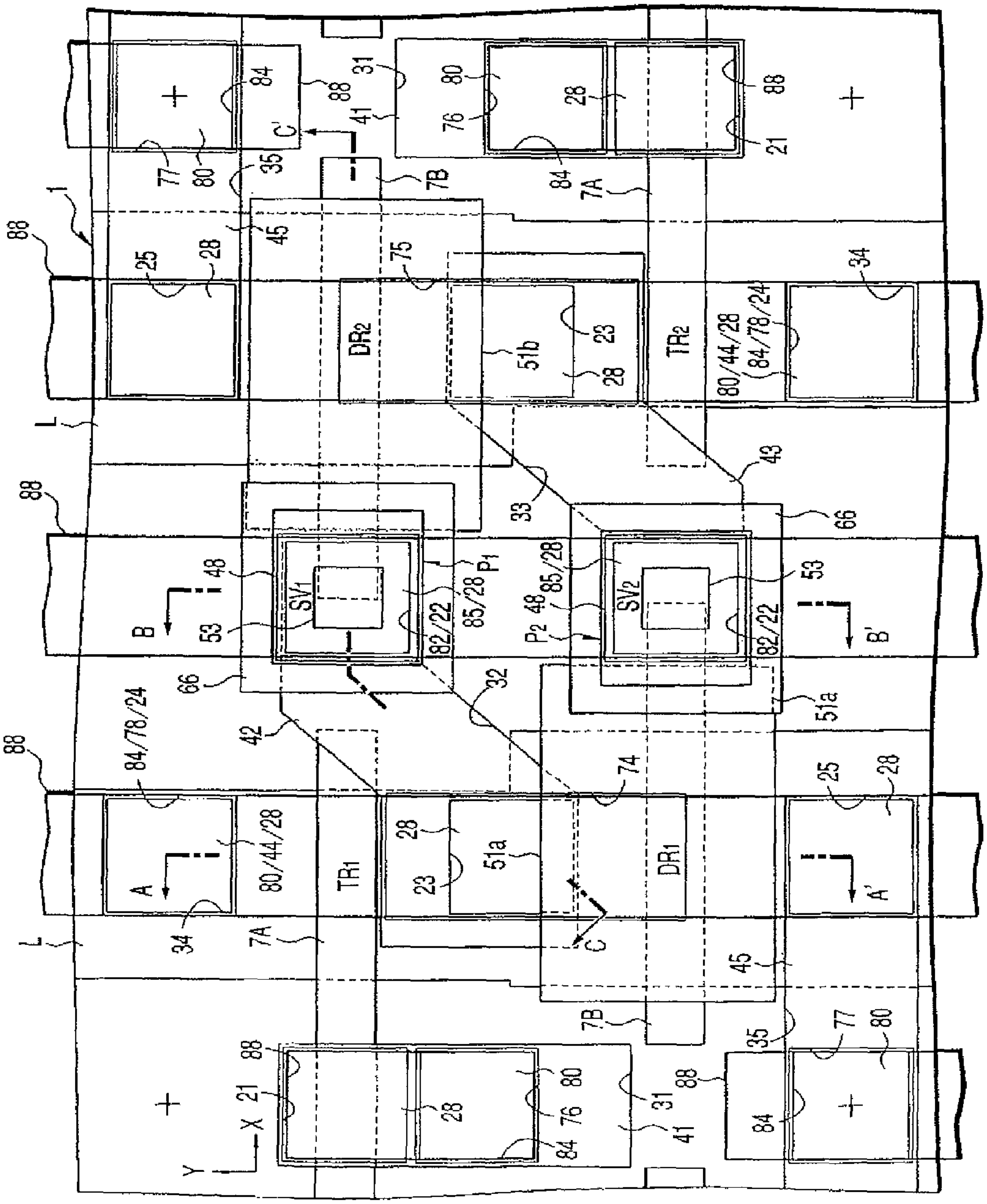
FIG. 57 is a fragmentary plan view depicting a step in the method of manufacturing the SRAM of the present invention.

Next, as shown in FIGS. 56 and 57, a silicon carbide film 86 and a silicon oxide film 87 are deposited over the silicon oxide film 81 by the CVD method. Thereafter, the silicon oxide film 87 and silicon carbide film 86 above the through holes 82, 83 and 84 are dry-etched using a photoresist film as a mask to thereby form wiring trenches 88. As shown in FIG. 57, the wiring trench formed over the through holes 82 located above the vertical MISFETs ($SV_1$ and $SV_2$), and the two wiring trenches 88 formed adjacent to both sides of the wiring trench 88 respectively have strip-like plane patterns extending in the Y direction. The four wiring trenches 88 formed at the ends of the memory cell respectively have rectangular plane patterns each having a long side as viewed in the Y direction.

Figure 58:
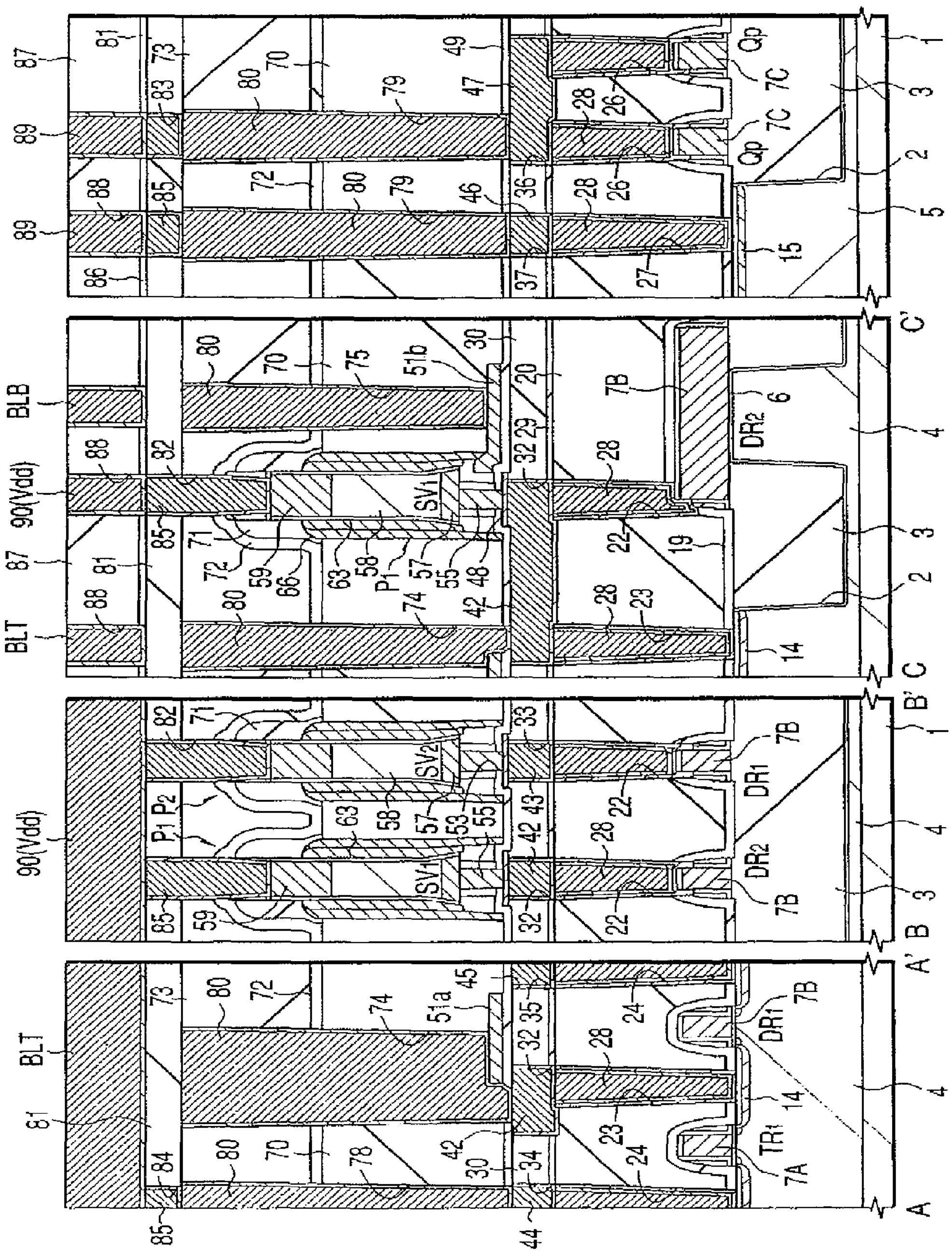
FIG. 58 is a fragmentary cross-sectional view showing a step in the method of manufacturing the SRAM of the present invention.
Figure 59:
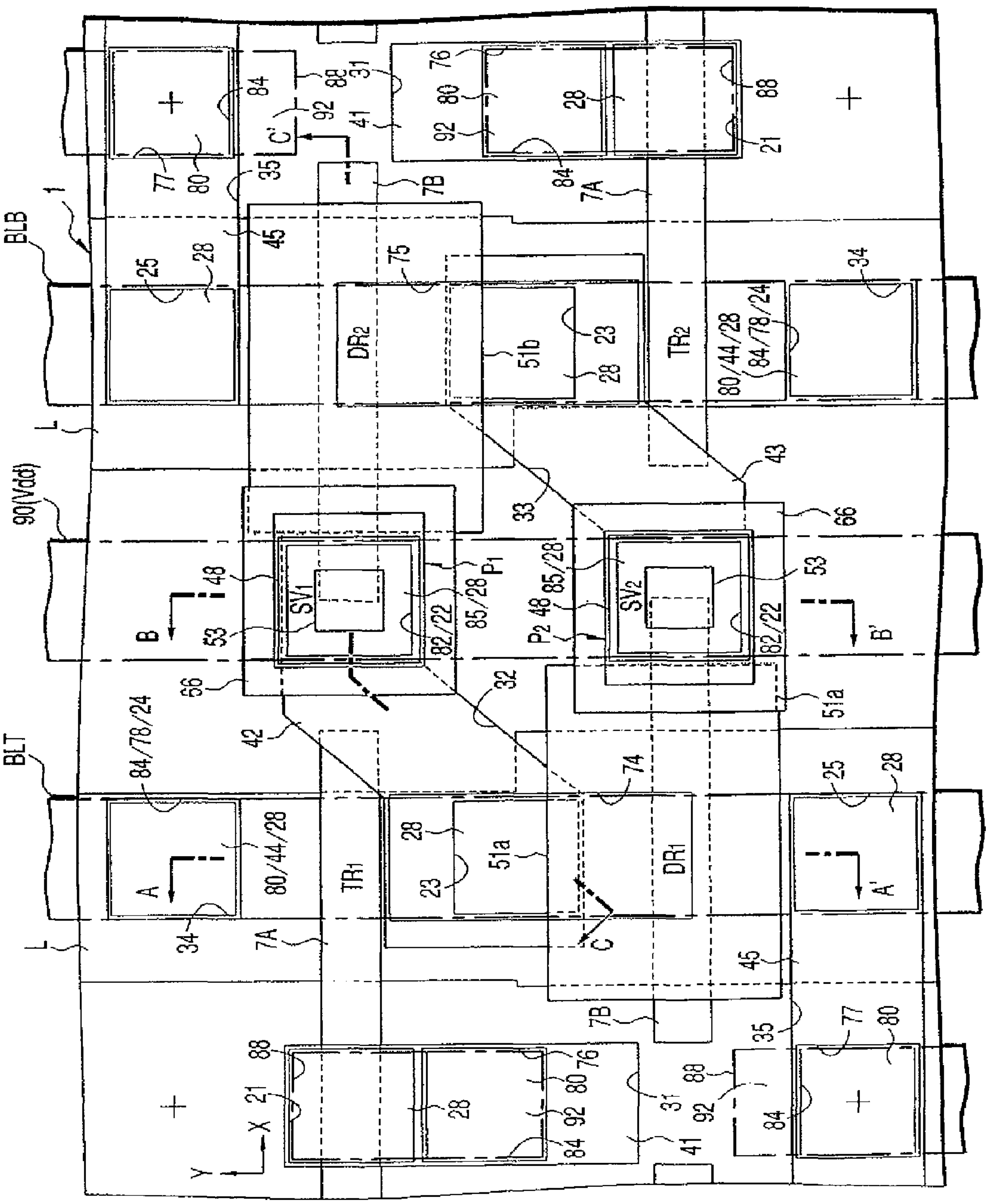
FIG. 59 is a fragmentary plan view illustrating a step in the method of manufacturing the SRAM of the present invention.

Next, as shown in FIGS. 58 and 59, a source voltage line 90 (Vdd) is formed inside the wiring trench 88 passing over the vertical. MISFETs ($SV_1$ and $SV_2$), and a second layer wiring 89 is formed inside each wiring trench 88 in the peripheral circuit area. One (data line BLT) of complementary data lines (BLT and BLB) is formed inside the wiring trench 88 passing over the $n^+$ type semiconductor regions 14 (source and drain) of the transfer MISFET ($TR_1$) and drive MISFET ($DR_1$) and the plugs 80, whereas the other line (data line BLB) of the complementary data lines (BLT and BLB) is formed inside the wiring trench 88 passing over the $n^+$ type semiconductor regions 14 (source and drain) of the transfer MISFET ($TR_2$) and drive MISFET ($DR_2$). Further, drawing wirings 92 are respectively formed inside the four wiring trenches 88 formed at the ends of the memory cell.

In order to form the source voltage line 90 (Vdd), complementary data lines (BLT and BLB), second layer wirings 89 and drawing wirings 92, a tantalum nitride (TaN) film or a Ta film is deposited on the silicon oxide film 87 including the interiors of the wiring trenches 88 as a conductive barrier film by the sputtering method, for example. Further, a Cu film used as a metal film is deposited thereon by the sputtering method or plating method, followed by removal of the unnecessary Cu film and TaN film lying outside the wiring trenches 88 by the CMP method.

The source voltage line 90 (Vdd) is electrically connected to the upper semiconductor layers (sources) 59 of the vertical MISFETs ($SV_1$ and $SV_2$) through the plugs 85. One (data line BLT) of the complementary data lines (BLT and BLB) is electrically connected to the $n^+$ type semiconductor region 14 (the other of source and drain) of the transfer MISFET ($TR_1$) through the plugs 84 and 80, the intermediate conductive layer 44 and the plug 28, whereas the other line (data line BLB) thereof is electrically connected to the $n^+$ type semiconductor region 14 (the other of source and drain) of the transfer MISFET ($TR_2$) through the plugs 84 and 80, the intermediate conductive layer 44 and the plug 28.

Figure 60:
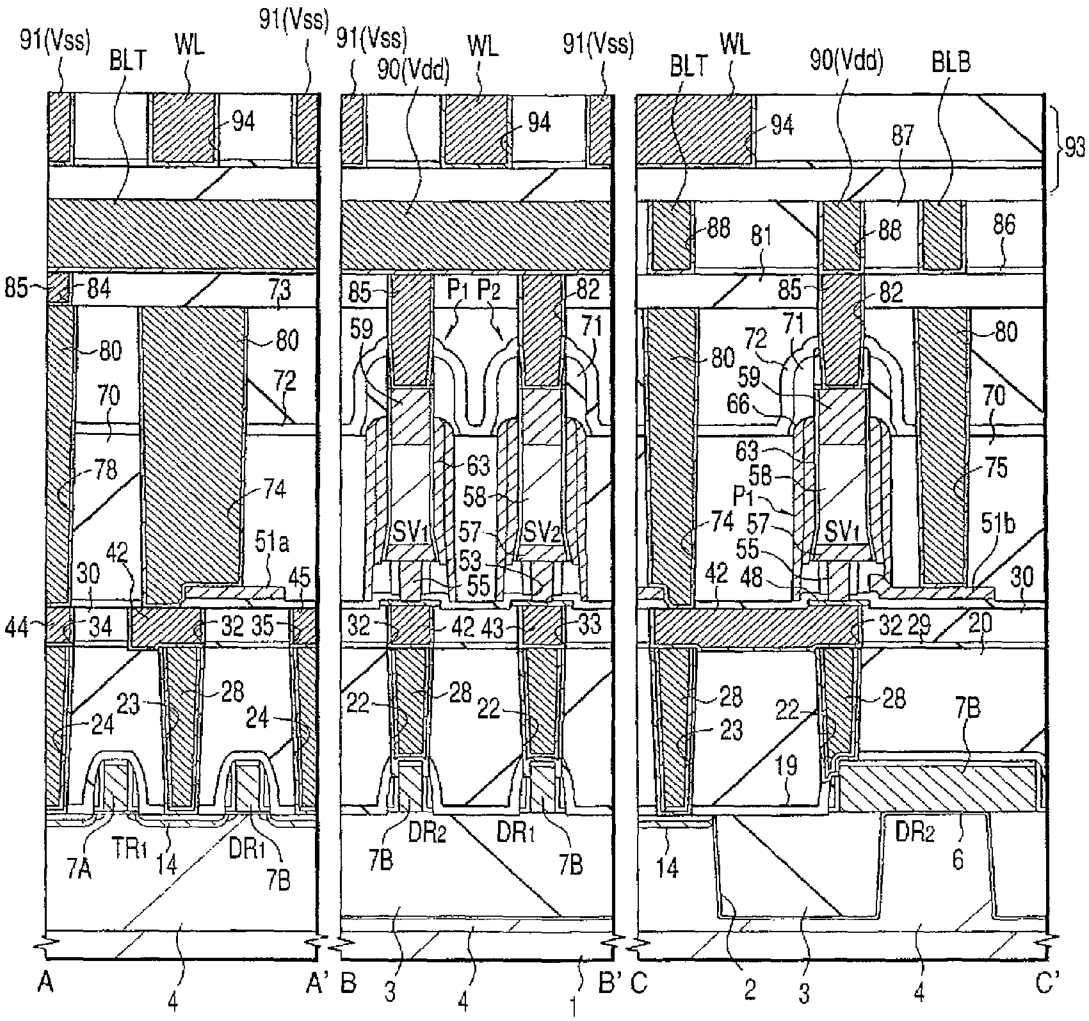
FIG. 60 is a fragmentary cross-sectional view depicting a step in the method of manufacturing the SRAM of the present invention.
Figure 61:
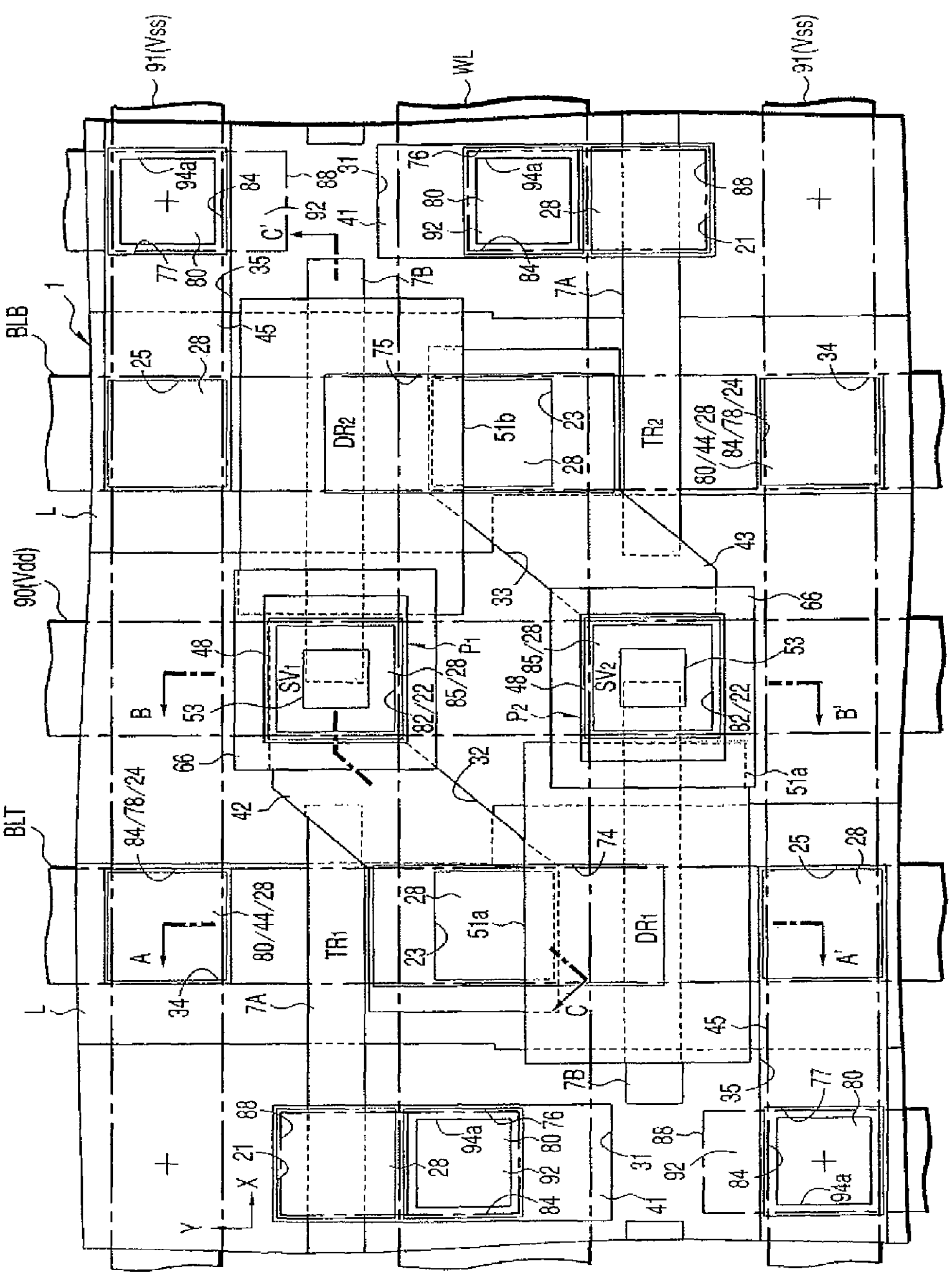
FIG. 61 is a fragmentary plan view showing a step in the method of manufacturing the SRAM of the present invention.

Next, as shown in FIGS. 60 and 61, reference voltage lines 91 (Vss) and a word line (WL) are formed over the wiring layers in which the source voltage line 90 (Vdd), complementary data lines (BLT and BLB), second layer wirings 89 and drawing wirings 92 are formed. The reference voltage lines 91 (Vss) and the word line (WL) respectively have strip-like plane patterns extending in the X direction of FIG. 61.

In order to form the reference voltage lines 91 (Vss) and the word line (WL), wiring trenches 94 are first defined in an insulating film 93 after the insulating film 93 is deposited over the silicon oxide film 87. Subsequently, a Cu film and TaN film are deposited on the insulating film 93 including the interiors of the wiring trenches 94 by the above-described method, followed by removal of the unnecessary Cu film and TaN film lying outside the wiring trenches 94 by the CMP method. The insulating film 93 is formed of, for example, a laminated film of a silicon oxide film, a silicon carbide film and a silicon oxide film deposited by the CVD method. Upon formation of the wiring channels 94 in the insulating film 93, openings 94*a* are formed in the wiring trenches 94 above the four drawing wirings 92 formed at the ends of the memory cell, and respective parts of the four drawing wirings 92 are respectively exposed at the bottoms of the wiring trenches 94 through these openings 94*a*.

The reference voltage lines 91 (Vss) are electrically connected to the respective $n^+$ type semiconductor regions 14 (sources) of the drive MISFETs ($DR_1$ and $DR_2$) through the drawing wirings 92, the plugs 84 and 80, the intermediate conductive layers 45 and the plugs 28. The word line (WL) is electrically connected to the respective $n^+$ type semiconductor regions 14 (the others of sources and drains) of the transfer MISFETs ($TR_1$ and $TR_2$) through the drawing wirings 92, the plugs 84 and 80, the intermediate conductive layers 41 and the plugs 28. According to the processes described up to now, the SRAM of the present embodiment shown in FIGS. 2 and 3 is completed.

Thus, the electrical connections between the MISFETs constituting the peripheral circuit are formed by the plugs 28 and intermediate conductive layers 46 and 47 formed below the vertical MISFETs ($SV_1$ and $SV_2$) and are established using the plugs and the first and second metal wiring layers formed above the vertical MISFETs ($SV_1$ and $SV_2$), so that the degree of freedom of wiring can be enhanced and hence high integration can be achieved. It is also possible to reduce the resistance of connection between the adjacent MISFETs and improve a circuit's operating speed.

Second Embodiment

The plugs 55 and barrier layers 48 that are formed below the vertical MISFETs ($SV_1$ and $SV_2$) can also be formed by the following method.

Figure 62:
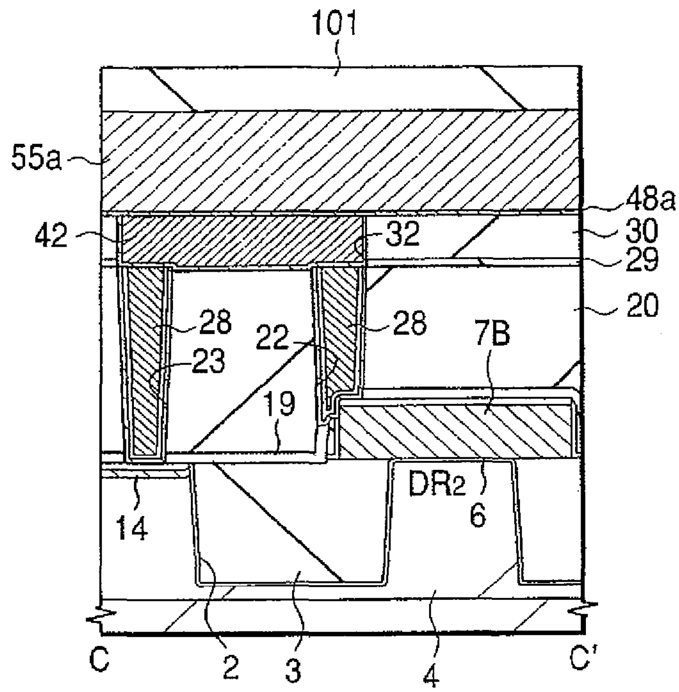
FIG. 62 is a fragmentary cross-sectional view showing a step in the method of manufacturing an SRAM according to a second embodiment of the present invention.

As shown in FIG. 62, transfer MISFETs ($TR_1$ and $TR_2$) and drive MISFETs ($DR_1$ and $DR_2$) are first formed by a method similar to that of the first embodiment, and an intermediate conductive layer 42 is formed over them.

Next, in the present embodiment, a WN film 48*a* constituting a barrier layer 48 is deposited over the intermediate conductive layer 42 by a sputtering method. Further, a polycrystal silicon film (or amorphous silicon film) 55*a* constituting a plug 55 is deposited thereover by a CVD method. Furthermore, a silicon oxide film 101 is deposited thereover by the CVD method. A polycrystal silicon film 50 is doped with boron to bring it to the same conductivity type (e.g., p type) as the polycrystal silicon films (64 and 65) constituting gate electrodes (66) of the vertical MISFETs ($SV_1$ and $SV_2$).

Figure 63:
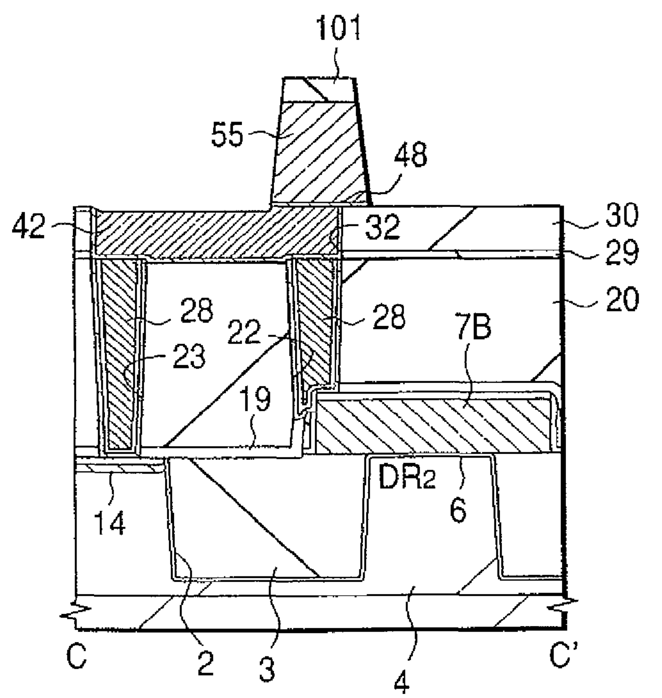
FIG. 63 is a fragmentary cross-sectional view illustrating a step in the method of manufacturing the SRAM of the present invention.

Next, as shown in FIG. 63, the silicon oxide film 101 is dry-etched using a photoresist film as a mask to thereby leave the silicon oxide film 101 in an area for forming the plug 55. Subsequently, the polycrystal silicon film 50 and WN film 48*a* are dry-etched using the silicon oxide film 101 as a mask to thereby form a plug 55 and a barrier layer 48.

Figure 64:
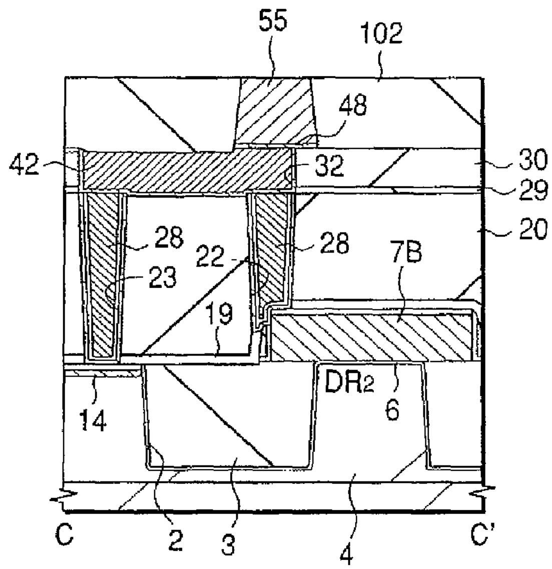
FIG. 64 is a fragmentary cross-sectional view depicting a step in the method of manufacturing the SRAM of the present invention.

Next, as shown in FIG. 64, the silicon oxide film 102 deposited by the CVD method is planarized by a CMP method, At this time, the silicon oxide film 101 for the etching mask, which has been left over the plug 55, is polished until the surface of the plug 55 is exposed.

According to the above method, since the plug 55 and barrier layer 48 are simultaneously formed by one etching, the photomask for forming the barrier layer 48 becomes unnecessary, and, hence, the process can be simplified.

Third Embodiment

The gate drawing electrodes used to connect the gate electrodes of the vertical MISFETs ($SV_1$ and $SV_2$) and the lower transfer MISFETs ($TR_1$ and $TR_2$) and drive MISFETs ($DR_1$ and $DR_2$) can also be formed by the following method.

Figure 65:
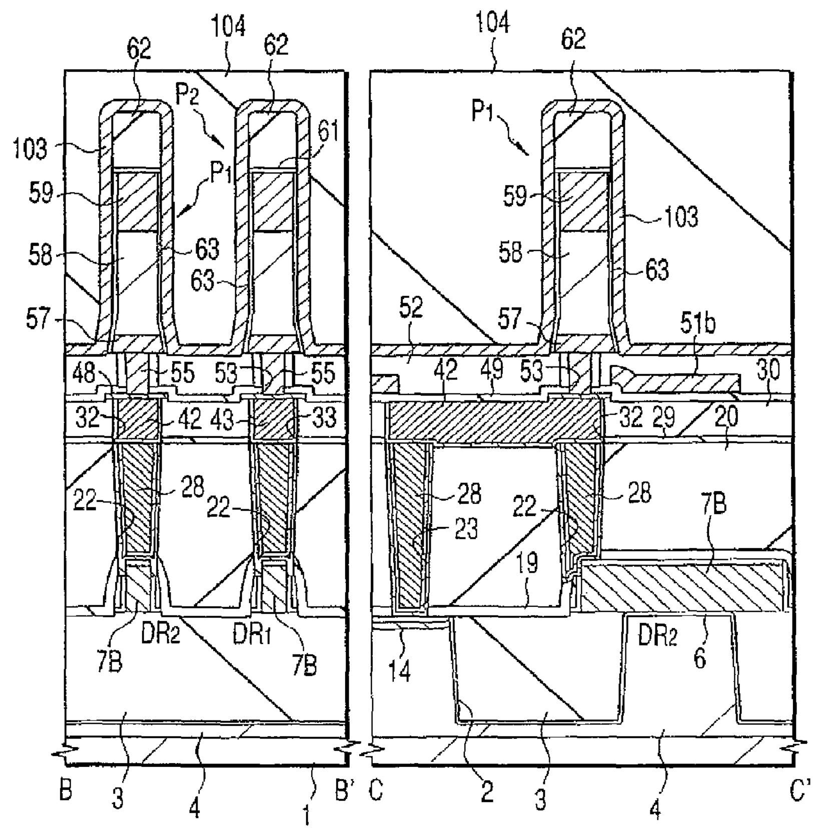
FIG. 65 is a fragmentary cross-sectional view showing a step in the method of manufacturing an SRAM according to a embodiment of the present invention.

As shown in FIG. 65, laminated bodies ($P_1$ and $P_2$) are first formed over the transfer MISFETs ($TR_1$ and $TR_2$) and drive MISFETs ($DR_1$ and $DR_2$). Thereafter, for example, a substrate 1 is thermally-oxidized to form gate insulating films 63 formed of a silicon oxide film on the surfaces of side walls of intermediate conductive layers 58 and upper semiconductor layers 59.

Next, a polycrystal silicon film (or amorphous silicon film) 103 for each gate drawing electrode is deposited over the laminated bodies ($P_1$ and $P_2$) by a CVD method, and a silicon oxide film 104 is subsequently deposited by the CVD method, followed by planarization of its surface by a CMP method. The silicon oxide film 104 is deposited to a large thickness such that the height of the planarized surface becomes higher than the surface of each silicon nitride film 62, thereby avoiding cutting or scraping of the surface of the silicon nitride film 62 upon its planarizing process.

Figure 66:
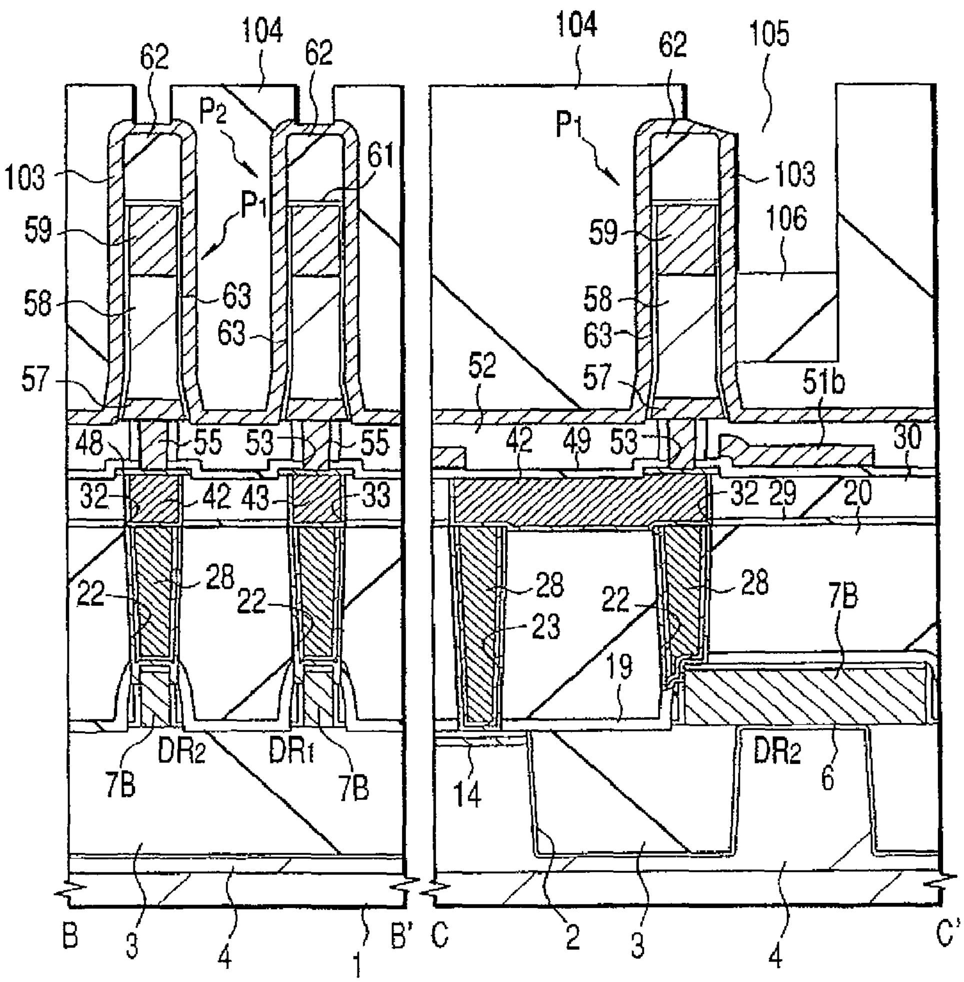
FIG. 66 is a fragmentary cross-sectional view illustrating a step in the method of manufacturing the SRAM of the present invention.

Next, as shown in FIG. 66, the silicon oxide film 104 in each gate drawing electrode forming area is removed up to midstream portions of the laminated bodies ($P_1$ and $P_2$) by dry etching using a photoresist film as a mask to thereby form a trench 105 in the silicon oxide film 104 in the gate drawing electrode forming area. Next, a material different in etching selection ratio from the silicon oxide film 104, as in the case of, for example, a photoresist film 106 or an antireflection film, is embedded into each trench 105. When the photoresist film 106 is embedded therein, the photoresist film 106 is applied onto the silicon oxide film 104 including the interior of each trench 105, and, thereafter, it is subjected to exposure and developed to thereby leave the non-exposed photoresist film 106 inside the trench 105.

Figure 67:
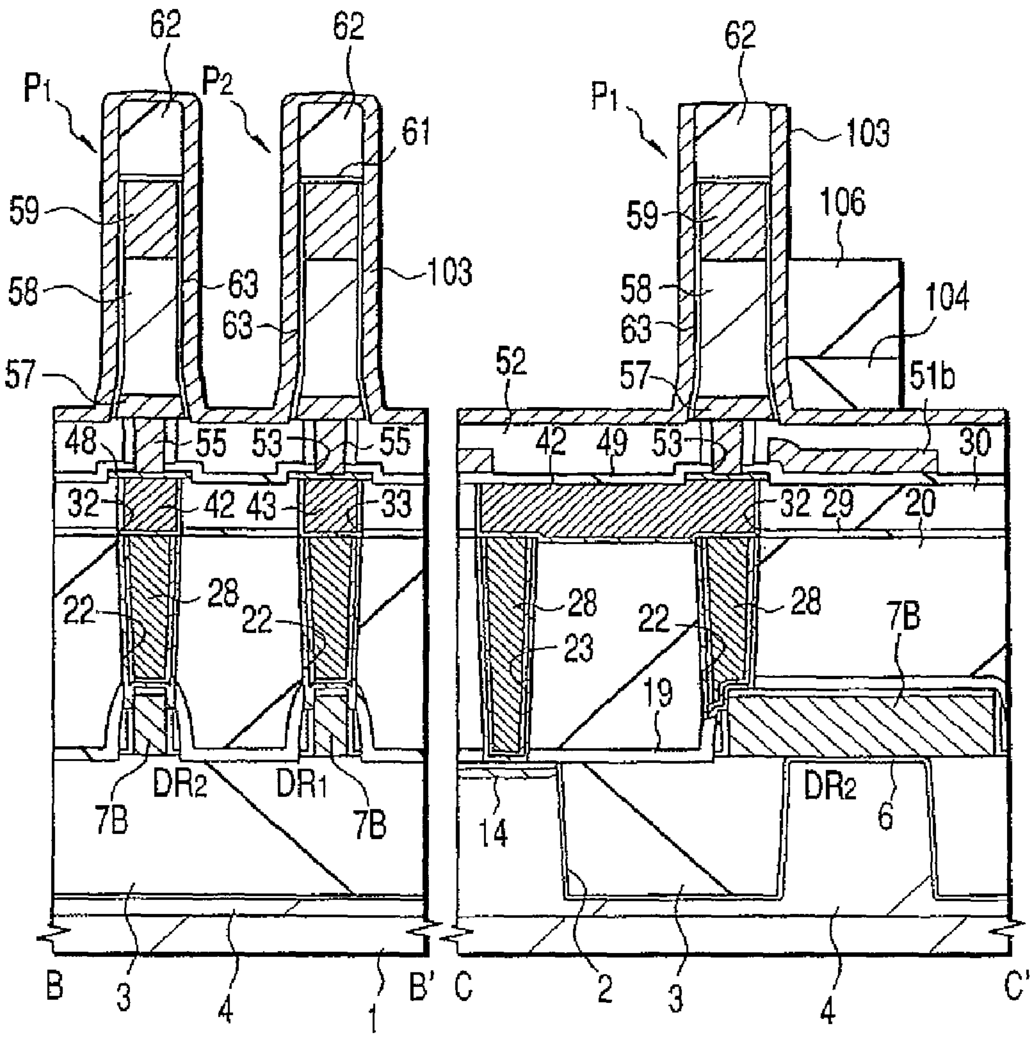
FIG. 67 is a fragmentary cross-sectional view depicting a step in the method of manufacturing the SRAM of the present invention.

Next, as shown in FIG. 67, the silicon oxide film 104 is dry-etched using the photoresist film 106 embedded in the corresponding trench 105 as a mask to thereby leave the silicon oxide film 104 in the gate drawing electrode forming area alone.

Figure 68:
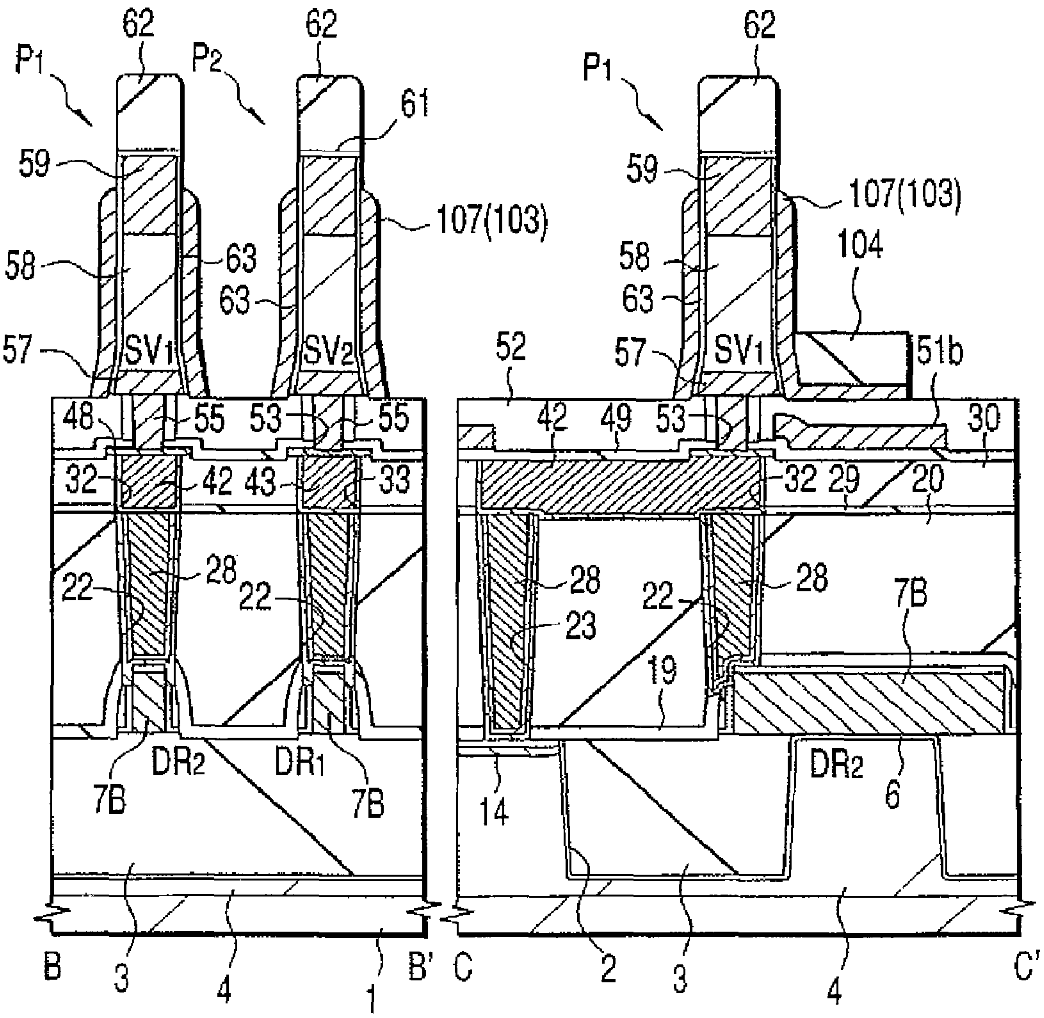
FIG. 68 is a fragmentary cross-sectional view illustrating a step in the method of manufacturing the SRAM of the present invention.

Next, the photoresist film 106 on the silicon oxide film 104 is removed. Thereafter, as shown in FIG. 68, the polycrystal silicon film 103 is anisotropically etched using the silicon oxide film 104 as a mask to thereby form gate electrodes 107 of vertical MISFETs ($SV_1$ and $SV_2$) each formed of the polycrystal silicon film 103 on the side walls of the laminated bodies ($P_1$ and $P_2$) and at the lower portion of the silicon oxide film 104. At this time, part of the gate electrode 107, which has been left at the lower portion of the silicon oxide film 104, serves as a gate drawing electrode. According to the processes described up to now, the vertical MISFETs ($SV_1$ and $SV_2$) are completed.

Figure 69:
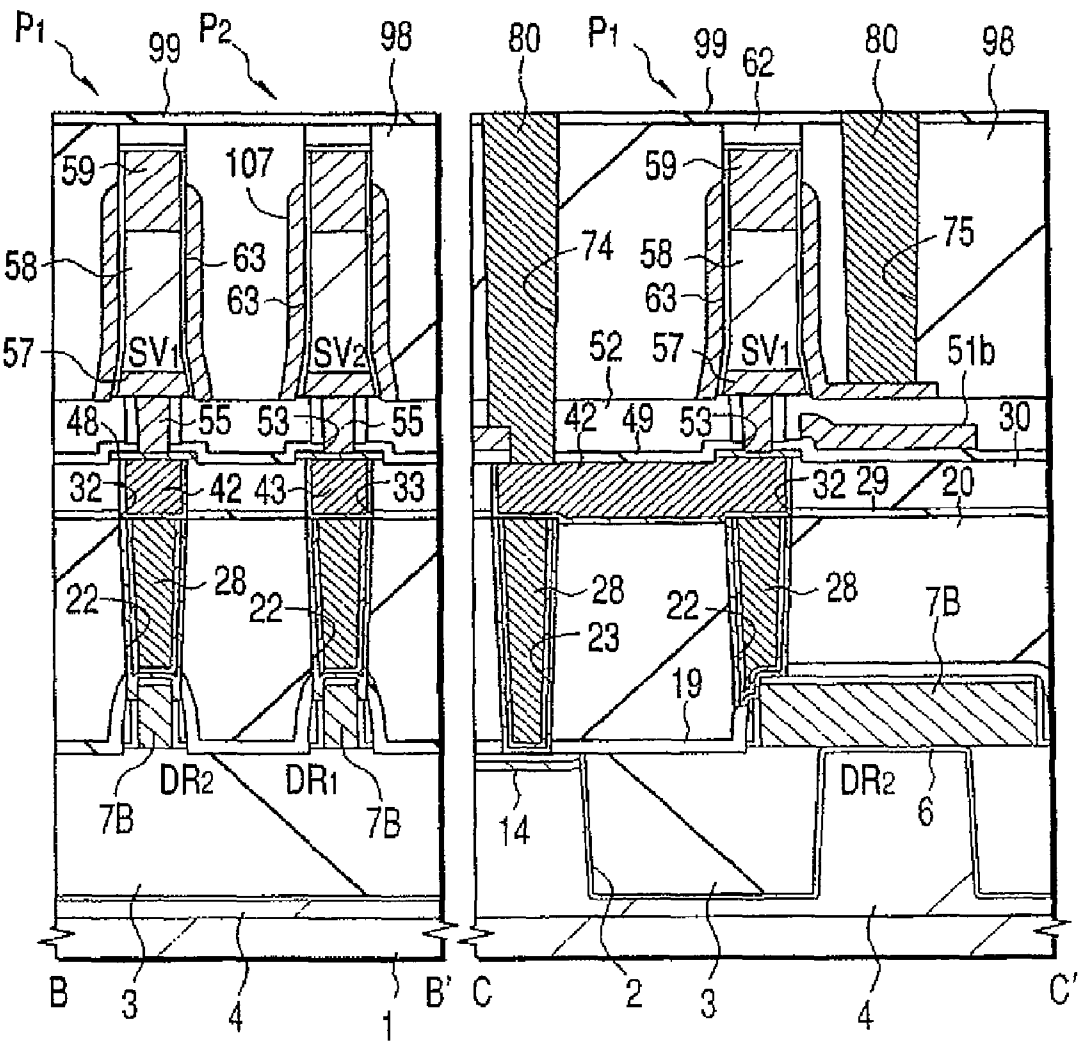
FIG. 69 is a fragmentary cross-sectional view depicting a step in the method of manufacturing the SRAM of the present invention.
Figure 70:
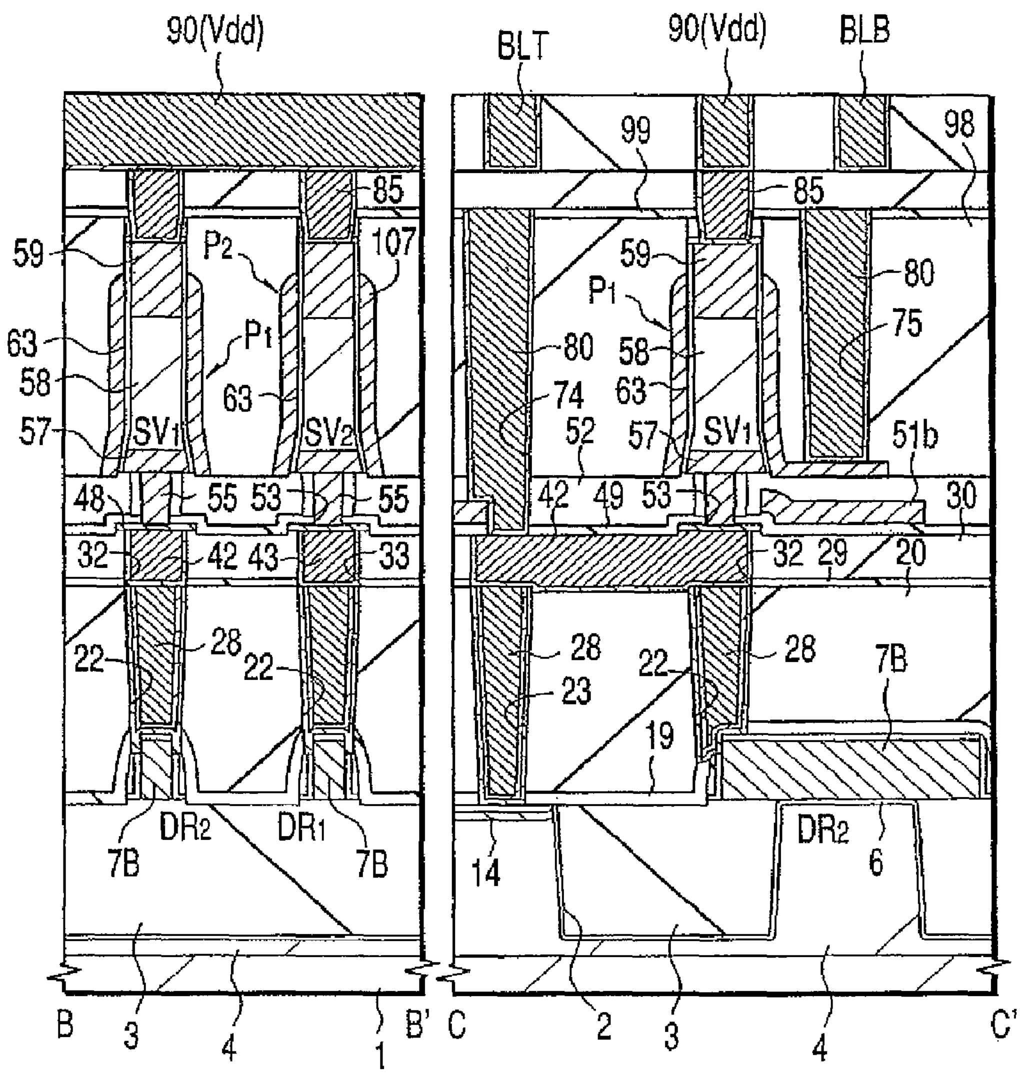
FIG. 70 is a fragmentary cross-sectional view illustrating a step in the method of manufacturing the SRAM of the present invention.

Next, after the removal of the silicon oxide film 104, a silicon oxide film 98 and a silicon nitride film 99 are deposited over the vertical MISFETs ($SV_1$ and $SV_2$) by the CVD method as shown in FIG. 69, and through holes 74 and 75 and plugs 80 are subsequently formed by a method similar to the first embodiment, whereby part (gate drawing electrode) of the gate electrode 107, each of the intermediate conductive layers 42 and 43 and a plug 80 are electrically connected. Thereafter, plugs 85, a source voltage line 90 (Vdd) and complementary data lines (BLT and BLB) are formed over the vertical MISFETs ($SV_1$ and $SV_2$) as shown in FIG. 70.

According to the above method, since the gate electrodes 107 and gate drawing electrodes of the vertical MISFETs ($SV_1$ and $SV_2$) can be simultaneously formed, and the gate electrodes 107 can be made up of the polycrystal silicon film 103 of one layer, the process of forming the vertical MISFETs ($SV_1$ and $SV_2$) can be simplified.

Fourth Embodiment

The through holes for connecting the upper semiconductor layers 59 of the vertical MISFETs ($SV_1$ and $SV_2$) and the complementary data lines (BLT and BLB) can be formed by the following method.

Figure 71:
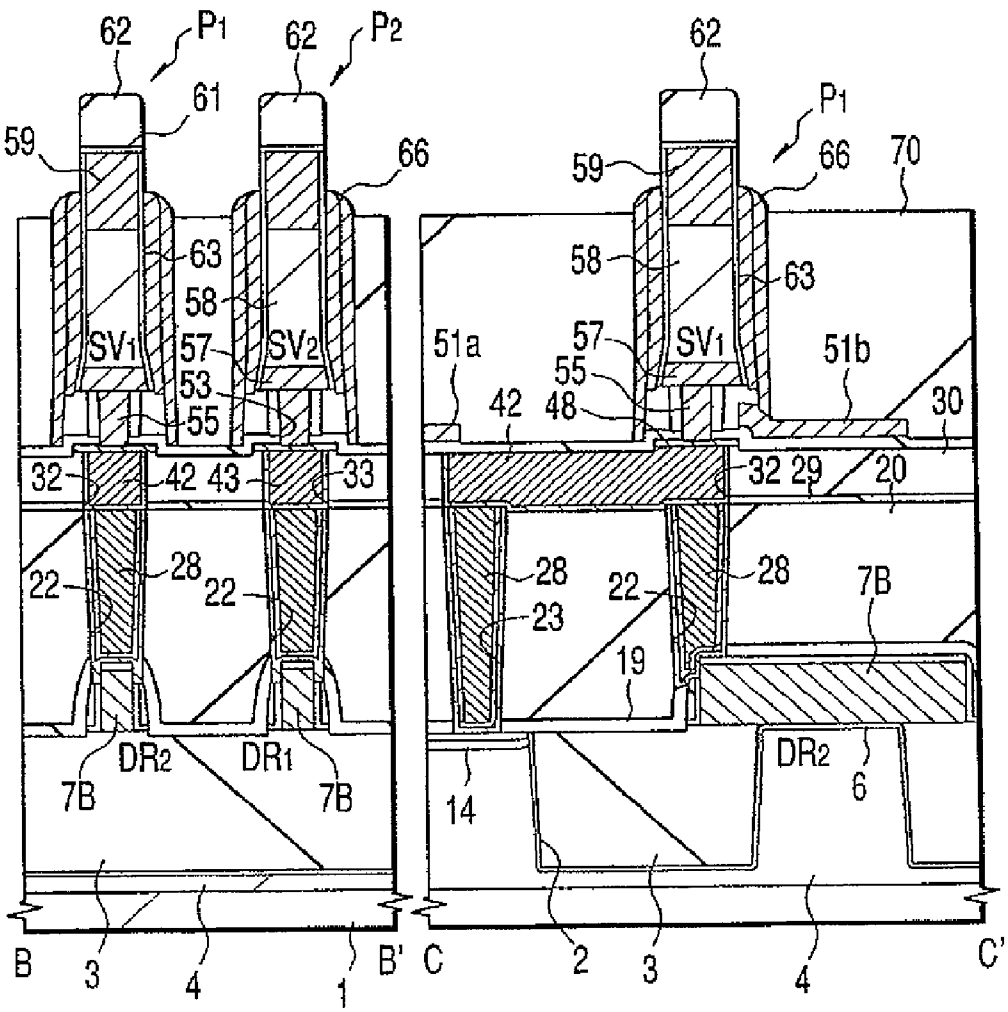
FIG. 71 is a fragmentary cross-sectional view illustrating a step in a method of manufacturing an SRAM according to a fourth embodiment of the present invention.

As shown in FIG. 71, gate electrodes 66 are first formed on their corresponding side walls of laminated bodies ($P_1$ and $P_2$) by a method similar to that of the first embodiment. Thereafter, a silicon oxide film 70 deposited on a substrate 1 is etched to withdraw its surface to midstream portions of the laminated bodies ($P_1$ and $P_2$). Subsequently, the gate electrodes 66 formed on the side walls of the laminated bodies ($P_1$ and $P_2$) and silicon nitride films 62 are etched to withdraw their upper ends downwards. Processes up to described now are identical to the first embodiment (see FIG. 44).

Figure 72:
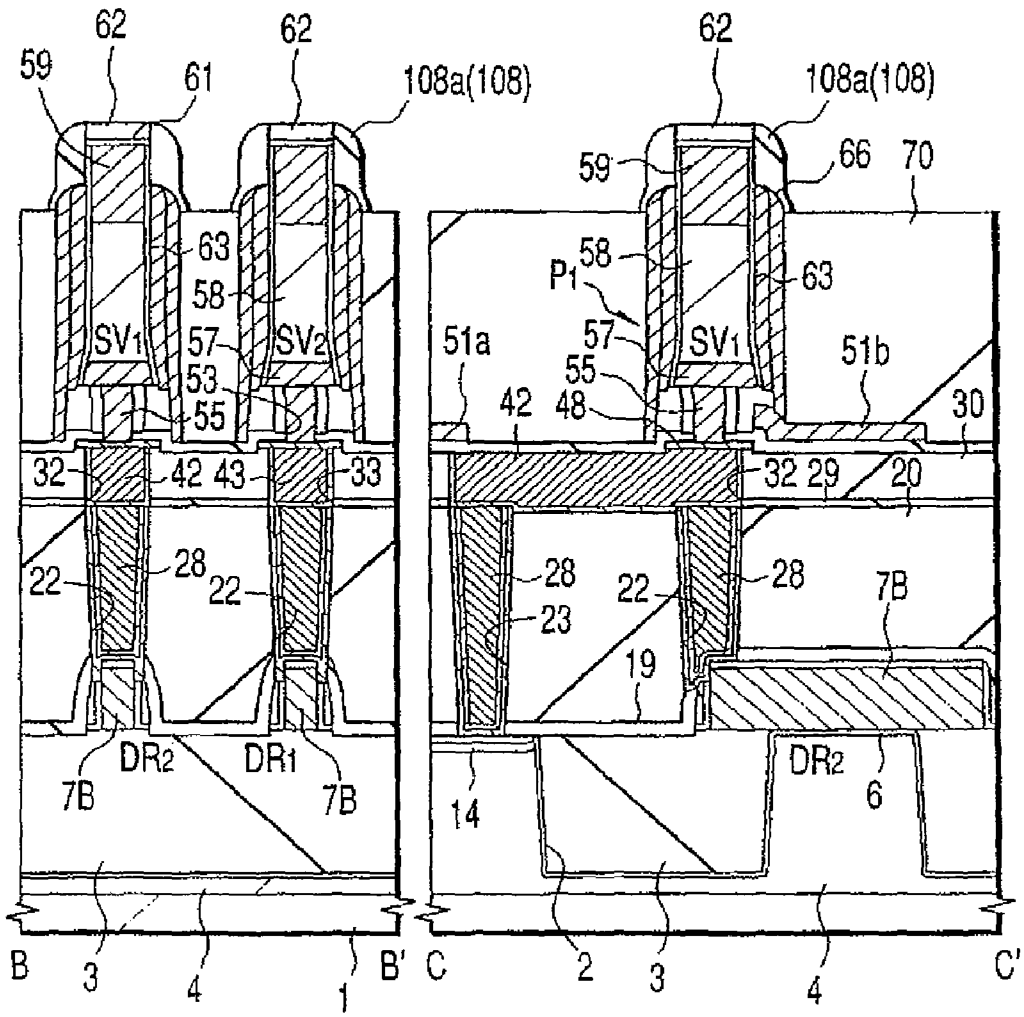
FIG. 72 is a fragmentary cross-sectional view depicting a step in the method of manufacturing the SRAM of the present invention.

Next, as shown in FIG. 72, a silicon nitride film 108 deposited on the silicon oxide film 70 by a CVD method is anisotropically etched to form sidewall spacers 108*a* made up of the silicon nitride film 108 on their corresponding side walls of the laminated bodies ($P_1$ and $P_2$) and gate electrodes 66 exposed to above the silicon oxide film 70. At this time, the silicon nitride films 62 formed over the laminated bodies ($P_1$ and $P_2$) are also etched so that their thicknesses become thin.

Figure 73:
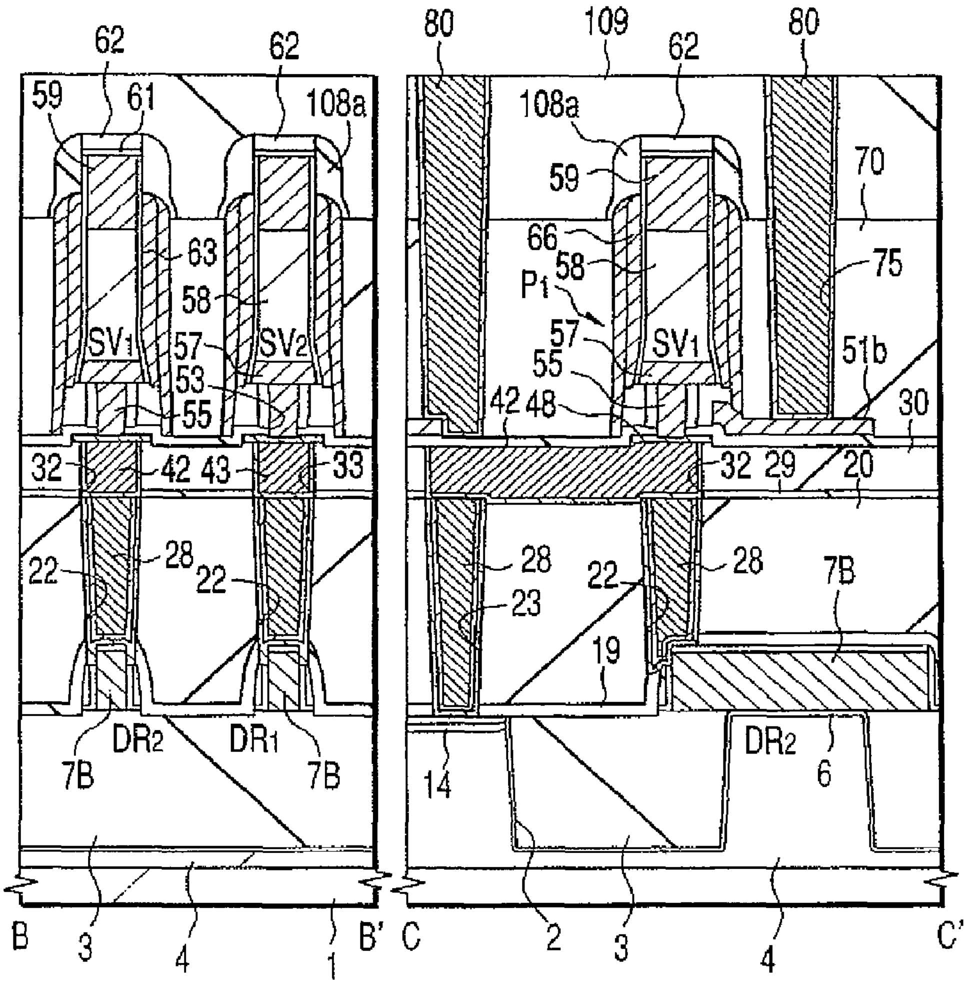
FIG. 73 is a fragmentary cross-sectional view illustrating a step in the method of manufacturing the SRAM of the present invention.

Next, as shown in FIG. 73, a silicon oxide film 109 is deposited on the silicon oxide film 70 by the CVD method. Thereafter, through holes 75 are formed above their corresponding gate drawing electrodes 51 by a method similar to the first embodiment, and plugs 80 are respectively formed inside the through holes 75.

Figure 74:
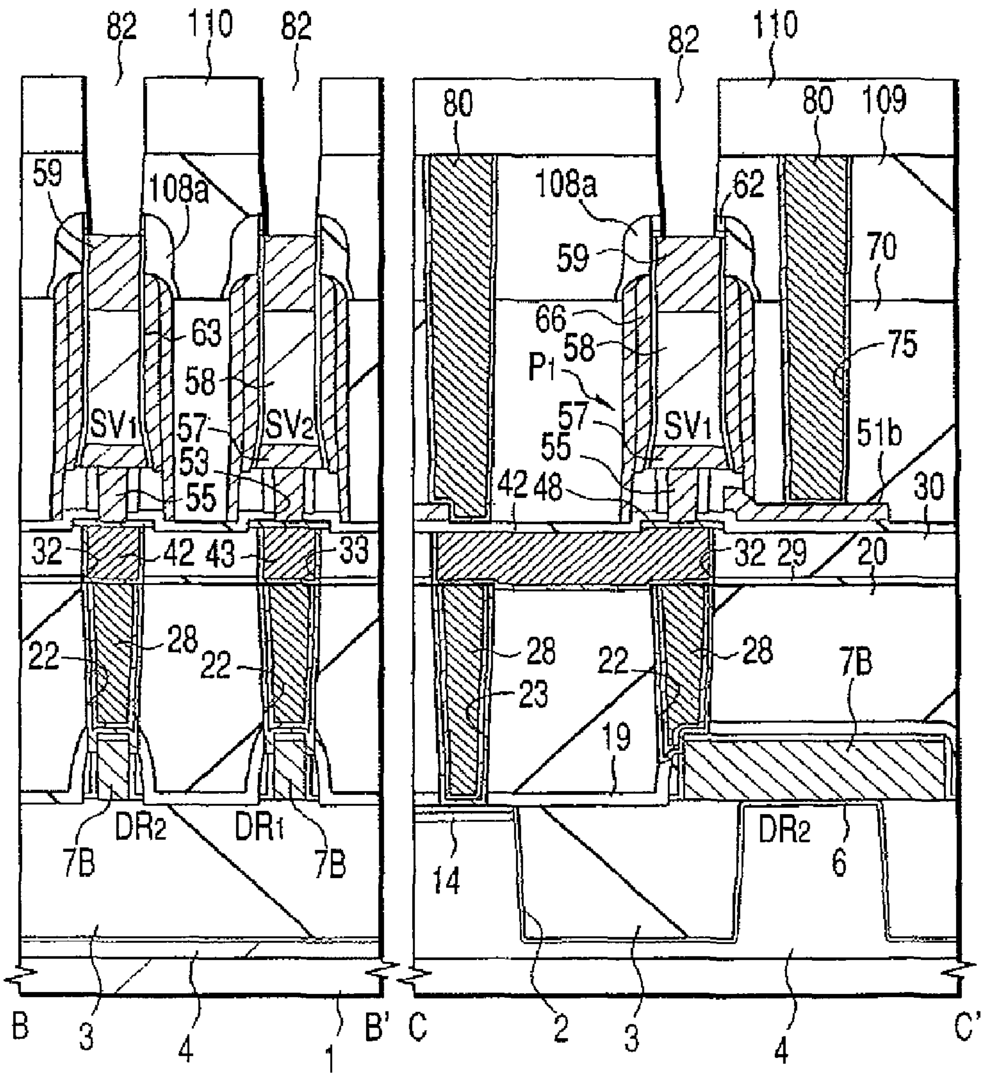
FIG. 74 is a fragmentary cross-sectional view showing a step in the method of manufacturing the SRAM of the present invention.

Next, as shown in FIG. 74, a silicon oxide film 110 is deposited on the silicon oxide film 109 by the CVD method. Afterwards, the silicon oxide films 110 and 109 and the silicon nitride films 62 located above the laminated bodies ($P_1$ and $P_2$) are sequentially dry-etched to form through holes 82 for exposing upper semiconductor layers 59 over the laminated bodies ($P_1$ and $P_2$).

Since, at this time, the silicon nitride film 62 above each upper semiconductor layer 59 is thinner in thickness than each of the sidewall spacers 108*a* made up of the silicon nitride film 108 above each gate electrode 66 even when the relative positions of the through hole 82 and its corresponding upper semiconductor layer 59 are displaced due to misalignment of photomasks, the upper semiconductor layer 59 can be exposed before the gate electrode 66 in each area covered with the sidewall spacers 108*a* is exposed.

Although a diagrammatic representation is omitted, plugs (85) are thereafter formed inside the through holes 82 by a method similar to the first embodiment. Further, complementary data lines (BLT and BLB) are respectively formed over the plugs (85).

Figure 75:
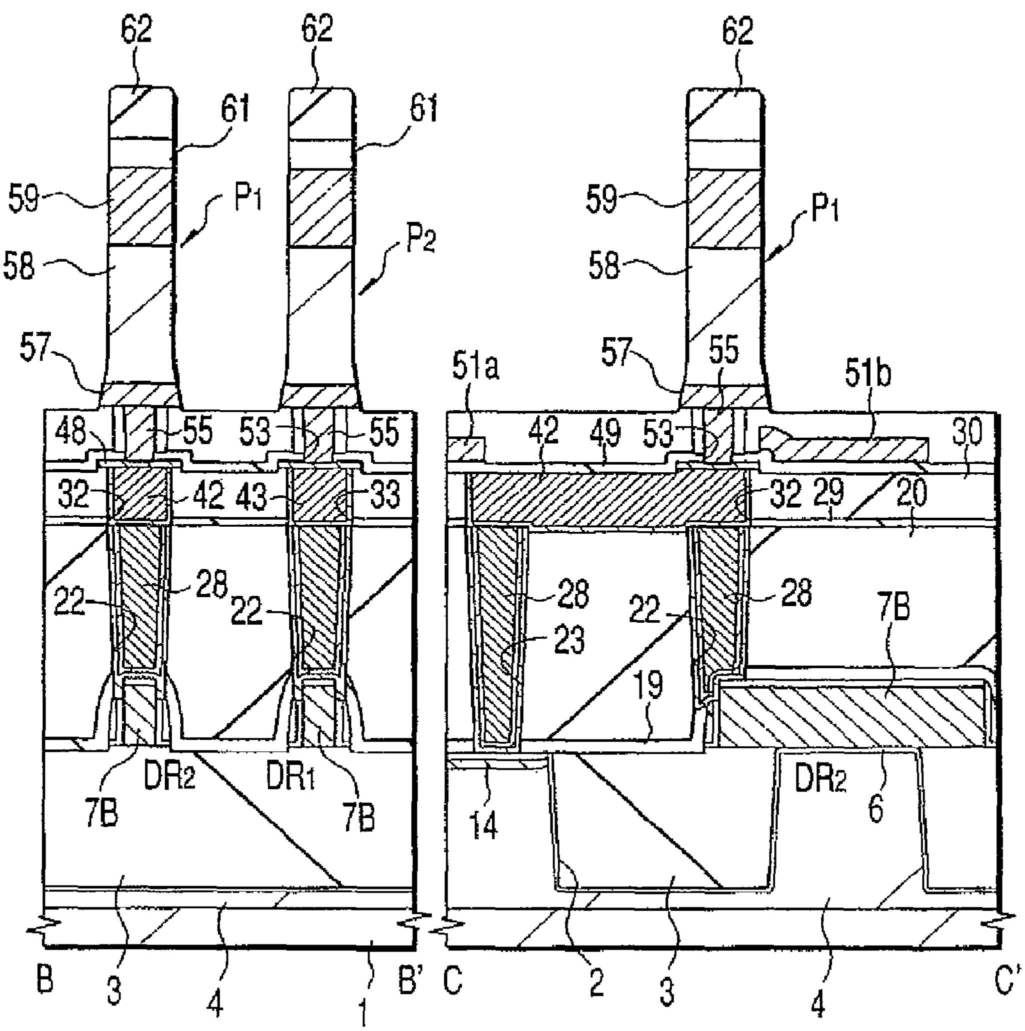
FIG. 75 is a fragmentary cross-sectional view depicting a step in the method of manufacturing the SRAM of the present invention.

The through holes 82 can also be formed by the following method. According to this method, the thickness of each silicon oxide film 61 interposed between a p type silicon film (59*p*) constituting each of upper semiconductor layers 59 of vertical MISFETs ($SV_1$ and $SV_2$) and its corresponding silicon nitride film 62 located thereabove is formed to be thicker than that employed in the first embodiment as shown in FIG. 75. Thereafter, laminated bodies ($P_1$ and $P_2$) are formed by a method similar to the first embodiment.

Figure 76:
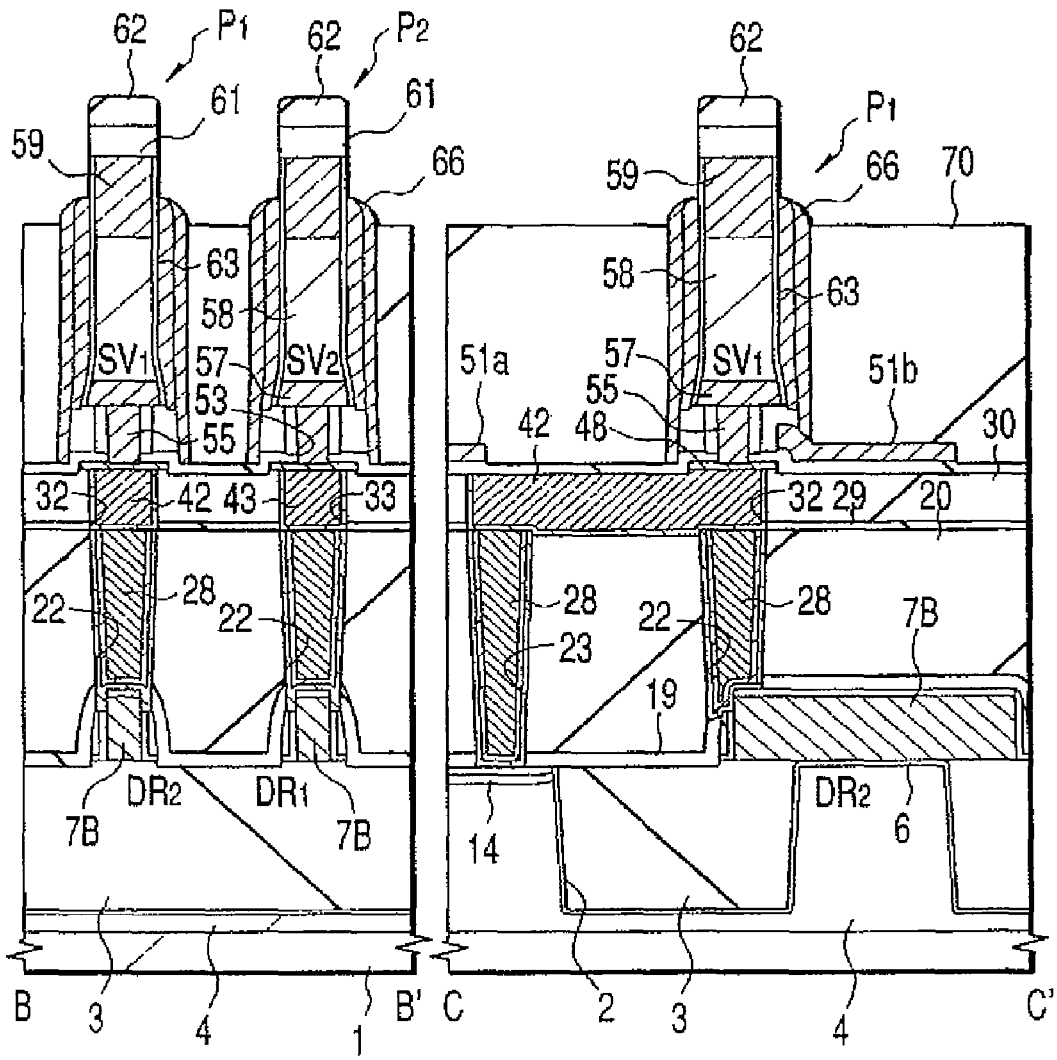
FIG. 76 is a fragmentary cross-sectional view illustrating a step in the method of manufacturing the SRAM of the present invention.

Next, as shown in FIG. 76, gate electrodes 66 are formed on their corresponding side walls of the laminated bodies ($P_1$ and $P_2$) by a method similar to the first embodiment. Thereafter, a silicon oxide film 70 deposited over a substrate 1 is etched to withdraw its surface to midstream portions of the laminated bodies ($P_1$ and $P_2$). Further, the gate electrodes 66 formed on the side walls of the laminated bodies ($P_1$ and $P_2$) and silicon nitride films 62 are etched to withdraw their upper ends downwards.

Figure 77:
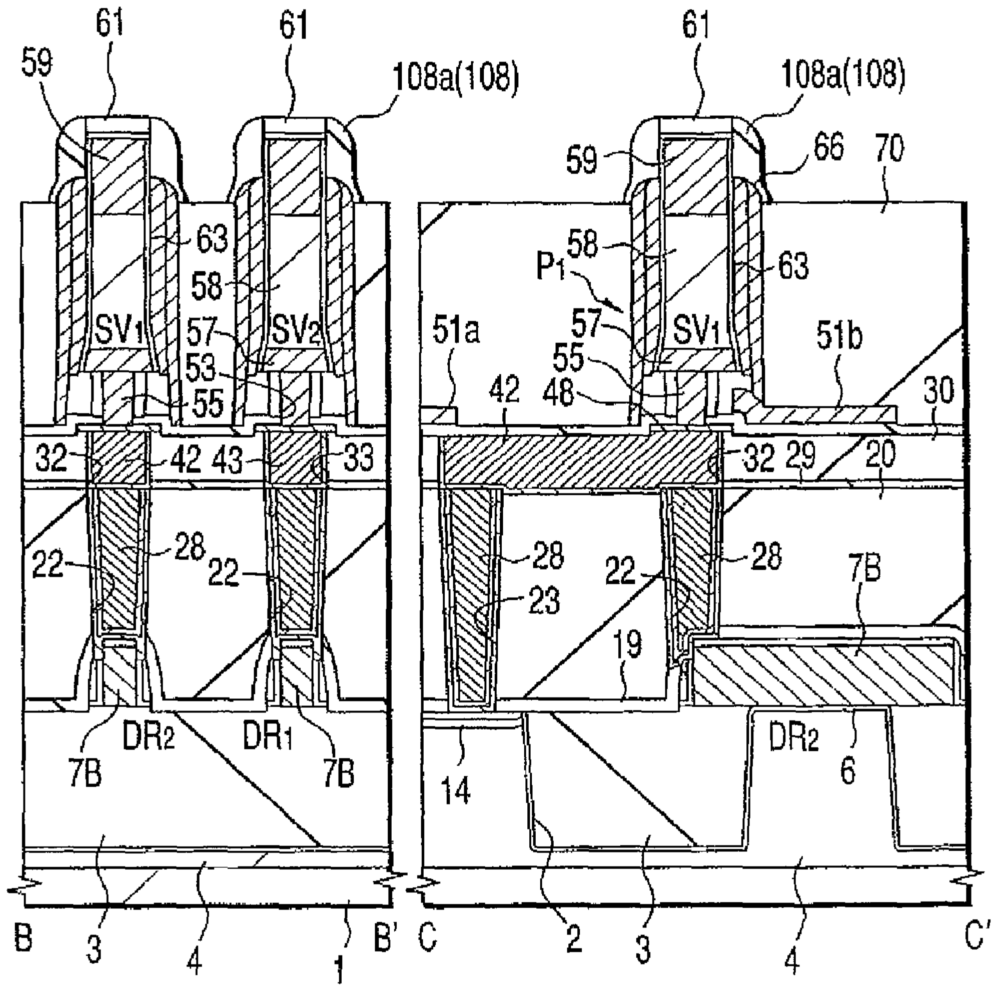
FIG. 77 is a fragmentary cross-sectional view depicting a step in the method of manufacturing the SRAM of the present invention.

Next, as shown in FIG. 77, a silicon nitride film 108 deposited on the silicon oxide film 70 by the CVD method is anisotropically etched to thereby form sidewall spacers 108*a* formed of the silicon nitride film 108 on their corresponding side walls of the laminated bodies ($P_1$ and $P_2$) and gate electrodes 66 exposed to above the silicon oxide film 70. At this time, the silicon nitride films 62 formed above the laminated bodies ($P_1$ and $P_2$) are simultaneously etched to expose the silicon oxide films 61 located therebelow.

Figure 78:
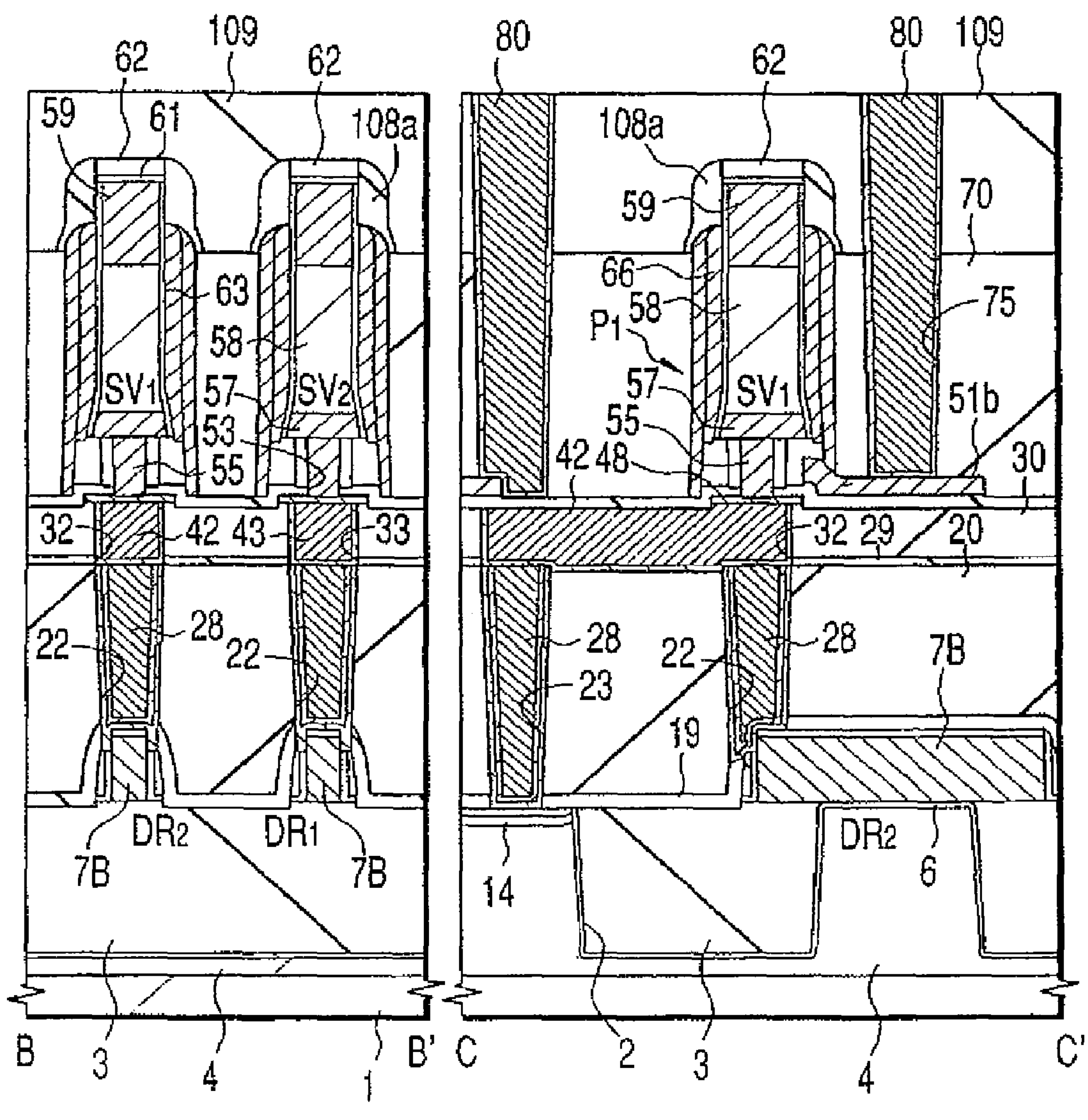
FIG. 78 is a fragmentary cross-sectional view showing a step in the method of manufacturing the SRAM of the present invention.

Next, as shown in FIG. 78, a silicon oxide film 109 is deposited on the silicon oxide film 70 by the CVD method. Thereafter, through holes 75 are respectively formed over gate drawing electrodes 51 by a method similar to the first embodiment, and plugs 80 are formed inside their corresponding through holes 75.

Figure 79:
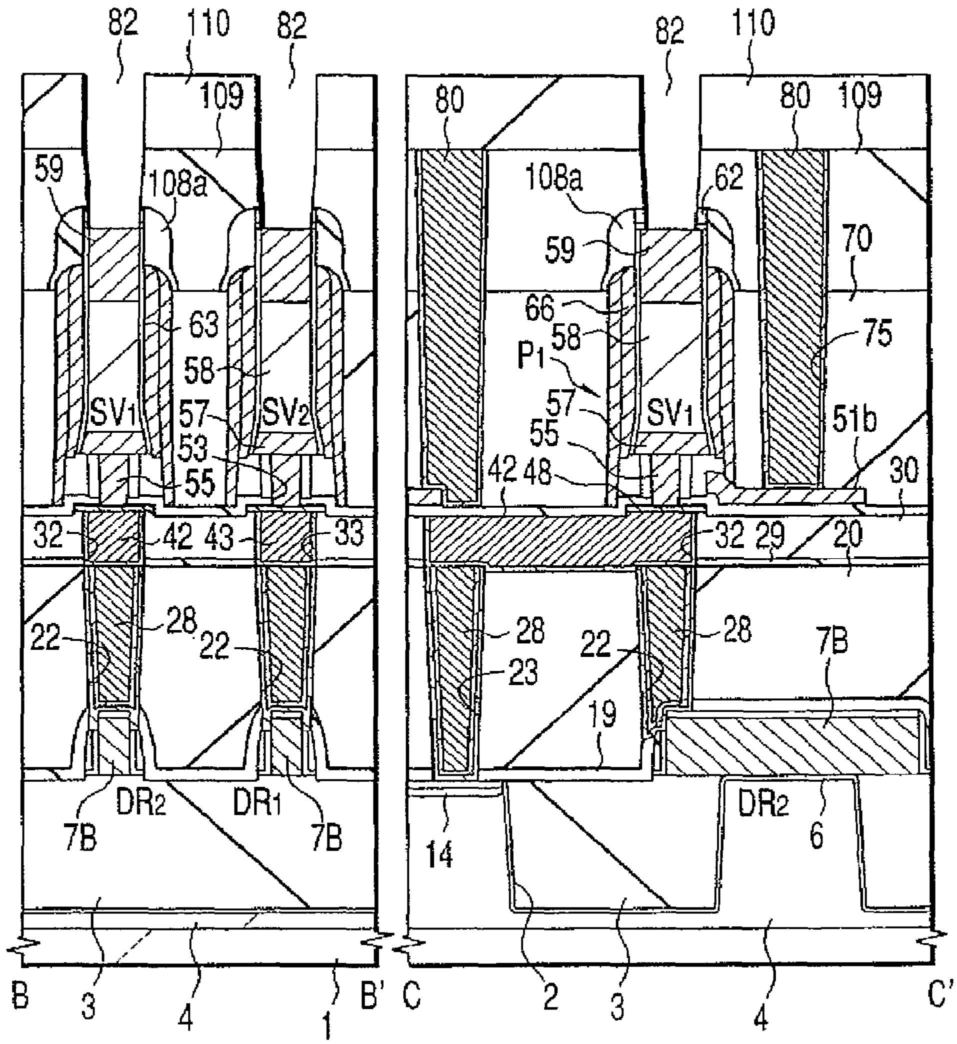
FIG. 79 is a fragmentary cross-sectional view depicting a step in the method of manufacturing the SRAM of the present invention.

Next, as shown in FIG. 79, a silicon oxide film 110 is deposited on the silicon oxide film 109 by the CVD method. Thereafter, the silicon oxide film 109 and the silicon oxide films 61 above the laminated bodies ($P_1$ and $P_2$) are dry-etched using a photoresist film as a mask to thereby define through holes 82 through which the upper semiconductor layers 59 are exposed, over the laminated bodies ($P_1$ and $P_2$).

Since, at this time, the upper portions of the gate electrodes 66 are covered with the sidewall spacers 108*a* each formed of the silicon nitride film 108 even when the relative positions of the through holes 82 and the upper semiconductor layers 59 are respectively displaced due to misalignment of photomasks, the upper semiconductor layers 59 can be exposed without exposing the gate electrodes 66.

Although a diagrammatic representation is omitted, plugs (85) are thereafter formed inside the through holes 82 by a method similar to the first embodiment. Further, complementary data lines (BLT and BLB) are formed over the plugs (85) respectively.

Fifth Embodiment

Connections between the gate electrodes of the vertical MISFETs ($SV_1$ and $SV_2$), and the lower transfer MISFETs ($TR_1$ and $TR_2$) and drive MISFETs ($DR_1$ and $DR_2$) can also be carried out by the following method.

Figure 80:
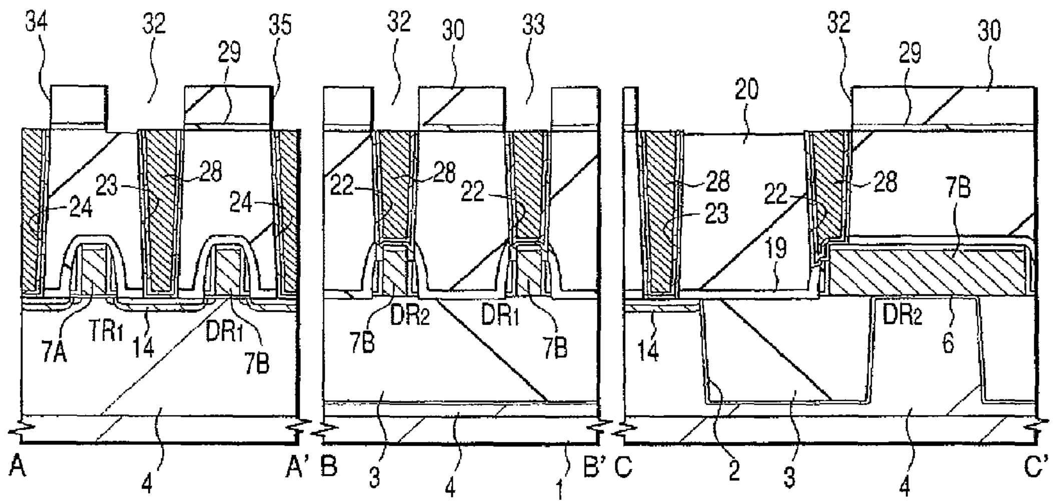
FIG. 80 is a fragmentary cross-sectional view showing a step in the method of manufacturing an SRAM according to a fifth embodiment of the present invention.

As shown in FIG. 80, transfer MISFETs ($TR_1$ and $TR_2$) and drive MISFETs ($DR_1$ and $DR_2$) are first formed on a major surface of a p type well 4. Subsequently, contact holes 22 through 24 are defined in a silicon oxide film for covering upper portions of the transfer MISFETs ($TR_1$ and $TR_2$) and drive MISFETs ($DR_1$ and $DR_2$). Afterwards, plugs 28 formed principally of a W film are embedded into the contact holes 22 through 24 respectively. Then a silicon nitride film 29 and a silicon oxide film 30 are deposited over the silicon oxide film 20 and thereafter dry-etched using a photoresist film as a mask to thereby form or define trenches 31 through 34 over the contact holes 22 through 24 respectively. Processes described up to now are identical to the processes shown in FIGS. 4 through 23 in the first embodiment.

Figure 81:
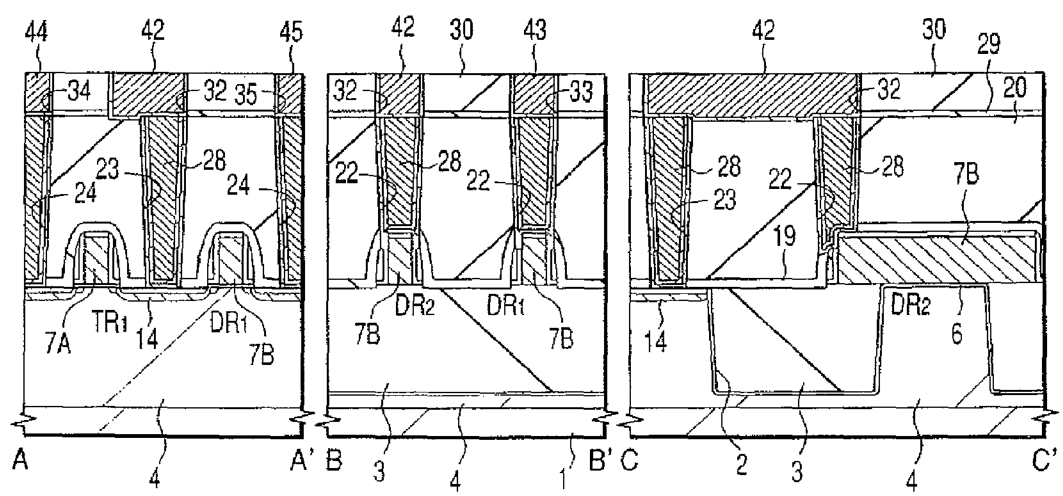
FIG. 81 is a fragmentary cross-sectional view depicting a step in the method of manufacturing the SRAM of the present invention.

Next, as shown in FIG. 81, intermediate conductive layers 42 through 44 are formed inside the trenches 31 through 34 respectively. Each of the intermediate conductive layers 42 through 44 is made up of an oxidation-resistant conductive film like, for example, a W silicide ($WSi_2$) film. When the intermediate conductive layers 42 through 44 are respectively formed of the W silicide film, for example, an adhesive layer such as a TiN film is deposited on the silicon oxide film 30 including the interiors of the trenches 31 through 34 by a sputtering method. Next, the W silicide film is deposited thereover by the sputtering method, followed by removal of the W silicide film and TiN film lying outside the trenches 31 through 34 by a CMP method.

When the intermediate conductive layers 42 through 44 are respectively made up of the oxidation-resistant conductive film like the W silicide film, the process of forming a barrier layer (48) on the surface of each of the intermediate conductive layers 42 through 44 and forming plugs (55) each formed of a polycrystal silicon film over the barrier layer (48) becomes unnecessary.

Figure 82:
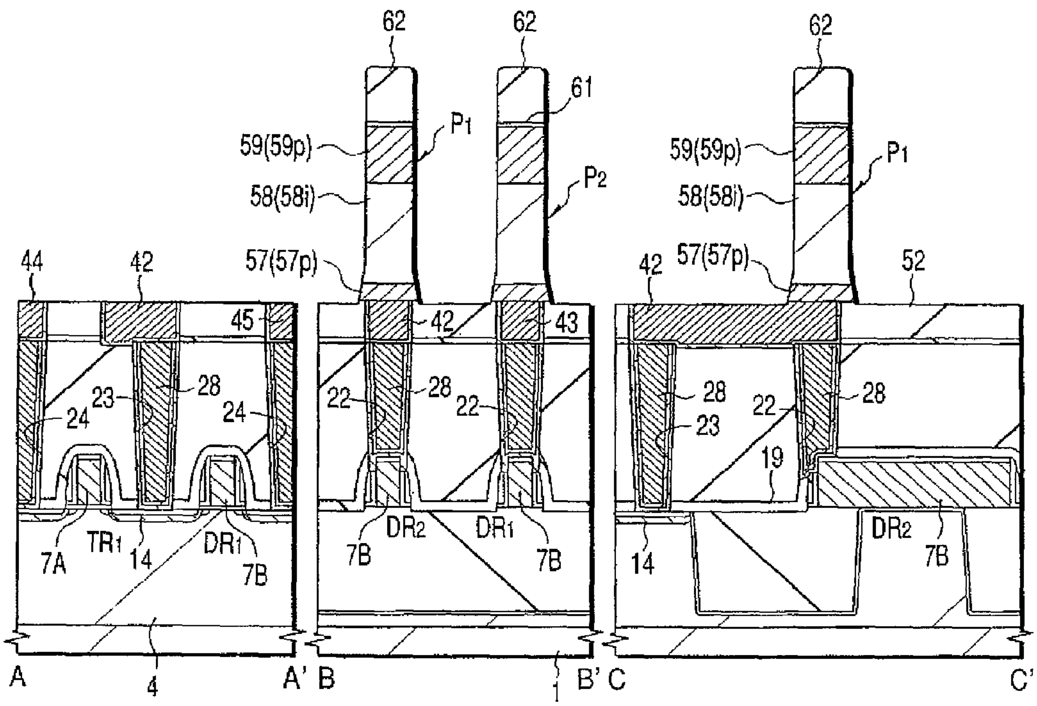
FIG. 82 is a fragmentary cross-sectional view showing a step in the method of manufacturing the SRAM of the present invention.

Next, as shown in FIG. 82, silicon films (57*p*, 58*i* and 59*p*) of three layers, a silicon oxide film 61 and a silicon nitride film 62 are deposited over the silicon oxide film 20 according to the processes shown in FIGS. 35 through 38 in the first embodiment. Subsequently, the triple-layer silicon films (57*p*, 58*i* and 59*p*) are dry-etched using the silicon nitride film 62 as a mask to thereby form laminated bodies ($P_1$ and $P_2$) comprising lower semiconductor layers 57 each formed of the p type silicon film 57*p*, intermediate semiconductor layers 58 each formed of the silicon film 58*i* and upper semiconductor layers 59 each formed of the p type silicon film 59*p*.

Figure 83:
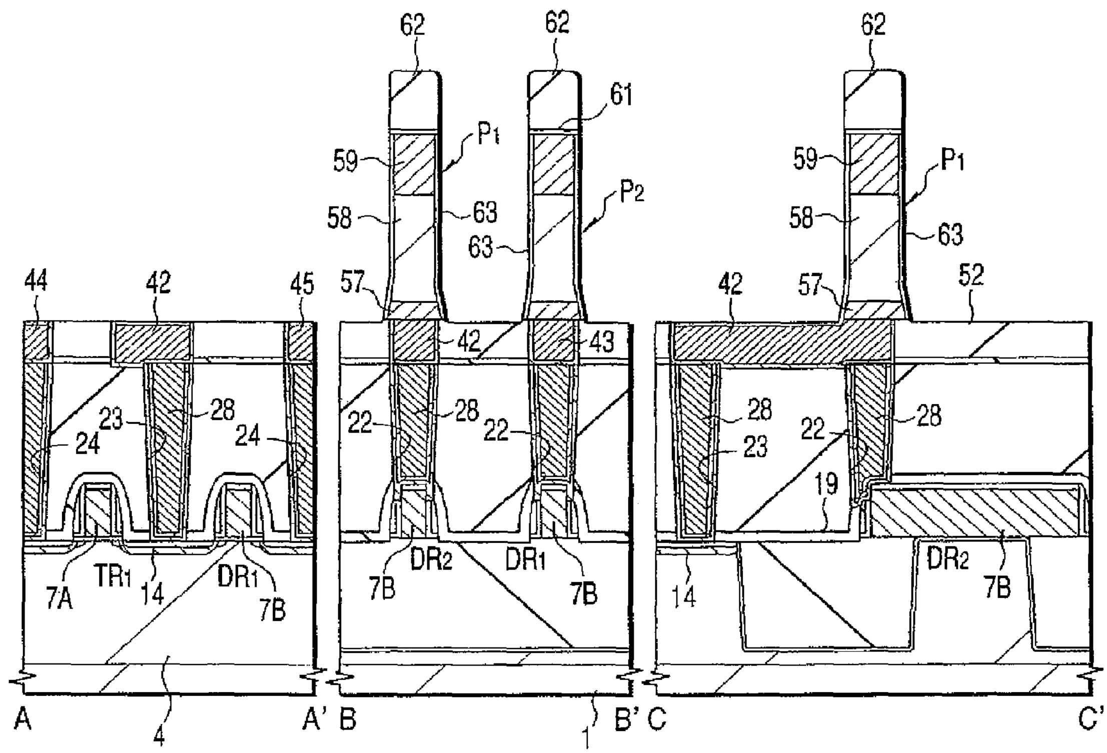
FIG. 83 is a fragmentary cross-sectional view depicting a step in the method of manufacturing the SRAM of the present invention.

Next, as shown in FIG. 83, a substrate 1 is thermally-oxidized to form gate insulating films 63 each formed of a silicon oxide film on their corresponding sidewall surfaces of the lower semiconductor layers 57, intermediate semiconductor layers 58 and upper semiconductor layers 59 constituting the laminated bodies ($P_1$ and $P_2$). Although the intermediate conductive layers 42 through 44 in areas uncovered with the laminated bodies ($P_1$ and $P_2$) are also subjected to an oxidative atmosphere at this time, they are not oxidized up to their interiors because they are formed of the oxidation-resistant conductive film even if their surfaces are oxidized.

Figure 84:
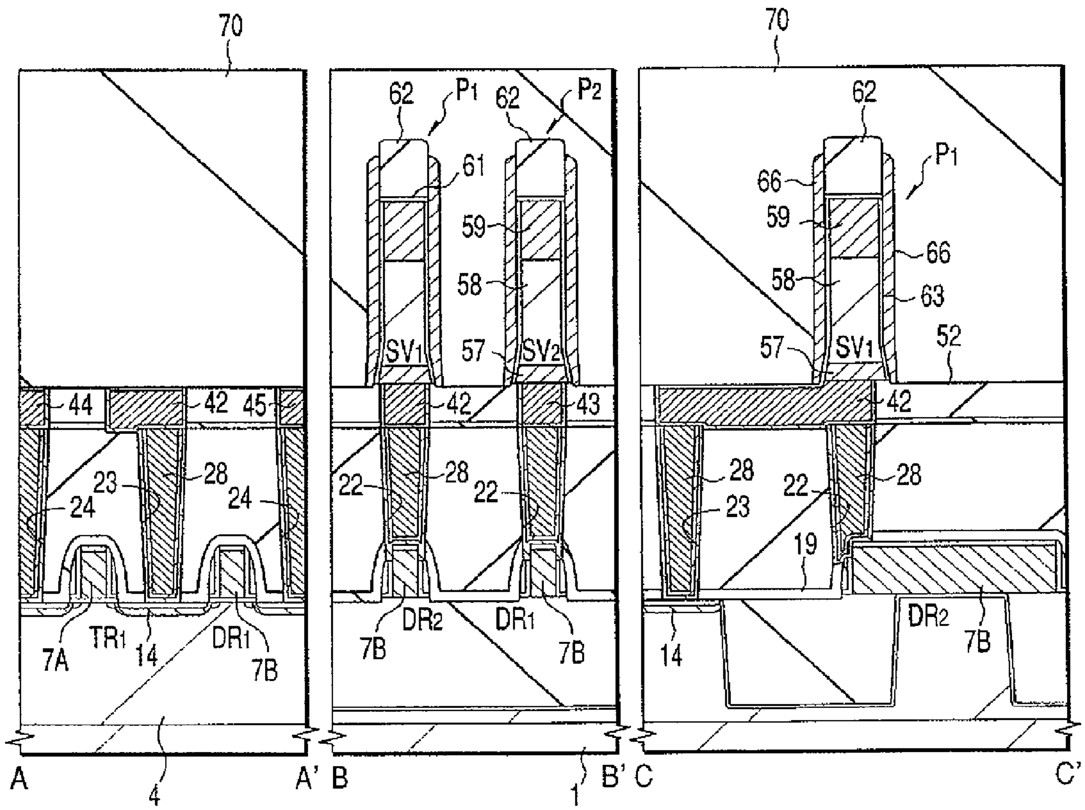
FIG. 84 is a fragmentary cross-sectional view illustrating a step in the method of manufacturing the SRAM of the present invention.

Next, as shown in FIG. 84, gate electrodes 66 of vertical MISFETs ($SV_1$ and $SV_2$) are formed on their corresponding side walls of the laminated bodies ($P_1$ and $P_2$) and silicon nitride films 62 disposed thereabove according to the processes shown in FIGS. 40 through 42 in the first embodiment. Subsequently, a silicon oxide film 70 is deposited over the substrate 1 by a CVD method and thereafter the surface thereof is planarized by the CMP method. While each of the gate electrodes 66 is made up of, for example, a p type polycrystal silicon film, it may be formed of a one-layer polycrystal silicon film as shown in the drawing.

Figure 85:
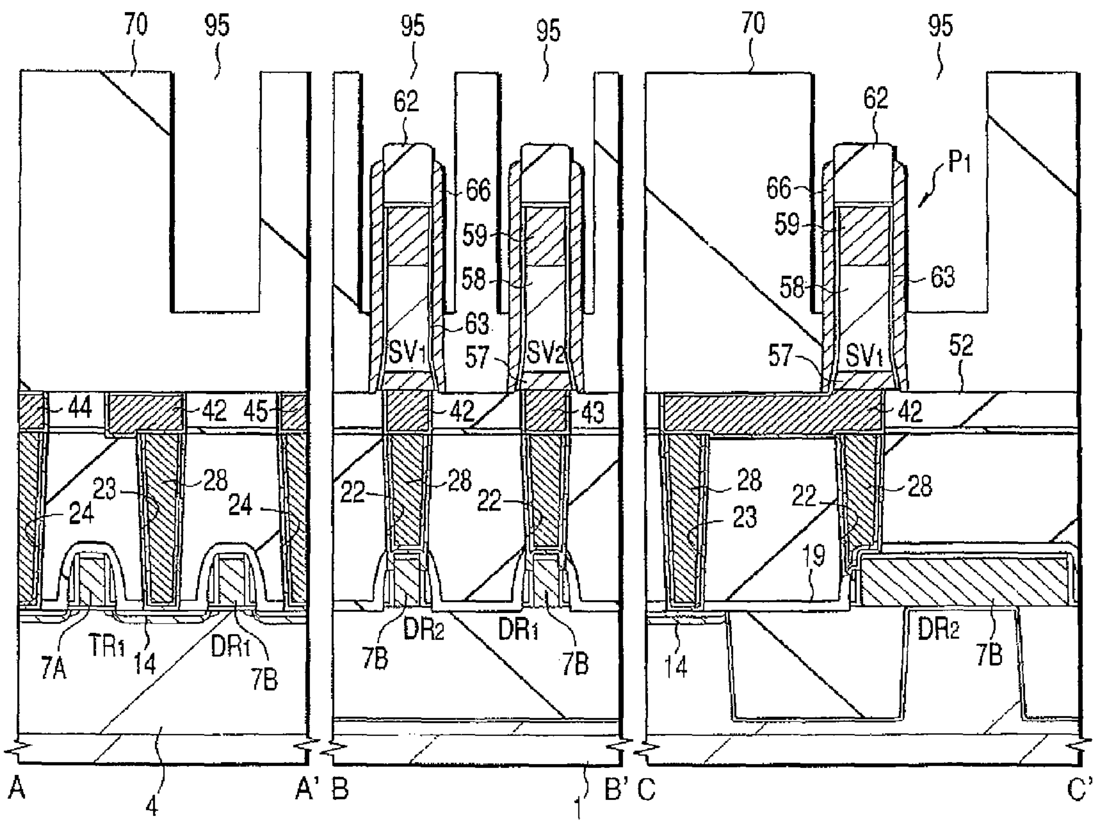
FIG. 85 is a fragmentary cross-sectional view depicting a step in the method of manufacturing the SRAM of the present invention.

Next, as shown in FIG. 85, the silicon oxide film 70 is dry-etched using a photoresist film as a mask to thereby form a trench 95 for opening the peripheries of the laminated bodies ($P_1$ and $P_2$).

Figure 86:
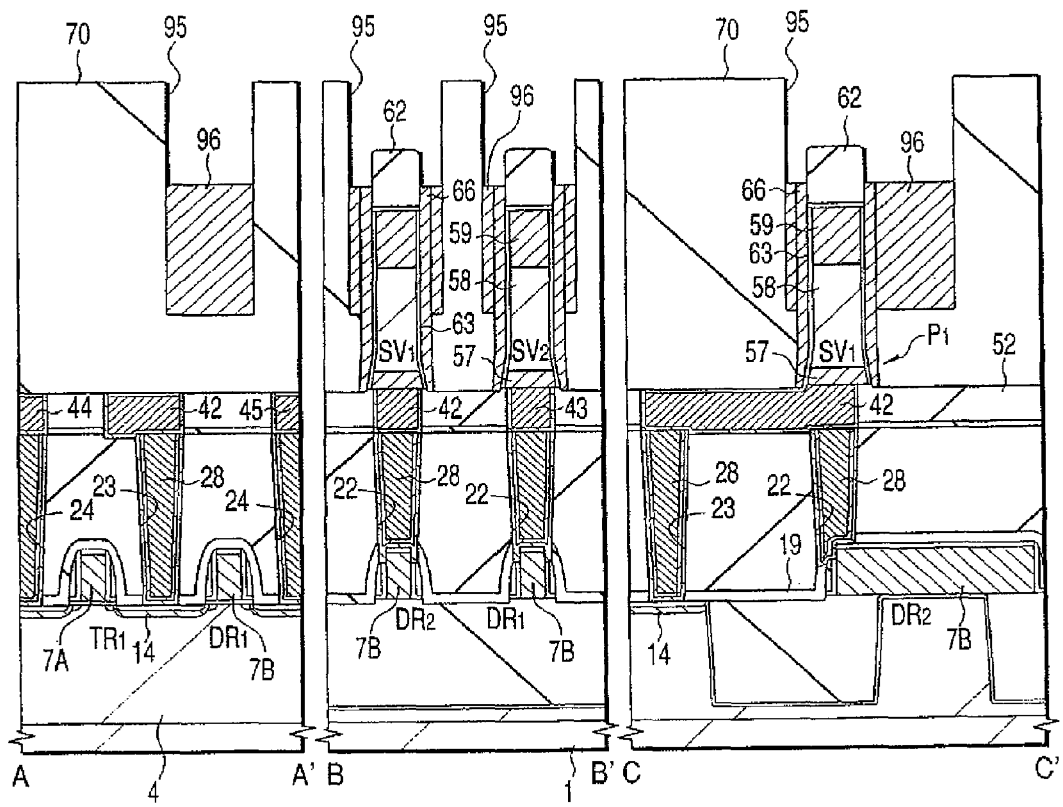
FIG. 86 is a fragmentary cross-sectional view showing a step in the method of manufacturing the SRAM of the present invention.

Next, as shown in FIG. 86, a p type polycrystal silicon film is deposited on the silicon oxide film 70 containing the interior of the trench 95 by the CVD method. Thereafter, the polycrystal silicon film lying outside the trench 95 is removed by CMP or etchback. Subsequently, the polycrystal silicon film lying inside the trench 95 and the gate electrodes 66 are etched back to thereby withdraw upper surfaces of the polycrystal silicon film and gate electrodes 66 downward as viewed from the upper surface of the silicon oxide film 70 and form a gate drawing electrode 96 formed of the polycrystal silicon film inside the trench 95. Thereafter, a silicide layer such as Co silicide or the like may be formed on the surface of the gate drawing electrode 96 to thereby reduce contact resistance between a plug (80) formed over the gate drawing electrode 96 in the following process and the gate drawing electrode 96.

Figure 87:
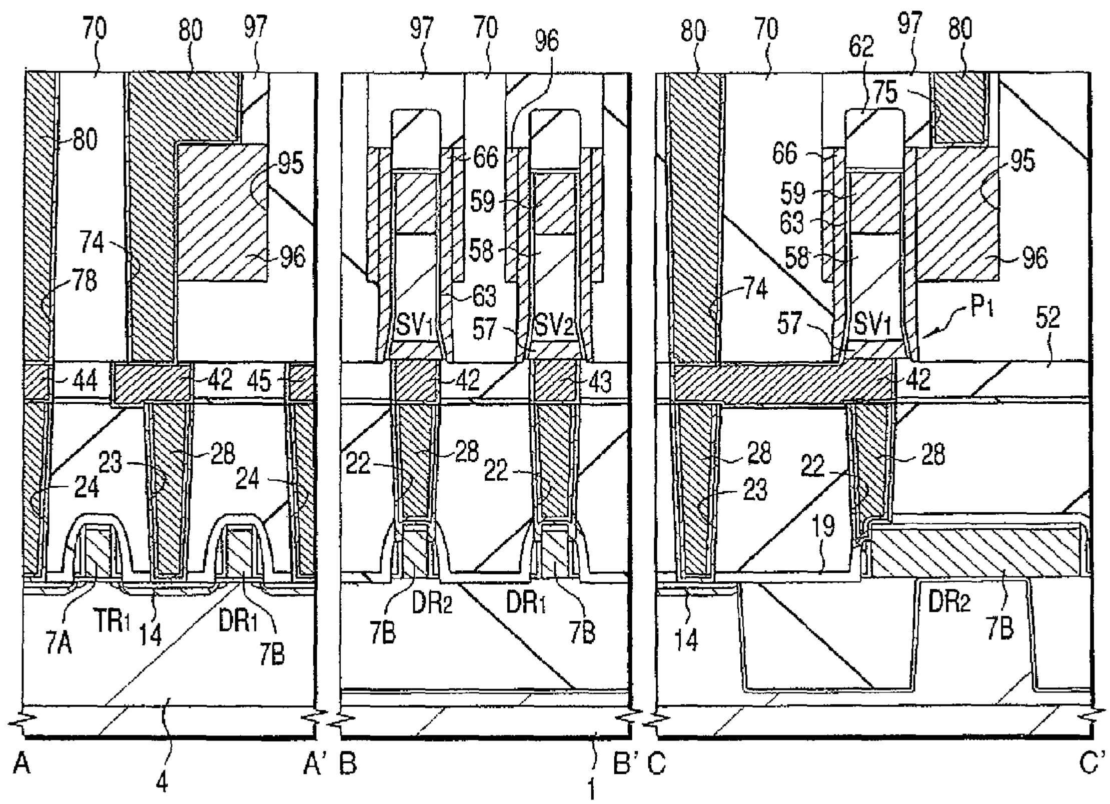
FIG. 87 is a fragmentary cross-sectional view depicting a step in the method of manufacturing the SRAM of the present invention.

Next, as shown in FIG. 87, a silicon oxide film 97 is embedded into the trench 95 to planarize the surface thereof. Thereafter, the silicon oxide film 70 is dry-etched according to the processes shown in FIGS. 48 through 50 in the first embodiment to thereby form a through hole 74 for exposing the surface of the gate drawing electrode 96 and an intermediate conductive layer 42. Subsequently, the plug 80 is formed inside the through hole 74. In order to form the plug 80, for example, a Ti film and a TiN film are deposited on the silicon oxide film 70 containing the interiors of the through holes 74 through 79 by the sputtering method. After the deposition of a TiN film and a W film by the CVD method, the W film, TiN film and Ti film lying outside the through holes 74 through 79 are continuously removed by the CMP method. Consequently, the gate electrode 66 of the vertical MISFET ($SV_2$), an $n^+$ type semiconductor region 14 (source or drain) common to the transfer MISFET ($TR_1$) and drive MISFET ($DR_1$), and a gate electrode 7B of the drive MISFET ($DR_2$) are electrically connected to one another through the gate drawing electrode 96, plug 80, intermediate conductive layer 42 and plug 28.

According to the present embodiment, since the area where each of the gate electrodes 66 of the vertical MISFETs ($SV_1$ and $SV_2$) and its corresponding gate drawing electrode 96 contact, can be made wider, the contact resistance between the gate electrode 66 and the gate drawing electrode 96 can be reduced.

Sixth Embodiment

Figure 88:
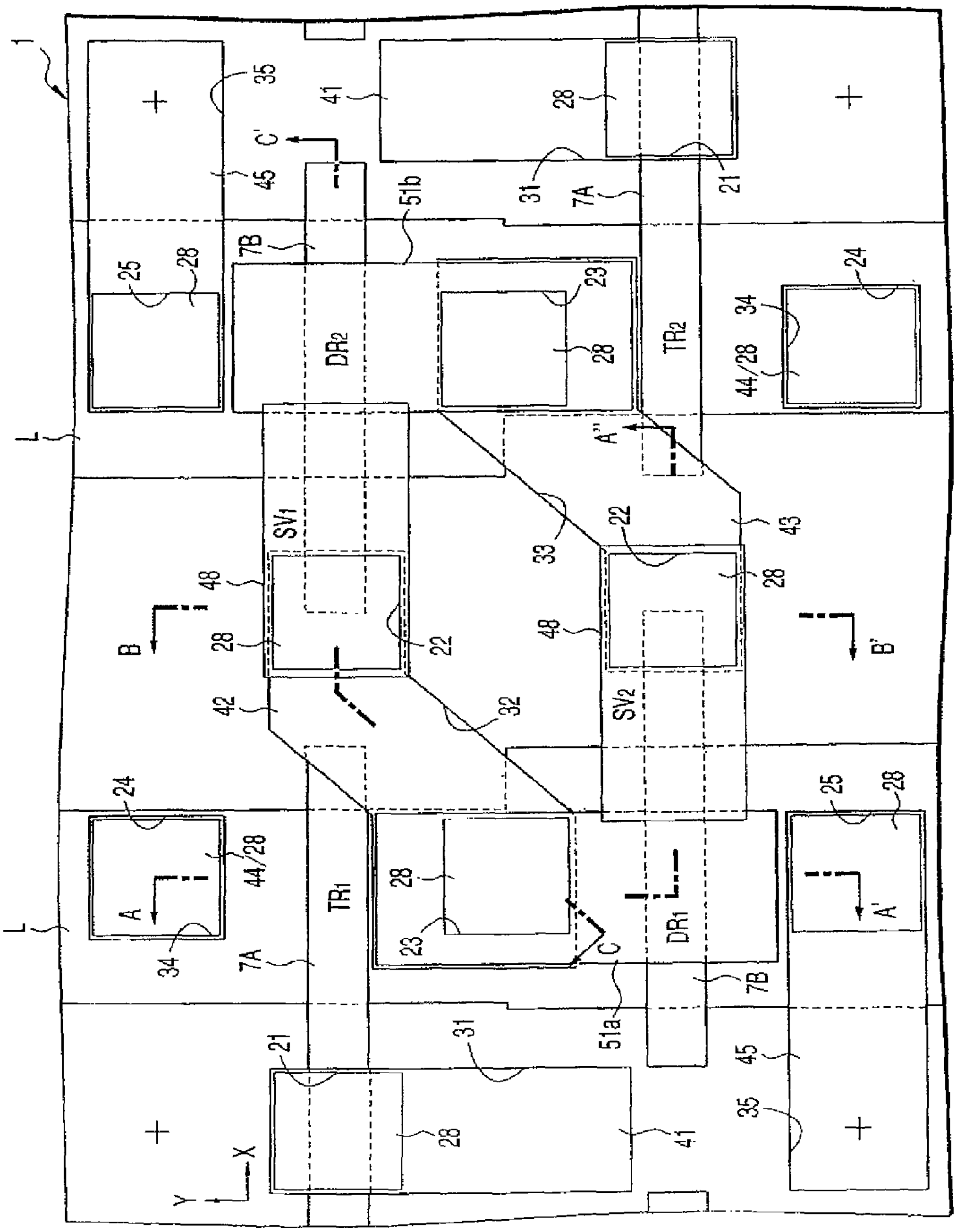
FIG. 88 is a fragmentary plan view showing a step in the method of manufacturing an SRAM according to a sixth embodiment of the present invention.
Figure 89:
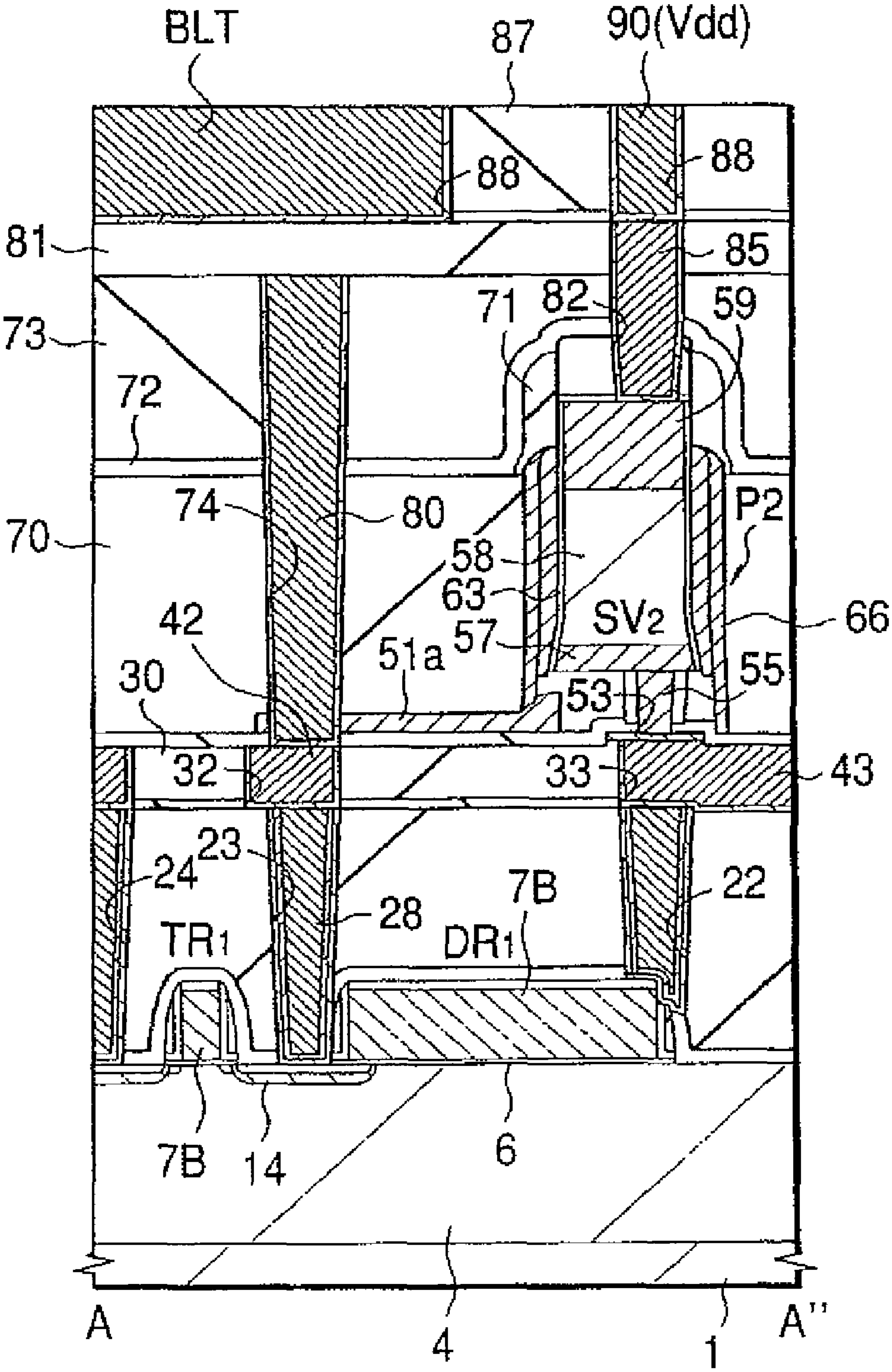
FIG. 89 is a fragmentary cross-sectional view depicting a step in the method of manufacturing the SRAM of the present invention.

FIG. 88 is a plan view of a memory cell according to the present embodiment, and FIG. 89 is a cross-sectional view taken along line A-A' of FIG. 88, respectively.

In the memory cell according to the first embodiment as shown in FIG. 29, the gate drawing electrodes 51 connected to the gate electrodes 66 of the vertical MISFETs ($SV_1$ and $SV_2$) are constituted by the rectangular plane patterns each having the long side extending in the X direction as viewed in the drawing. In the memory cell according to the present embodiment, on the contrary, as shown in FIG. 88, gate drawing electrodes 51 are constituted by rectangular plane patterns each having a long side extending in a Y direction as viewed in the drawing.

When the gate drawing electrodes 51 are respectively constituted by such plane patterns, X-direction sizes of laminated bodies ($P_1$ and $P_2$) can be increased by reductions in the X-direction sizes of the gate drawing electrodes 51 respectively. Thus, since the areas of the vertical MISFETs ($SV_1$ and $SV_2$) can be increased, drain currents (Ids) of the vertical MISFETs ($SV_1$ and $SV_2$) can be increased.

When the gate drawing electrodes 51 are constituted by such plane patterns, the flat or plane patterns of the gate drawing electrodes 51, a through hole 74 and intermediate conductive layers 42 and 43 overlap each other as shown in FIG. 89. Therefore, even when the gate drawing electrodes 51 and the through hole 74 are displaced in relative position due to misalignment of photomasks, a reduction in the contact area therebetween can be suppressed. Since, in this case, the through hole 74 extends through the gate drawing electrodes 51 to reach the surfaces of the intermediate conductive layers 42 and 43, plug 80 lying inside the through hole 74 is brought into contact with side faces of the gate drawing electrodes 51, which are exposed to inner walls of the through hole 74 respectively.

Seventh Embodiment

Figure 90:
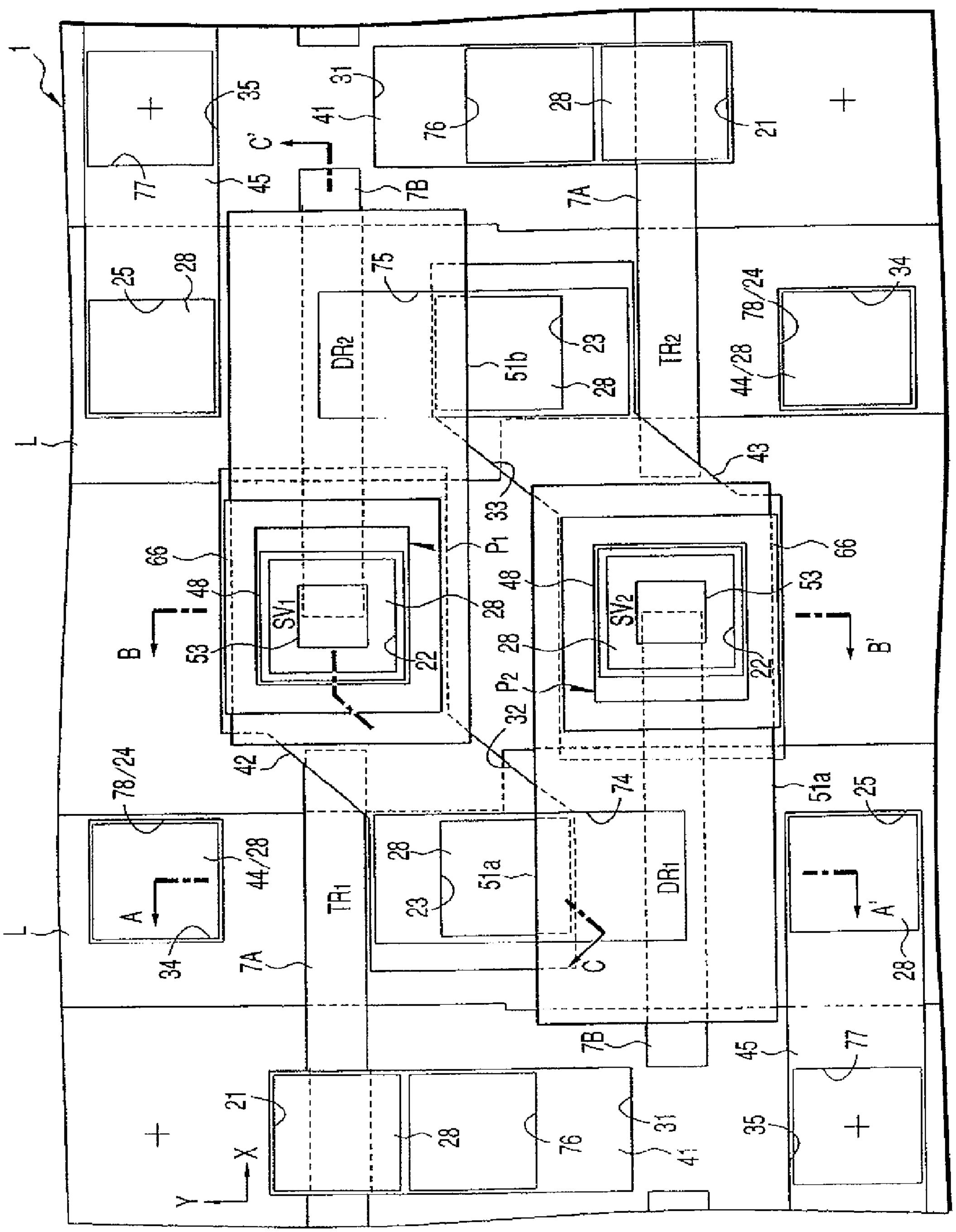
FIG. 90 is a fragmentary plan view showing a step in the method of manufacturing an SRAM according to a seventh embodiment of the present invention.
Figure 91:
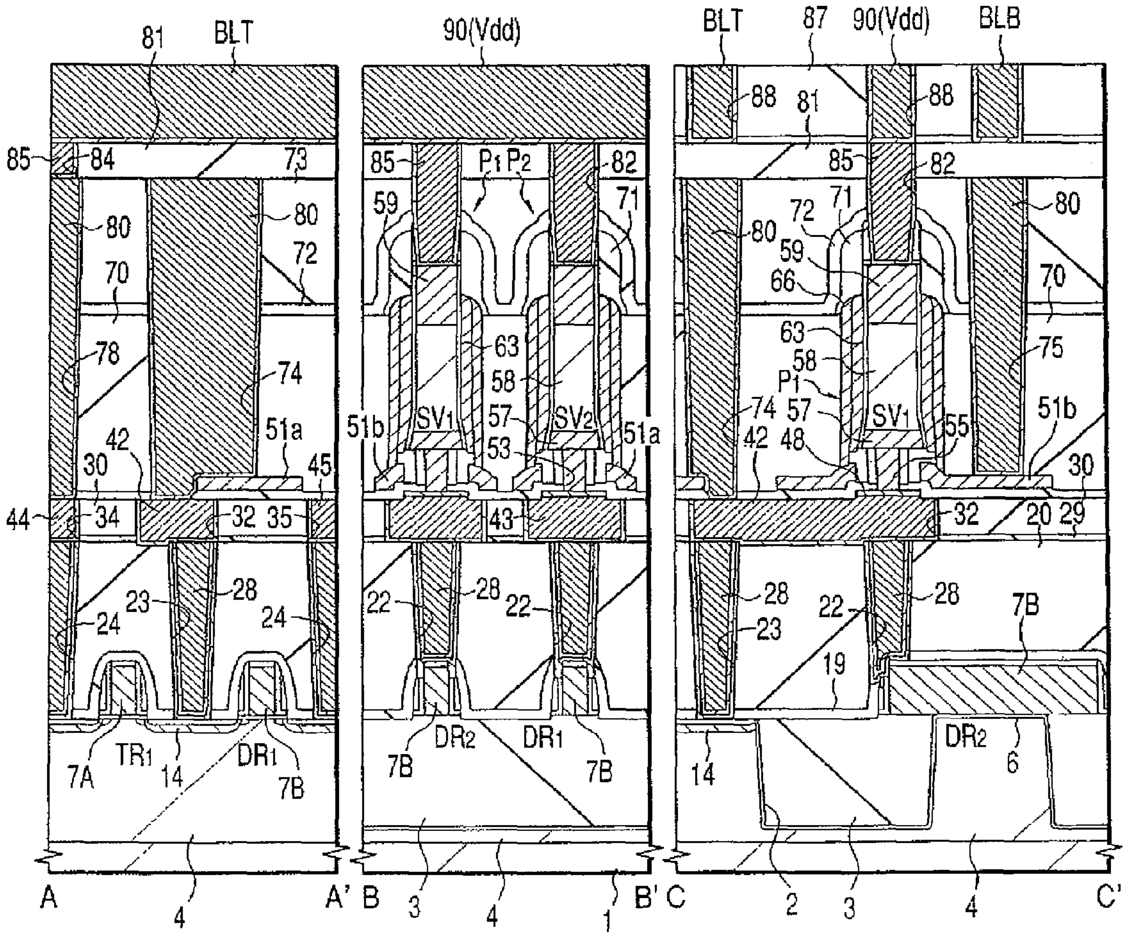
FIG. 91 is a fragmentary cross-sectional view illustrating a step in the method of manufacturing the SRAM of the present invention.

FIG. 90 is a plan view of a memory cell according to the present embodiment, and FIG. 91 is a fragmentary cross-sectional view of FIG. 90, respectively. As shown in FIG. 90, the present embodiment is identical to the first embodiment except that the plane patterns of intermediate conductive patterns 42 and 43 and gate drawing electrodes 51*a* and 51*b* are different from one another. Incidentally, FIG. 90 corresponds to FIG. 48 in the first embodiment, and FIG. 91 corresponds to FIG. 3 in the first embodiment, respectively.

Figure 92:
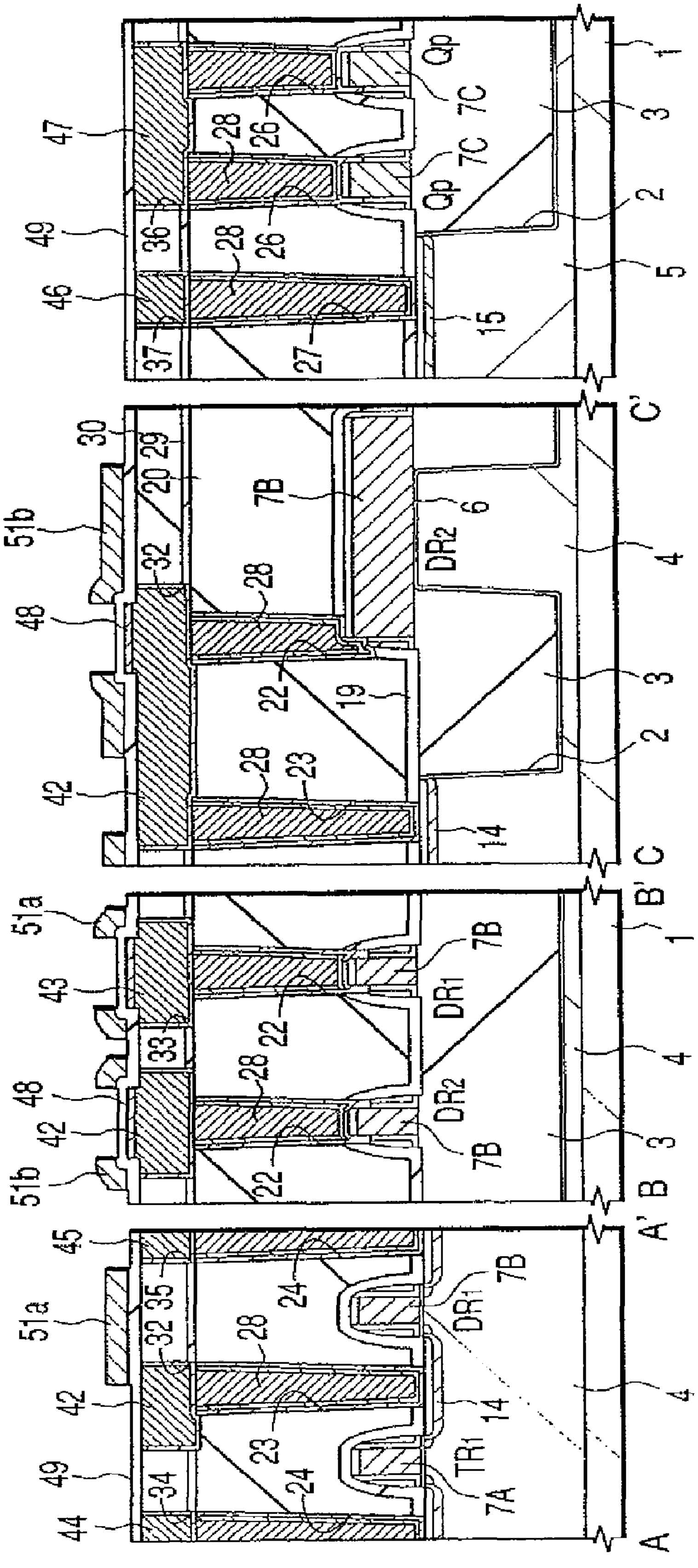
FIG. 92 is a fragmentary cross-sectional view depicting a step in the method of manufacturing the SRAM of the present invention.
Figure 93:
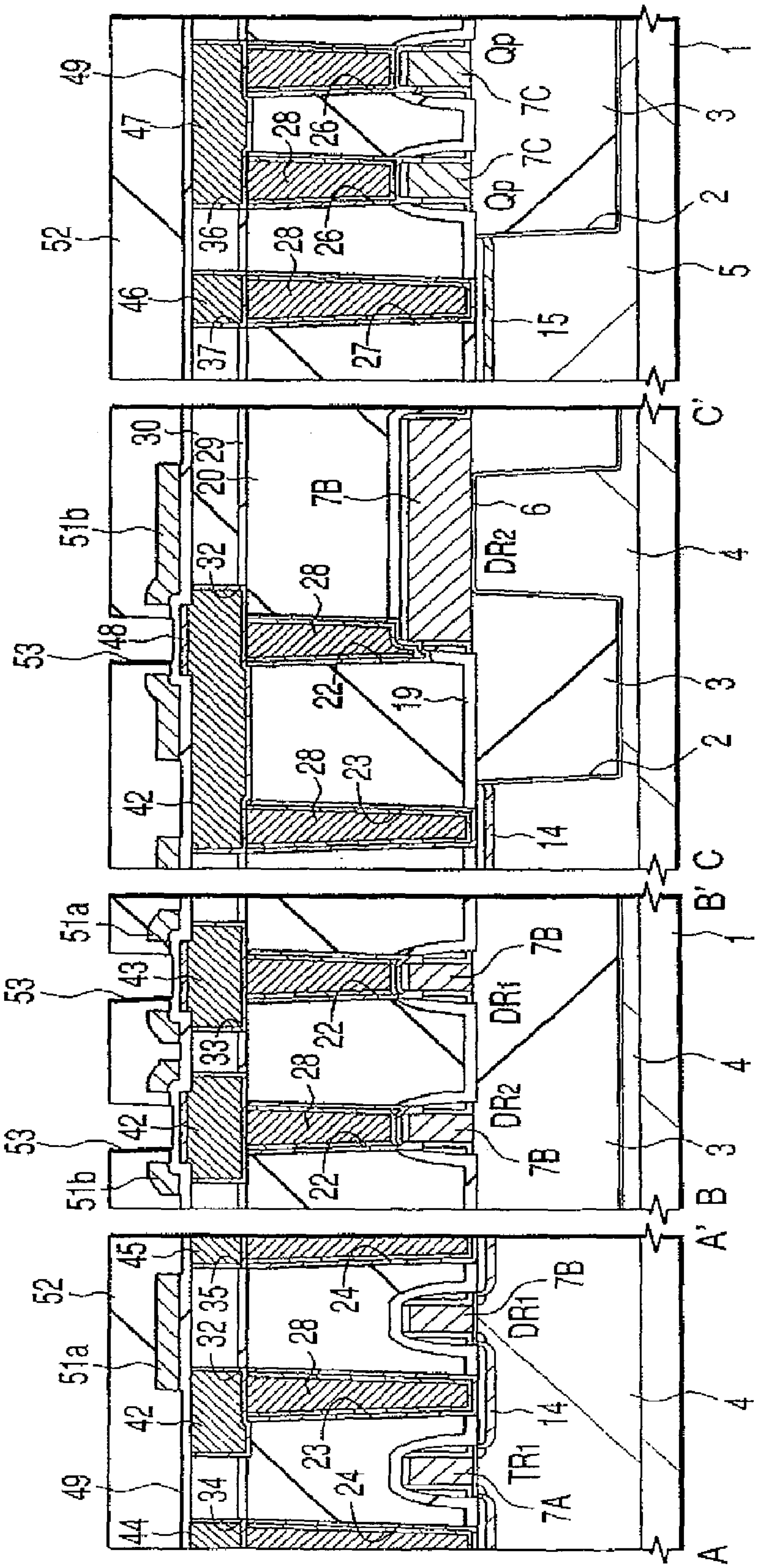
FIG. 93 is a fragmentary cross-sectional view showing a step in the method of manufacturing the SRAM of the present invention.
Figure 94:
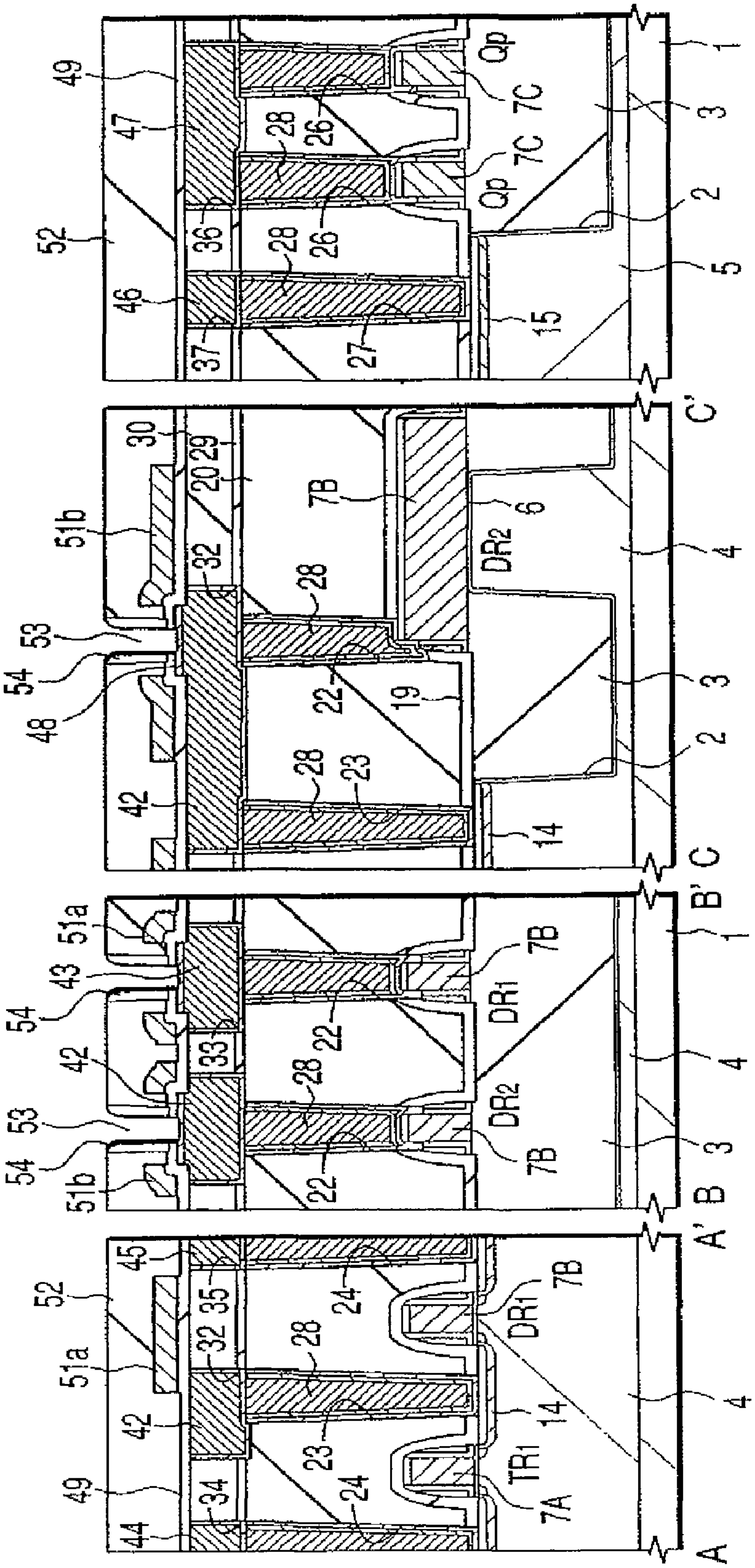
FIG. 94 is a fragmentary cross-sectional view depicting a step in the method of manufacturing the SRAM of the present invention.

As shown in FIGS. 90 and 91, the gate drawing electrodes 51*a* and 51*b* are respectively constituted by such plane patterns as to cover lower ends of gate electrodes 66 (second polycrystal silicon layer 65) of vertical MISFETs ($SV_1$ and $SV_2$). Thus, since the gate electrodes 66 (second polycrystal silicon layer 65) are respectively brought into contact with the gate drawing electrodes 51*a* and 51*b* over substantially the full circumferential gates at the lower ends of the gate electrodes 66 (second polycrystal silicon layer 65) formed in a sidewall spacer fashion, the contact areas between the gate drawing electrodes 51*a* and 51*b* with the gate electrodes 66 (second polycrystal silicon layer 65) of the vertical MISFETs ($SV_1$ and $SV_2$), can be increased, and a connection resistance can be reduced, thereby making it possible to enhance the characteristic of the memory cell. Incidentally, the gate drawing electrodes 51*a* and 51*b* and plugs 55 are electrically isolated from one another by sidewall spacers 54 formed of an insulating film and an insulating film 52. Incidentally, the manufacturing process for the present embodiment is substantially similar to that of the first embodiment. FIGS. 92 through 94 show fragmentary cross-sectional views showing step in the manufacturing process for the present embodiment. FIG. 92 corresponds to FIG. 30 in the first embodiment, FIG. 93 corresponds to FIG. 31 in the first embodiment, and FIG. 94 corresponds to FIG. 32 in the first embodiment, respectively. As shown in FIGS. 92 and 93, through holes 53 are respectively defined in gate drawing electrodes 51*a* and 51*b*. As shown in FIG. 94, sidewall spacers 54 formed of an insulating film are formed on their corresponding side walls of the through holes 53 on a self-alignment basis with respect to the through holes 53. Thus, the gate drawing electrodes 51*a* and 51*b* and plugs 55 are electrically isolated from one another by the sidewall spacers 54 formed of the insulating film and an insulating film 52.

As shown in FIGS. 90 and 91 as well, an intermediate conductive film 42 is formed so as to overlap with the gate drawing electrode 51*b* within an alignment-margin allowable range as viewed on a plane basis. An intermediate conductive film 43 is formed so as to overlap with the gate drawing electrode 51*a* within an alignment-margin allowable range as viewed on a plane basis. Thus, the intermediate conductive film 42 is set as one electrode, and the gate drawing electrode 51*b* is set as the other electrode. A silicon nitride film 49 formed therebetween forms a first capacitive element which serves as a capacitive insulating film. The intermediate conductive film 43 is set as one electrode, and the gate drawing electrode 51$a$ is set as the other electrode. A silicon nitride film 49 formed therebetween forms a second capacitive element which serves as a capacitive insulating film. The first capacitive element and the second capacitive element each have one electrode electrically connected to a storage node A and the other electrode electrically connected to a storage node B. Namely, the first capacitive element and the second capacitive element are added between the pair of storage nodes A and 13 and are capable of enhancing the soft error resistance of the memory cell. Since the capacitive insulating film is made up of the silicon nitride film 49 which is higher in dielectric constant than a silicon oxide film, its capacitance value can be increased.

Eighth Embodiment

In the memory cell according to the first embodiment, the gate drawing electrodes 51 (51$a$ and 51$b$) for connecting the gate electrodes 66 of the vertical MISFETs ($SV_1$ and $SV_2$) and the storage nodes are formed of the p type polycrystal silicon film 50.

The surfaces of the gate drawing electrodes 51$a$ and 51$b$ are etched by the process of forming the first polycrystal silicon layer 64 constituting parts of the gate electrodes 66 of the vertical MISFETs ($SV_1$ and $SV_2$) on the side wails of the laminated bodies ($P_1$ and $P_2$) (see FIG. 40), the process of forming the second polycrystal silicon layer 65 constituting the other parts of the gate electrodes 66 (see FIG. 41), and the process of forming the through holes 74 and 75 over the gate drawing electrodes 51$a$ and 51$b$ (see FIG. 49). Therefore, there is a possibility that when the gate drawing electrodes 51$a$ and 51$b$ are formed of the polycrystal silicon film 50, the gate drawing electrodes 51$a$ and 51$b$ will be made thin in thickness after the passage of the above-described three etching processes, and if the worst happens, the contact resistance between each of plugs 80 formed inside the through holes 74 and 75 and each of the gate drawing electrodes 51$a$ and 51$b$ will increase to a large extent.

As a countermeasure against this problem, the formation of the gate drawing electrodes 51$a$ and 51$b$ by a metal nitride film like a WN film or a TiN film is effective.

Since the metal nitride film is large in etching selection to an insulating film as compared with the polycrystal silicon film, cutting or scraping of the film by the above-described three etching is less reduced. Therefore, the gate drawing electrodes 51$a$ and 51$b$ can be originally made thin in thickness, so the thickness of a silicon oxide film 52 covering the gate drawing electrodes 51$a$ and 51$b$ can also be made thin. Thus, since the through holes 53 (see FIG. 31) formed in the silicon oxide film 52 can be reduced in aspect ratio, a process margin is enhanced.

Since the metal nitride film is high in barrier property, there is no possibility that an undesired reactive product will occur in an interface where it comes into contact with each of the gate electrodes 66 of the vertical MISFETs ($SV_1$ and $SV_2$) formed of the polycrystal silicon film.

The surfaces of intermediate conductive layers 42 and 43 each formed of a laminated film of a TiN film and a W film are also etched in the process of forming the through holes 74 and 75 over the gate drawing electrodes 51$a$ and 51$b$ (see FIG. 49). Since, however, the difference in etching selection ratio between each of the gate drawing electrodes 51$a$ and 51$b$ and each of the intermediate conductive layers 42 and 43 is reduced where the gate drawing electrodes 51$a$ and 51$b$ and the intermediate conductive layers 42 and 43 are both made of a metal material, the processing of the through holes 74 and 75 becomes easy. The gate drawing electrodes 51$a$ and 51$b$ may be made up of a metal silicide film like a W silicide film or a Ti silicide film.

When the gate drawing electrodes 51$a$ and 51$b$ are made of such a metal material as described above, the second polycrystal silicon layer 65 brought into contact with the gate drawing electrodes 51$a$ and 51$b$, of the two polycrystal silicon layers (64 and 65) constituting the gate electrodes 66 of the vertical MISFETs ($SV_1$ and $SV_2$) may be replaced by a metal film. In doing so, the metal materials are brought into contact with each other at a portion where each of the gate drawing electrodes 51$a$ and 51$b$ and its corresponding gate electrode 66 are brought into contact with each other, even if its contact area is small, so the contact resistance between the two can be reduced. A portion where the first polycrystal silicon layer 64 constituting the gate electrodes 66 and the metal film are brought into contact with each other, increases in contact resistance per unit area as compared with the contact between the metal materials. However, since the contact area between two is large, the whole contact resistance is reduced.

Ninth Embodiment

In the memory cell according to the first embodiment, the barrier layers 48 formed of the WN film or the like are formed on the surfaces of the intermediate conductive layers 42 and 43 for connecting the vertical MISFETs ($SV_1$ and $SV_2$) and the lower MISFETs ($DR_1$, $DR_2$, $TR_1$ and $TR_2$) to thereby prevent the occurrence of an undesired silicide reaction at the interface between each of the intermediate conductive layers 42 and 43 formed of the W film and each of the plugs 55 formed of the polycrystal silicon film, which are formed within the through holes 53 provided thereabove.

However, when the barrier layers 48 are formed of the WN film, a problem arises in that the contact resistance at the interface between the plug 55 formed of the polycrystal silicon film and the barrier layer 48 is relatively high. Particularly since the through holes 53 into which the plugs 55 are embedded, are very small in diameter, the contact resistance increases with micro-fabrication of the memory cell, so that a reduction in drain current of each of the vertical MISFETs ($SV_1$ and $SV_2$) occurs.

The reason why the contact resistance at the interface between the plug 55 and the barrier layer 48 increases is considered to result from the fact that, since the WN film constituting the barrier layers 48 is thermally instable, part of WN is decomposed into W and N under heat treatment in the manufacturing process and such N reacts with the polycrystal silicon film constituting the plugs 55, so that a high-resistance silicon nitride layer is produced at the interface between the plug 55 and the barrier layer 48.

Figure 95:
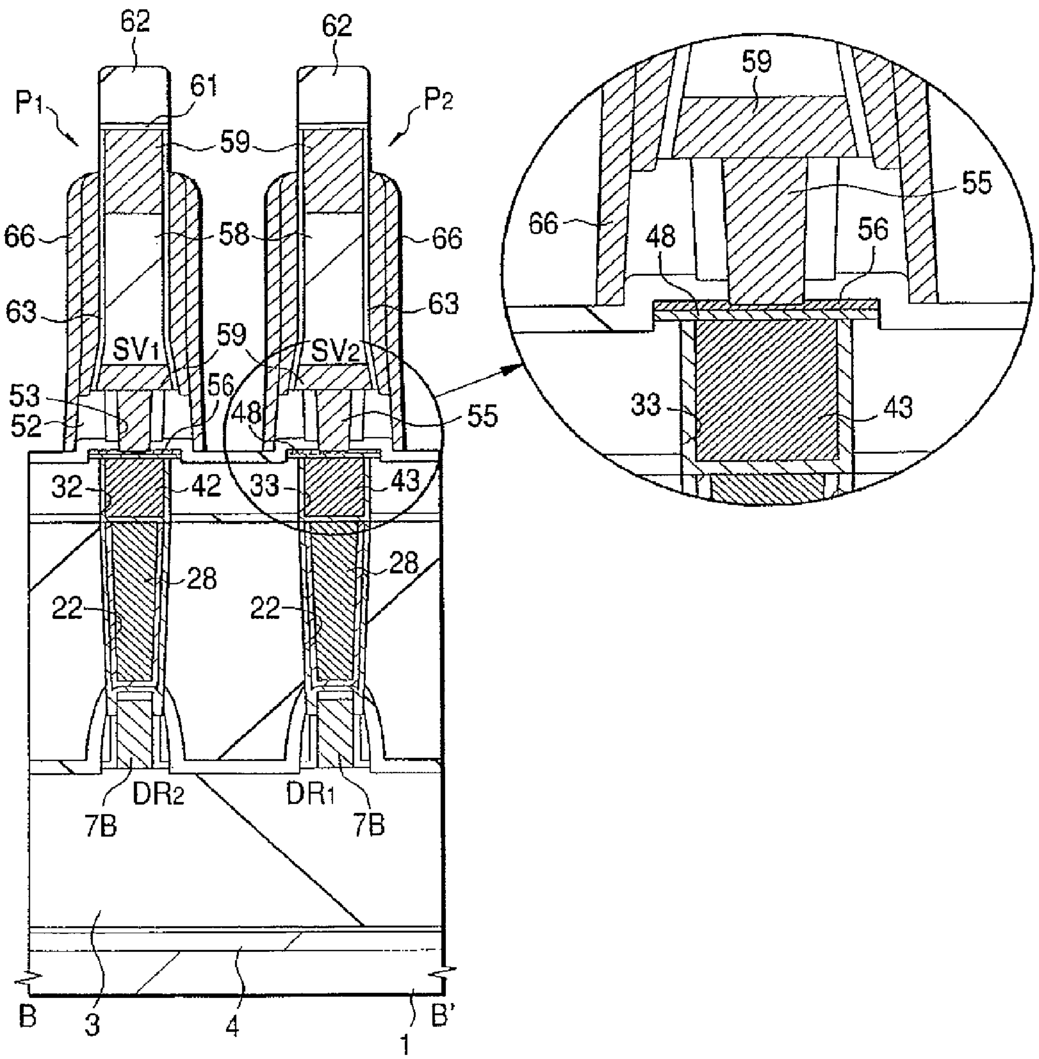
FIG. 95 is a fragmentary cross-sectional view showing a step in the method of manufacturing an SRAM according to a ninth embodiment of the present invention.

As a countermeasure against this problem, reactive layers 56 for preventing reactions between the plugs 55 and the barrier layers 48 are respectively provided between the plugs 55 and the barrier layers 48 in the present embodiment as shown in FIG. 95.

The barrier layer 48 is made up of, for example, a single-layered film such as a WN film, a Ti film or a TiN film, or a laminated film of the WN film and a W film, the TiN film and W film, or the like. On the other hand, the reactive layer 56 is made up of a metal film which is able to form silicide by reaction with a polycrystal silicon film constituting each plug 55 as in the case of, for example, a Co film, a Ti film, a W film or the like. A pre-silicidized metal film like a Co silicide film, a Ti silicide film, a W silicide film or the like may be used.

In order to form the reactive layers 56, a barrier layer material (e.g., WN film) and a reactive layer material (e.g., Co film) are sequentially deposited on a substrate 1 by a sputtering method in the process shown in FIG. 27 in the first embodiment. Thereafter, the barrier layer material and reactive layer material may be patterned by dry etching using a photoresist film as a mask.

Figure 96:
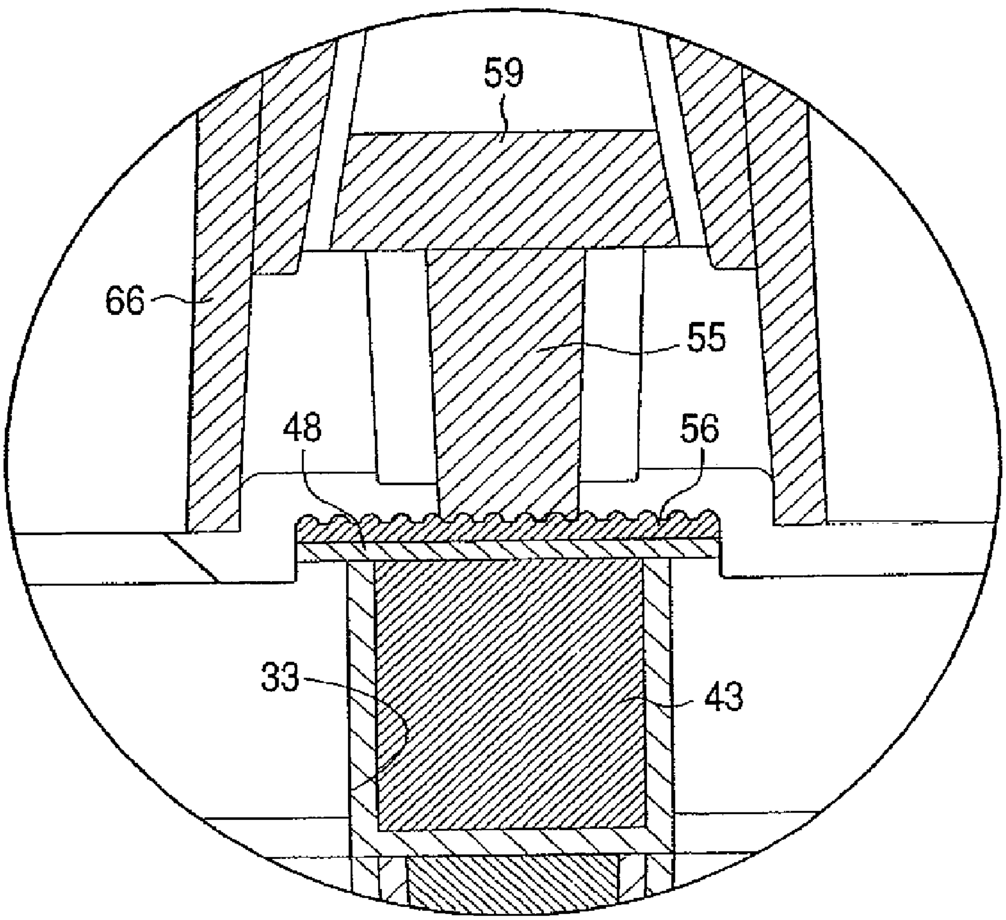
FIG. 96 is a fragmentary enlarged cross-sectional view showing a step in the method of manufacturing an SRAM of the present invention.

As shown in FIG. 96, small depressions and projections are formed in the surface of the reactive layer 56 to increase the area where the reactive layer 56 and the plug 55 are brought into contact with each other, whereby the contact resistance between the two can further be reduced. The depressions and projections can be formed by controlling the growth rate of each crystal grain in the film upon growth or deposition of, for example, a material (Co film or the like) constituting the reactive layer 56.

Thus, according to the present embodiment wherein the barrier layer 48 and reactive layer 56 are interposed at the interface between each of the intermediate conductive layers 42 and 43 and the plug 55, the diffusion of silicon from the plug 55 to each of the intermediate conductive layers 42 and 43 can be prevented by a barrier, and an increase in contact resistance at the interface referred to above can be suppressed. It is therefore possible to suppress a reduction in drain current of each of the vertical MISFETs ($SV_1$ and $SV_2$).

Incidentally, a thermal treatment temperature in an LSI manufacturing process generally tends to fall with micro-fabrication of a semiconductor device. Thus, if a thermal treatment temperature in an SRAM manufacturing process is lowered even in the case of an SRAM, then a single-layered film of a metal silicide film like, for example, a W silicide film may be shared between the barrier layer 48 and the reactive layer 56. Alternatively, the barrier layer 48 and the reactive layer 56 are omitted and the plug 55 may be brought into direct contact with the surface of each of the intermediate conductive layers 42 and 43.

Figure 97:
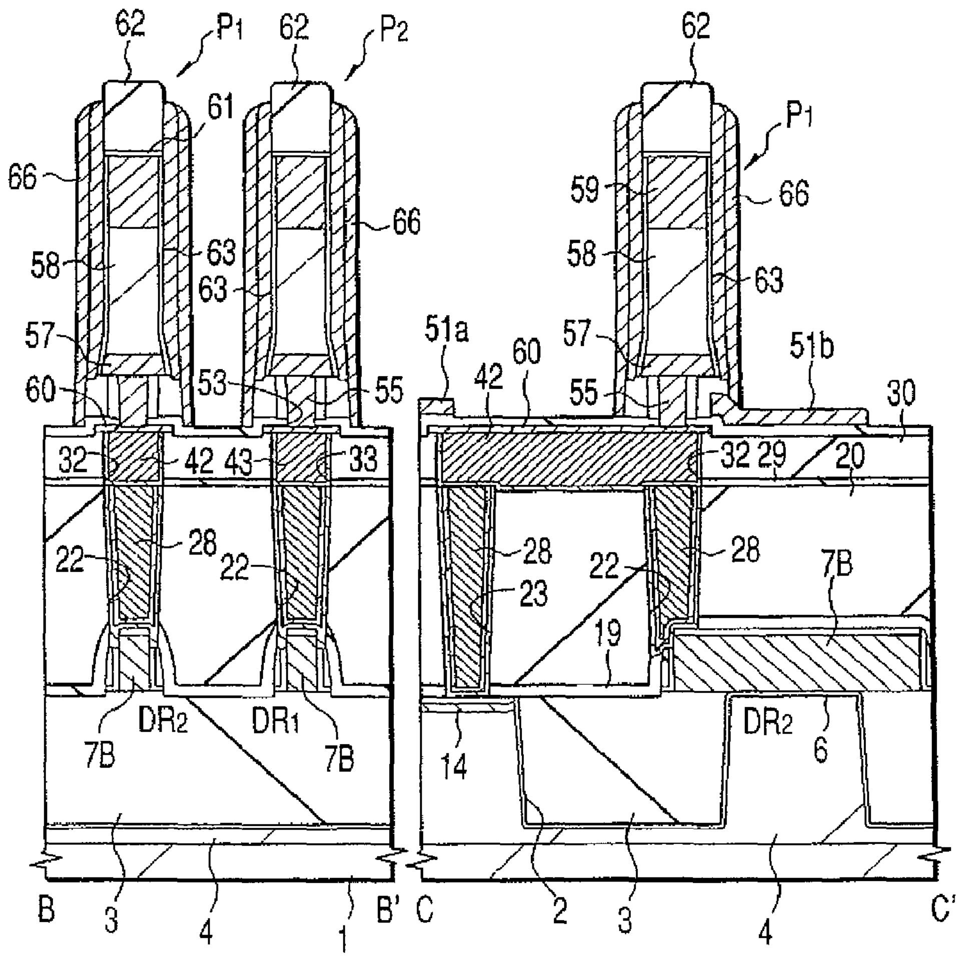
FIG. 97 is a fragmentary cross-sectional view illustrating a step in the method of manufacturing the SRAM of the present invention.

When the plugs 55 are respectively brought into direct contact with the surfaces of the intermediate conductive layers 42 and 43, a polycrystal silicon film 60 of the same conductivity type as the plugs 55 may be formed over the whole surfaces of the intermediate conductive layers 42 and 43 as shown in FIG. 97, for example. Alternatively, each of the intermediate conductive layers 42 and 43 may be made up of a laminated film of a W film and the polycrystal silicon film 60. Since the W film and polycrystal silicon film 60 constituting the intermediate conductive layers 42 and 43 are brought into contact with each other in a large area in such a case, the contact resistance between each of the intermediate conductive layers 42 and 43 and the plug 55 can be reduced as compared with the case in which the plug 55 small in area is brought into direct contact with the surface of each of the intermediate conductive layers 42 and 43.

Tenth Embodiment

In the memory cell according to the first embodiment, the gate electrodes 66 of the vertical MISFETs ($SV_1$ and $SV_2$) are made up of the two-layer polycrystal silicon films (first polycrystal silicon layer 64 and second polycrystal silicon layer 65). However, when the size of the memory cell is intended for micro-fabrication, there is a need to form these two-layer polycrystal silicon films with a small thickness.

However, when an attempt is made to thin the two-layer polycrystal silicon films, there is a fear that some of a cleaning fluid may reach the surface of a gate insulating film 63 through crystal grains of the thin first polycrystal silicon layer 64 upon wet cleaning of the surface of a substrate 1 with the cleaning fluid in advance of the process of forming the first polycrystal silicon layer 64 on sidewalls of laminated bodies ($P_1$ and $P_2$) and thereafter forming the second polycrystal silicon layer 65 on its surface, thereby causing part of the gate insulating film 63 to dissolve and disappear.

Figure 98:
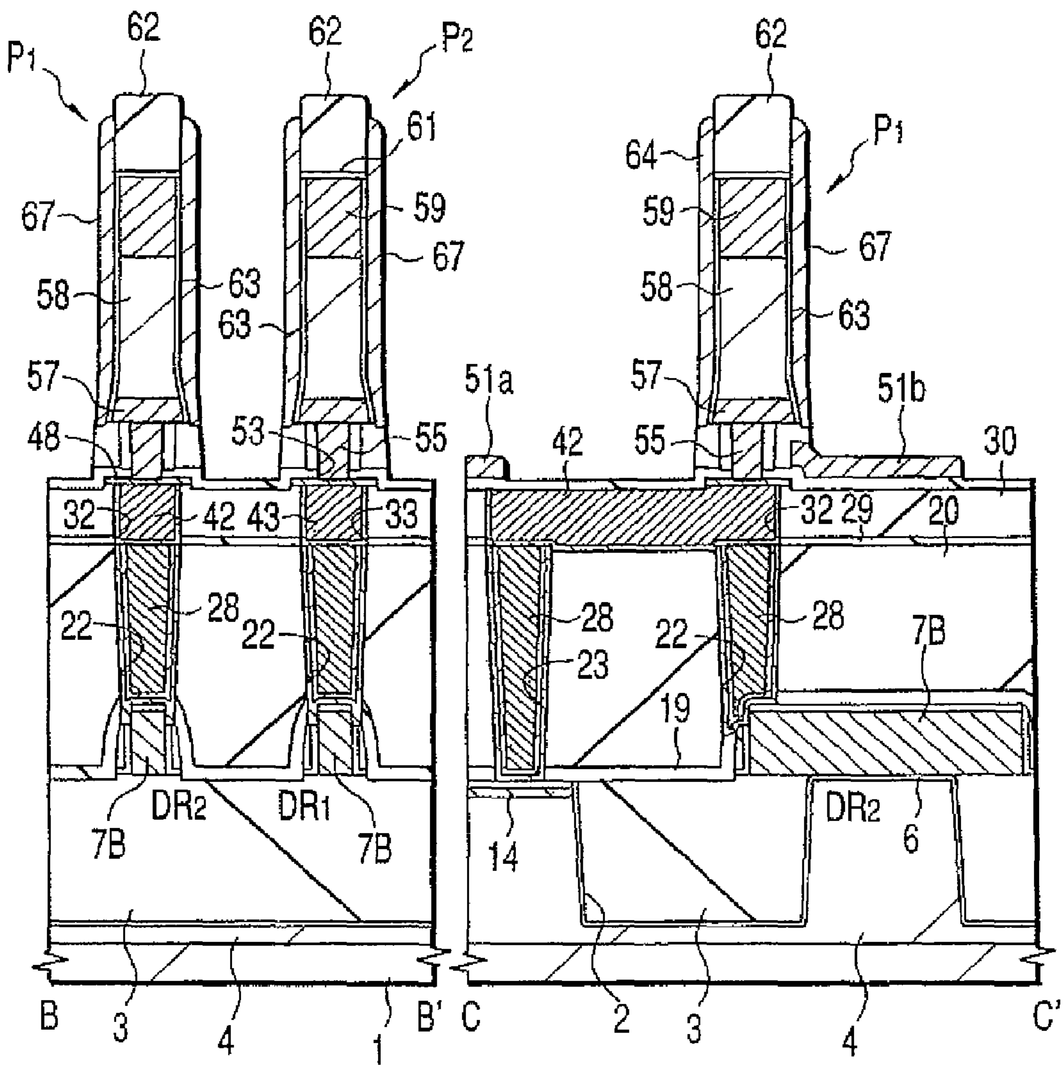
FIG. 98 is a fragmentary cross-sectional view showing a step in the method of manufacturing an SRAM according to a tenth embodiment of the present invention.

As a countermeasure against this problem, an amorphous silicon film is used as an alternative to the first polycrystal silicon layer 64 in the present embodiment. Namely, according to a gate electrode forming method of the present embodiment, the gate insulating film 63 formed of the silicon oxide film is formed on the surfaces of the sidewalls of each of the laminated bodies ($P_1$ and $P_2$) (see FIG. 39). Thereafter, as shown in FIG. 98, the amorphous silicon film is first deposited over the substrate 1 by a CVD method and subsequently anisotropically etched to thereby form sidewall spacer-shaped amorphous silicon layers 67 on their corresponding side walls of the laminated bodies ($P_1$ and $P_2$).

Next, the surface of the substrate 1 is wet-cleaned with a cleaning fluid to remove foreign particles on the surface of each amorphous silicon layer 67. Since no crystal grains substantially exist in the film in the case of the amorphous silicon layer 67, the surface of the film is extremely flat. Thus, since no cleaning fluid reaches the surface of the gate insulating film 63 even if the film is made thin, the gate insulating film 63 can be prevented from locally dissolving and disappearing.

Figure 99:
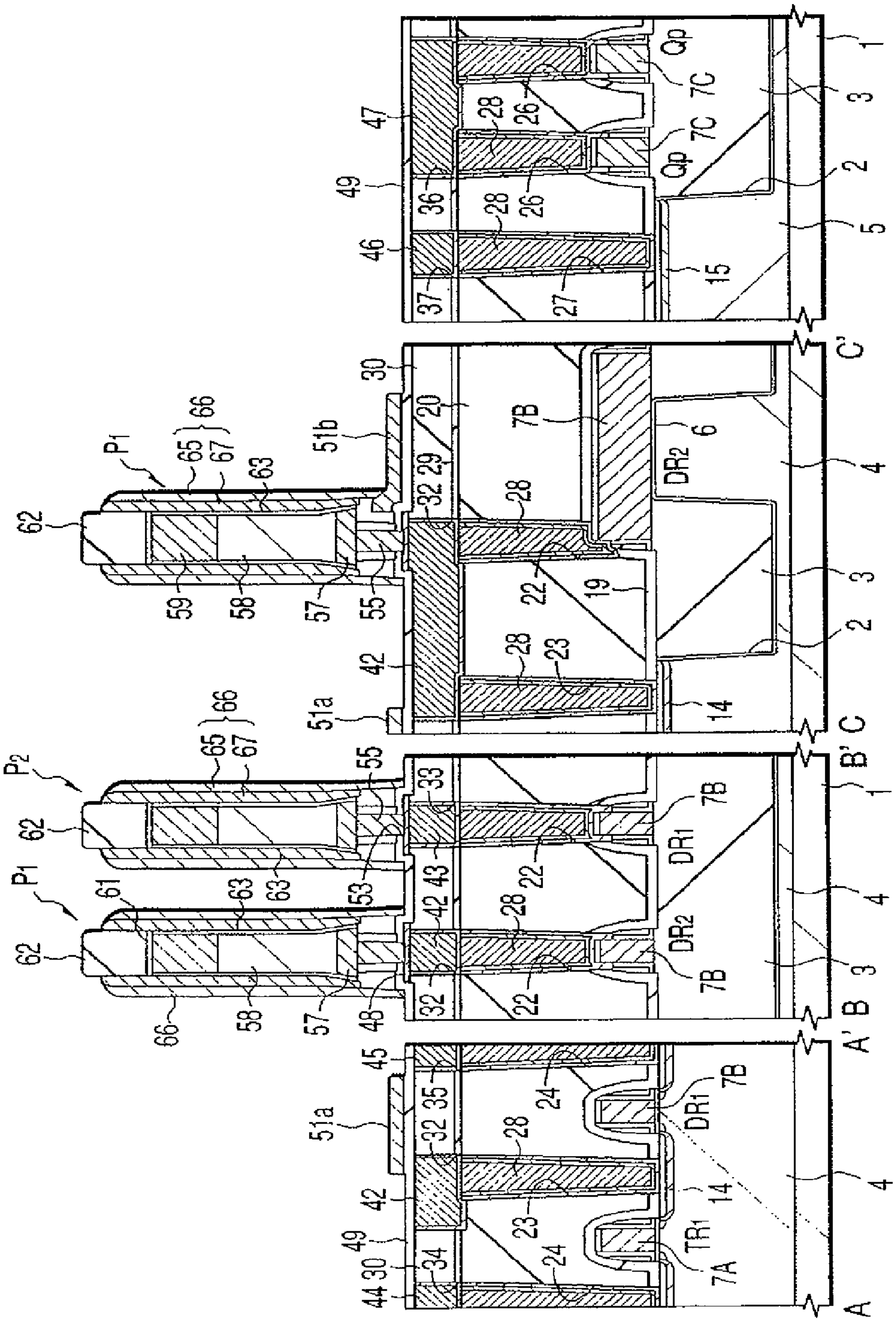
FIG. 99 is a fragmentary cross-sectional view illustrating a step in the method of manufacturing the SRAM of the present invention.

Next, as shown in FIG. 99, a second polycrystal silicon layer 65 is formed on the surface of its corresponding amorphous silicon layer 67 by a method similar to the first embodiment to thereby form gate electrodes 66 each made up of a laminated film of the amorphous silicon layer 67 and second polycrystal silicon film 65 on their corresponding side walls of the laminated bodies ($P_1$ and $P_2$).

Next, the substrate 1 is heat-treated to polycrystallize the amorphous silicon layers 67. Incidentally, since the amorphous silicon layers 67 are polycrystallized by heat treatment in a subsequent process, a special heat-treating or annealing process for polycrystallizing the amorphous silicon layers 67 may be omitted.

The conductive film corresponding to the first layer, of the two-layer conductive films constituting the gate electrodes 66 is constituted of the amorphous silicon film in this way, so the thickness of these two-layer conductive films can be thinned. It is therefore possible to reduce the transverse areas of the vertical MISFETs ($SV_1$ and $SV_2$) and promote micro-fabrication of the memory cell size.

Incidentally, the SRAM in which the vertical MISFETs ($SV_1$ and $SV_2$) are disposed over the transfer MISFETs ($TR_1$ and $TR_2$) and drive MISFETs ($DR_1$ and $DR_2$), needs the process for forming the vertical MISFETs ($SV_1$ and $SV_2$) to be set at as low a temperature as possible to thereby suppress degradation of the characteristics of the lower MISFETs ($TR_1$, $TR_2$, $DR_1$ and $DR_2$). Thus, when parts of the gate electrodes 66 of the vertical MISFETs ($SV_1$ and $SV_2$) are constituted of the amorphous silicon layer 67 as in the present embodiment, there is a need to execute heat treatment for polycrystallizing the amorphous silicon layers 67 at as low a temperature as possible.

Since the second polycrystal silicon layer 65 is formed on the surface of the amorphous silicon layer 67 as the conductive film corresponding to the second layer in the present embodiment, the second polycrystal silicon layer 65 serves as a seed crystal upon heat treatment of the amorphous silicon layer 67. Therefore, even if the thermal treatment temperature at the polycrystallization of the amorphous silicon layer 67 is set low, the amorphous silicon layer 67 is rapidly polycrystallized. Namely, according to the present embodiment, the polycrystallization of the amorphous silicon layer 67 can be performed at a low temperature even if the amorphous silicon film is used in the process of forming the vertical MISFETs ($SV_1$ and $SV_2$). It is therefore possible to avoid degradation of the characteristics of the lower MISFETs ($TR_1$, $TR_2$, $DR_1$ and $DR_2$).

Eleventh Embodiment

Figure 100:
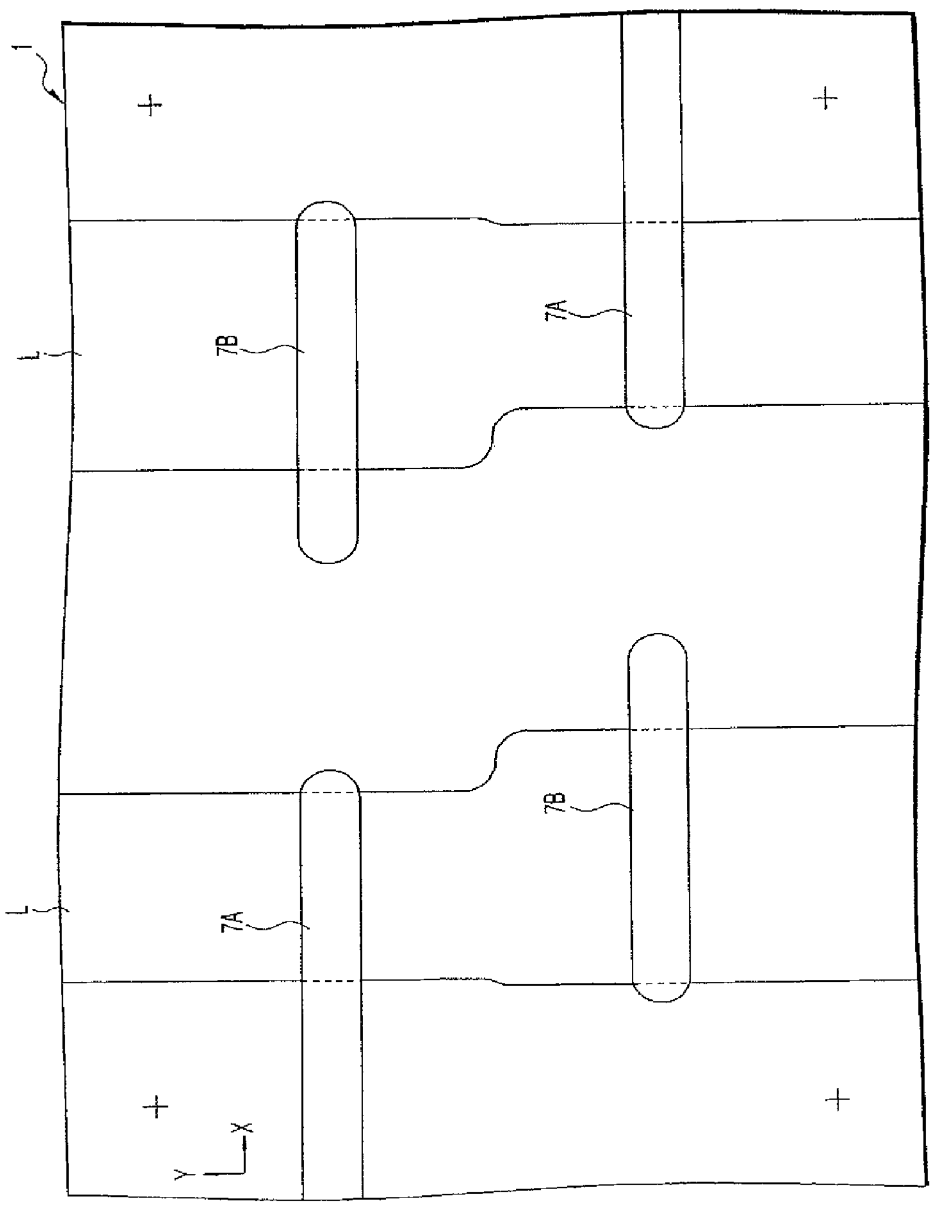
FIG. 100 is a fragmentary plan view showing a step in the method of manufacturing an SRAM according to an eleventh embodiment of the present invention.

With micro-fabrication of a memory cell size of an SRAM, gate electrodes 7A of transfer MISFETs ($TR_1$ and $TR_2$) and gate electrodes 7B of drive MISFETs ($DR_1$ and $DR_2$) are configured such that their widths (gate lengths) extremely approach the wavelength of exposure light. When, in this case, the gate electrodes 7A and 7B are patterned by one etching as in the first embodiment, the four corners of the gate electrodes 7A and 7B become round due to interference of the exposure light, as shown in FIG. 100, and, hence, the ends of the gate electrodes 7A and 7B are respectively withdrawn into active regions (L), thus resulting in the problem that the gate lengths become narrow at circumferential or peripheral edge portions of the active regions (L) and the characteristics of the MISFETs ($TR_1$, $TR_2$, $DR_1$ and $DR_2$) are degraded.

Thus, since the gate lengths are not narrowed at the peripheral edge portions of the active regions (L) even if the four corners become round as long as the ends of the gate electrodes 7A and 7B are set far away from the active regions (L) in advance, the above problem can be avoided. However, since the space for the two active regions (L) must be opened up in this case to prevent the distance between the two gate electrodes 7A and 7B adjacent along an X direction in FIG. 100 from decreasing, the memory cell size cannot be scaled down.

Figure 101:
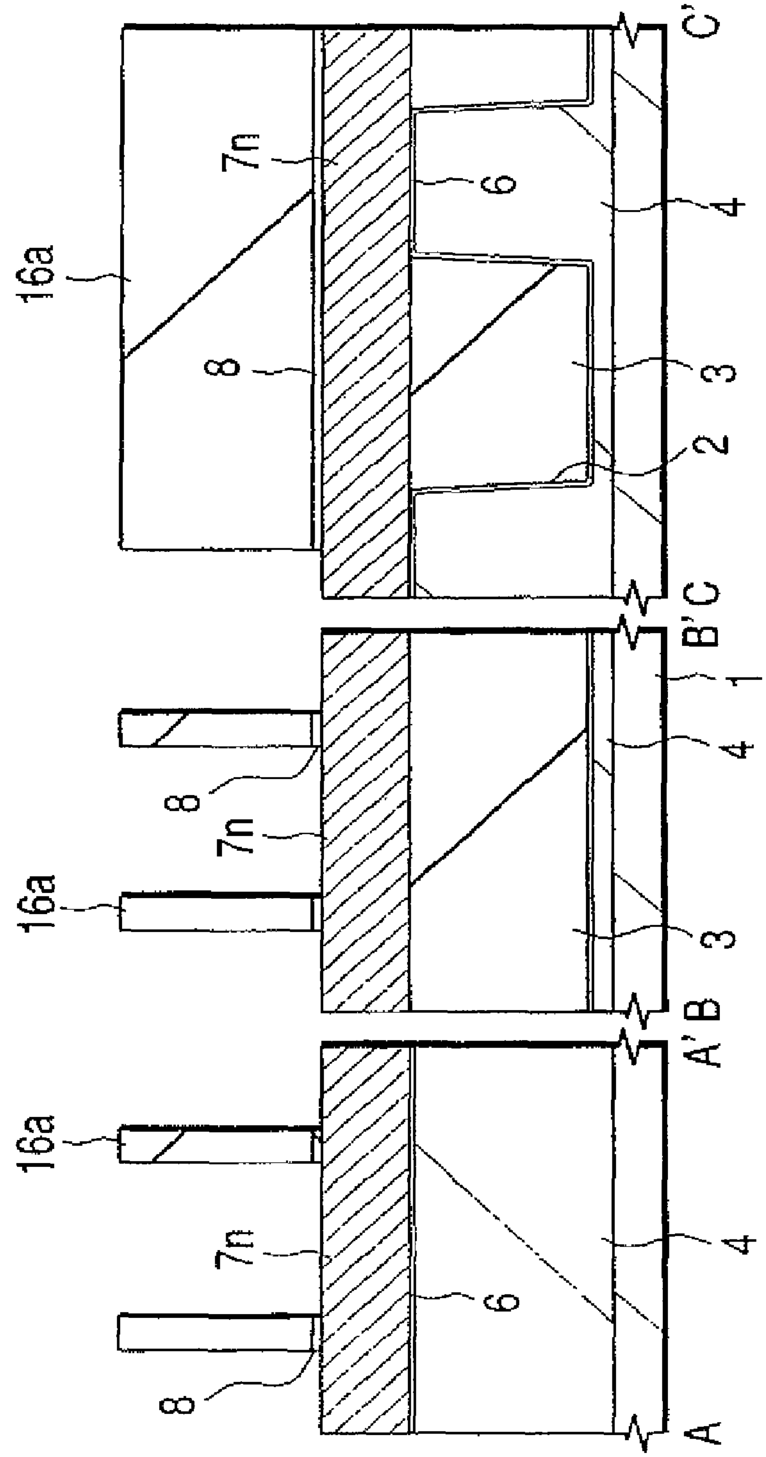
FIG. 101 is a fragmentary cross-sectional view illustrating a step in the method of manufacturing the SRAM of the present invention.
Figure 102:
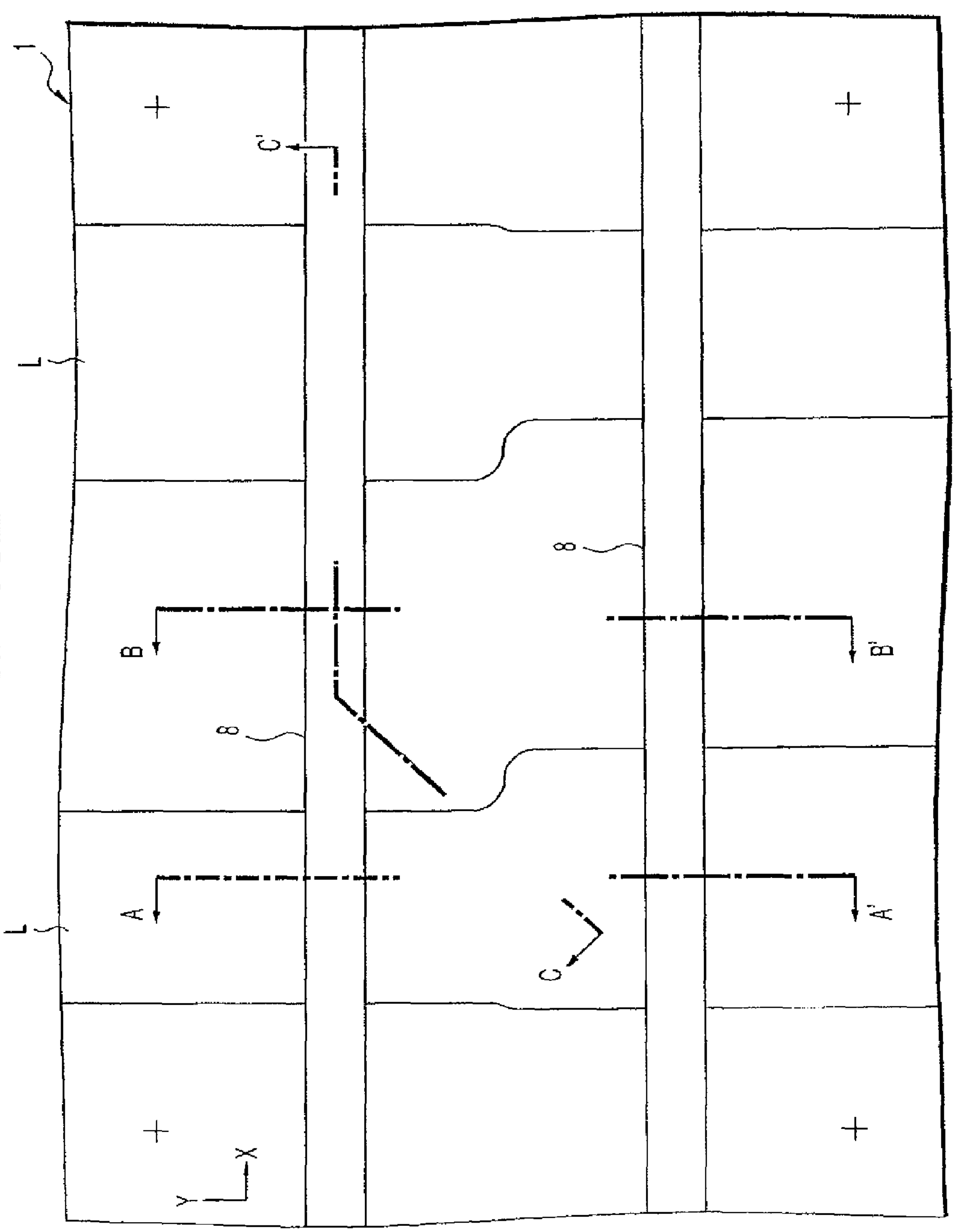
FIG. 102 is a fragmentary plan view showing a step in the method of manufacturing the SRAM of the present invention.

As a countermeasure against this problem, the gate electrodes 7A and 7B are formed by the following method in the present embodiment. As shown in FIG. 101, a first photoresist film 16*a* is first formed over a cap insulating film (silicon oxide film 8) covering a gate electrode material (n type polycrystal silicon film 7*n*). The silicon oxide film 8 is patterned by dry etching using the photoresist film 16*a* as a mask. At this time, the silicon oxide film 8 is patterned in such a manner that plane patterns thereof extend in strip form along the X direction as shown in FIG. 102.

Figure 103:
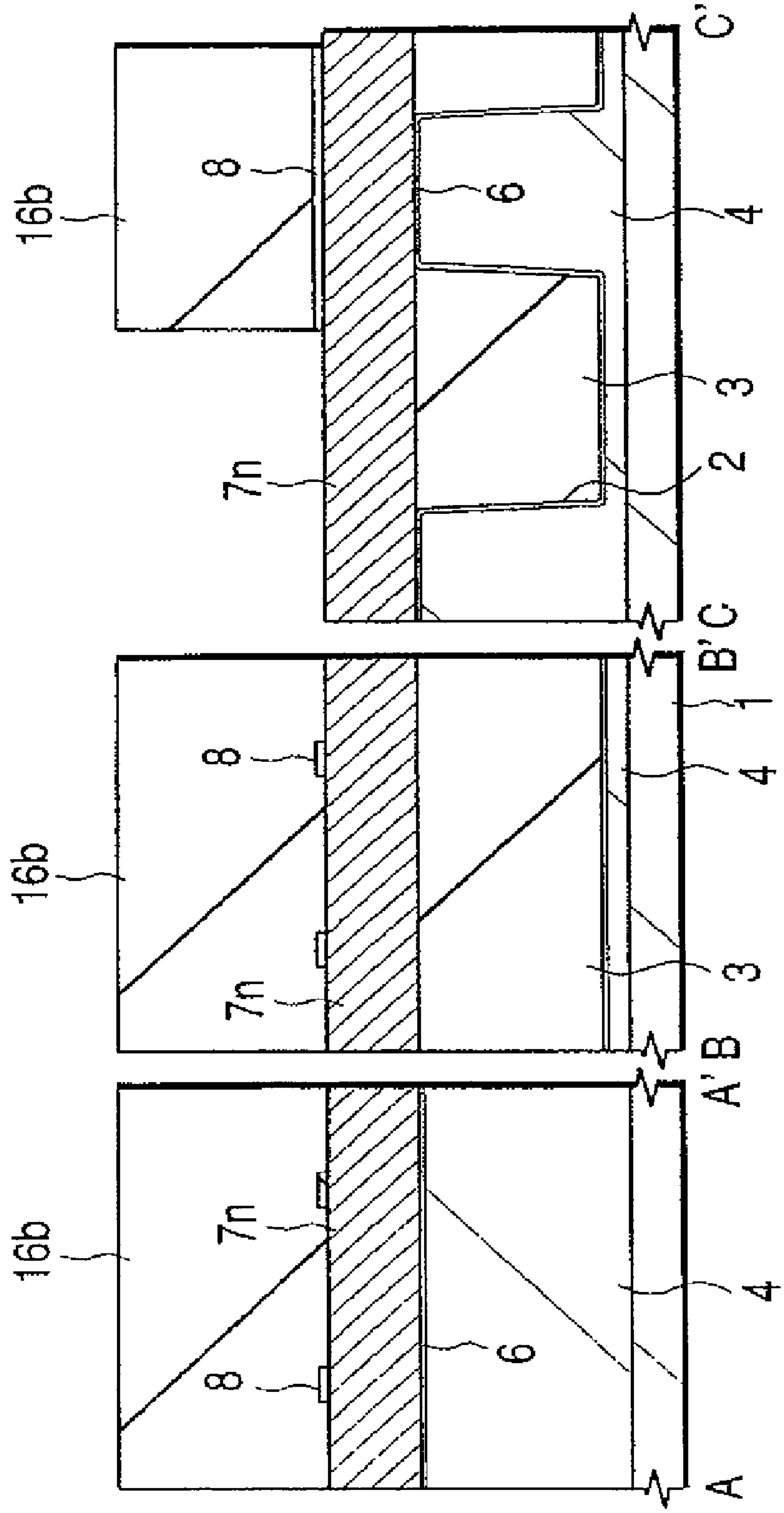
FIG. 103 is a fragmentary cross-sectional view illustrating a step in the method of manufacturing the SRAM of the present invention.
Figure 104:
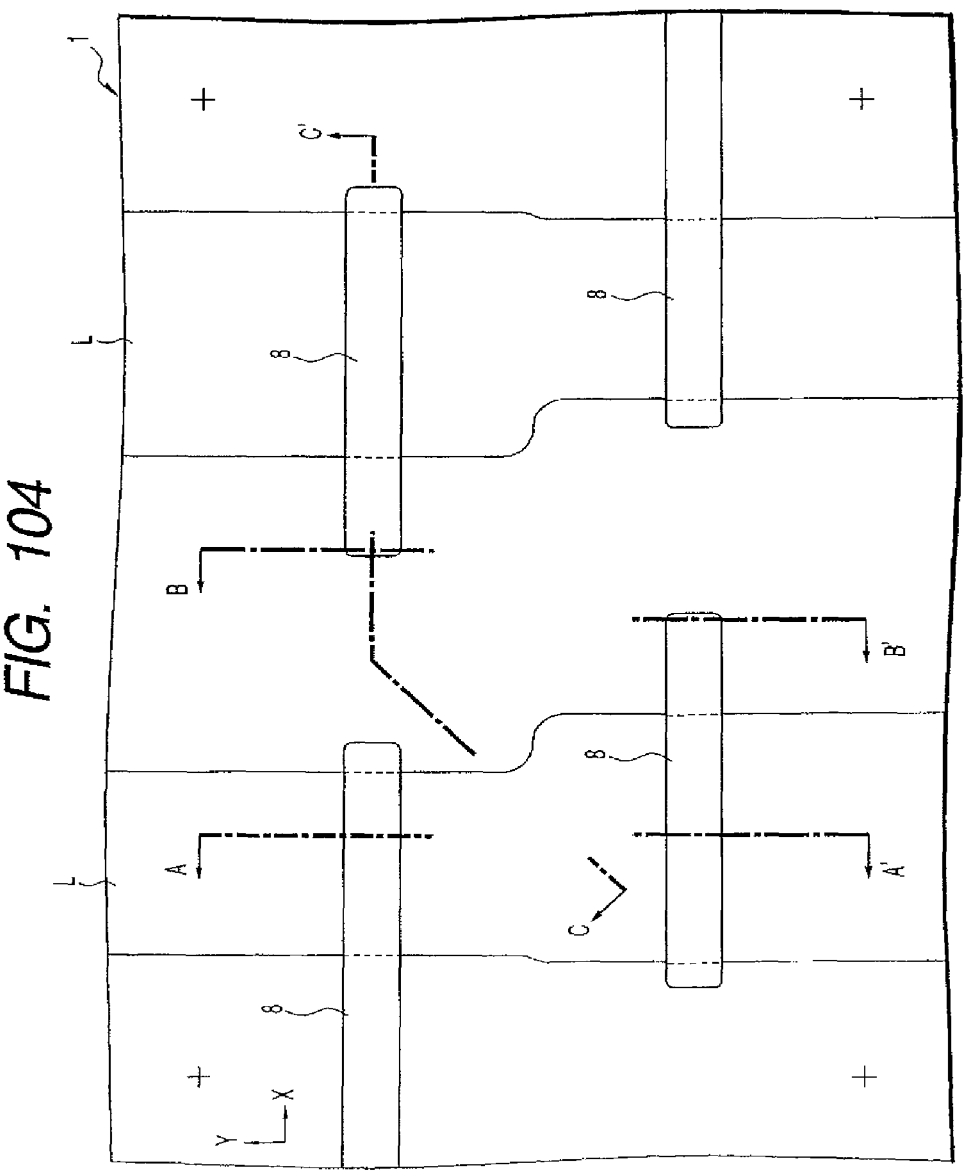
FIG. 104 is a fragmentary plan view showing a step in the method of manufacturing the SRAM of the present invention.
Figure 105:
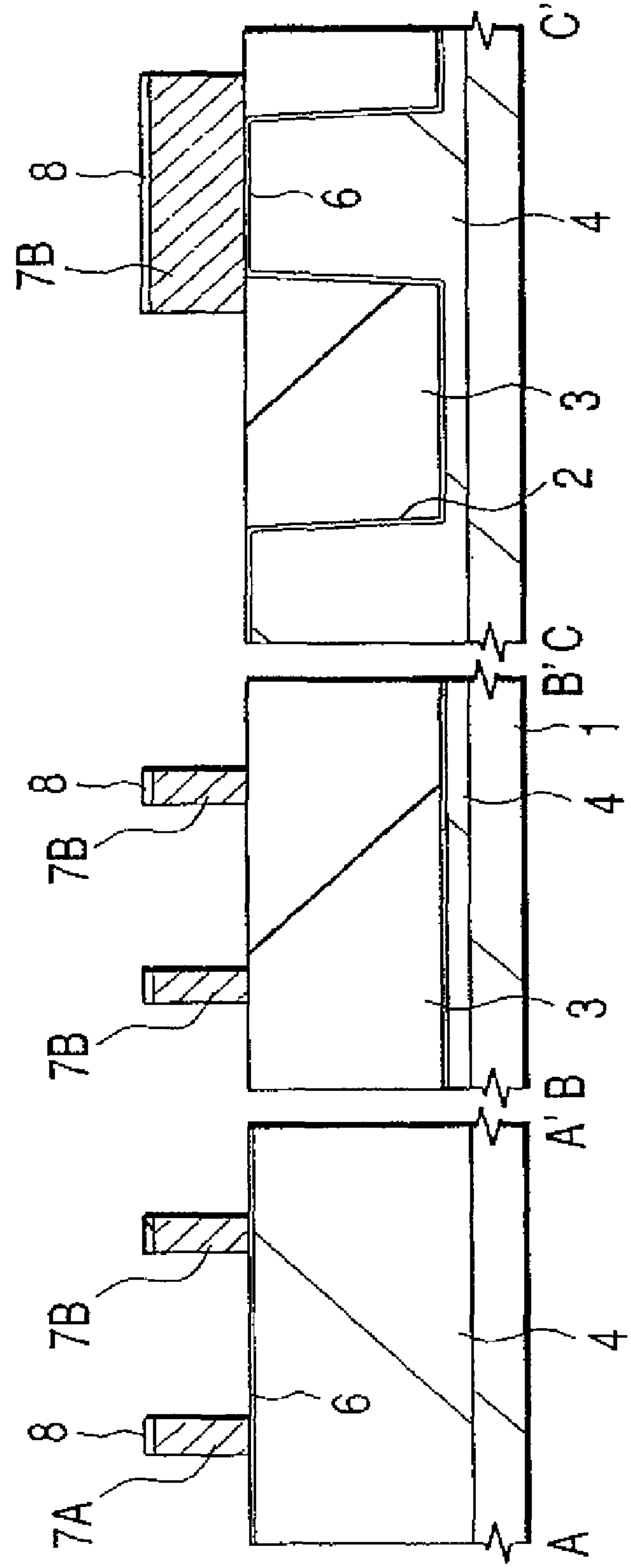
FIG. 105 is a fragmentary cross sectional view illustrating a step in the method of manufacturing the SRAM of the present invention.

Next, the photoresist film 16*a* is removed and thereafter the silicon oxide film 8 is patterned by dry etching using a second photoresist film 16*b* as a mask as shown in FIG. 103. At this time, the silicon oxide film 8 is patterned in such a manner that plane patterns thereof become identical to the gate electrodes 7A and 7B as shown in FIG. 104. Thereafter, the n type polycrystal silicon film 7*n* is dry-etched with the silicon oxide films 8 as masks as shown in FIG. 105 to thereby form the corresponding gate electrodes 7A and 7B.

In the above method of forming the gate electrodes 7A and 76, the silicon oxide films 8 having the same plane shapes as the gate electrodes 7A and 7B are formed by two etching processes using the two sheets of photomasks. Therefore, the roundnesses of the four corners of each silicon oxide film 8 are reduced as a result of the nonexistence of the influence of interference of the exposure light. Thus, since the roundnesses of the four corners of the gate electrodes 7A and 7B obtained by dry etching using the silicon oxide films 8 as the masks are less reduced, the gate lengths are not narrowed at the peripheral edge portions of the active regions (L) even if their ends are not set far away from the active regions (L). Since the silicon oxide is large in etching selection ratio to the polycrystal silicon as compared with the photoresist, the gate electrodes 7A and 7B can be patterned with satisfactory accuracy as compared with the case where the polycrystal silicon films (7*n* and 7*p*) are etched using the photoresist films as the masks or the silicon oxide film 8 and the polycrystal silicon films (7*n* and 7*p*) are continuously etched.

On the other hand, when the gate electrodes 7A and 76 are formed by one etching, the roundnesses of the four corners of the gate electrodes 7A and 76 increase as shown in FIG. 100. Thus, unless the ends of the gate electrodes 7A and 7B are set far away from the active regions (L) in this case, the roundnesses of their ends reach the insides of the active regions (L) and hence the characteristics of the MISFETs ($TR_1$, $TR_2$, $DR_1$ and $DR_2$) are degraded.

According to the above method of forming the gate electrodes 7A and 7B in this way, the number of photomasks and the number of times that etching is performed increase, but the amount of withdrawal of the ends of the gate electrodes 7A and 7B into the insides of the active regions (L) can be reduced. Thus, since the ends of the gate electrodes 7A and 7B can be disposed in the neighborhood of the active regions (L), space for the two active regions (L) can be narrowed correspondingly, so that the memory cell size can be scaled down.

Incidentally, part of each peripheral circuit in the SRAM includes a circuit wherein MISFETs relatively long in gate length are disposed at a relatively low density as in the case of a power circuit, for example. Since the MISFETs of such a circuit have no problem even if the ends of gate electrodes 7C are set far away from the active regions (L), the gate electrodes 7C may be formed by one etching. Namely, the gate electrodes 7C may be formed according to any one of the two etching processes using the two sheets of masks. On the other hand, a circuit including MISFETs short in gate length and a circuit in which MISFETs are disposed in high density, of the peripheral circuits in the SRAM may preferably pattern a gate electrode material (polycrystal silicon film) by two etching processes using two different masks upon forming gate electrodes 7C of the MISFETs constituting these circuits.

When the silicon oxide films 8 having the same plane shapes as the gate electrodes 7A and 7B are formed by two etching processes using the two sheets of photomasks, ArF (argon fluoride) may be used for an exposure light source upon transfer of patterns to the first photoresist film 16*a*, and KrF (krypton fluoride) may be used for an exposure light source upon transfer of patterns to the second photoresist film 16*b*.

Namely, when the silicon oxide film 8 is dry-etched using the first photoresist film 16*a* as the mask, the silicon oxide film 8 is processed to the same width as the gate length of each of the gate electrodes 7A and 7B. Therefore, high processing accuracy is required as compared with the case in which the silicon oxide film 8 is dry-etched using the second photoresist film 16*b* as the mask. Thus, ArF shorter in wavelength than KrF is used as the exposure light source upon transfer of photomask's patterns to the first photoresist film 16*a*, so that the silicon oxide film 8 can be dry-etched with high accuracy. On the other hand, since a photoresist for ArF is more expensive than a photoresist for KrF, the photoresist film 16*b* can be configured using the inexpensive KrF photoresist if KrF is used as the exposure light source at the transfer of the photomask's patterns to the second photoresist film 16*b*.

Figure 106:
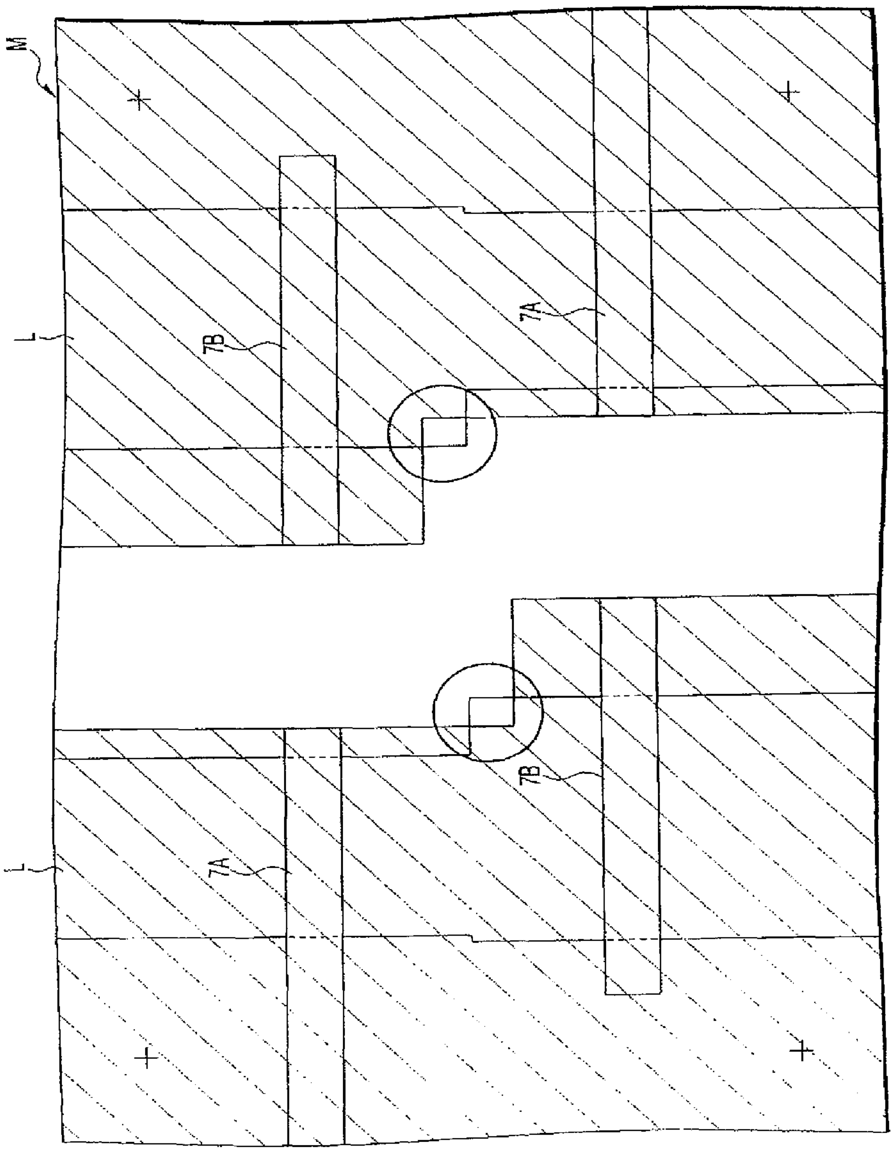
FIG. 106 is a fragmentary plan view of a photomask used in the manufacture of the SRAM according to the present invention.
Figure 107:
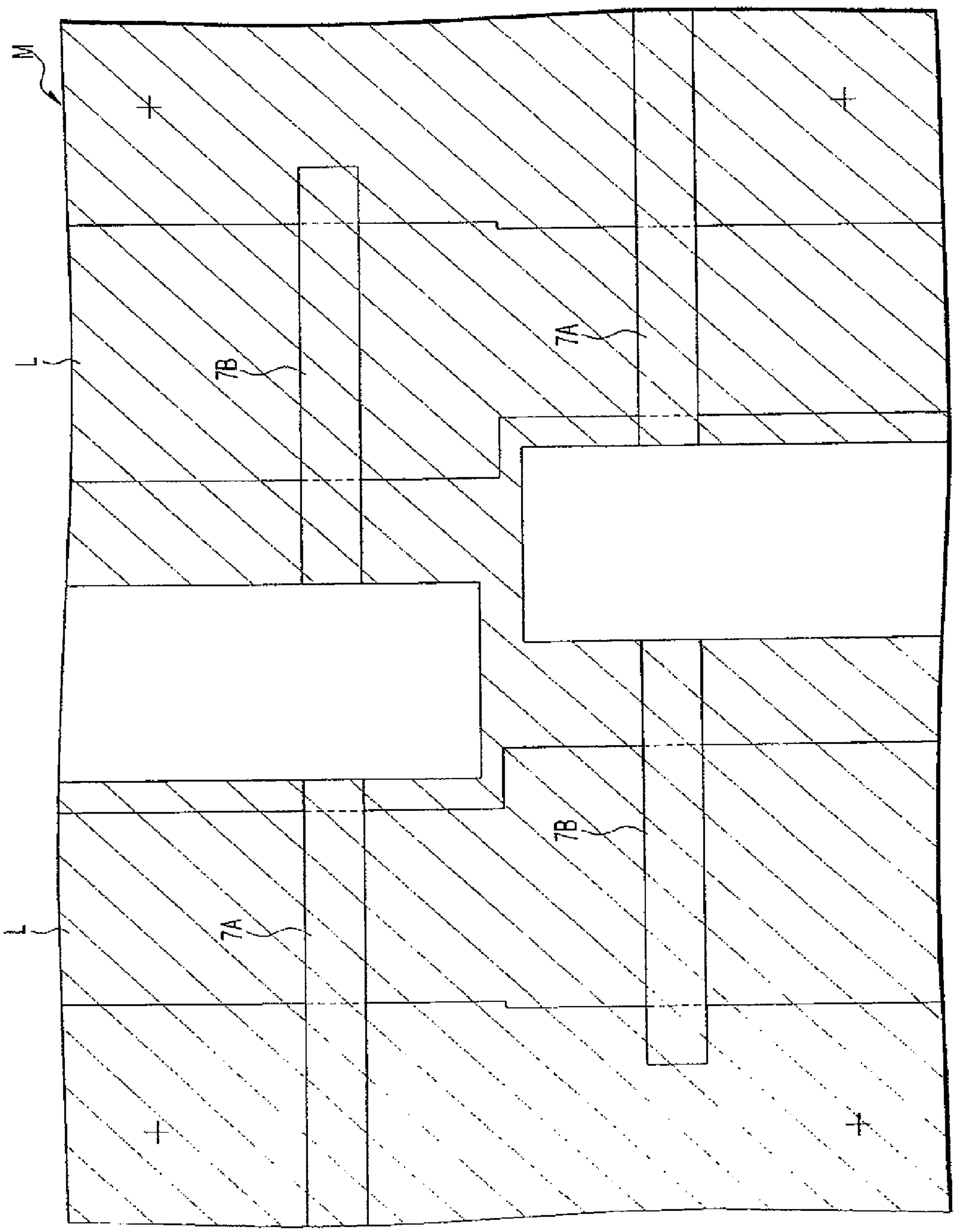
FIG. 107 is a fragmentary plan view of a photomask used in the manufacture of the SRAM according to the present invention.

Incidentally, there is a fear that when boundary portions between lightproof patterns (corresponding to diagonally-shaded areas) formed in a photomask (M) for transferring patterns to a second photoresist film 16*b* and optical transmissive patterns overlap with parts (areas marked with circles) of active regions (L) as shown in FIG. 106, a substrate 1 corresponding to parts of the active regions (L) is scraped or chipped off in an etching process. Thus, the boundary portions between the lightproof patterns and the light transmissive patterns may preferably be laid out so as not to overlap with the active regions (L) as shown in FIG. 107, for example.

Twelfth Embodiment

In the first embodiment, the plugs 55 each made up of the polycrystal silicon film are formed inside the through holes 53 for connecting the vertical MISFETs ($SV_1$ and $SV_2$) and the lower MISFETs ($DR_1$, $DR_2$, $TR_1$ and $TR_2$) (see FIG. 34).

In this case, there is a possibility that when a deposition or growth temperature of the polycrystal silicon film constituting the plugs 55 rises, the surface of the barrier layer 48 exposed to the bottom of each through hole 53 becomes easy to be oxidized, and hence the contact resistance between the barrier layer 48 and the plug 55 rises. When a p type polycrystal silicon film is formed by a CVD method using silane ($SiH_4$) and borane ($BH_3$) as source gases, for example, the surface of the barrier layer 48 exposed at the bottom of each through hole 53 is subjected to a high temperature of about 540° C.

As a countermeasure against this problem, a conductive film constituting each plug 55 is deposited at a low temperature in the twelfth embodiment. More specifically, a p type amorphous silicon film is formed by a CVD method using disilane ($Si_2H_6$) and diborane ($B_2H_6$) as source gases. When these source gases are used, the p type amorphous silicon film can be embedded inside the through holes 53 at a low temperature of about 390° C. It is therefore possible to suppress oxidation of the barrier layer 48 exposed to the bottom of each through hole 53. The oxidation of the barrier layer 48 can be further suppressed by bringing the inside of a chamber of a CVD device used for growth of the p type amorphous silicon film to a non-oxidative atmosphere.

Thirteenth Embodiment

As described in the first embodiment, the intermediate semiconductor layers 58 constituting the channel regions of the vertical MISFETs ($SV_1$ and $SV_2$) are made up of the silicon film 581 obtained by crystallizing the non-doped amorphous silicon film deposited by the CVD method by heat treatment (see FIG. 35).

The size of crystal grains in the silicon film *58i* constituting the intermediate semiconductor layers 58 and drain currents of the vertical MISFETs ($SV_1$ and $SV_2$) have a relative relationship. When the size of each crystal grain in the silicon film *58i* increases in general, the drain current also increases. When the silane ($SiH_4$) is used as the source gas and the disilane ($Si_2H_6$) is used as the source gas upon growth of the non-doped amorphous silicon film, the size of each crystal grain in the silicon film *58i* increases in the case of the use of the latter. Thus, since the size of each crystal grain in the silicon film *58i* can be made large with the use of the disilane ($Si_2H_6$) upon formation of the intermediate semiconductor layers 58, the drain currents of the vertical MISFETs ($SV_1$ and $SV_2$) can be increased.

Fourteenth Embodiment

In the first embodiment, even when the through holes 82 and the upper semiconductor layers 59 are displaced in relative position upon formation of the through holes 82 over the upper semiconductor layers 59 of the vertical MISFETs ($SV_1$ and $SV_2$), the upper portions of the gate electrodes 66 are protected by their corresponding sidewall spacers 71 each formed of the silicon oxide film to avoid short circuits between the plugs 85 in the through holes 82 and the gate electrodes 66 (see FIG. 52).

Figure 108:
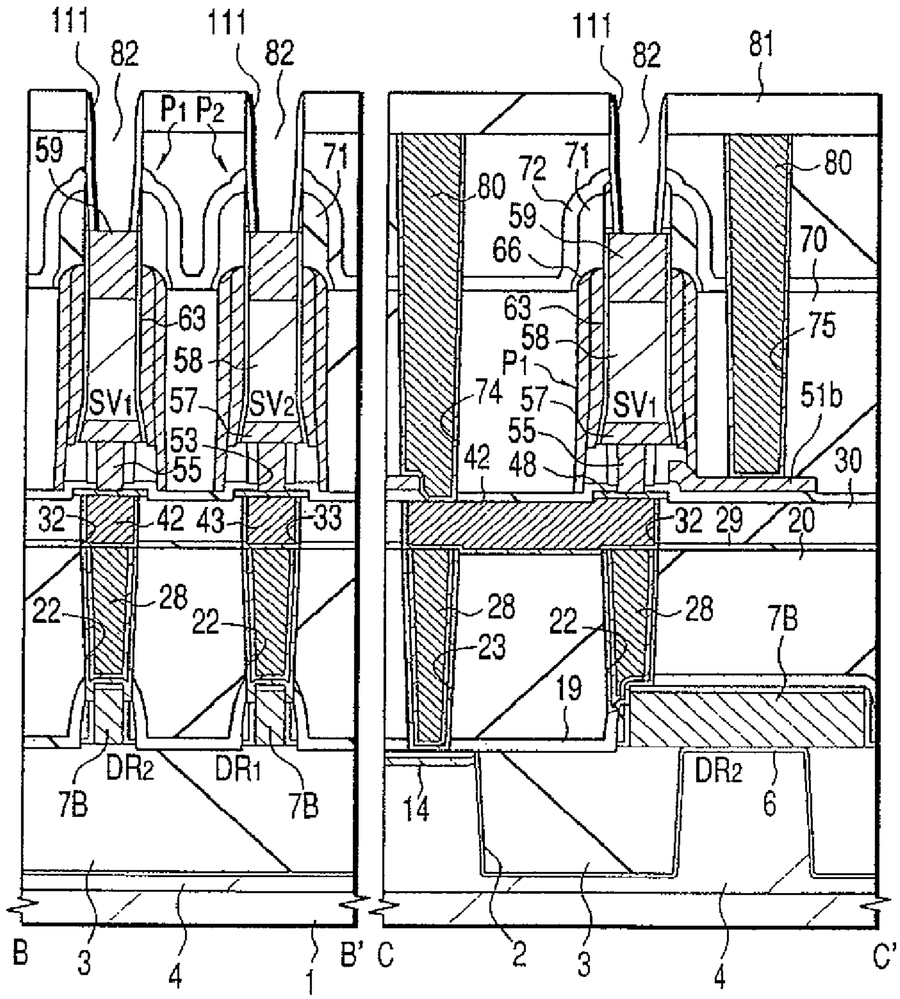
FIG. 108 is a fragmentary cross-sectional view illustrating a step in a method of manufacturing an SRAM according to a fourteenth embodiment of the present invention.

In the present embodiment, second sidewall spacers 111 are formed on their corresponding side walls of through holes 82 as shown in FIG. 108 to more reliably prevent short circuits between plugs 85 in the through holes 82 and gate electrodes 66 after the process of forming the through holes 82 over upper semiconductor layers 59. In order to form the sidewall spacers 111, the through holes 82 are formed over the upper semiconductor layers 59. Thereafter, for example, a silicon nitride film is deposited over a substrate 1 containing the interiors of the through holes 82 by a CVD method. Subsequently, the silicon nitride film may be anisotropically etched to leave the corresponding side walls of the through holes 82.

Figure 109:
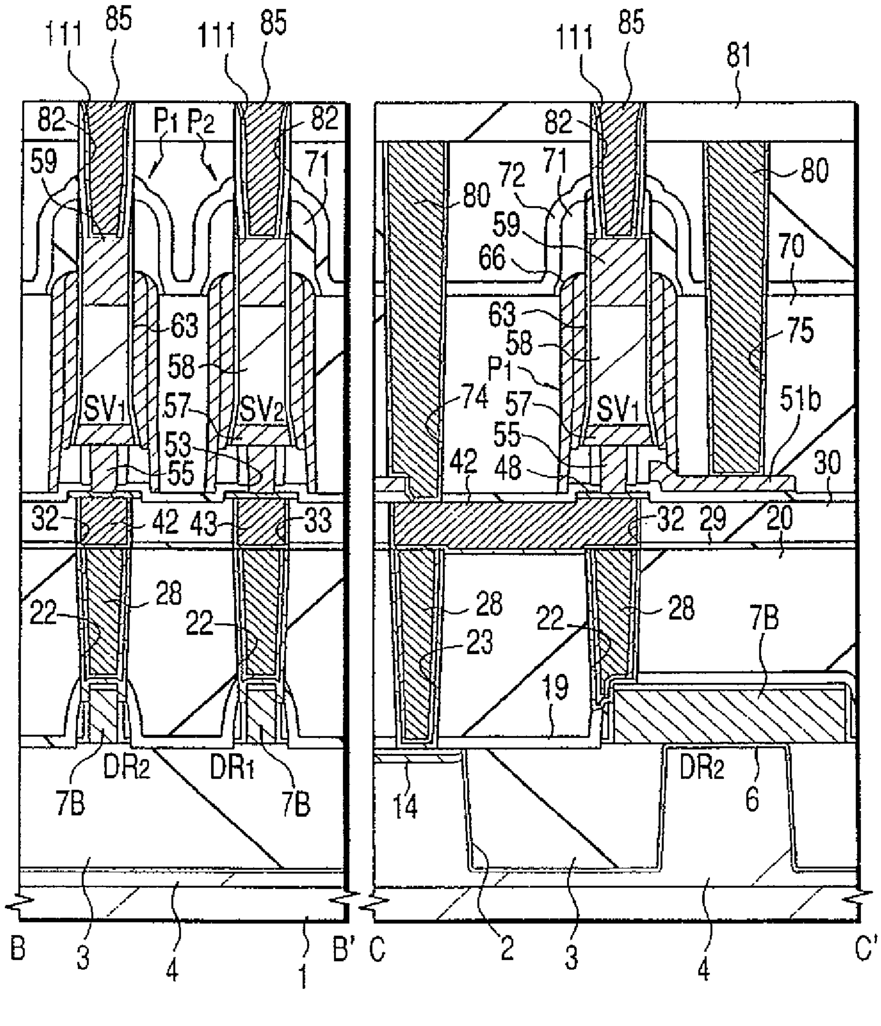
FIG. 109 is a fragmentary cross-sectional view showing a step in the method of manufacturing an SRAM of the present invention.

When the sidewall spacers 111 referred to above are formed on their corresponding side walls of the through holes 82, the sidewall spacers 111 reliably separate between plugs 85 embedded in through holes 82 and their corresponding gate electrodes 66 as shown in FIG. 109. Therefore, even when the size of a memory cell is micro-fabricated, a short circuit between the plug 85 and the gate electrode 66 can be reliably prevented.

Figure 110:
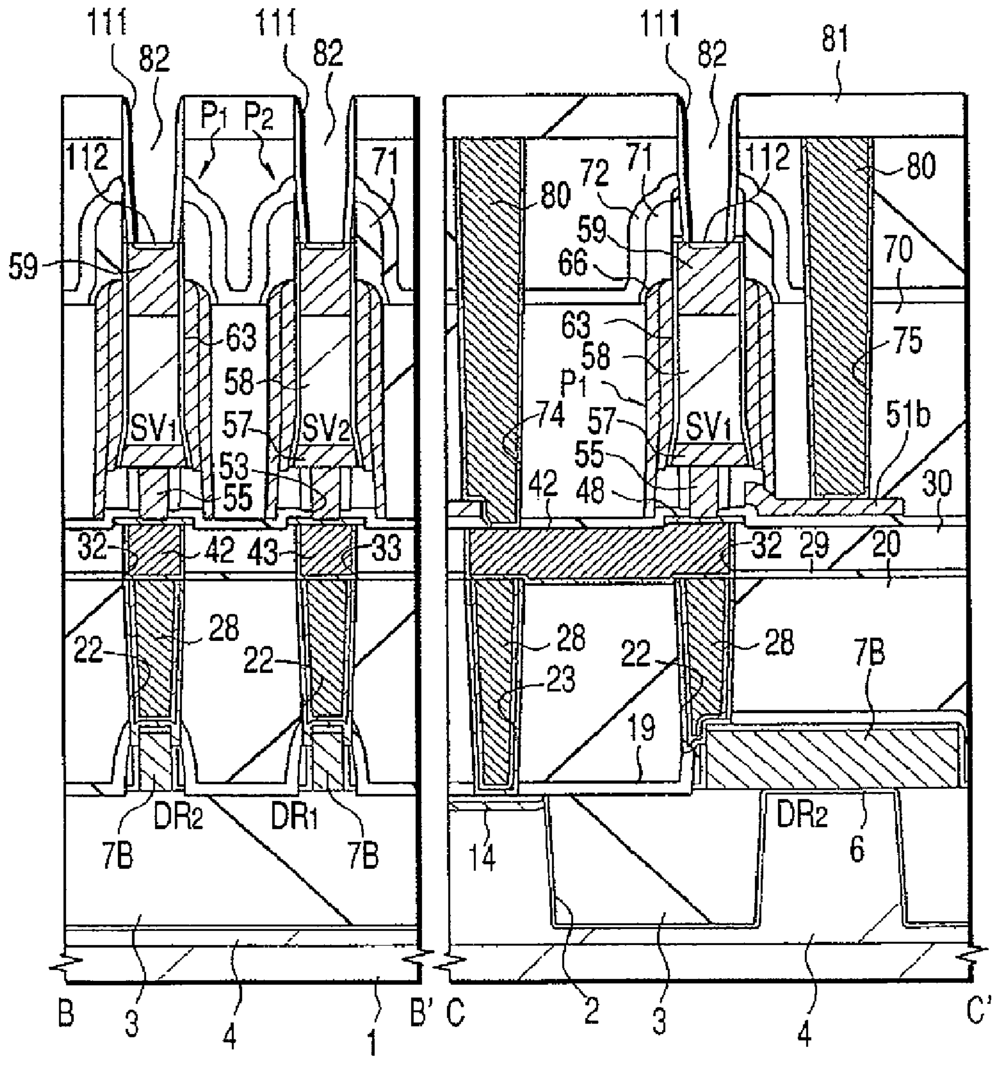
FIG. 110 is a fragmentary cross-sectional view depicting a step in the method of manufacturing an SRAM of the present invention.

Prior to the process of embedding the plugs 85 in the through holes 82 respectively, a metal silicide layer 112 such as Co silicide or the like may be formed on the surface of each upper semiconductor layer 59 exposed to the bottom of each through hole 82 as shown in FIG. 110 by way of example. In doing so, even when the area where the upper semiconductor layer 59 and the plug 85 contact, decreases with the formation of each sidewall spacer 111 on its corresponding side wall of the through hole 82, a reduction in the contact resistance between the two can be suppressed.

While the invention developed by the present inventors has been described specifically based on the illustrated embodiments, the present invention is not limited to the illustrated embodiments. It is needless to say that various changes can be made thereto within the scope not departing from the substance thereof.

Figure 112:
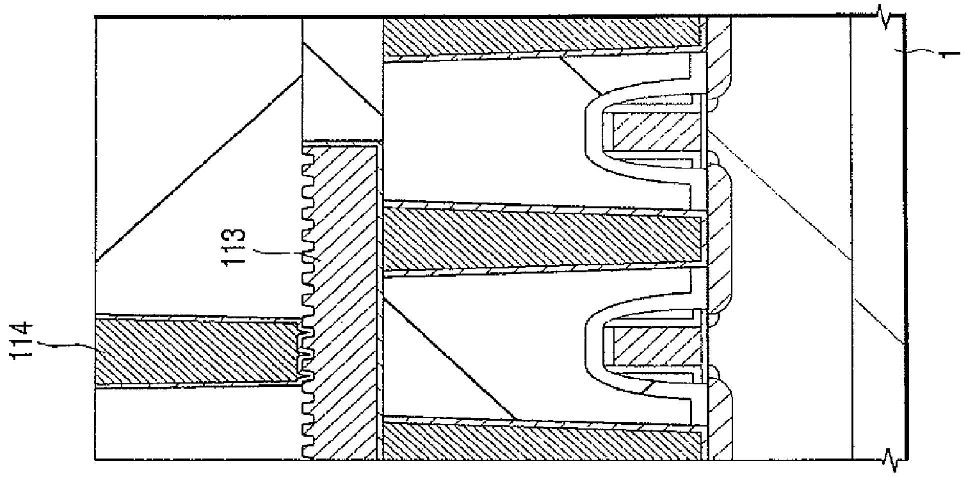
FIG. 112 is a fragmentary cross-sectional view showing a step in the method of manufacturing the SRAM of the present invention.
Figure 111:
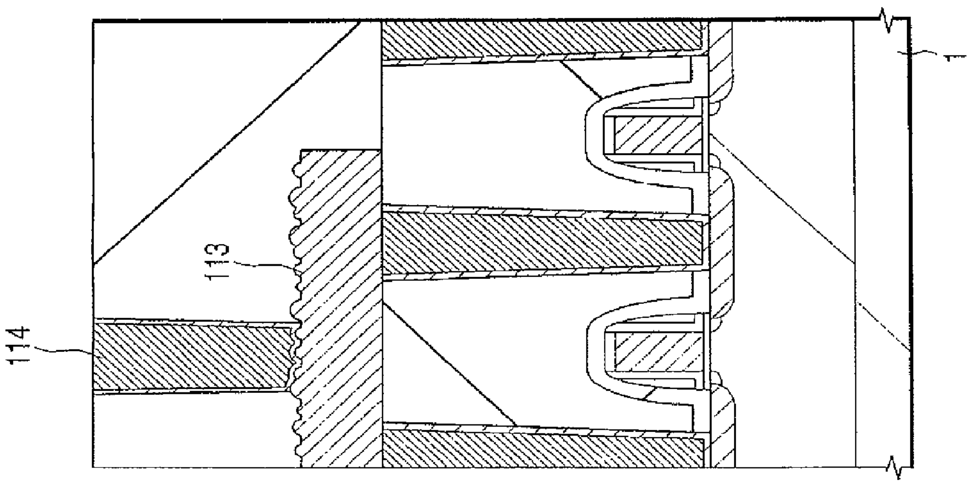
FIG. 111 is a fragmentary cross-sectional view illustrating a step in the method of manufacturing an SRAM of the present invention.

While the small depressions and projections are formed in the surface of each reactive layer 56 formed over the barrier layer 48, and the area where the reactive layer 56 and the plug 55 placed thereabove are in contact, increases to thereby reduce the contact resistance between the two in the ninth embodiment (see FIG. 96), small protrusions or steps may be formed in the surfaces of metal wirings 113 such as W, Al or the like as shown in FIGS. 111 and 112, for example in such a manner that the areas where the metal wirings 113 and plugs 114 formed thereabove are brought into contact with each other respectively, increase.

Figure 113:
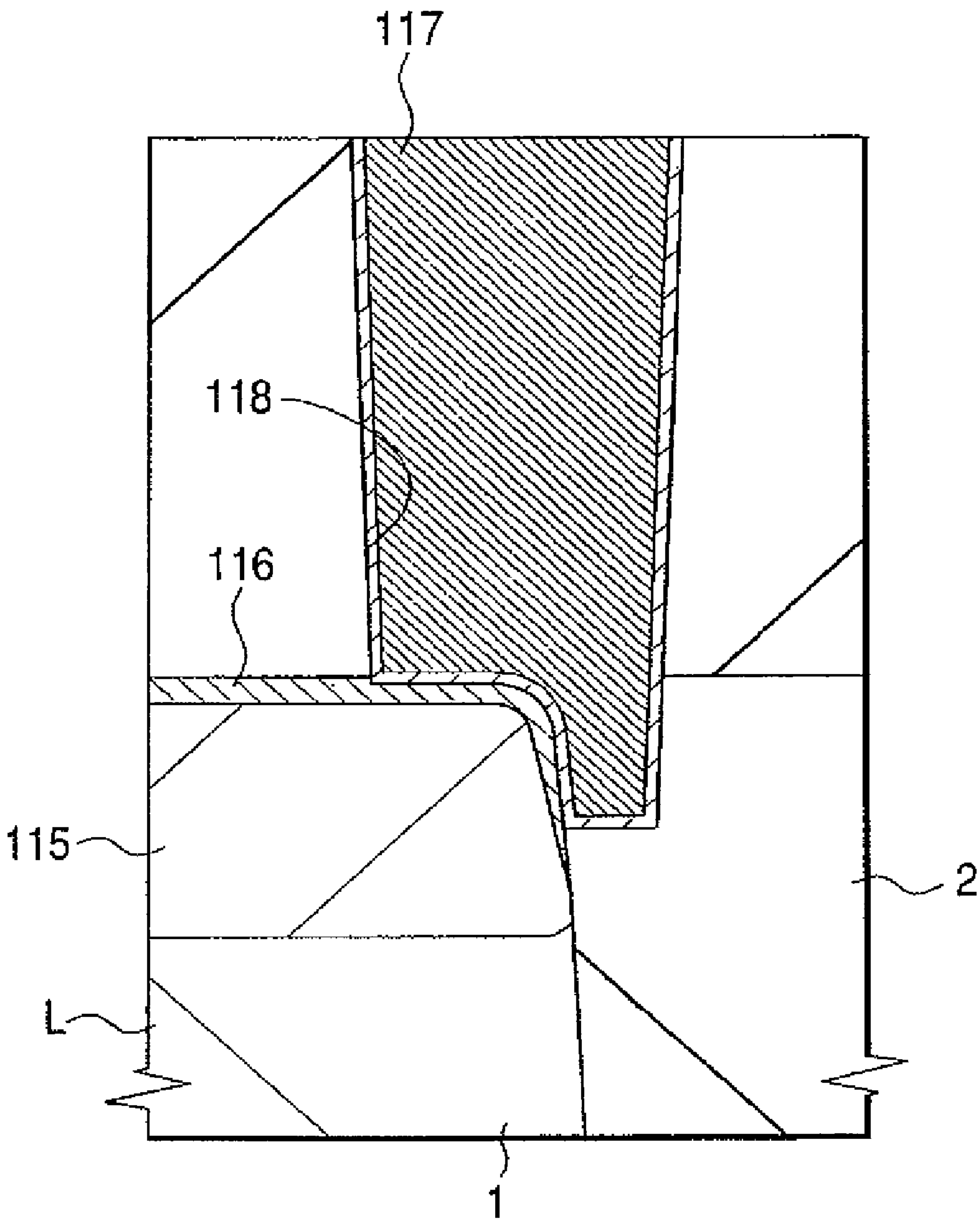
FIG. 113 is a fragmentary cross-sectional view depicting a step in the method of manufacturing an SRAM of the present invention.

As shown in FIG. 113, for example, when a semiconductor region (source, drain) 115 with a Co silicide layer 116 formed on the surface thereof and its corresponding plug 117 are connected, a contact hole 118 is disposed at a boundary portion between an active region (L) and a device isolation trench 2, and the area of the bottom of the contact hole 118 is made wide using an etching selection ratio between a substrate 1 and the device isolation trench 2 at the formation of the contact hole 118, whereby the contact resistance between the semiconductor region 115 and the plug 117 may be reduced. When a plug lying within a contact hole and its corresponding gate electrode or a plug lying within a contact hole and a source/drain are connected, depressions and projections may be provided on the surface of the source/drain to reduce contact resistance.

It is needless to say that the present invention can be applied to, for example, a semiconductor device having lower MISFETs and upper vertical MISFETs, and a semiconductor device having vertical MISFETs.

It is also needless to say that each of the methods described n conjunction with the illustrated embodiments can be applied as a method of forming a semiconductor device having vertical MISFETs. Thus, the present invention is not limited to the illustrated embodiments. It is needless to say that various changes can be made thereto within the scope not departing from the substance thereof.

Typical or representative aspects of the invention disclosed in the present application will hereinafter be described in brief as follows:

1. MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Metal films (42 and 43) are respectively formed over the MISFETs ($DR_1$ and $DR_2$) with insulating films (20 and 30) interposed therebetween. The vertical MISFETs ($SV_1$ and $SV_2$) are formed over the metal films (42 and 43) respectively.

The first MISFET ($DR_1$) and first vertical MISFET ($SV_1$), and the second MISFET ($DR_2$) and second vertical MISFET ($SV_2$) are cross-connected to form a memory cell. The gates and drains of the first and second MISFETs are respectively cross-connected by the metal films (42 and 43).

Each of the metal films has a tungsten film, and each of the vertical MISFETs and the tungsten film are electrically connected via a barrier film (48).

Forming the vertical MISFET ($SV_1$ and $SV_2$) over the metal films (42 and 43) enables an improvement in the characteristic of a memory cell and a reduction in the size of the memory cell. Also forming the vertical MISFETs ($SV_1$ and $SV_2$) each formed of a silicon film over the metal films (42 and 43) with the barrier layers (48) interposed therebetween respectively makes it possible to reduce a connection resistance between the adjacent MISFETs and improve the characteristic of the memory cell.

2. (a) MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Gates (64, 65 and 66) of the vertical MISFETs ($SV_1$ and $SV_2$) formed over the MISFETs ($DR_1$ and $DR_2$) with insulating films (20, 30, 49 and 52) interposed therebetween are respectively electrically connected to lower conductive films (51, 51*a* and 51*b*) at lower portions of the gates (64, 65 and 66), so that the gates are electrically connected to gates (7B) or drains (14) of the MISFETs ($DR_1$ and $DR_2$).

(b) MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. The vertical MISFETs ($SV_1$ and $SV_2$) are formed over the MISFETs ($DR_1$ and $DR_2$) with insulating films (20, 30, 49 and 52) interposed therebetween. Current paths between gates (7B) or drains (14) of the MISFETs ($DR_1$ and $DR_2$) and gates (64, 65 and 66) of the vertical MISFETs ($SV_1$ and $SV_2$) are respectively formed via lower portions of the gates (64, 65 and 66) of the vertical MISFETs ($SV_1$ and $SV_2$) through conductive films (51, 51*a* and 51*b*).

(c) MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Conductive films (51, 51*a* and 51*b*) electrically connected to gates (7B) or drains (14) of the MISFETs ($DR_1$ and $DR_2$) are respectively formed over the MISFETs ($DR_1$ and $DR_2$) with insulating films (20, 30, 49, 52 and 54) interposed therebetween. The vertical MISFETs ($SV_1$ and $SV_2$) are respectively formed over the conductive films (51, 51*a* and 51*b*), and gates (64, 65 and 66) of the vertical MISFETs ($SV_1$ and $SV_2$) are formed in sidewall spacer form and electrically connected to the conductive films (51, 51*a* and 51*b*) respectively.

(d) MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Conductive films (51, 51*a* and 51*b*) electrically connected to gates (7B) or drains (14) of the MISFETs ($DR_1$ and $DR_2$) are respectively formed over the MISFETs ($DR_1$ and $DR_2$) with insulating films (20, 30, 49 and 52) interposed therebetween. The vertical MISFETs ($SV_1$ and $SV_2$) are respectively formed over the conductive films (51, 51*a* and 51*b*), and gates (64, 65 and 66) of the vertical MISFETs ($SV_1$ and $SV_2$) are respectively electrically connected to the conductive films (51, 51*a* and 51*b*) on a self-alignment basis.

Owing to aspects (a) to (d) referred to above, the characteristic of a memory cell can be improved and the size of the memory cell can be scaled down.

In the above aspects (a) to (d), the vertical MISFETs ($SV_1$ and $SV_2$) are respectively formed over the conductive films (51, 51*a* and 51*b*) with the insulating films (49 and 52) interposed therebetween. Each of the gates (64, 65 and 66) of the vertical MISFETs ($SV_1$ and $SV_2$) includes a first film (64) and a second film (65) formed on a self-alignment basis in sidewall spacer form. The conductive films (51, 51*a* and 51*b*) are opened on a self-alignment basis with respect to the first film (64). The second film (65) is electrically connected to each of the conductive films (51, 51*a* and 51*b*) at its lower end. It is thus possible to scale down the size of a memory cell.

The gates (66) of the vertical MISFETs ($SV_1$ and $SV_2$) are respectively disposed over plugs 28, and the plugs 28 and the gates (66) of the vertical MISFETs ($SV_1$ and $SV_2$) are disposed so as to overlap each other on a plane basis. It is thus possible to improve the characteristic of the memory cell and scale down the size of the memory cell.

3. MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. First conductive films (42 and 43) electrically connected to gates (7B) or drains (14) of the MISFETs ($DR_1$ and $DR_2$) are respectively formed over the MISFETs ($DR_1$ and $DR_2$) with insulating films (20 and 30) interposed therebetween. Second conductive films (51, 51*a* and 51*b*) are respectively formed over the first conductive films (42 and 43). The vertical MISFETs ($SV_1$ and $SV_2$) are respectively formed over the second conductive films (51, 51*a* and 51*b*), and gates (64, 65 and 66) of the vertical MISFETs ($SV_1$ and $SV_2$) are respectively electrically connected to the second conductive films (51, 51*a* and 51*b*). Drains (57) of the vertical MISFETs ($SV_1$ and $SV_2$) are respectively electrically connected to the first conductive films (42 and 43) without involving the second conductive films (51, 51*a* and 51*b*).

The vertical MISFETs ($SV_1$ and $SV_2$) are formed over the second conductive films (51, 51*a* and 51*b*) with insulating films (20, 30, 49, 52 and 54) interposed therebetween. Each of the gates (66) of the vertical MISFETs ($SV_1$ and $SV_2$) includes a first film (64) and a second film (65) formed on a self-alignment basis in sidewall spacer form. The second conductive films (51, 51*a* and 51*b*) are opened on a self-alignment basis with respect to the first film (64). The second film (65) is electrically connected to each of the second conductive films (51, 51*a* and 51*b*) at its lower end. It is thus possible to improve the characteristic of a memory cell.

The first conductive films (42 and 43) are respectively made up of a metal film such as tungsten or the like. The second conductive films (51, 51*a* and 51*b*) are respectively constituted of a silicon film. The first conductive films (42 and 43) are electrically connected to their corresponding drains (57) of the vertical MISFETs ($SV_1$ and $SV_2$) through barrier films (48). Thus, the characteristic of the memory cell can be improved.

Conductive films (46 and 47) are formed which are conductive films lying in the same layer as the first conductive films (42 and 43) and perform electrical connection between gated (7C) and drains (15) of MISFETs (Qp) for a peripheral circuit. Thus, the degree of freedom of an electrical connection between the MISFETs constituting the peripheral circuit can be enhanced and high integration is enabled. Further, a connection resistance between the MISFETs can be reduced and a circuit's operating speed can be improved.

4. MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Conductive films (42 and 43) electrically connecting gates (7B) and drains (14) of the MISFETs ($DR_1$ and $DR_2$) are respectively formed over the MISFETs ($DR_1$ and $DR_2$) with insulating films (20, 30, 49, 52 and 54) interposed therebetween. The vertical MISFETs ($SV_1$ and $SV_2$) are respectively formed over the conductive films (42 and 43). Conductive films are formed which are conductive films (46 and 47) lying in the same layer as the conductive films (42 and 43) and perform electrical connection between gates (7C) and drains (15) of the MISFETs (Qp) for the peripheral circuit. Thus, the degree of freedom of an electrical connection between the MISFETs constituting each peripheral circuit can be enhanced, and high integration is enabled. Further, a connection resistance between the MISFETs can be reduced, and a circuit operating speed can be improved.

The conductive films (42 and 43) are respectively made up of a metal film such as tungsten or the like. The conductive films (42 and 43) are respectively electrically connected to their corresponding drains (57) of the vertical MISFETs ($SV_1$ and $SV_2$) through barrier films (48). Thus, the characteristic of the memory cell can be improved.

A metal wiring layer (89) is formed through insulating films (70, 72, 73 and 81) covering the vertical MISFETs ($SV_1$ and $SV_2$). With the formation of the metal wiring layer (89), wirings (89) for electrically connecting between the gates (7C) and drains (15) of the MISFETs (Qp) for the peripheral circuit are formed. Thus, the electrical connections between the MISFETs constituting the peripheral circuit are made by plugs 28 and intermediate conductive layers 46 and 47 formed below the vertical MISFETs ($SV_1$ and $SV_2$) and made using the plugs and first and second metal wiring layers formed above the vertical MISFETs ($SV_1$ and $SV_2$), so that the degree of freedom of wiring can be enhanced and high integration can be achieved. It is also possible to reduce the resistance of connection between the adjacent MISFETs and improve a circuit's operating speed.

5. MISFETs ($DR_1$ and $DR_2$) and vertical MISFETs ($SV_1$ and $SV_2$) are provided. The MISFETs ($DR_1$ and $DR_2$) are formed on a major surface of a semiconductor substrate. Conductive films (42 and 43) electrically connected to gates (7B) or drains (14) of the MISFETs ($DR_1$ and $DR_2$) are respectively formed over the drive MISFETs with insulating films interposed therebetween. The vertical MISFETs ($SV_1$ and $SV_2$) are respectively formed over the conductive films (42 and 43). The conductive films (42 and 43) and gate electrodes (51, 51*a*, 51*b* and 66) of the vertical MISFETs ($SV_1$ and $SV_2$) are respectively electrically connected by a plug (80) embedded in a connecting hole (74) defined in insulating films (70, 72, 73 and 81) covering the vertical MISFETs ($SV_1$ and $SV_2$) at the connecting hole (74). It is thus possible to improve the characteristic of a memory cell and scale down the memory cell size.

The plug 80 is disposed over its corresponding plug 28, and the plug 28 and plug 80 are disposed so as to overlap on a plane basis. Thus, the characteristic of the memory cell can be improved and the memory cell size can be scaled down.

Conductive films (46 and 47) are respectively formed which are conductive films (46 and 47) lying in the same layer as the conductive films (42 and 43) and perform electrical connection between gates (7C) and drains (15) of MISFETs (Qp) for each peripheral circuit. Thus; the degree of freedom of an electrical connection between the MISFETs constituting the peripheral circuit can be improved and high integration is enabled. Further, a connection resistance between the MISFETs can be reduced and a circuit's operating speed can be improved.

The vertical MISFETs respectively have sources (59), channel regions (58, substrate) and drains (57) formed in laminated bodies ($P_1$ and $P_2$) extending in the direction perpendicular to the major surface of the semiconductor substrate, and gate electrodes (66) formed on their corresponding side walls of the laminated bodies ($P_1$ and $P_2$) with gate insulating films (63) interposed therebetween. The laminated bodies ($P_1$ and $P_2$) are respectively formed of a silicon film.

6. A method of manufacturing a semiconductor device includes the steps of:

forming MISFETs ($DR_1$ and $DR_2$) on a major surface of a semiconductor substrate, forming conductive films (42 and 43) electrically connected to gates (7B) or drains (14) of the MISFETs over the MISFETs ($DR_1$ and $DR_2$) with insulating films (20, 30, 49, 52 and 54) interposed therebetween respectively, forming vertical MISFETs ($SV_1$ and $SV_2$) over the conductive films (42 and 43) respectively, defining a connecting hole (74) in insulating films (70, 72, 73 and 81) covering the vertical MISFETs ($SV_1$ and $SV_2$), and embedding a plug (80) into the connecting hole (74) to thereby electrically connect the conductive films (42 and 43) and gate electrodes (51, 51*a*, 51*b* and 66) of the vertical MISFETs within the connecting hole.

Conductive films (46 and 47) are respectively formed which are conductive films (46 and 47) lying in the same layer as the conductive films (42 and 43) and perform electrical connection between gates (7C) and drains (15) of MISFETs (Qp) for each peripheral circuit. Consequently, the size of a memory cell can be scaled down.

The plug 80 is disposed over its corresponding plug 28, and the plug 28 and plug 80 are disposed so as to overlap each other on a plane basis. It is thus possible to improve the characteristic of the memory cell and scale down the size of the memory cell.

7. A method of manufacturing a semiconductor device includes the steps of:

forming MISFETs ($DR_1$ and $DR_2$) on a major surface of a semiconductor substrate, forming semiconductor films (57, 58 and 59) formed as drain/channel/source and a cap insulating film (61) over the MISFETs ($DR_1$ and $DR_2$) with insulating films (20, 30, 49, 50 and 52) interposed therebetween, patterning the semiconductor films and cap insulating film into columnar shapes, forming an etching stopper film (108*a*) on side walls of each columnar cap insulating film in side spacer form, forming an interlayer insulating film (109) on the cap insulating film and etching stopper film, and etching the interlayer insulating film and cap insulating film, using the etching stopper film as a stopper and thereafter etching the etching stopper film to thereby form connecting holes (82) for opening the semiconductor film (59). It is thus possible to improve the characteristic of a memory cell.

8. A semiconductor memory device comprises, a memory cell having first and second transfer MISFETs disposed at portions where a pair of complementary data lines and a word line intersect, first and second drive MISFETs, and first and second vertical MISFETs, and wherein the first drive MISFET and the first vertical MISFET, and the second drive MISFET and the second vertical MISFET are cross-connected, wherein the first and second transfer MISFETs, and the first and second drive MISFETs are formed on a major surface of a semiconductor substrate, wherein the first and second vertical MISFETs are formed over the first and second transfer MISFETs and the first and second drive MISFETs respectively, wherein the first vertical MISFET has a source, a channel region and a drain formed in a first laminated body extending in a direction perpendicular to the major surface of the semiconductor substrate, and a gate electrode formed on sidewall portions of the first laminated body with a gate insulating film interposed therebetween, wherein the second vertical MISFET has a source, a channel region and a drain formed in a second laminated body extending in a direction perpendicular to the major surface of the semiconductor substrate, and a gate electrode formed on sidewall portions of the second laminated body with a gate insulating film interposed therebetween, and wherein sources of the first and second vertical MISFETs are electrically connected to a source voltage line formed over the first and second laminated bodies.

One of the complementary data lines, which is electrically connected to one of a source and drain of the first transfer MISFET, and the other of the complementary data lines, which is electrically connected to one of a source and drain of the second transfer MISFET, are formed in the same wiring layer as the source voltage line.

The word line electrically connected to gate electrodes of the first and second transfer MISFETs is formed in a wiring layer above the source voltage line and the complementary data lines.

Reference voltage lines electrically connected to sources of the first and second drive MISFETs are formed in the same wiring layer as the word line.

The reference voltage lines comprise a first reference voltage line electrically connected to the source of the first drive MISFET, and a second reference voltage line electrically connected to the source of the second drive MISFET. The first reference voltage line and the second reference voltage line extend in a first direction with the word line being interposed therebetween.

One of the complementary data lines and the other of the complementary data lines extend in a second direction intersecting the first direction with the source voltage line being interposed therebetween.

The complementary data lines, the source voltage line, the reference voltage lines and the word line are constituted of a metal film with copper as a principal component.

9. A semiconductor memory device comprises, a memory cell having first and second transfer MISFETs disposed at portions where a pair of complementary data lines and a word line intersect, first and second drive MISFETs, and first and second vertical MISFETs, and wherein the first drive MISFET and the first vertical MISFET, and the second drive MISFET and the second vertical MISFET are cross-connected, wherein the first and second transfer MISFETs, and the first and second drive MISFETs are formed on a major surface of a semiconductor substrate, wherein the first vertical MISFET is disposed on one end of a gate electrode of the second drive MISFET and has a source, a channel region and a drain formed in a first laminated body extending in a direction perpendicular to the major surface of the semiconductor substrate, and a gate electrode formed on sidewall portions of the first laminated body with a gate insulating film interposed therebetween, and wherein the second vertical MISFET is disposed on one end of a gate electrode of the first drive MISFET and has a source, a channel region and a drain formed in a second laminated body extending in a direction perpendicular to the major surface of the semiconductor substrate, and a gate electrode formed on sidewall portions of the second laminated body with a gate insulating film interposed therebetween.

10. The first and second vertical MISFETs are disposed between areas for forming the first transfer MISFET and the first drive MISFET and areas for forming the second transfer MISFET and the second drive MISFET as viewed on a plane basis in a plane parallel to the major surface of the semiconductor substrate.

11. A semiconductor memory device comprises, a memory cell having first and second transfer MISFETs disposed at portions where a pair of complementary data lines and a word line intersect, first and second drive MISFETs, and first and second vertical MISFETs, and wherein the first drive MISFET and the first vertical MISFET, and the second drive MISFET and the second vertical MISFET are cross-connected, wherein the first and second transfer MISFETs, and the first and second drive MISFETs are formed on a major surface of a semiconductor substrate, wherein the first and second vertical MISFETs are formed over the first and second transfer MISFETs and the first and second drive MISFETs, wherein the first vertical MISFET has a source, a channel region and a drain formed in a first laminated body extending in a direction perpendicular to the major surface of the semiconductor substrate, and a first gate electrode formed on sidewall portions of the first laminated body with a gate insulating film interposed therebetween, wherein the second vertical MISFET includes a source, a channel region and a drain formed in a second laminated body extending in a direction perpendicular to the major surface of the semiconductor substrate, and a second gate electrode formed on sidewall portions of the second laminated body with a gate insulating film interposed therebetween, wherein the drain of the first vertical MISFET, a gate electrode of the second drive MISFET, and a drain of the first drive MISFET are electrically connected to one another through a first intermediate conductive layer, wherein the drain of the second vertical MISFET, a gate electrode of the first drive MISFET, and a drain of the second drive MISFET are electrically connected to one another through a second intermediate conductive layer, wherein the first gate electrode of the first vertical MISFET is electrically connected to the second intermediate conductive layer through a first gate drawing electrode formed so as to come into contact with the first gate electrode, and a first conductive layer lying in a first connecting hole, which is formed so as to come into contact with the first gate drawing electrode and the second intermediate conductive layer, and wherein the second gate electrode of the second vertical MISFET is electrically connected to the first intermediate conductive layer through a second gate drawing electrode formed so as to come into contact with the second gate electrode, and a second conductive layer lying in a second connecting hole, which is formed so as to come into contact with the second gate drawing electrode and the first intermediate conductive layer.

A plurality of MISFETs for each peripheral circuit are further formed on the major surface of the semiconductor substrate, and wirings for connecting between the MISFETs of the peripheral circuit and the first and second intermediate conductive layers are formed in the same wiring layer.

The first and second intermediate conductive layers are made up of a metal film, a first barrier layer is formed between the drain of the first vertical MISFET and the first intermediate conductive layer, and a second barrier layer is formed between the drain of the second vertical MISFET and the second intermediate conductive layer.

The first and second intermediate conductive layers are constituted of a tungsten film, and the first and second barrier layers comprise a tungsten nitride (WN) film.

The first and second intermediate conductive layers are constituted of an oxidation resistant conductive film.

The first gate electrode of the first vertical MISFET is electrically connected to the first gate drawing electrode at its lower end, and the second gate electrode of the second vertical MISFET is electrically connected to the second gate drawing electrode at its lower end.

The first gate electrode of the first vertical MISFET and the second gate electrode of the second vertical MISFET are respectively made up of two-layer conductive films.

The second intermediate conductive layer, the first gate drawing electrode and the first connecting hole are disposed so as to have portions which overlap each other on a plane basis, whereas the first intermediate conductive layer, the second gate drawing electrode and the second connecting hole are disposed so as to have portions which overlap each other on a plane basis.

The first connecting hole extends through the first gate drawing electrode to connect to the second intermediate conductive layer, and the second connecting hole extends through the second gate drawing electrode to connect to the first intermediate conductive layer.

The first gate drawing electrode contacts the first gate electrode of the first vertical MISFET at the sidewall portions of the first laminated body, and the second gate drawing electrode contacts the second gate electrode of the second vertical MISFET at the sidewall portions of the second laminated body.

The first gate drawing electrode is formed integrally with the first gate electrode of the first vertical MISFET, and the second gate drawing electrode is formed integrally with the second gate electrode of the second vertical MISFET.

The gate electrode of the first vertical MISFET is formed so as to surround the sidewall portions of the first laminated body, and the gate electrode of the second vertical MISFET is formed so as to surround the sidewall portions of the second laminated body.

Each of the first and second gate drawing electrodes is made up of a silicon conductive film and a silicide film formed on its surface.

The first and second transfer MISFETs, and the first and second drive MISFETs comprise n channel type MISFETs respectively, and the first and second vertical MISFETs comprise p channel type MISFETs respectively.

12. A method of manufacturing a semiconductor memory device comprising a memory cell which includes first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first vertical MISFET has a source, a channel region and a drain formed in a first laminated body extending in a direction perpendicular to a major surface of a semiconductor substrate, and a gate electrode formed on sidewall portions of the first laminated body with a gate insulating film interposed therebetween, and wherein the second vertical MISFET has a source, a channel region and a drain formed in a second laminated body extending in a direction perpendicular to the major surface of the semiconductor substrate, and a gate electrode formed on sidewall portions of the second laminated body with a gate insulating film interposed therebetween, comprises the steps of:

(a) forming first and second transfer MISFETs and first and second drive MISFETs in a first area of a major surface of a semiconductor substrate, (b) forming a first intermediate conductive layer for electrically connecting a gate electrode of the second drive MISFET and a drain of the first drive MISFET over the first and second transfer MISFETs and the first and second drive MISFETs, and forming a second intermediate conductive layer for electrically connecting a gate electrode of the first drive MISFET and a drain of the second drive MISFET over them, (c) forming first and second gate drawing electrodes over the first and second intermediate conductive layers with a first insulating film interposed therebetween, (d) after the step (c), forming first and second laminated bodies over the first and second gate drawing electrodes to thereby electrically connect a drain of a first vertical MISFET formed in the first laminated body and the first intermediate conductive layer and electrically connect a drain of a second vertical MISFET formed in the second laminated body and the second intermediate conductive layer, (e) electrically connecting a gate electrode of the first vertical MISFET, which is formed on sidewall portions of the first laminated body with a gate insulating film interposed therebetween, and the first gate drawing electrode, and electrically connecting a gate electrode of the second vertical MISFET, which is formed on sidewall portions of the second laminated body with a gate insulating film interposed therebetween, and the second gate drawing electrode, and (f) forming a first connecting hole over the first gate drawing electrode so as to come into contact with the first gate drawing electrode and the second intermediate conductive layer and embedding a first conductive layer into the first connecting hole, and forming a second connecting hole over the second gate drawing electrode so as to come into contact with the second gate drawing electrode and the first intermediate conductive layer and embedding a second conductive layer into the second connecting hole.

The step (c) includes a step of forming a barrier layer on the surfaces of the first and second intermediate conductive layers, and a step of forming the first and second gate drawing electrodes over the first and second intermediate conductive layers formed with the barrier layer with the first insulating film interposed therebetween.

The step (d) includes a step of forming a second insulating film for covering the first insulating film and the first and second gate drawing electrodes, a step of etching the second insulating film and the first insulating film to thereby form a first opening for exposing the barrier layer on the surface of the first intermediate conductive layer and a second opening for exposing the barrier layer on the surface of the second intermediate conductive layer, a step of embedding a conductive layer into the first and second openings, and a step of forming the first and second laminated bodies over the second insulating film to thereby electrically connect the drain of the first vertical MISFET formed in the first laminated body and the first intermediate conductive layer through the barrier layer and the conductive layer lying inside the first opening, and electrically connect the drain of the second vertical MISFET formed in the second laminated body and the second intermediate conductive layer through the barrier layer and the conductive layer lying inside the second opening.

The step (e) includes a step of heat-treating the semiconductor substrate in a state in which the first and second gate drawing electrodes and the conductive film lying inside the first and second openings are being covered with the second insulating film, to thereby form the gate insulating film on each of the sidewall portions of the first and second laminated bodies, a step of etching a first gate electrode material deposited on the semiconductor substrate to thereby form a first gate electrode layer on the sidewall portions of the first and second laminated bodies, a step of etching the second insulating film to thereby expose the first and second gate drawing electrodes, and a step of etching a second gate electrode material deposited on the semiconductor substrate to thereby form a second gate electrode layer on the sidewall portions of the first and second laminated bodies, which are formed with the first gate electrode layer, and electrically connecting the second gate electrode layer formed on the sidewall portions of the first laminated body and the first gate drawing electrode, and electrically connecting the second gate electrode layer formed on the sidewall portions of the first laminated body and the first gate drawing electrode.

13. A method of manufacturing a semiconductor memory device comprising a memory cell which includes first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first vertical MISFET has a source, a channel region and a drain formed in a first laminated body extending in a direction perpendicular to a major surface of a semiconductor substrate, and a gate electrode formed on sidewall portions of the first laminated body with a gate insulating film interposed therebetween, and wherein the second vertical MISFET has a source, a channel region and a drain formed in a second laminated body extending in a direction perpendicular to the major surface of the semiconductor substrate, and a gate electrode formed on sidewall portions of the second laminated body with a gate insulating film interposed therebetween, comprises the steps of:

(a) forming first and second transfer MISFETs and first and second drive MISFETs in a first area of a major surface of a semiconductor substrate, (b) forming a first intermediate conductive layer for electrically connecting a gate electrode of the second drive MISFET and a drain of the first drive MISFET over the first and second transfer MISFETs and the first and second drive MISFETs, and forming a second intermediate conductive layer for electrically connecting a gate electrode of the first drive MISFET and a drain of the second drive MISFET over them, (c) after the step (b), forming first and second laminated bodies over the first and second intermediate conductive layers to thereby electrically connect a drain of a first vertical MISFET formed in the first laminated body and the first intermediate conductive layer and electrically connect a drain of a second vertical MISFET formed in the second laminated body and the second intermediate conductive layer, (d) after the step (c), forming a first gate drawing electrode so as to come into contact with a gate electrode of the first vertical MISFET, which is formed on sidewall portions of the first laminated body with a gate insulating film therebetween, and forming a second gate drawing electrode so as to come into contact with a gate electrode of the second vertical MISFET, which is formed on sidewall portions of the second laminated body with a gate insulating film interposed therebetween, and (e) forming a first connecting hole over the first gate drawing electrode so as to come into contact with the first gate drawing electrode and the second intermediate conductive layer and embedding a first conductive layer into the first connecting hole, and forming a second connecting hole over the second gate drawing electrode so as to come into contact with the second gate drawing electrode and the first intermediate conductive layer and embedding a second conductive layer into the second connecting hole.

A step of forming a source voltage fine electrically connected to the respective sources of the first and second vertical MISFETs over the first and second laminated bodies after the step (e) is further included.

A step of forming one of the complementary data lines, which is electrically connected to one of a source and drain of the first transfer MISFET, and the other thereof electrically connected to one of a source and drain of the second transfer MISFET in the source voltage line forming step is further included.

A step of forming the word line electrically connected to gate electrodes of the first and second transfer MISFETs and reference voltage lines electrically connected to sources of the first and second drive MISFETs over the source voltage line is further included.

14. In the above methods 11 through 13, first and second gate drawing electrodes are constituted of a metal nitride film.

The first and second gate drawing electrodes are made up of a metal nitride film. The conductive film brought into contact with the first gate drawing electrode, of the two-layer conductive films constituting the first gate electrode of the first vertical MISFET, and the conductive film brought into contact with the second gate drawing electrode, of the two-layer conductive films constituting the second gate electrode of the second vertical MISFET are respectively constituted of a metal film.

The drain of the first vertical MISFET is electrically connected to the first barrier layer through a first plug made up of a (polycrystal) silicon film, the drain of the second vertical MISFET is electrically connected to the second barrier layer through a second plug made up of a (polycrystal) silicon film, a first reactive layer for preventing a reaction between the first plug and the first barrier layer is formed between the first plug and the first barrier layer, and a second reactive layer for preventing a reaction between the second plug and the second barrier layer is formed between the second plug and the second barrier layer.

Depressions and projections are provided on the surfaces of the first and second reactive layers.

The (polycrystal) silicon film constituting each of the first and second plugs is one formed by annealing or heat-treating an amorphous silicon film deposited by a CVD method using a source gas containing disilane.

15. A method of manufacturing vertical MISFETs each having a source, a channel region and a drain formed in each laminated body extending in a direction perpendicular to a major surface of a semiconductor substrate, and a gate electrode formed on sidewall portions of the laminated body with a gate insulating film interposed therebetween, comprises a step of forming the gate electrode, which includes, (a) a step of depositing an amorphous silicon film on a semiconductor substrate and anisotropically etching the amorphous silicon film to thereby form a sidewall spacer-shaped amorphous silicon layer on the sidewall portions of the laminated body, (b) after the step (a), depositing a polycrystal silicon film on the semiconductor substrate and anisotropically etching the polycrystal silicon film to thereby form a sidewall spacer-shaped polycrystal silicon layer on the surface of the amorphous silicon layer formed on the sidewall portions of the laminated body, and (c) an annealing step of polycrystallizing the amorphous silicon layer.

A method of manufacturing a semiconductor memory device comprising a memory cell which includes first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first vertical MISFET has a source, a channel region and a drain formed in a first laminated body extending in a direction perpendicular to a major surface of a semiconductor substrate, and a first gate electrode formed on sidewall portions of the first laminated body with a gate insulating film interposed therebetween, and wherein the second vertical MISFET has a source, a channel region and a drain formed in a second laminated body extending in a direction perpendicular to the major surface of the semiconductor substrate, and a second gate electrode formed on sidewall portions of the second laminated body with a gate insulating film interposed therebetween, comprises a step of forming the first gate electrode of the first vertical MISFET and the second gate electrode of the second vertical MISFET, which includes, (a) a step of depositing an amorphous silicon film on the semiconductor substrate and anisotropically etching the amorphous silicon film to thereby form a sidewall spacer-shaped amorphous silicon layer on each of the sidewall portions of the first and second laminated bodies, (b) after the step (a), depositing a polycrystal silicon film on the semiconductor substrate and anisotropically etching the polycrystal silicon film to thereby form a sidewall spacer-shaped polycrystal silicon layer on the surface of the amorphous silicon layer formed on each of the sidewall portions of the first and second laminated bodies, and (c) an annealing step of polycrystallizing the amorphous silicon layer.

16. A method of manufacturing a semiconductor device comprises:

(a) a step of forming a mask layer over a first conductive film constituting a gate electrode of a first MISFET and a gate electrode of a second drive MISFET, (b) a first step of patterning the mask layer along a first direction of a major surface of a semiconductor substrate, (c) a second step of patterning the mask layer along a second direction intersecting the first direction, and (d) a step of patterning the first conductive film with the mask layer as a mask after the step (c).

A method of manufacturing a semiconductor memory device comprising a memory cell which includes first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first vertical MISFET has a source, a channel region and a drain formed in a first laminated body extending in a direction perpendicular to a major surface of a semiconductor substrate, and a gate electrode formed on sidewall portions of the first laminated body with a gate insulating film interposed therebetween, and wherein the second vertical MISFET has a source, a channel region and a drain formed in a second laminated body extending in a direction perpendicular to the major surface of the semiconductor substrate, and a gate electrode formed on sidewall portions of the second laminated body with a gate insulating film interposed therebetween, comprises a step of forming gate electrodes of the first and second transfer MISFETs and gate electrodes of the first and second drive MISFETs, which includes, (a) a step of forming a mask layer over a first conductive film constituting each of the gate electrodes of the first and second transfer MISFETs and each of the gate electrodes of the first and second drive MISFETs, (b) a first step of patterning the mask layer along a first direction of the major surface of the semiconductor substrate, (c) a second step of patterning the mask layer along a second direction intersecting the first direction, and (d) a step of patterning the first conductive film with the mask layer as a mask after the step (c).

17. A method of manufacturing vertical MISFETs each having a source, a channel region and a drain formed in each laminated body extending in a direction perpendicular to a major surface of a semiconductor substrate, and a gate electrode formed on sidewall portions of the laminated body with a gate insulating film interposed therebetween, comprises a step of forming channel regions of the first and second vertical MISFETs, which includes, (a) a step of depositing an amorphous silicon film over a conductive film constituting each of the sources of the first and second vertical MISFETs by a CVD method using disilane as a source gas, and (b) an annealing step of polycrystallizing the amorphous silicon film.

A method of manufacturing a semiconductor memory device comprising a memory cell which includes first and second transfer MISFETs disposed at portions where a pair of complementary data lines and a word line intersect, first and second drive MISFETs, and first and second vertical MISFETs, and in which the first drive MISFET and the first vertical MISFET, and the second drive MISFET and the second vertical MISFET are cross-connected, wherein the first vertical MISFET has a source, a channel region and a drain formed in a first laminated body extending in a direction perpendicular to a major surface of a semiconductor substrate, and a gate electrode formed on sidewall portions of the first laminated body with a gate insulating film interposed therebetween, and wherein the second vertical MISFET has a source, a channel region and a drain formed in a second laminated body extending in a direction perpendicular to the major surface of the semiconductor substrate, and a gate electrode formed on sidewall portions of the second laminated body with a gate insulating film interposed therebetween, comprises a step of forming channel regions of the first and second vertical MISFETs, including, (a) a step of depositing an amorphous silicon film over a conductive film constituting each of the sources of the first and second vertical MISFETs by a CVD method using disilane as a source gas, and (b) an annealing step of polycrystallizing the amorphous silicon film.

Advantageous effects obtained by a typical or representative one of the inventions disclosed by the present application will be described in brief as follows:

Each of memory cells in an SRAM comprises four MISFETs and two vertical MISFETs formed thereabove. It is thus possible to substantially scale down a memory cell size.

What we claim is:

1. A method of manufacturing a semiconductor device including memory cells having MISFETs, comprising steps of:

(a) forming a first film over a conductive film formed over a main surface of a semiconductor substrate;

(b) patterning the first film to form first patterns each having a shape extending in a first direction;

(c) patterning the first patterns in a second direction perpendicular to the first direction to form second patterns each separated in the first direction; and (d) patterning the conductive film by using the second patterns to form gate patterns for gate electrodes of the MISFETs, wherein the memory cell comprises a memory cell of a static random memory, wherein the memory cell includes a first drive MISFET, a second drive MISFET, a first transfer MISFET and a second transfer MISFET such that the first drive MISFET and the first transfer MISFET are cross-coupled to the second drive MISFET and the second transfer MISFET, and wherein the first drive MISFET and the first transfer MISFET are arranged with point symmetry to the second drive MISFET and the second transfer MISFET, respectively, with respect to a center point in a memory cell forming region.

2. A method according to claim 1, wherein the gate patterns are formed such that a gate electrode of the first drive MISFET is integrally formed with a gate electrode of the first transfer MISFET and such that a gate electrode of the second drive MISFET is integrally formed with a gate electrode of the second transfer MISFET.

3. A method according to claim 1, wherein a gate pattern of the first film for a gate electrode of an MISFET in a peripheral circuit is formed by using the step (b) or the step (c).

4. A method according to claim 1, wherein a gate pattern of the first film for a gate electrode of an MISFET in a peripheral circuit is formed by using the step (b), the step (c) and the step (d).

5. A method according to claim 1, wherein the first film includes a silicon oxide film.

6. A method according to claim 1, wherein the memory cells arranged in the first direction are arranged with the same layout pattern in the first direction.

7. A method of manufacturing a semiconductor device including memory cells having MISFETs, comprising steps of:

(a) forming a first film over a conductive film formed over a main surface of a semiconductor substrate;

(b) patterning the first film to form first patterns each having a shape extending a first direction;

(c) patterning the first patterns in a second direction perpendicular to the first direction to form second patterns each separated in the first direction; and (d) patterning the conductive film by using the second patterns to form gate patterns for gate electrodes of the MISFETs, wherein each of the gate patterns has a rectangle shape such that a width, in the first direction, of the rectangle shape is greater than a width, in the second direction, of the rectangle shape, wherein the memory cell comprises a memory cell of a static random memory, wherein the memory cell includes a first drive MISFET, a second drive MISFET, a first transfer MISFET and a second transfer MISFET such that the first drive MISFET and the first transfer MISFET are cross-coupled to the second drive MISFET and the second transfer MISFET, and wherein the first drive MISFET and the first transfer MISFET are arranged with point symmetry to the second drive MISFET and the second transfer MISFET, respectively, with respect to a center point in a memory cell forming region.

8. A method according to claim 7, wherein the gate patterns are formed such that a gate electrode of the first drive MISFET is integrally formed with a gate electrode of the first transfer MISFET and such that a gate electrode of the second drive MISFET is integrally formed with a gate electrode of the second transfer MISFET.

9. A method according to claim 7, wherein a gate pattern of the first film for a gate electrode of an MISFET in a peripheral circuit is formed by using the step (b) or the step (c).

10. A method according to claim 7, wherein a gate pattern of the first film for a gate electrode of an MISFET in a peripheral circuit is formed by using the step (b), the step (c) and the step (d).

11. A method according to claim 7, wherein the first film includes a silicon oxide film.

12. A method according to claim 7, wherein the memory cells arranged in the first direction are arranged with the same layout pattern in the first direction.

* * * * *